US008489666B1

(12) United States Patent
Nikitin

(10) Patent No.: US 8,489,666 B1
(45) Date of Patent: *Jul. 16, 2013

(54) METHOD AND APPARATUS FOR SIGNAL FILTERING AND FOR IMPROVING PROPERTIES OF ELECTRONIC DEVICES

(71) Applicant: Alexei V. Nikitin, Lawrence, KS (US)

(72) Inventor: Alexei V. Nikitin, Lawrence, KS (US)

(73) Assignee: Avatekh, Inc., Lawrence, KS (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/662,127

(22) Filed: Oct. 26, 2012

Related U.S. Application Data

(63) Continuation of application No. 13/599,866, filed on Aug. 30, 2012.

(60) Provisional application No. 61/573,305, filed on Sep. 2, 2011, provisional application No. 61/686,376, filed on Apr. 4, 2012, provisional application No. 61/687,346, filed on Apr. 23, 2012, provisional application No. 61/673,976, filed on Jul. 20, 2012, provisional application No. 61/682,367, filed on Aug. 13, 2012.

(51) Int. Cl.
 *G06G 7/02* (2006.01)
(52) U.S. Cl.
 USPC .......................................................... 708/819
(58) Field of Classification Search
 USPC .......................................................... 708/819
 See application file for complete search history.

(56) References Cited

U.S. PATENT DOCUMENTS

| | | | |
|---|---|---|---|
| 3,495,184 A * | 2/1970 | Duggan et al. ................... | 331/10 |
| 6,456,950 B1 * | 9/2002 | El-Ghoroury et al. .......... | 702/75 |
| 7,107,306 B2 | 9/2006 | Nikitin | |
| 7,133,568 B2 | 11/2006 | Nikitin et al. | |
| 7,242,808 B2 | 7/2007 | Nikitin et al. | |
| 7,418,469 B2 | 8/2008 | Nikitin | |
| 7,617,270 B2 | 11/2009 | Nikitin | |
| 2011/0112784 A1 | 5/2011 | Nikitin | |

OTHER PUBLICATIONS

Assessment of compatibility of planned LightSquared Ancillary Terrestrial Component transmissions in the 1526-1536 MHz band with certified aviation GPS receivers. Federal Aviation Administration status report, Jan. 25, 2012.

(Continued)

*Primary Examiner* — Tan V. Mai
(74) *Attorney, Agent, or Firm* — Erickson Kernell Derusseau & Kleypas, LLC

(57) ABSTRACT

The present invention relates to nonlinear signal processing, and, in particular, to adaptive nonlinear filtering of real-, complex-, and vector-valued signals utilizing analog Nonlinear Differential Limiters (NDLs), and to adaptive real-time signal conditioning, processing, analysis, quantification, comparison, and control. More generally, this invention relates to methods, processes and apparatus for real-time measuring and analysis of variables, and to generic measurement systems and processes. This invention also relates to methods and corresponding apparatus for measuring which extend to different applications and provide results other than instantaneous values of variables. The invention further relates to post-processing analysis of measured variables and to statistical analysis. The NDL-based filtering method and apparatus enable improvements in the overall properties of electronic devices including, but not limited to, improvements in performance, reduction in size, weight, cost, and power consumption, and, in particular for wireless devices, NDLs enable improvements in spectrum usage efficiency.

30 Claims, 119 Drawing Sheets

(a)

(b)

OTHER PUBLICATIONS

M. Abramowitz and I. A. Stegun, editors. Handbook of Mathematical Functions with Formulas, Graphs, and Mathematical Tables. 9th printing. New York: Dover, 1972.

S. H. Ardalan and J. J. Paulos. An analysis of nonlinear behavior in delta-sigma modulators. IEEE Transactions on Circuits and Systems, CAS-34(6), 1987.

S. A. Bhatti, Q. Shan, R. Atkinson, M. Vieira, and I. A. Glover. Vulnerability of Zigbee to impulsive noise in electricity substations. In General Assembly and Scientific Symposium, 2011 XXXth URSI, Aug. 13-20, 2011.

R. Bracewell. The Fourier Transform and Its Applications, chapter "Heaviside's Unit Step Function, H(x)", pp. 61-65. McGraw-Hill, New York, 3rd edition, 2000.

J. Carey. Noise wars: Projected capacitance strikes back against internal noise. EDN, pp. 61-65, Jan. 19, 2012.

A. Chopra. Modeling and Mitigation of Interference in Wireless Receivers with Multiple Antennae. Phd thesis, The University of Texas at Austin, Dec. 2011.

P. A. M. Dirac. The Principles of Quantum Mechanics. Oxford University Press, London, 4th edition, 1958.

R. Dragomir, S. Puscoci, and D. Dragomir. A synthetic impulse noise environment for DSL access networks. In Proceedings of the 2nd International conference on Circuits, Systems, Control, Signals (CSCS'11), pp. 116-119, 2011.

C. Fischer. Analysis of cellular CDMA systems under UWB interference. In International Zurich Seminar on Communications, pp. 130-133, Feb. 22-24, 2006.

T. B. Gabrielson. Mechanical-thermal noise in micromachined acoustic and vibration sensors. IEEE Transactions on Electron Devices, 40(5): 903-909, 1993.

V. Guillet, G. Lamarque, P. Ravier, and C. Leger. Improving the power line communication signal-to-noise ratio during a resistive load commutation. Journal of Communications, 4(2): 126-132, 2009.

A. Hyvarinen, J. Karhunen, and E. Oja. Independent component analysis. Wiley, New York, 2001.

E. Janssen and A. van Roermund. Look-Ahead Based Sigma-Delta Modulation. Springer, 2011.

F. Leferink, F. Silva, J. Catrysse, S. Batterman, V. Beauvois, and A. Roc'h. Man-made noise in our living environments. Radio Science Bulletin, (334):49-57, Sep. 2010.

S. R. Mallipeddy and R. S. Kshetrimayum. Impact of UWB interference on IEEE 802.11a WLAN system. In National Conference on Communications (NCC), Jan. 29-31, 2010.

F. Mohd-Yasin, D. J. Nagel, and C. E. Korman. Noise in MEMS. Meas. Sci. Technol., 21 (012001), 2010.

A. V. Nikitin and R. L. Davidchack. Signal analysis through analog representation. Proc. R. Soc. Lond. A, 459 (2033):1171-1192, 2003.

A. V. Nikitin, M. Epard, J. B. Lancaster, R. L. Lutes, and E. A. Shumaker. Impulsive interference in communication channels and its mitigation by SPART and other nonlinear filters. EURASIP Journal on Advances in Signal Processing, 2012 (79), 2012.

A. V. Nikitin. On the impulsive nature of interchannel interference in digital communication systems. In Proc. IEEE Radio and Wireless Symposium, pp. 118-121, Phoenix, AZ, 2011.

A. V. Nikitin. On the interchannel interference in digital communication systems, its impulsive nature, and its mitigation. EURASIP Journal on Advances in Signal Processing, 2011 (137), 2011.

C. R. Popa. High-accuracy function synthesizer circuit with applications in signal processing. EURASIP Journal on Advances in Signal Processing, 2012 (146), 2012.

J. G. Proakis and D. G. Manolakis. Digital signal processing: principles, algorithms, and applications, Prentice Hall, 4th edition, 2006.

R. P. Sallen and E. L. Key. A practical method of designing RC active filters. IRE Transactions on Circuit Theory, CT-2: 78-85, 1955.

R. Schaumann and M. E. Van Valkenburg. Design of analog filters, chapter 16. Oxford University Press, 2001.

C. E. Shannon. Communication in the presence of noise. Proc. Institute of Radio Engineers, 37(1): 10-21, Jan. 1949.

I. Shanthi and M. L. Valarmathi. Speckle noise suppression of SAR image using hybrid order statistics filters. International Journal of Advanced Engineering Sciences and Technologies (IJAEST), 5(2): 229-235, 2011.

K. Slattery and H. Skinner. Platform Interference in Wireless Systems. Elsevier, 2008.

G. H. Stauffer. Finding the lumped element varactor diode model. High Frequency Electronics, 2(6): 22-28, Nov. 2003.

X. Yang and A. P. Petropulu. Co-channel interference modeling and analysis in a poisson field of interferers in wireless communications. IEEE Transactions on Signal Processing, 51(1): 64-76, 2003.

Y. Zheng. Operational transconductance amplifiers for gigahertz applications. Phd thesis, Queen's University, Kingston, Ontario, Canada, Sep. 2008.

* cited by examiner

Basic Nonlinear Differential Limiter (NDL)

(a)
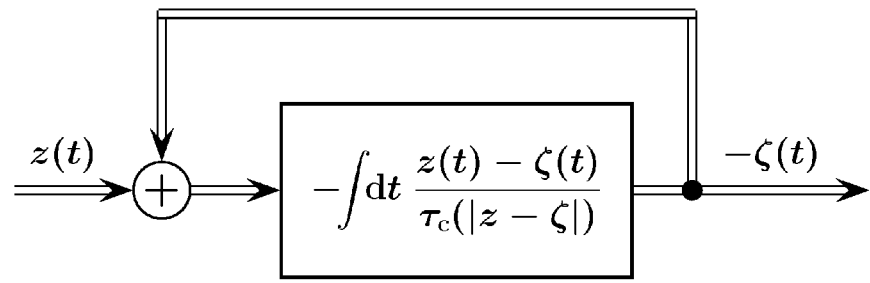
$$\tau_c(|z|+\varepsilon) \geq \tau_c(|z|) \geq \tau_0 \quad \text{for} \quad \varepsilon > 0$$
(b)
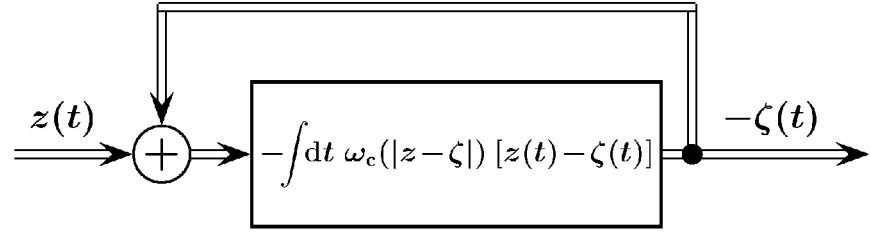
$$\omega_c(|z|+\varepsilon) \leq \omega_c(|z|) \leq \omega_0 \quad \text{for} \quad \varepsilon > 0$$
Fig. 4

(a)

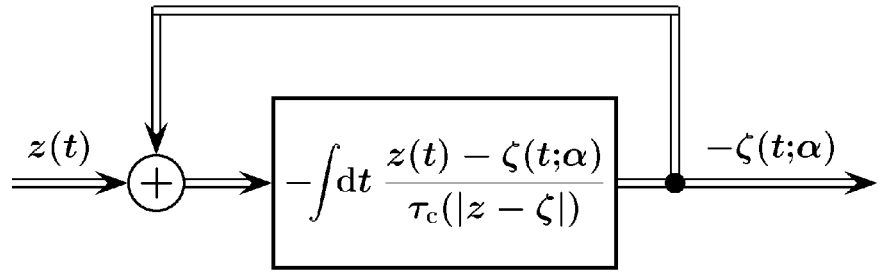

$$\begin{cases} \tau_c(|z|) = \tau_0 & \text{when } |z| \text{ is sufficiently small in comparison with } \alpha \\ \tau_c(|z| + \varepsilon) > \tau_c(|z|) & \text{for } \varepsilon > 0 \quad \text{otherwise} \end{cases}$$

(b)

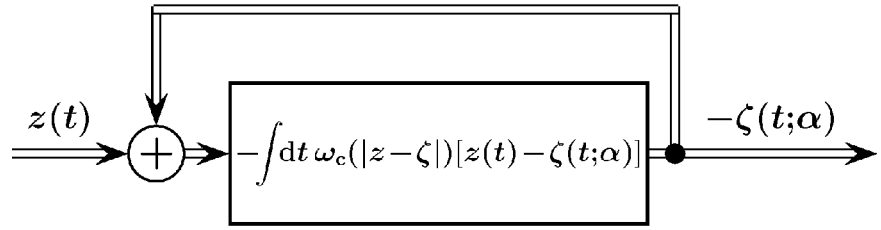

$$\begin{cases} \omega_c(|z|) = \omega_0 & \text{when } |z| \text{ is sufficiently small in comparison with } \alpha \\ \omega_c(|z| + \varepsilon) < \omega_c(|z|) & \text{for } \varepsilon > 0 \quad \text{otherwise} \end{cases}$$

Fig. 6

$$\zeta(t) = z(t) - 2RC\,\dot{\zeta}(t) - 2\,(RC)^2\,\ddot{\zeta}(t)$$
$$\left(\tau = 2RC,\quad Q = \frac{1}{\sqrt{2}},\quad R = R\,(|z - \zeta|)\right)$$

Input (thin line), rec. moving window median (dashed)
and respective small-$\alpha$ DcL output (larger $\alpha$).
Rectangular moving window mean is shown by dotted line
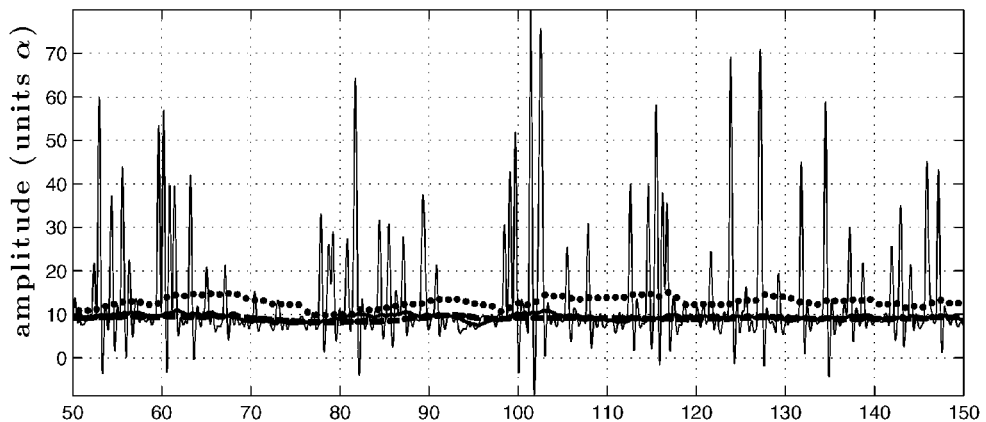
Input (thin line), rec. moving window median (dashed)
and respective small-$\alpha$ DcL output (10 times smaller $\alpha$).
Rectangular moving window mean is shown by dotted line
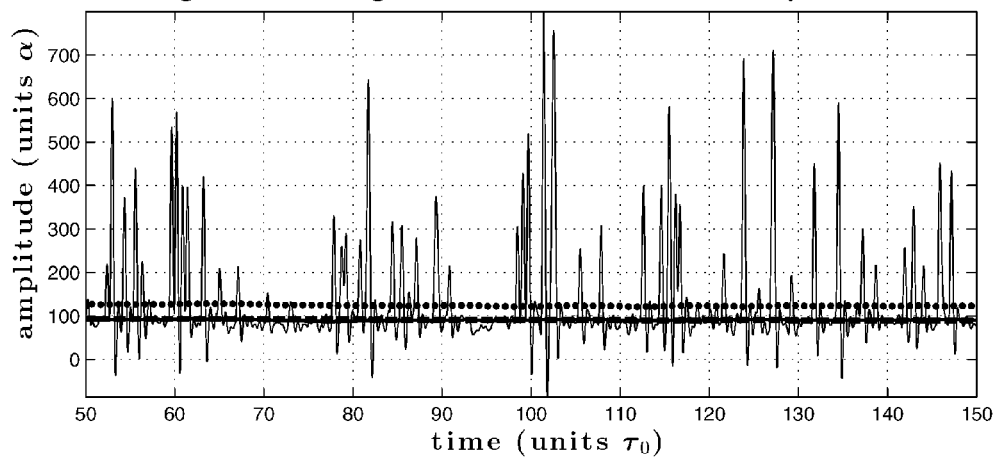
Fig. 23

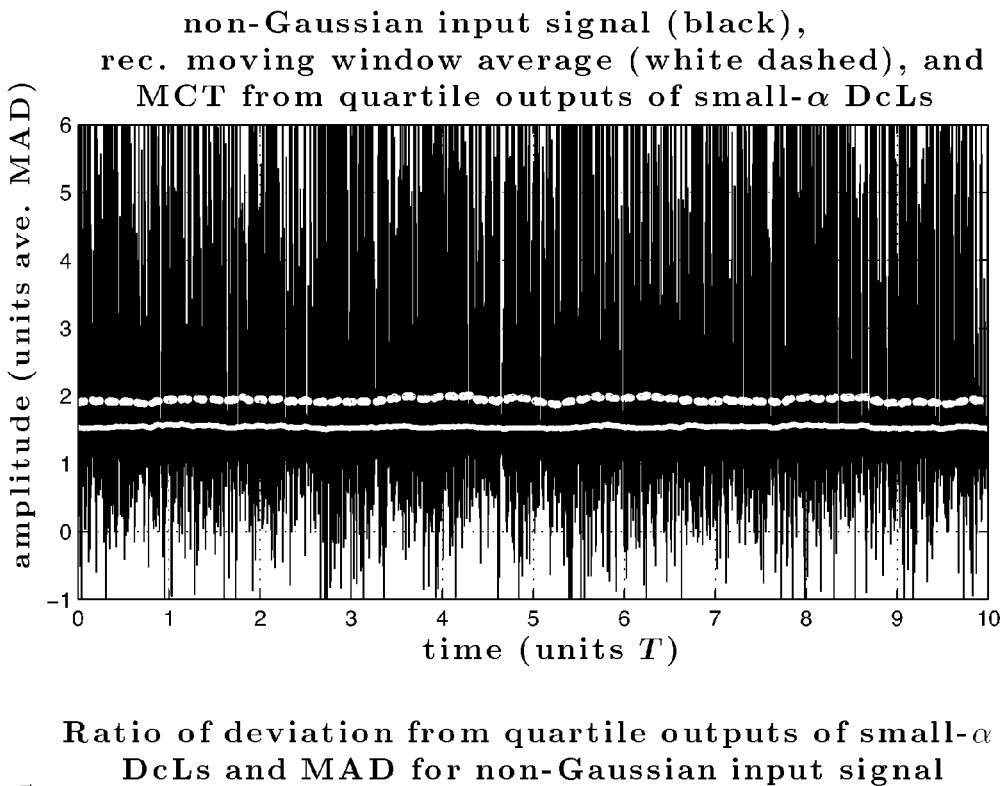
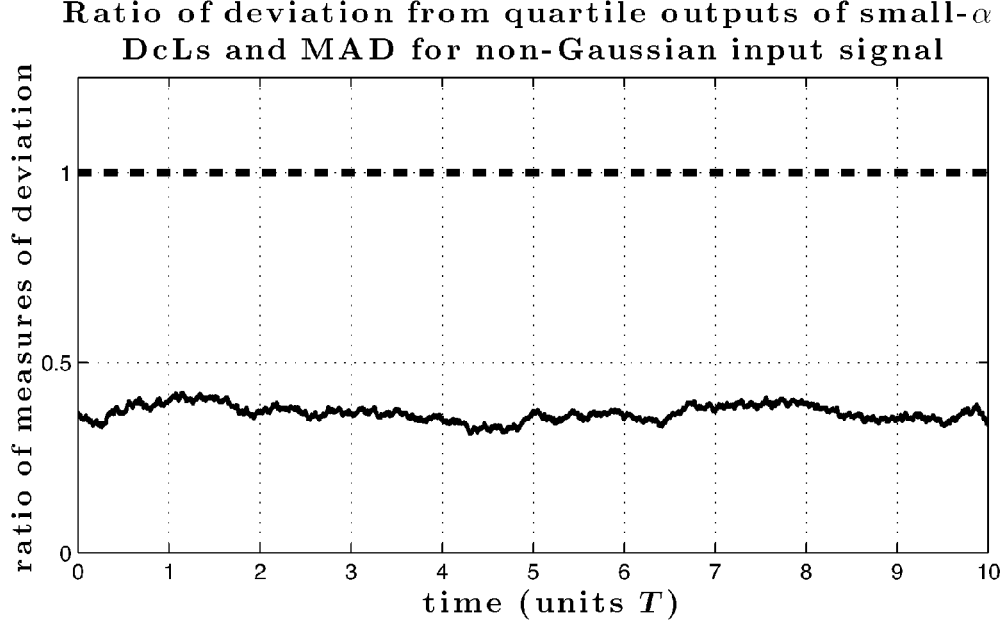
Fig. 30

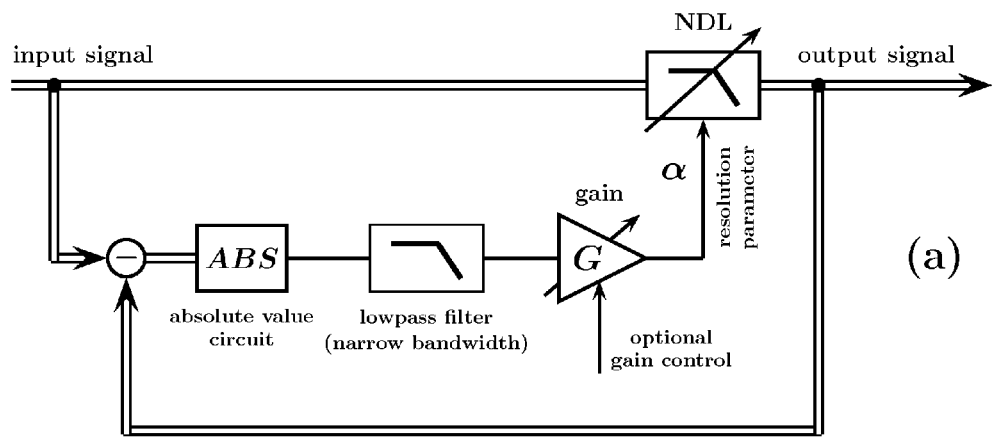
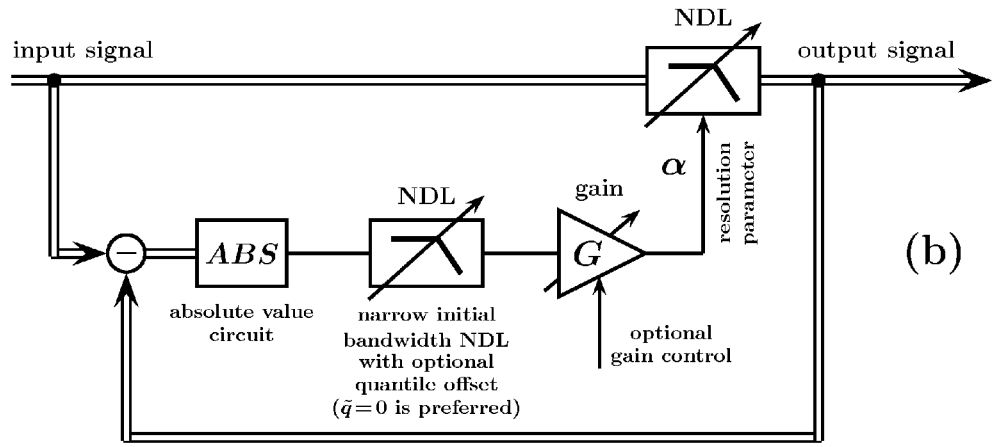
Fig. 31

Adaptive NDL (lowpass-based resolution setting)
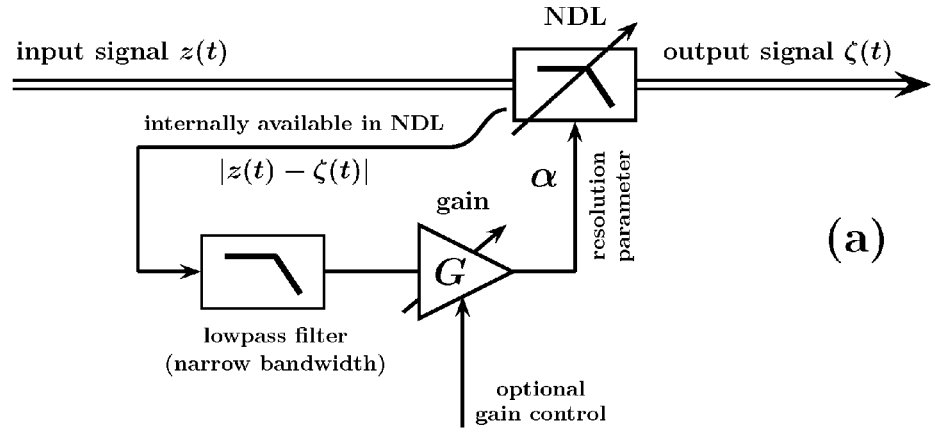
(a)
Adaptive NDL (NDL-based resolution setting)
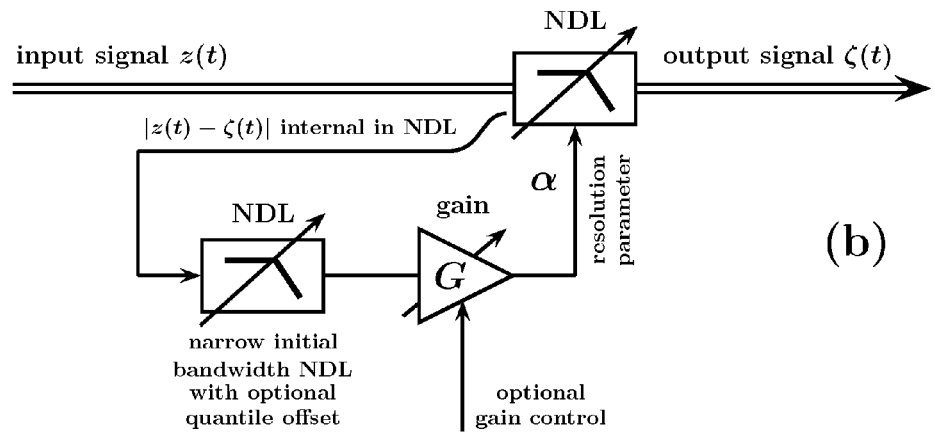
(b)
Fig. 32

$$I_c = \alpha\, g_m \times \begin{cases} \frac{x-\chi}{\alpha} & \text{for } |x-\chi| \leq \alpha \\ \text{sign}(x-\chi) & \text{otherwise} \end{cases}$$

$$\chi(t) = \frac{1}{C} \int dt \left[ \frac{x(t) - \chi(t)}{R(|x - \chi|)} + \tilde{q}\alpha g_m \right],$$

where $R(|x - \chi|) = \dfrac{1}{g_m} \times \begin{cases} 1 & \text{for } |x - \chi| \leq \alpha \\ \dfrac{|x-\chi|}{\alpha} & \text{otherwise} \end{cases}$ $$I_c = \alpha\, g_m \left( \tilde{q} + \begin{cases} \frac{x-\chi}{\alpha} & \text{for } |x-\chi| \leq \alpha \\ \text{sign}(x-\chi) & \text{otherwise} \end{cases} \right)$$

$$\tau = L\frac{\beta}{K} \times \begin{cases} 1 & \text{for } |x - \chi| \leq \alpha \\ \frac{|x-\chi|}{\alpha} & \text{otherwise} \end{cases}$$

if $\dfrac{1}{R(V_c)} = \beta V_c$ and $V_c = \dfrac{1}{K} \times \begin{cases} 1 & \text{for } |x - \chi| \leq \alpha \\ \frac{|x-\chi|}{\alpha} & \text{otherwise} \end{cases}$

Example of odd order NDL-based lowpass filter
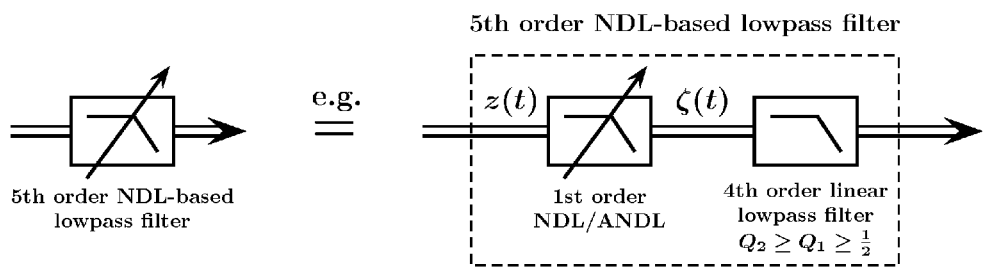
Pole-zero diagram
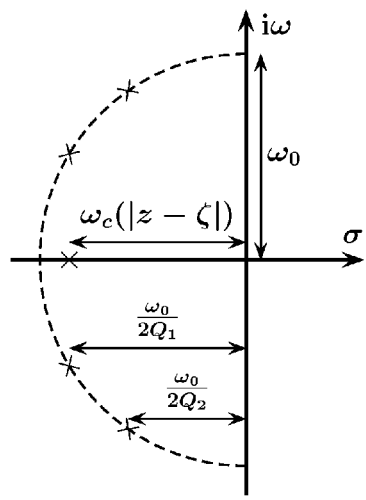
$\omega_c(|z|)$ is non-increasing function of $|z|$:
$$\omega_c(|z| + \varepsilon) \leq \omega_c(|z|) \leq \omega_0 \quad \text{for} \quad \varepsilon > 0$$
E.g. for 1st order CDL:
$$\omega_c(|z - \zeta|) = \omega_0 \times \begin{cases} 1 & \text{for } |z - \zeta| \leq \alpha \\ \frac{\alpha}{|z-\zeta|} & \text{otherwise} \end{cases}$$
Fig. 64

Example of odd order NDL-based lowpass filter

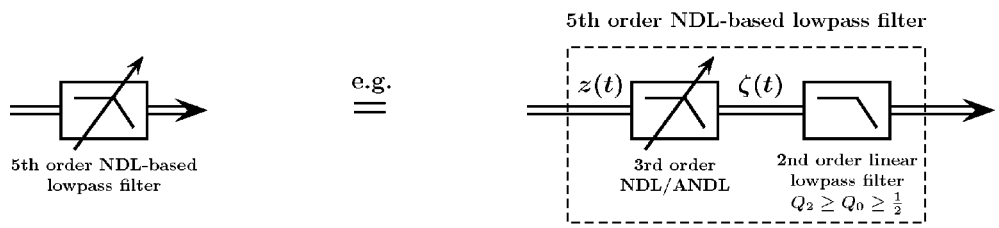

Pole-zero diagram

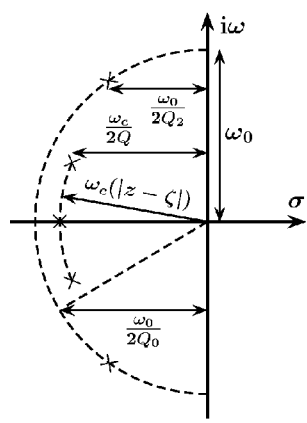

$\omega_c(|z|)$ and $Q(|z|)$ are non-increasing functions of $|z|$:

$$\omega_c(|z| + \varepsilon) \leq \omega_c(|z|) \leq \omega_0 \quad \text{for} \quad \varepsilon > 0$$

and $$Q(|z| + \varepsilon) \leq Q(|z|) \leq Q_0 \quad \text{for} \quad \varepsilon > 0$$

E.g. for 3rd order CDL:

$$\omega_c(|z - \zeta|) = \omega_0 \times \begin{cases} 1 & \text{for } |z - \zeta| \leq \alpha \\ \frac{\alpha}{|z-\zeta|} & \text{otherwise} \end{cases}$$

and $Q(|z|) = Q_0 = \text{const}$

Fig. 65

Example of even order NDL-based lowpass filter

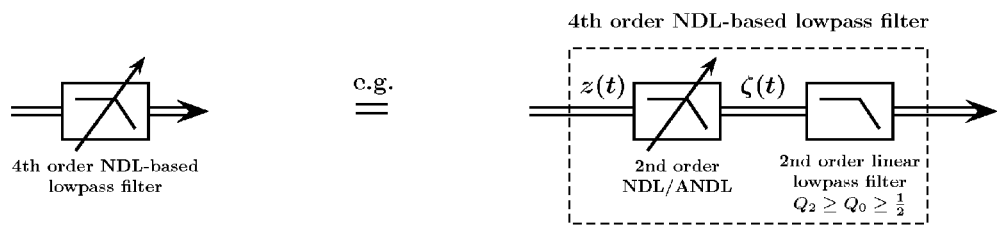

4th order NDL-based lowpass filter

Pole-zero diagram

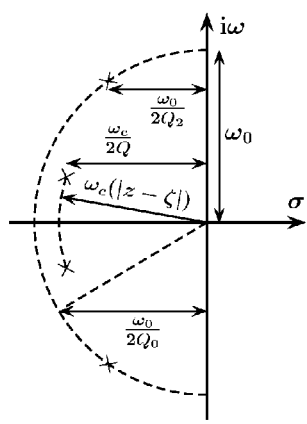

$\omega_c(|z|)$ and $Q(|z|)$ are non-increasing functions of $|z|$:

$$\omega_c(|z|+\varepsilon) \leq \omega_c(|z|) \leq \omega_0 \quad \text{for} \quad \varepsilon > 0$$
and
$$Q(|z|+\varepsilon) \leq Q(|z|) \leq Q_0 \quad \text{for} \quad \varepsilon > 0$$

E.g. for 2nd order CDL:

$$\omega_c(|z-\zeta|) = \omega_0 \times \begin{cases} 1 & \text{for } |z-\zeta| \leq \alpha \\ \frac{\alpha}{|z-\zeta|} & \text{otherwise} \end{cases}$$

and $Q(|z|) = Q_0 = \text{const}$

Fig. 66

Improved NDL-based bandpass filters

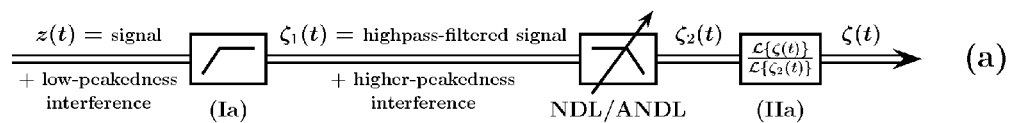

(Ia): Highpass filter to increase peakedness of interference (IIa): Optional linear filter to achieve desired initial response

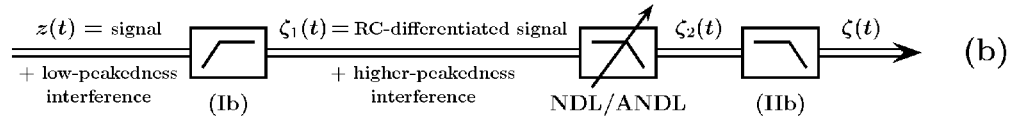

(Ib): RC differentiator (high $f_c$) to increase peakedness of interference (IIb): RC integrator (low $f_c$) for desired initial response

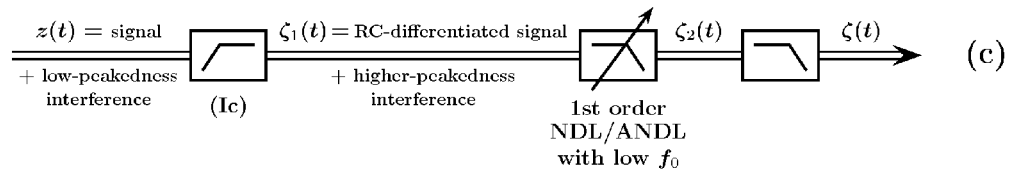

(Ic): RC differentiator (high $f_c$) to increase peakedness of interference

Fig. 71

Particular illustration of constructing
an improved 2nd order NDL-based bandpass filter
Original 2nd order linear bandpass filter
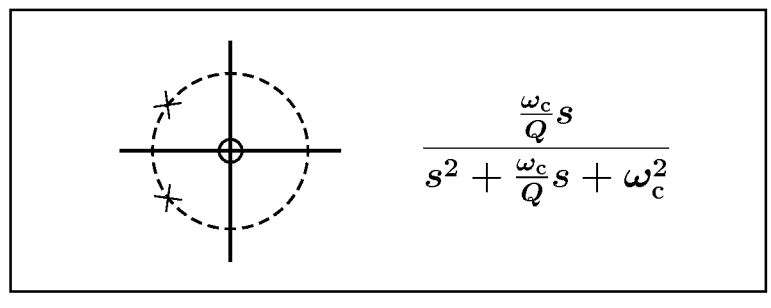
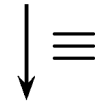
Equivalent linear filter
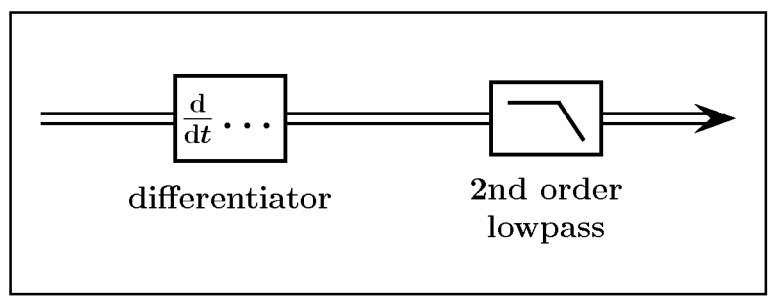
Improved 2nd order NDL-based bandpass filter
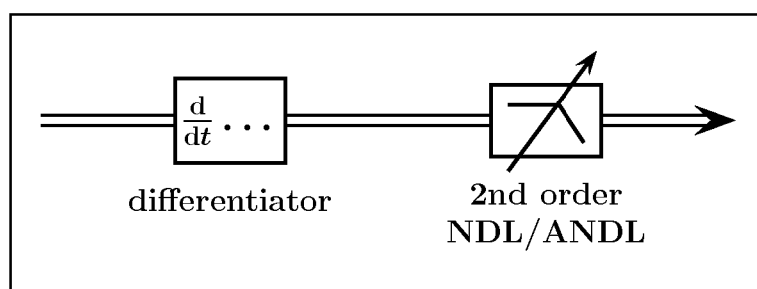
Fig. 75

I: Optional linear filter to increase impulsiveness of interference
   and/or to reduce its non-impulsive component II: Optional linear filter for desired initial response

METHOD AND APPARATUS FOR SIGNAL FILTERING AND FOR IMPROVING PROPERTIES OF ELECTRONIC DEVICES

CROSS REFERENCES TO RELATED APPLICATIONS

This application is a continuation of application Ser. No. 13/599,866, filed Aug. 30, 2012, which claims the benefit of provisional patent application Ser. Nos. 61/573,305, filed on Sep. 2, 2011; 61/686,376, filed on Apr. 4, 2012; 61/687,346, filed on Apr. 23, 2012; 61/673,976, filed on Jul. 20, 2012; and 61/682,367, filed on Aug. 13, 2012.

STATEMENT REGARDING FEDERALLY SPONSORED RESEARCH OR DEVELOPMENT

None.

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to nonlinear signal processing, and, in particular, to adaptive nonlinear filtering utilizing analog nonlinear differential limiters, and to adaptive real-time signal conditioning, processing, analysis, quantification, comparison, and control. More generally, this invention relates to methods, processes and apparatus for real-time measuring and analysis of variables, including statistical analysis, and to generic measurement systems and processes which are not specially adapted for any specific variables, or to one particular environment. This invention also relates to methods and corresponding apparatus for mitigation of electromagnetic interference, and further relates to improving properties of electronic devices and to improving and/or enabling coexistence of a plurality of electronic devices. The invention further relates to post-processing analysis of measured variables and to post-processing statistical analysis.

BACKGROUND

An electronic device always comprises at least one electronic component (e.g. an antenna, a transducer, a sensor, an active and/or passive filter, an integrated circuit, a power supply/battery) and a plurality of signal paths through which various signals (e.g. input, feedback, control, and output signals) propagate. A signal path may in turn be a signal chain, that is, a series of signal-conditioning electronic components that receive input (data acquired from sampling either real-time phenomena or from stored data) in tandem, with the output of one portion of the chain supplying input to the next.

Signals of interest in various signal paths of an electronic device (such as, for example, a communication or data acquisition and processing device, a biomedical device, or a computer) are affected by various interferences (noise) from natural and man-made sources. Be it a signal from a sensor, or a signal from a transmitter in a communication chain, the amount of noise affecting the signal may be reduced to improve the signal quality and/or other properties of the device (e.g. reduce its size and/or power consumption, the bill of materials, and/or the cost of the components).

For example, the demand for wireless Internet data is exponentially increasing, and the interference in wireless receivers "is the key bottleneck preventing service providers from meeting this demand" (see Chopra [7, p. 21]). This interference comes from various sources including, but not limited to, the circuit noise and the interference from extraneous sources, such as conductive electromagnetic interference (EMI-conductive) and radio frequency interference (RFI), intelligent (co-channel, adjacent-channel interference (ACI)) as well as non-intelligent (commercial electronic devices, powerlines, and platform (clocks, amplifiers, co-located transceivers)) sources, and self-interference (multipath). Such technogenic noise is typically non-Gaussian, and often impulsive (Slattery and Skinner [31], Chopra [7]).

Electrical noise is transmitted into a system through the galvanic (direct electrical contact), electrostatic coupling, electromagnetic induction, or RFI ways. An inappropriate electronic design or layout, or insufficient radio frequency (RF) shielding may drastically reduce system performance and lead to "unexplainable" or "random" system failures or an overall reduction in system performance. Design, layout, and shielding considerations may significantly increase the size, weight, bill of materials, and the cost of an electronic device or system.

A particular example of impulsive interference is electromagnetic interference (EMI), also called radio frequency interference (RFI). It is a widely recognized cause of reception problems in communications and navigation devices. EMI is a disturbance that affects an electrical circuit due to either conduction or radiation emitted from a source internal or external to the device. EMI may interrupt, obstruct, or otherwise degrade the effective performance of the device, and limit its link budget. The detrimental effects of EMI are broadly acknowledged in the industry and include: (i) reduced signal quality to the point of reception failure, (ii) increased bit errors which degrade the system and results in lower data rates and decreased reach, and (iii) increased power output of the transmitter, which increases its interference with nearby receivers and reduces the battery life of a device.

A major and rapidly growing source of EMI in communication and navigation receivers is other transmitters that are relatively close in frequency and/or distance to the receivers. Multiple transmitters and receivers are increasingly combined in single devices, which produces mutual interference. A typical example is a smartphone equipped with cellular, WiFi, Bluetooth, and GPS receivers, or a mobile WiFi hotspot containing an HSDPA and/or LTE receiver and a WiFi transmitter operating concurrently in close physical proximity. Other typical sources of strong EMI are on-board digital circuits, clocks, buses, and switching power supplies. This physical proximity, combined with a wide range of possible transmit and receive powers, creates a variety of challenging interference scenarios. Existing empirical evidence (Slattery and Skinner [31], Leferink et al. [15], Nikitin et al. [22]) and its theoretical support (Nikitin [23, 24]) show that such interference often manifests itself as impulsive noise, which in some instances may dominate over the thermal noise (Yang and Petropulu [33], Slattery and Skinner [31], Nikitin et al. [22]).

A particular source of impulsive noise in digital communication systems is interchannel interference (Nikitin [23, 24], Nikitin et al. [22]). For example, a strong close transmitter (e.g. WiFi) may noticeably interfere with a receiver of a weak signal (e.g. GPS) even when the separation of their frequency bands exceeds the respective nominal bandwidths of the channels by orders of magnitude. When time domain observations of such far-out-of-band interference are made at the receiver frequency, in a relatively wide bandwidth to avoid excessive broadening of the transients, this interference is likely to appear impulsive.

The amount of the interchannel out-of-band (OOB) interference depends on the strength of the antenna coupling (Nikitin et al. [22]). This coupling may be changed by the shape and the orientation of the antennas, shielding, and the distance between the antennas. Increasing the distance between the antennas generally contributes to the overall size of the device (e.g. smartphone), while shielding increases its weight, bill of materials, and its cost.

The OOB emissions may be partially mitigated by additional filtering. For example, one may apply additional high-order lowpass filtering to the modulating signal, or bandpass filtering to the modulated carrier, under the constraint that the bandwidth of those additional filters must be sufficiently large in comparison with the bandwidth of the pulse shaping filter in the modulator in order to not significantly affect the designed signal (Nikitin [23, 24]). These additional filters increase the circuit complexity, component count, size and cost, and decrease the reliability of the device.

The non-idealities in hardware implementation of designed modulation schemes such as the non-smooth behavior of the modulator around zero exacerbate the OOB emissions (Nikitin [23, 24], Nikitin et al. [22]). Thus, in order to keep these emissions at a low level, expensive high-quality components such as integrated circuit (IC) modulators and power amplifiers may be used, which increases the complexity and the cost of the components. The OOB emissions are also exacerbated by the coupling of other interfering signals from the adjacent circuitry (Nikitin et al. [22]), which imposes additional limitations on the layout, shielding, and the overall size and cost of the device, and limits the amount of space left for other components, e.g. a battery.

The impulsive noise problem also arises when devices based on the Ultra-wideband (UWB) technology interfere with narrowband communication systems such as WLAN (Mallipeddy and Kshetrimayum [16]) or CDMA-based cellular systems (Fischer [10]). A UWB device is seen by a narrowband receiver as a source of impulsive noise, which degrades the performance of the receiver and increases its power consumption (Fischer [10]).

As an example for wired communication systems, a major impairment for Digital Subscriber Line (DSL) technologies is impulse noise in the telephone lines (Dragomir et al. [9]). This noise limits the performance of a DSL system, and increases its cost and power consumption through the necessity to deploy various nonlinear impulsive noise reduction techniques.

As yet another example, capacitive touchscreens in modern smartphones are ubiquitous but prone to false and erratic response due to noise from the product in which they reside. Noise comes from both the internal DC/DC-converter subsystem and the display drivers. One of the steady current trends in the telecommunications industry is the push toward thinner phones with multi-touch displays. Achieving this goal means direct lamination of capacitive-touch sensors to the display, moving the sensor inside the display, and overcoming many other challenges with antennas and ground loading. It is no longer acceptable to just use a shield layer in the sensor structure to block display noise, as it adds too much cost and thickness. Also, charger noise physically couples into the sensor through the battery charger during the presence of touch. Its effects include degraded accuracy or linearity of touch, false or phantom touches, or even an unresponsive or erratic touchscreen (Carey [6]).

Other systems impeded by the impulsive noise and artifacts are various sensor systems, including active radar and all coherent imaging systems such as synthetic aperture radar (SAR) [30]. A common example is various medical imaging systems such as ultrasonic, which are generally affected by multiplicative shot (or speckle) noise. Typically, various methods of reduction of the speckle noise involve non-real-time adaptive and non-adaptive speckle filtering of the acquired images, or multi-look processing. In order to effectively filter the speckle noise, the imaging data bandwidth needs to be greatly increased. This leads to a "too much data" problem and to a dramatic increase in the computational load (e.g. increase in memory and DSP requirements).

Since the introduction of the micromachining process, wherein mechanical structures are etched from blocks of silicon, a number of microelectromechanical systems (MEMS) have been produced. This size reduction is attractive for many applications but, since the ratio of mechanical to thermal energy diminishes as the device mass is reduced, MEMS are susceptible to both internal and external (for example, acoustic) limiting noises, especially in harsh environments, which may often be non-Gaussian and impulsive (see Gabrielson [11], Mohd-Yasin et al. [17], for example).

Advances in digital VLSI technologies lead to wider use of the delta-sigma ($\Delta\Sigma$) modulation-based analog-to-digital converters (ADCs) as a cost effective alternative for high resolution (greater than 12 bits) converters, which can be ultimately integrated on digital signal processor ICs. However, due to high nonlinearity of the delta-sigma modulation, $\Delta\Sigma$ converters are highly susceptible to misbehavior when their input contains high-amplitude transients (impulse noise) (Ardalan and Paulos [3], Janssen and van Roermund [14]), which decreases the system performance. When such transients are present, larger size and more expensive converters may need to be used, increasing the overall size and cost of a device and its power consumption.

In audio applications, impulse (acoustic) noise includes unwanted, almost instantaneous (thus impulse-like) sharp sounds (like clicks and pops). Noises of this kind are usually caused by electromagnetic interference, scratches on the recording disks, and poor synchronization in digital recording and communication. High levels of such a noise (200+ Decibels) may damage internal organs, while 180 Decibels (e.g. high power gunshots at close distance) are enough to destroy or damage human ears.

An impulse noise filter may be used to enhance the quality of noisy signals, in order to achieve robustness in audio applications, pattern recognition, and adaptive control systems. A classic filter used to remove impulse noise is the median filter, at the expense of signal degradation due to nonlinear distortions introduced by such a filter. Thus it is quite common, in order to get better performing impulse noise filters, to use model-based systems that know the properties of the noise and source signal (in time or frequency), in order to remove only impulse obliterated samples. Such model-based systems are slow (not real-time), and hardware and computationally intensive (e.g. memory and DSP intensive). In addition, digital median filters themselves require memory and are computationally expensive, and thus increase cost, complexity, and power consumption of a system.

Switched-mode power supplies (SMPS) are used as replacements for the linear regulators when higher efficiency, smaller size or lighter weight are required. However, their switching currents cause impulsive noise problems (as both the emitted RFI and the electronic noise at the output terminals) if not carefully suppressed by adequate EMI filtering and RF shielding, which contributes to an increased size, weight, circuit complexity, and cost.

The current trend in SMPSs is toward smaller devices which necessitates higher frequency operation of the SMPS oscillator. Most configurations also allow the clock frequency to vary based on the output load characteristics, making the coupled noise impulsive and somewhat aperiodic. Most of the SMPSs now operate in the range from hundreds of kHz to a few MHz, placing the noise in the same frequency range where the power-supply rejection ratio (PSRR) of analog components reaches a minimum. This necessitates designers to increase the power bus filtering, which adds significant cost.

WirelessHART is a standard that defines a protocol stack that can employ any short range wireless technologies (WLAN, Bluetooth, ZigBee) at its physical layer. Many companies in the health, oil exploration and other sectors have adopted WirelessHART. Its use in electricity supply industry, however, is limited because reliable operation is at risk due to short, but intense, field transients extending into the RF and microwave spectrum during faults and/or switching events [4]. Electrical substations contain transformers, circuit breakers, isolators, cables, voltage regulators, and other equipment for control and protection. Both partial and full discharges may occur within, and across, any degraded insulation forming part of these components of a plant. These discharges generate rapid changes in current and thus lead to the radiation of electromagnetic noise typically consisting of a quasi-random train of short (nanosecond) impulses. Corona discharge is one form of partial discharge, which occurs when the potential gradient in the gas (usually air) around a charged object (which may or may not be a conductor) exceeds the breakdown threshold. Power system switching events and fault transients also give rise to the radiation of unwanted impulsive noise that may interfere with the reliability or performance of wireless receivers generally and wireless sensor networks (WSNs) in particular (Bhatti et al. [4]). Thus there is a need for effective impulsive noise mitigation to enable reliable operation of the devices such as ZigBee receivers in impulsive noise environments.

In any cable or power line communications, impulse noise is known to be the most difficult noise to filter (Guillet et al. [12]). In particular, non periodic asynchronous impulse noise is impossible to predict. To overcome this problem, the signal-to-noise ratio is generally improved by detecting and/or filtering the noise. This leads, however, to heavy detection and computing time in comparison with the disturbance duration, and contributes to the decreased performance and the increased size, weight, circuit complexity, and cost.

Interference mitigation methods may be classified as either static methods (e.g. layout and shielding, spectrum allocation) that avoid interference through device design or network planning, or as active digital methods (e.g. controlling/managing protocols such as multiple access protocols, interference alignment and/or cancellation, or statistical mitigation) that estimate and cancel interference during data transmission (Chopra [7]). All these methods contribute to the decreased performance and the increased power consumption, size, weight, circuit complexity, and cost.

Most state-of-the-art analog mitigation methods of EMI focus on reducing the interference before it reaches the receiver (e.g. through shielding, physical separation to reduce coupling, and other layout techniques), and none of these methods allows effective EMI filtering once it has entered the receiver chain. After the interference has entered the signal path, only computationally and silicon intensive nonlinear, non-real-time digital signal processing solutions are offered.

Since a signal of interest typically occupies a different and/or narrower frequency range than the noise, linear filters are applied to the incoming mixture of the signal and the noise in order to reduce the frequency range of the mixture to that of the signal. This reduces the power of the interference to a fraction of the total, limited to the frequency range of the signal.

However, the noise having the same frequency power spectrum may have various peakedness (for example, as measured by excess kurtosis; see Section 13.2.1 of this disclosure for a discussion of measures of peakedness), and be impulsive or non-impulsive. For example, white shot noise is much more impulsive than white thermal noise, while both have identically flat power spectra. Linear filtering in the frequency domain does not discriminate between impulsive and non-impulsive noise contributions, and does not allow mitigation of the impulsive noise relative to the non-impulsive. In addition, reduction in the bandwidth of an initially impulsive noise by linear filtering typically reduces the peakedness and makes the noise less impulsive (more 'Gaussian-like'), decreasing the ability to separate the signal from the noise based on the peakedness.

Effective suppression of impulsive interferences in the signal path typically requires nonlinear means, for example, processing based on order statistics. These means may be employed either through digital signal processing, or in the analog signal chain. The nonlinear filters in the analog signal chain may range from simple slew rate limiting filters to more sophisticated analog rank filters described, for example, in U.S. Pat. Nos. 7,133,568 and 7,242,808 (Nikitin and Davidchack [21]), and U.S. Pat. Nos. 7,107,306, 7,418,469, and 7,617,270 (Nikitin [18]).

However, the practical use of nonlinear filters is limited as it typically results in complicated design considerations and in multiple detrimental effects on normal signal flow (signal degradation). These filters may cause various nonlinear distortions and excessive attenuation of the signal, and their effect on the useful signal components is typically unpredictable and depends on the type and magnitude of the interfering signal.

The invention described by Nikitin [19] overcomes some of the limitations of the prior art by introducing a new family of filters (referred to as 'SPART', and, in particular, 'FrankenSPART' filters) which behave nonlinearly only during the occurrence of relatively high power disturbances, and maintain linear behavior otherwise. When an interference contains an impulsive component, SPART filters have the ability to improve the signal-to-noise ratio even if the spectral density of the noise lies entirely within the passband of the signal. They also do so without the traditional limitations of "clamping"-type limiters, such as slow recovery from saturation, phase reversal, and generation of excessive harmonics.

A FrankenSPART filter obtains the time derivative of the output as the difference between the input signal and a feedback of the output signal, then produces the output by comprising the following steps: (i) applying a comparator to confine said derivative to a certain range, (ii) linearly transforming the output of the comparator to introduce the slew rate and quantile parameters, and (iii) integrating said linearly transformed output of the comparator.

There are several significant limitations of the SPART filter family based on the FrankenSPART filtering method. These limitations relate to their implementations, configurability, performance, and applicability.

The implementations of the SPART filters rely on the use of comparators, since applying a comparator function is a required step in the SPART filtering method. A required step of applying a comparator complicates the topology and configurability of the SPART filters. Comparators (including clamping amplifiers) also suffer from a number of limitations that preclude their use in precision circuits, specifically large offsets, overdrive requirements, and response time limits. Practical implementation of comparators for the SPART filters may be complicated and expensive, as their range needs to be well defined and controlled, and this range is coupled to the subsequent linear transformation of the comparator output. In addition, the comparator functions are not defined for complex-valued and multidimensional vector signals by Nikitin [19], which limits the applicability of the SPART filters in complex-valued and multidimensional signal processing.

The required linear transformation step of the SPART filters is necessary for its configurability. While implementing a gain (and a level shift) is a relatively simple task, in the SPART filters the gain of the linear transformation stage is coupled with the range of the comparator. Most filtering tasks may require that the time parameter of a SPART filter remains constant, while its slew rate parameter is adjusted. In order to maintain a constant time parameter, both the gain of the linear transformation stage and the range of the comparator in a SPART filter need to be simultaneously and proportionally changed. This complicates the topology and configurability of the SPART filters and limits their dynamic range.

While the required explicit integration step in the SPART filters is a well-known task, constructing an explicit integrator introduces a limiting complication in the design and implementation. As a total, the need for the three explicit stages in a SPART filter increases the complexity, noise, and the component count of the circuit, while limiting its frequency performance (as a consequence of additional delays and frequency limitations of the stages) and its dynamic range.

In its linear regime, a FrankenSPART filter is identical to an RC integrator, that is, to a 1st order lowpass filter, where the time constant of the latter is equal to the time parameter of the FrankenSPART. A 1st order filter does not provide a selective frequency response needed for many applications. Thus, for example, in order to use a FrankenSPART filter in a communication channel, its time parameter needs to be sufficiently small so it does not significantly affect the baseband signal (see, for example, Nikitin [24]). A small time parameter degrades both the FrankenSPART circuit performance and its ability to effectively mitigate the impulsive noise.

When the interference affecting the signal of interest is impulsive, the prior art typically views this as a problem presenting an additional challenge rather then an opportunity to increase the overall effectiveness of the mitigation of the interference. Thus the prior art does not offer interference reduction methods that intentionally increase the impulsiveness of the interference in order to increase the effectiveness of its mitigation. This constitutes yet another common limitation of the typical prior art methods outlined in this section.

SUMMARY

The present invention overcomes the shortcomings of the prior art through the introduction of the novel filter family, Nonlinear Differential Limiters (NDL), which are applicable to real as well as complex-valued and multidimensional vector signals. NDLs implement nonlinear signal processing functions in a way substantially distinct from the prior art, and offer new functionality, simplicity, configurability, and universality not achievable in the prior art. In addition, the novel NDL-based filtering method and apparatus enable improvements in the overall properties of electronic devices including, but not limited to, improvements in performance, reduction in size, weight, cost, and power consumption, and, in particular for wireless devices, improvements in spectrum usage efficiency.

A basic NDL may be viewed as an analog feedback circuit having the following behavior: When the magnitude of a difference between the input and the output ('the difference signal') is small (in particular, in comparison with some internal standard such as thermal voltage, or with an explicitly supplied resolution parameter), the NDL behaves as a linear lowpass filter of a certain order, characterized by a set of parameters (coefficients). The parameters, or coefficients, of an NDL may be defined as the parameters/coefficients of the corresponding linear lowpass filter. For example, these parameters may be specified as the locations of the poles in the S-plane, and these locations themselves may, in turn, be given by the cutoff frequencies and the quality factors of the poles. For larger absolute values of the difference signal, the NDL parameters (coefficients) are dynamically modified in a manner that limits the output of the NDL in comparison with the respective linear filter.

As described further in this disclosure, a typical configuration of an NDL defines these parameters as functions of the magnitude of the difference signal, and, in particular, as functions of this magnitude in relation to the resolution parameter. For example, if the filter parameters are specified as the locations of the poles in the S-plane, than the NDL output may be limited by moving some of these poles closer to the origin (thus reducing the cutoff frequencies of the poles), or moving the poles closer to the real axis (thus decreasing the quality factors of the poles).

A bandwidth of a lowpass filter may be defined as an integral over all frequencies (from zero to infinity) of a product of the frequency with the filter frequency response, divided by an integral of the filter frequency response over all frequencies. Then, for a lowpass filter, the reduction of the cutoff frequency and/or the reduction of the pole quality factor both result in the reduction of the filter bandwidth, as the latter is a monotonically increasing function of the cutoff frequency, and a monotonically increasing function of the pole quality factor. Thus an NDL may be defined in terms of the behavior of its bandwidth expressed through the filter parameters, as schematically illustrated in FIG. 1.

As shown in FIG. 1, when the magnitude of the difference signal is sufficiently small, an NDL behaves as a linear lowpass filter of a certain order, characterized by a set of parameters leading to a particular bandwidth. These parameters are such functions of the magnitude of the difference signal that the resulting bandwidth is a nonincreasing function of this magnitude when the latter takes larger values.

"For sufficiently small $|z|$" may be understood in its typical meaning that there exists such $\epsilon > 0$ that a specified condition is met for $|z| \leq \epsilon$, for example, $B(|z|) = B_0$ for $|z| \leq \epsilon$ in FIG. 1. Likewise, "for sufficiently large x" may mean that there exists such a that a specified effect or condition is true for $x \geq a$.

FIG. 2 provides a representative example of several functional dependencies of a bandwidth of an NDL filter on the magnitude of the difference signal. In this example, the bandwidth as a function of |z| is given by the following equation:

$$B(|z|) = B_0 \times \{(a|z|^\gamma)^b + \exp[-(a|z|^\gamma)^b]\}^{-\frac{1}{b}}, \quad (1)$$

where a, b, and γ are positive parameters, and $B_0$ is the initial bandwidth.

When b→∞ in equation (1), B (|z|) remains constant and equal to $B_0$ as long as $|z| \leq a^{-1/\gamma}$. Then the quantity $a^{-1/\gamma}$ may be defined as a resolution parameter α, $\alpha = a^{-1/\gamma}$. As may be seen in FIG. 2, when the parameter b is large (e.g. b=10 in FIG. 2), the bandwidth remains approximately constant for $|z| < a^{-1/\gamma}$.

In FIG. 3, an NDL is further characterized by a resolution parameter α so that "sufficiently small" translates into "sufficiently small in comparison with the resolution parameter" (for example, into "smaller than the resolution parameter").

The response of any NDL approaches that of a corresponding linear lowpass filter in the limit of a large resolution parameter, and thus, given a proper linear lowpass filter and a sufficiently large resolution parameter, an NDL replacing the linear filter in a device does not degrade the performance of the device, regardless of the noise composition. If an NDL circuit with a proper set of coefficients is deployed sufficiently early in the signal chain of a channel in a communication receiver or a data acquisition system affected by non-Gaussian impulsive noise, it may be shown that there exists such resolution parameter that maximizes signal-to-noise ratio and improves the quality of the channel.

Here and thereafter "proper" and/or "properly" may be understood in a context of satisfying certain conditions and/or requirements. For example, "a proper linear lowpass filter" in the previous paragraph may mean that the linear lowpass filter is appropriate for adequate performance of the device, and is not just any arbitrary linear lowpass filter.

More generally, given an electronic device comprising a plurality of signal paths through which various signals (e.g. input, feedback, control, and output signals) propagate, and characterized by various properties (such as, for example, size, dimensions, form factor, weight, bill of materials, total cost, cost of components, cost of materials, performance specifications, power consumption, battery size, circuit complexity, component count, reliability, and other properties and their combinations), deployment of an NDL in a signal path improves properties of the device. These improvements may include, for example, reduction in size, reduction of dimensions, reduction in form factor, reduction in weight, reduction in bill of materials, reduction of total cost, reduction in cost of components, reduction in cost of materials, increase in performance specifications, reduction of power consumption, increase of battery size, reduction in circuit complexity, reduction in component count, increase in reliability, and/or other improvements and their combinations.

If a device additionally includes an electronic lowpass filter, the improvement in properties of the device may also be achieved by replacing this lowpass filter by a corresponding NDL (that is, by an NDL with the set of parameters equal to those of the linear filter in the limit of small resolution parameter).

In addition to lowpass filters, any arbitrary linear filters (including highpass, bandpass, allpass, bandreject, etc.) may be converted into NDL-based filters to achieve improvement in properties of an electronic device utilizing such filters.

Even though an NDL is an analog filter, it may be implemented digitally, for example, in field-programmable gate arrays (FPGA) or software. A digital NDL requires little memory and typically is inexpensive computationally, which makes it suitable for real-time implementations.

Further scope and the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

BRIEF DESCRIPTION OF FIGURES

FIG. 4. Simplified block diagram of a 1st order nonlinear differential limiter method and/or circuit according to equation (7).

FIG. 6. Simplified block diagram of a 1st order nonlinear differential limiter method and/or circuit with specified resolution parameter according to equation (10).

FIG. 23. Comparison, for a real weak-sense stationary random input signal, of the outputs of small-α DcLs and the median filters with appropriate rectangular moving windows, for larger (upper panel) and 10 times smaller (lower panel) values of the resolution parameter.

for a Gaussian input signal (thermal noise).

FIG. 30. Simulated example of a real time test of normality according to equations (31) and (35), with $$\tilde{q} = \frac{1}{2},$$

for a non-Gaussian input signal (mixture of thermal noise and asymmetric impulsive noise).

FIG. 31. Illustrative block diagrams of adaptive (real- and/or complex-valued) NDLs (ANDLs).

FIG. 32. Illustrative block diagrams of adaptive (real- and/or complex-valued) NDLs (ANDLs) using the internally available absolute value of the difference signal.

Figure 33:
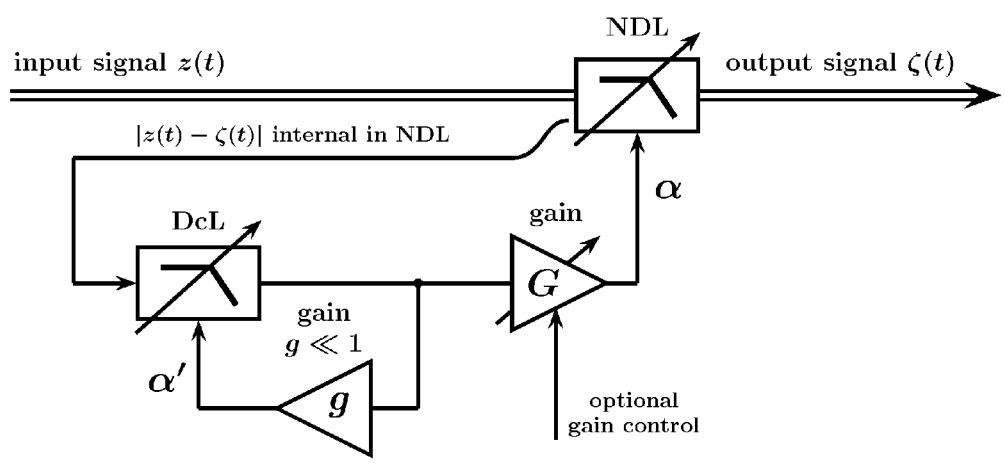

FIG. 33. Illustrative block diagram of an adaptive NDL (ANDL) using a small-α DcL operating on the absolute value of the difference signal to automatically adjust the value of the resolution parameter.

Figure 34:
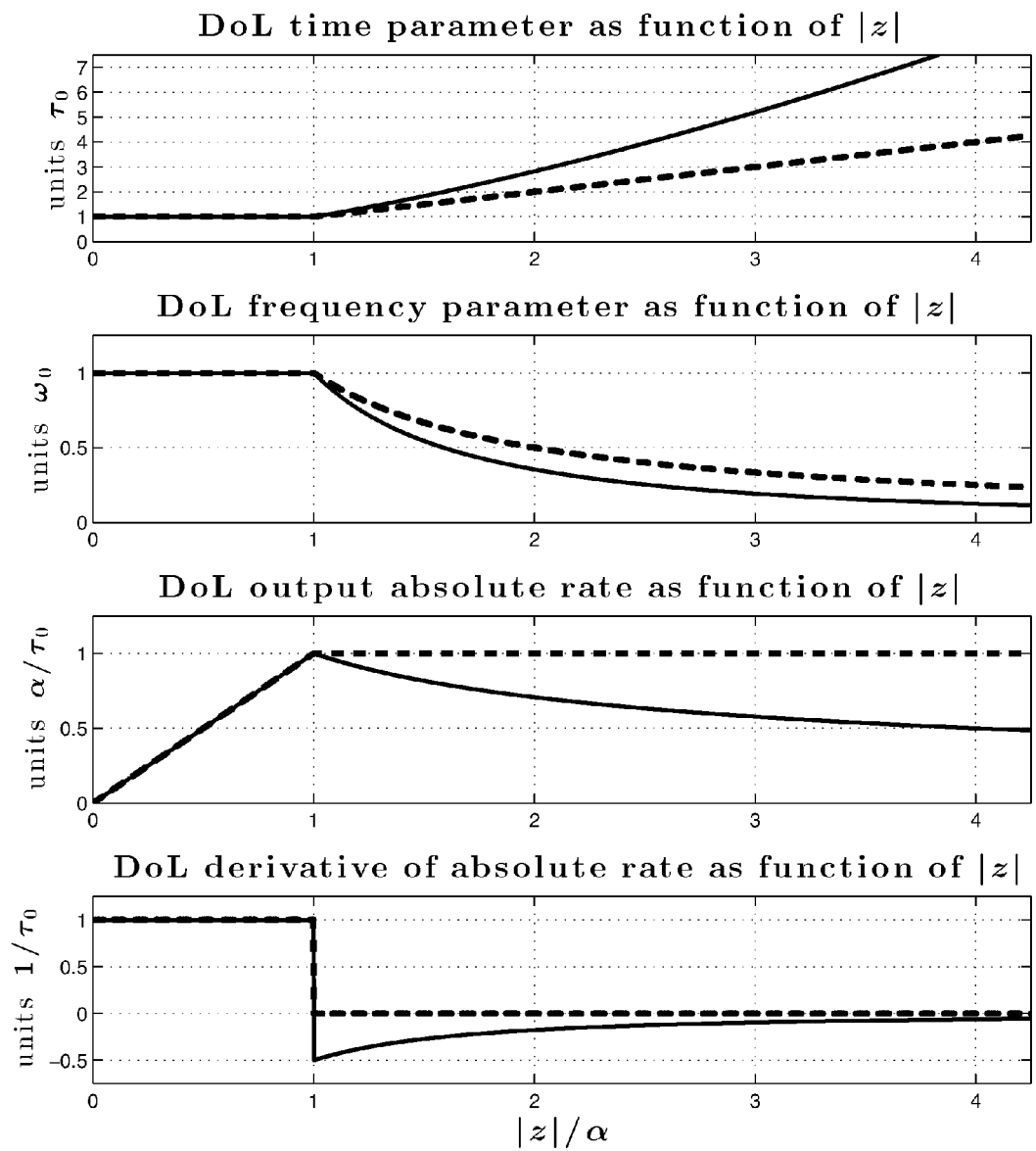

FIG. 34. Particular example (β=½ in equation (38)) of time and frequency parameters, and the output absolute rate of change and its derivative, as functions of the absolute value of the difference signal for a 1st order differential over-limiter. For comparison, the corresponding functions for the canonical differential limiter are shown by the dashed lines.

Figure 35:
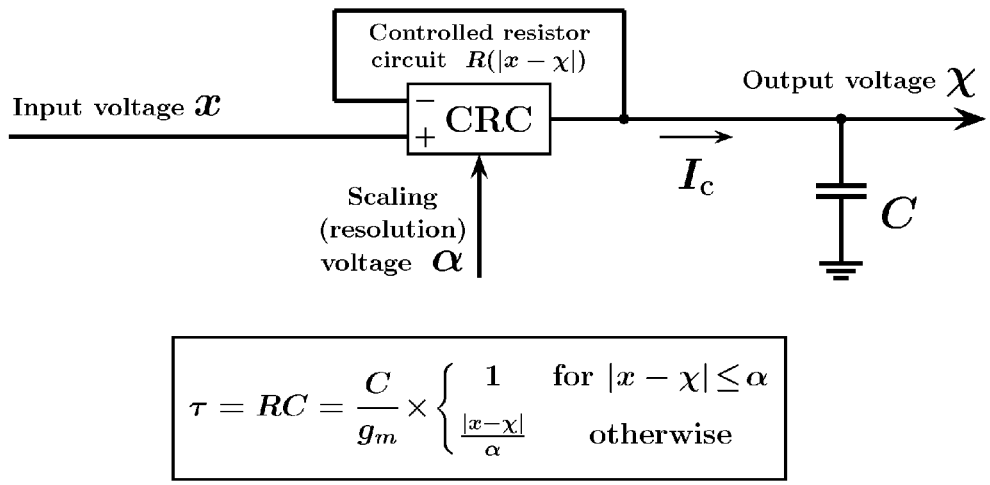

FIG. 35. Generalized block diagram of an 'RC' implementation of a 1st order CDL.

Figure 36:
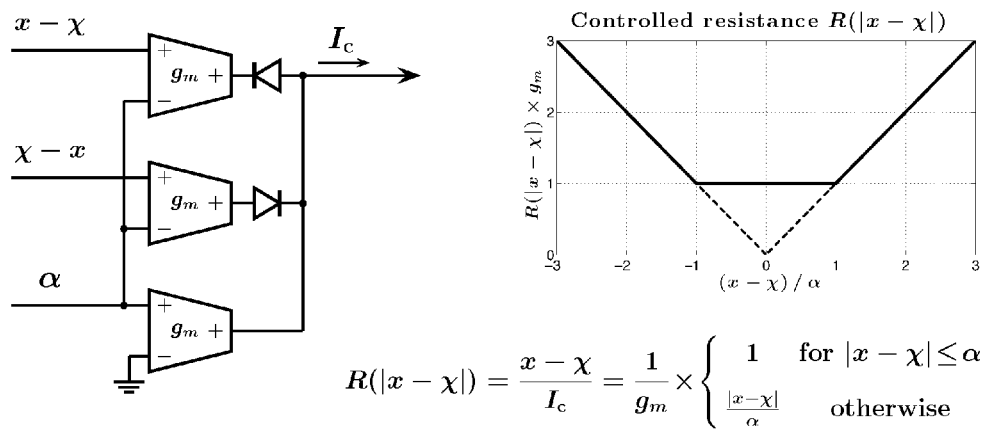

FIG. 36. Controlled resistor circuit for the CDL shown in FIG. 35.

Figure 37:
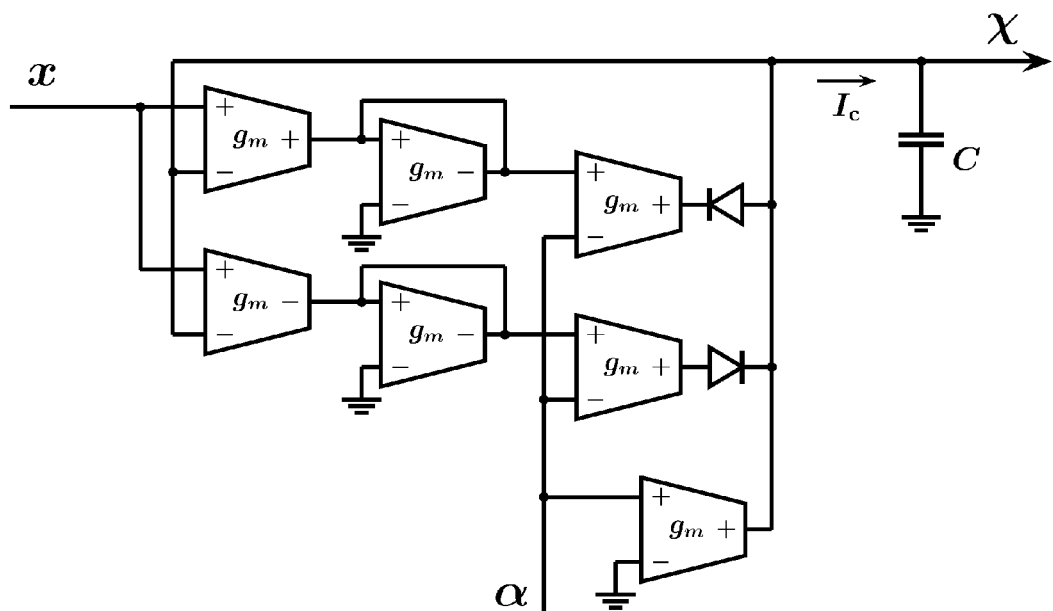

FIG. 37. Conceptual schematic for the CDL shown in FIG. 35.

Figure 38:
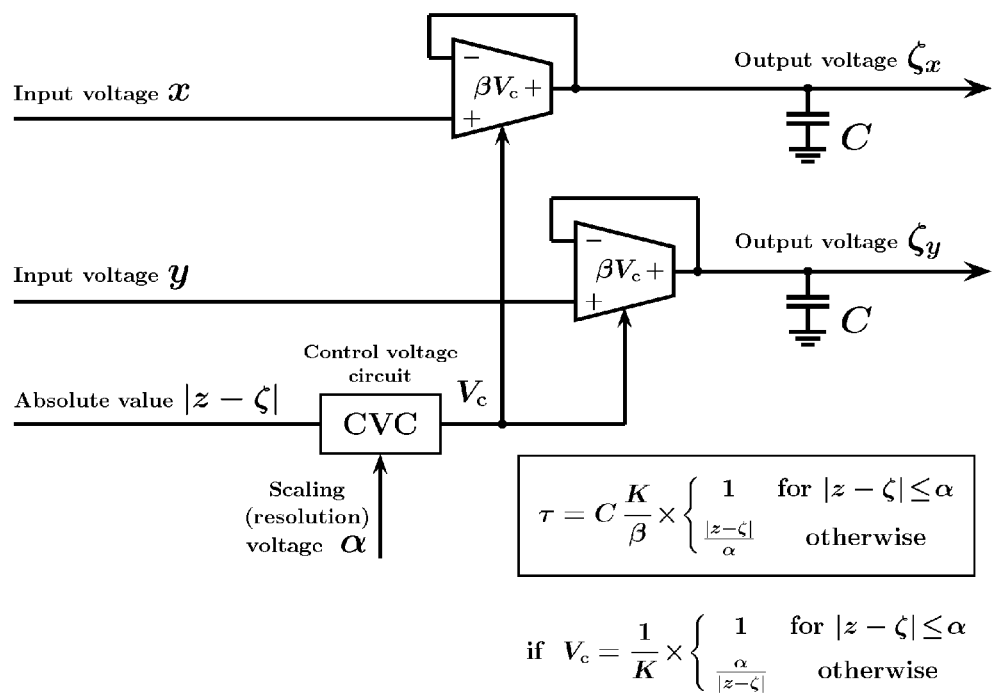

FIG. 38. Generalized block diagram of an 'RC' implementation of a 1st order complex-valued CDL.

Figure 39:
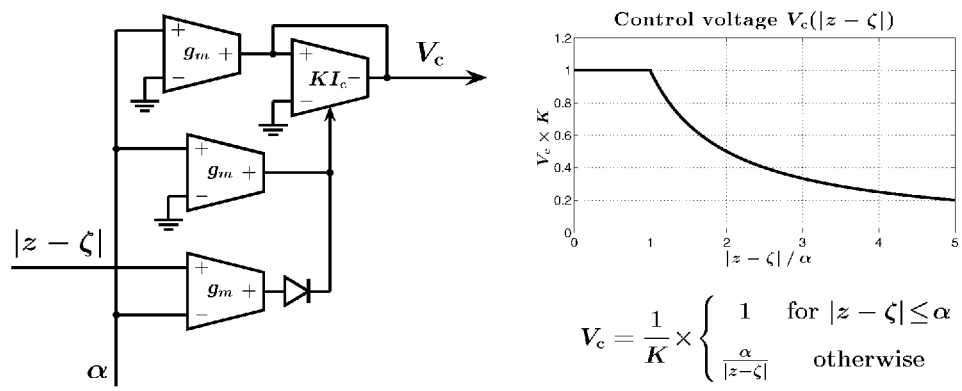

FIG. 39. Control voltage circuit for the complex-valued CDL shown in FIG. 38.

Figure 40:
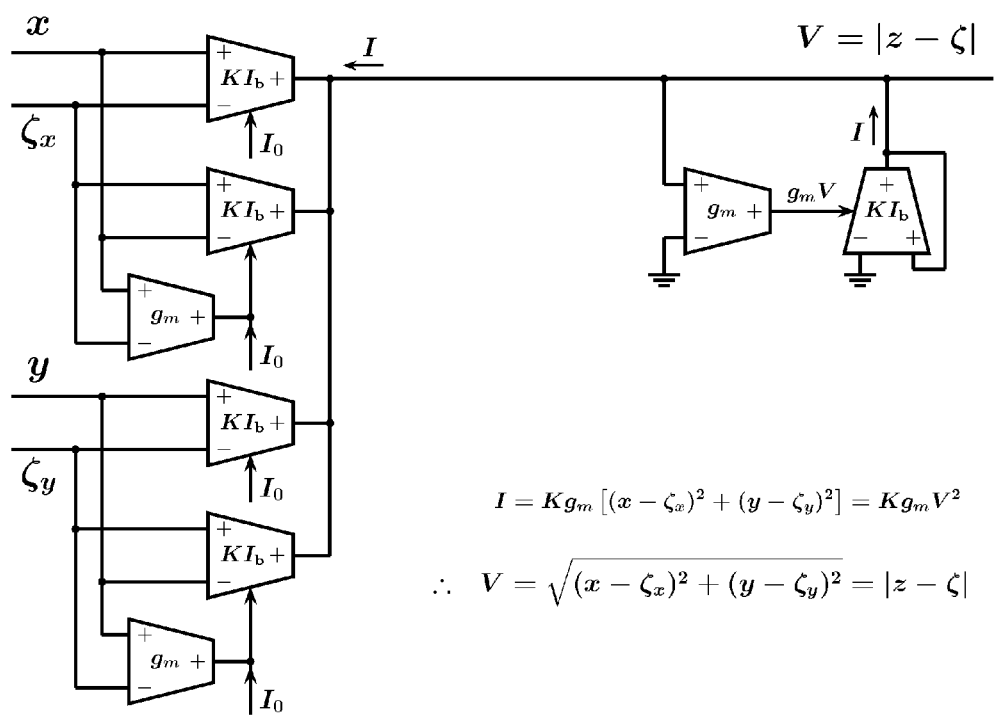

FIG. 40. Absolute value circuit for obtaining the magnitude of the complex difference signal used in the control voltage circuit of FIG. 39.

Figure 41:
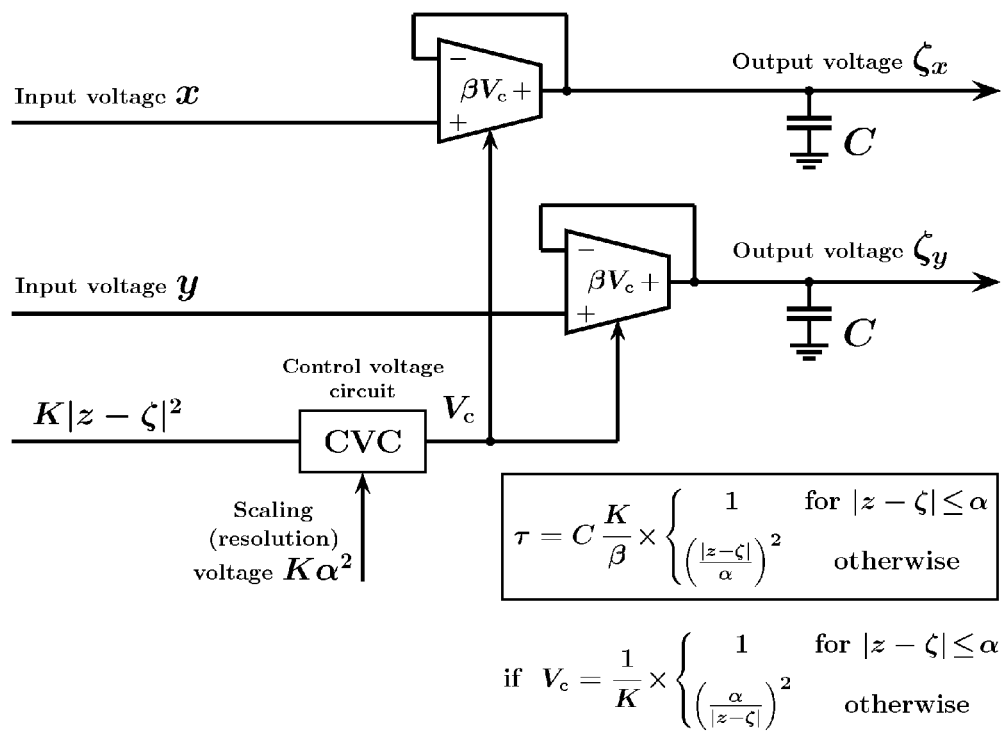

FIG. 41. Generalized block diagram of an 'RC' implementation of a particular 1st order complex-valued DoL.

Figure 42:
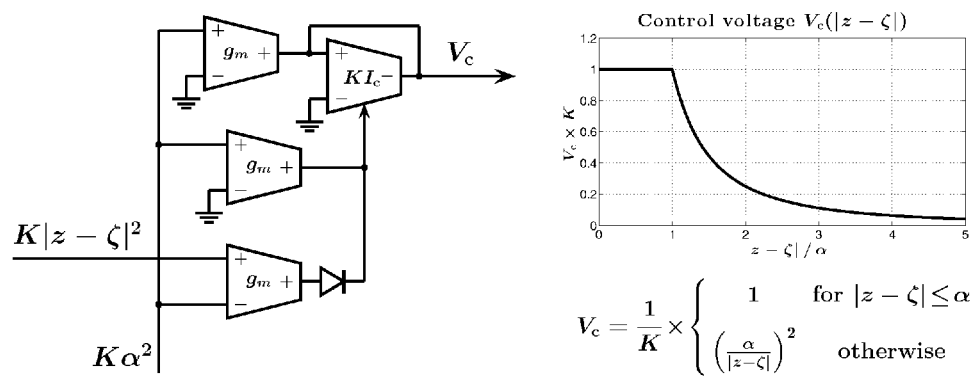

FIG. 42. Control voltage circuit for the complex-valued DoL shown in FIG. 41.

Figure 43:
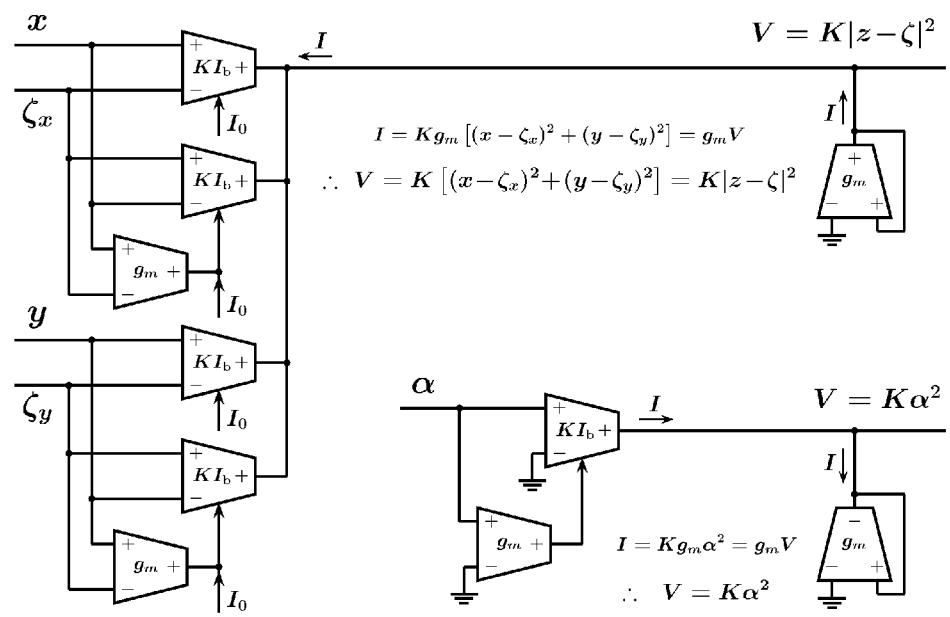

FIG. 43. Squaring circuits for obtaining the signals used in the control voltage circuit of FIG. 42.

Figure 44:
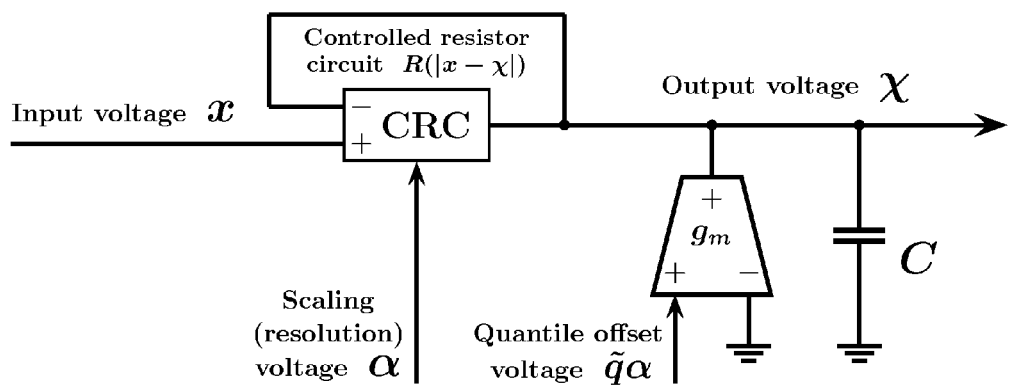

FIG. 44. Generalized block diagram of an 'RC' implementation of a 1st order CDL with quantile offset.

Figure 45:
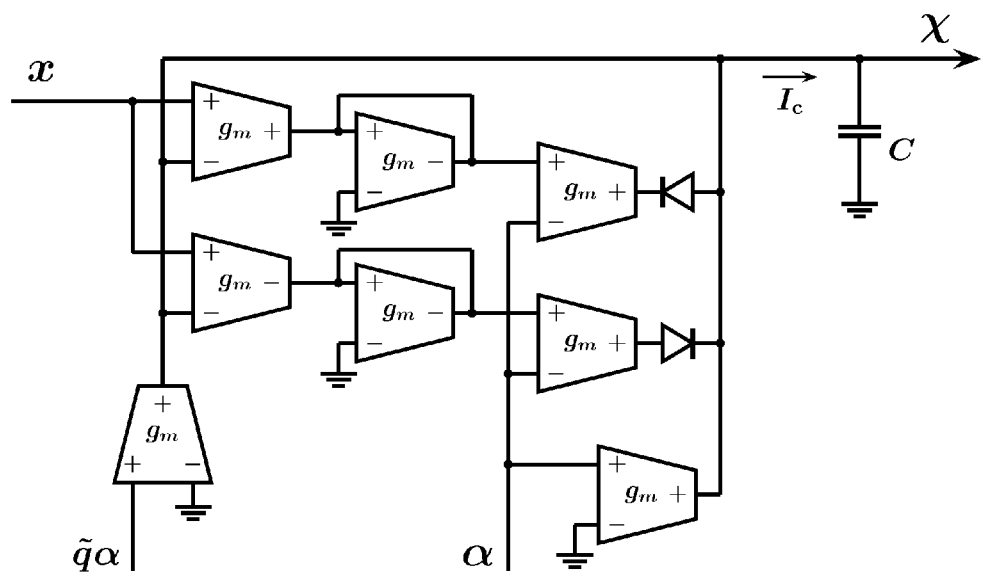

FIG. 45. Conceptual schematic for the CDL with quantile offset shown in FIG. 44.

Figure 46:
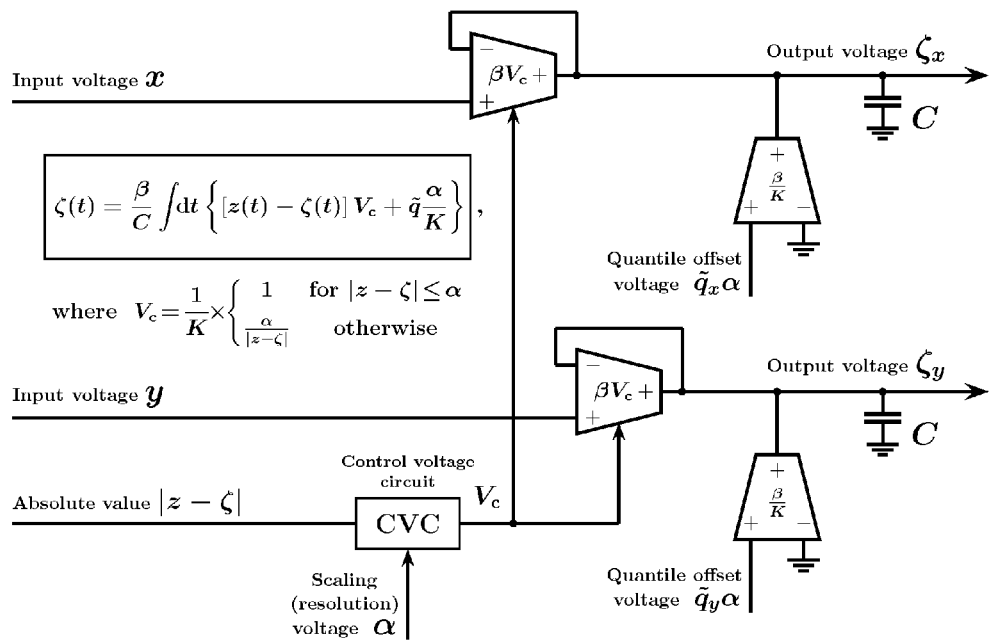

FIG. 46. Generalized block diagram of an 'RC' implementation of a 1st order complex-valued CDL with quantile offset.

Figure 47:
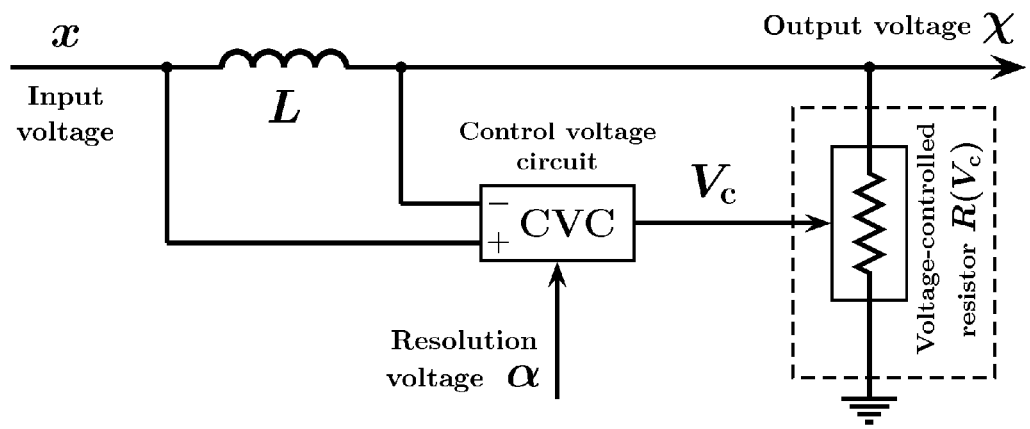

FIG. 47. Generalized block diagram of an 'LR' implementation of a 1st order CDL with the control of the resistive element.

Figure 48:
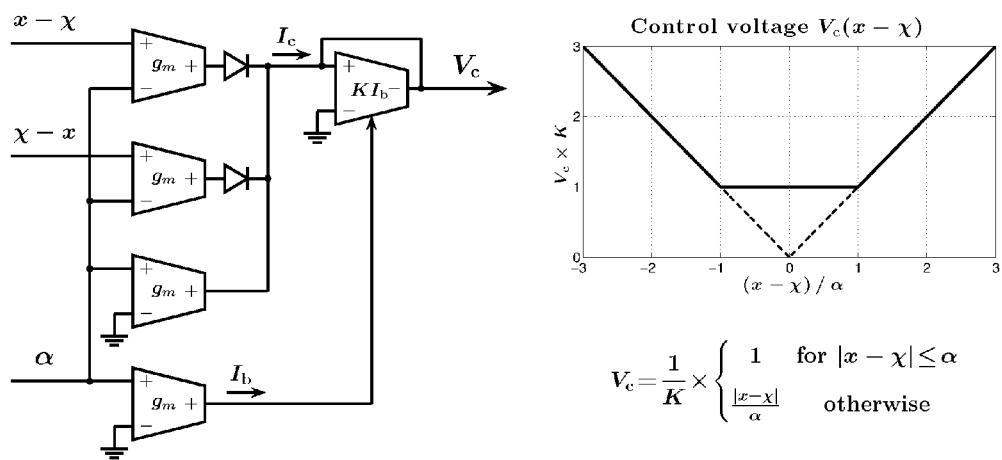

FIG. 48. OTA-based example of a control voltage circuit for the 'LR' CDL shown in FIG. 47.

Figure 49:
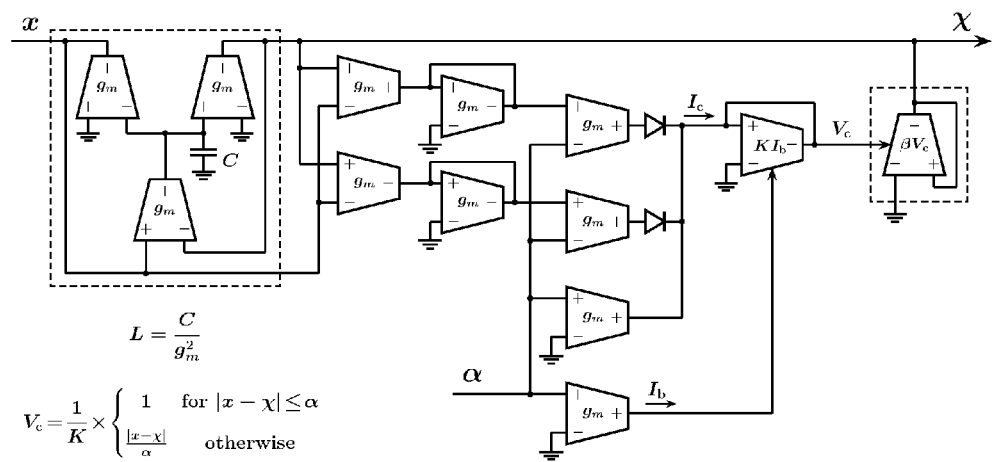

FIG. 49. Conceptual schematic for the 'LR' CDL outlined in FIG. 47.

Figure 50:
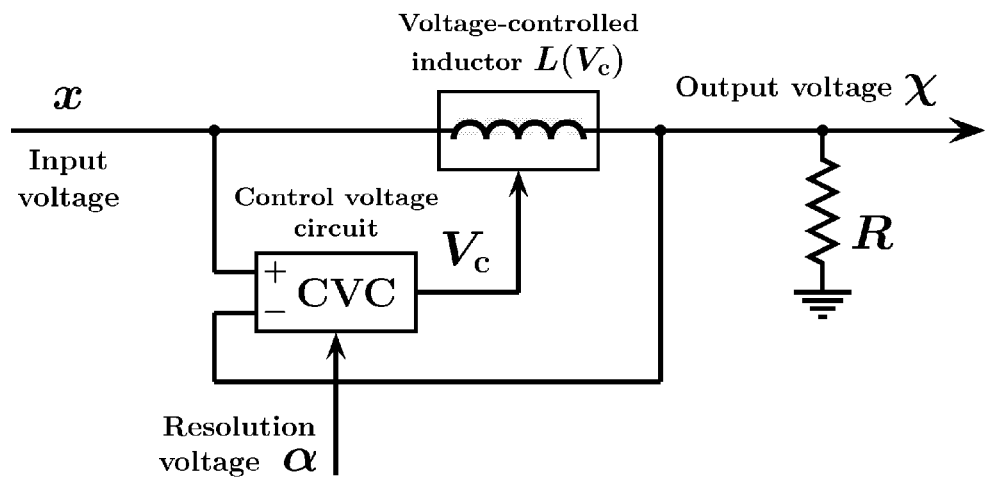

FIG. 50. Generalized block diagram of an 'LR' implementation of a 1st order CDL with the control of the reactive element.

Figure 51:
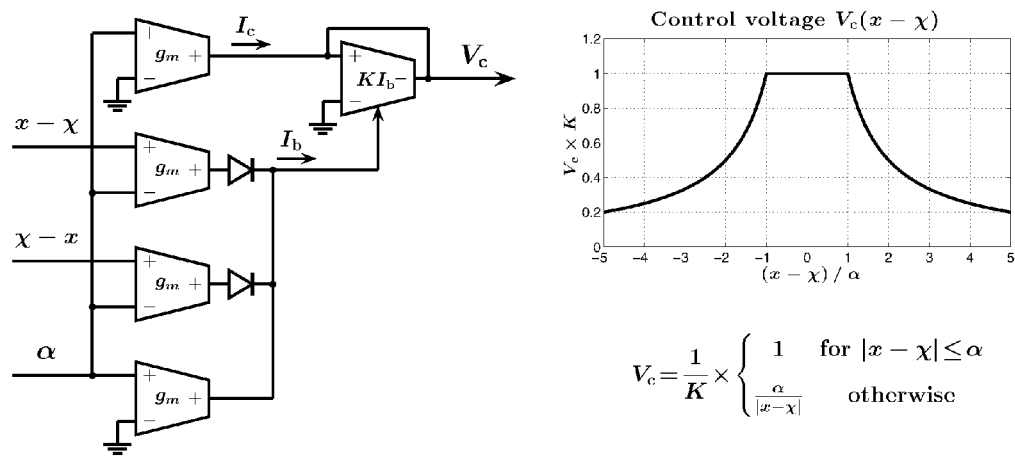

FIG. 51. OTA-based example of a control voltage circuit for the 'LR' CDL shown in FIG. 50.

Figure 52:
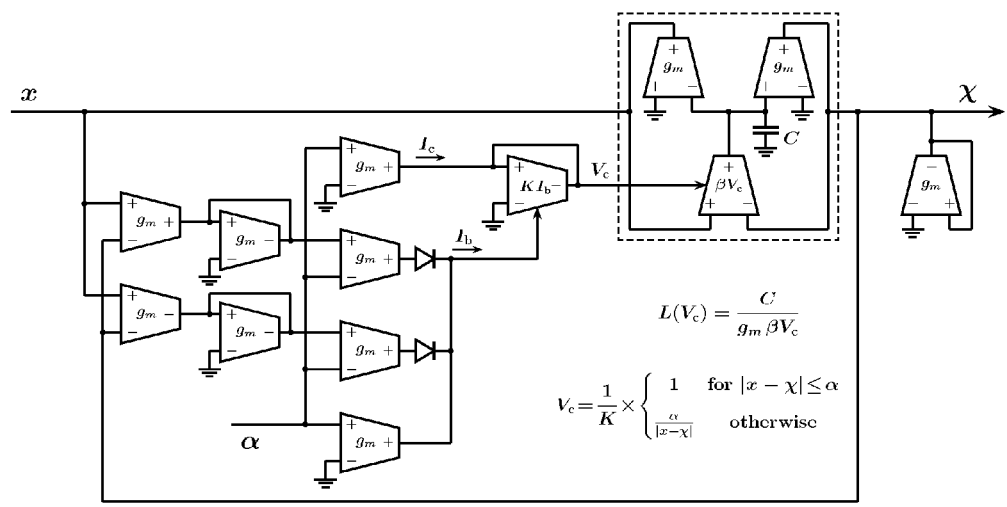

FIG. 52. Conceptual schematic for the 'LR' CDL outlined in FIG. 50.

Figure 53:
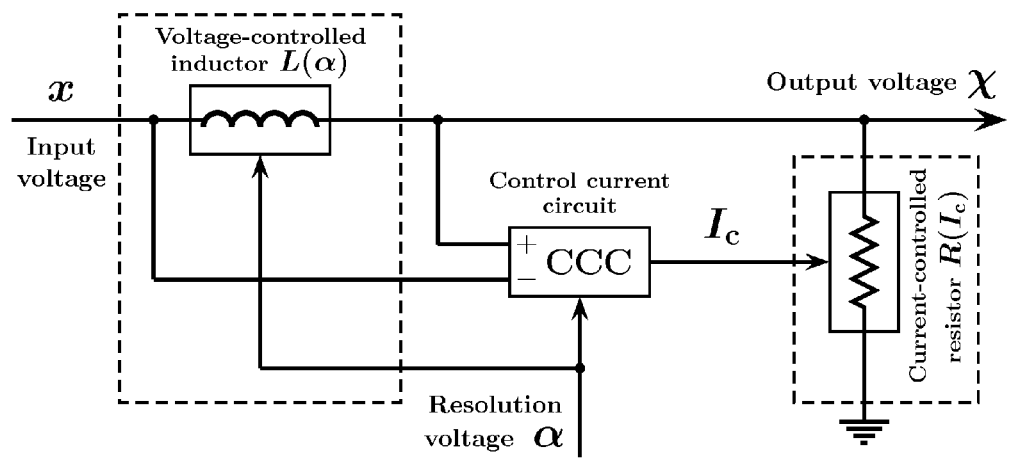

FIG. 53. Generalized block diagram of an 'LR' implementation of a 1st order CDL with the control of both resistive and reactive elements.

Figure 54:
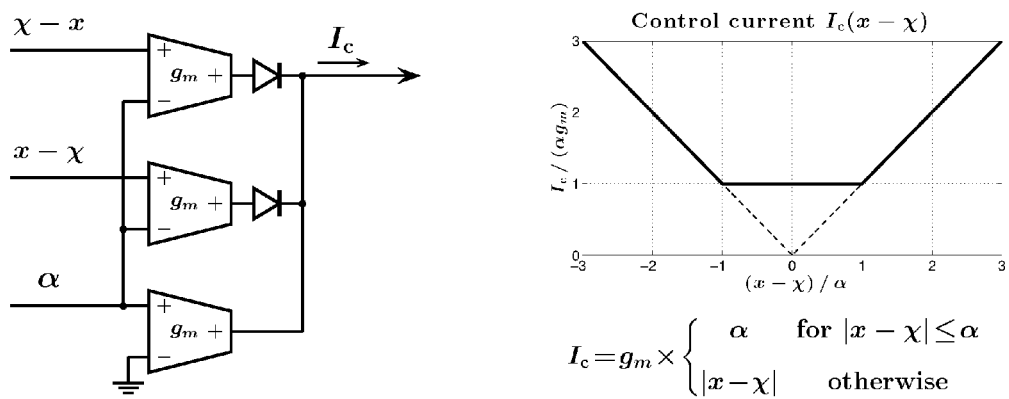

FIG. 54. OTA-based example of a control current circuit for the 'LR' CDL shown in FIG. 53.

Figure 55:
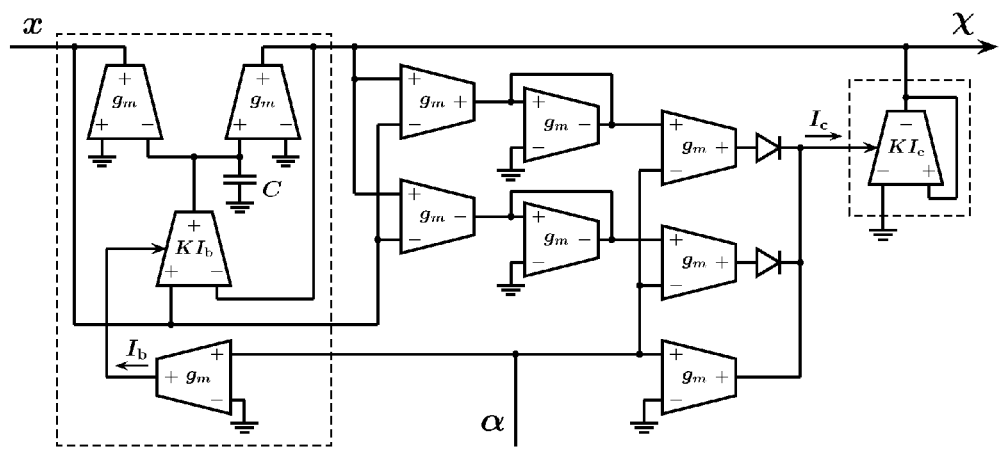

FIG. 55. Conceptual schematic for the 'LR' CDL outlined in FIG. 53.

Figure 56:
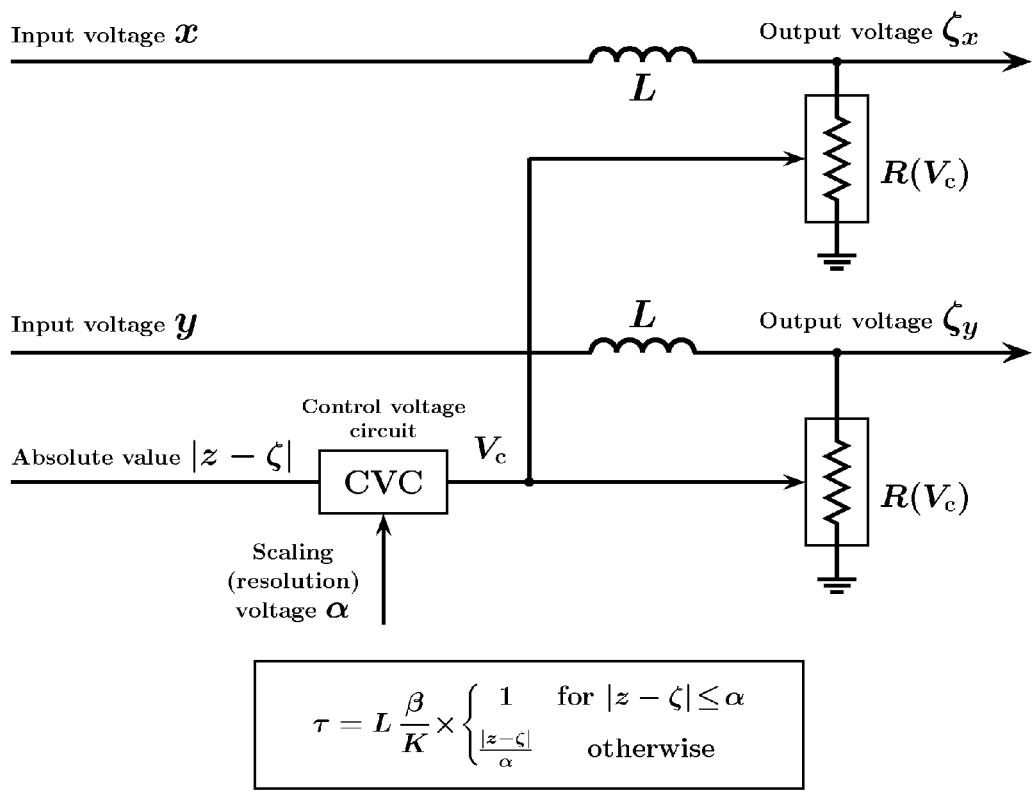

FIG. 56. Generalized block diagram of an 'LR' implementation of a 1st order complex-valued CDL with the control of the resistive elements.

Figure 57:
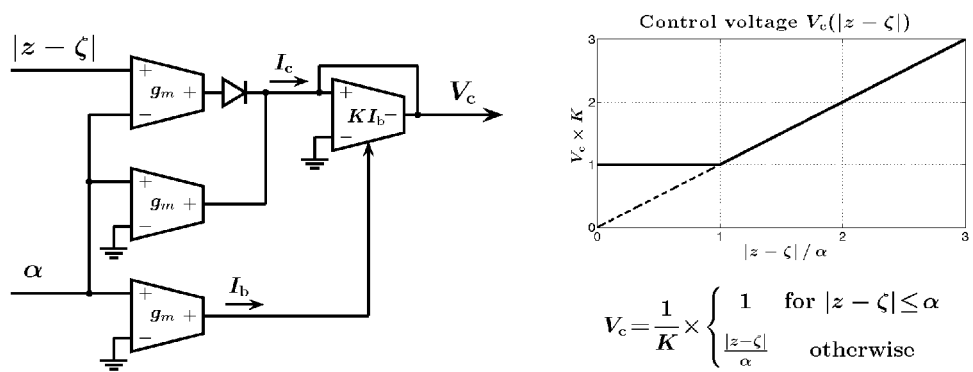

FIG. 57. Control voltage circuit for the complex-valued DoL shown in FIG. 56.

Figure 58:
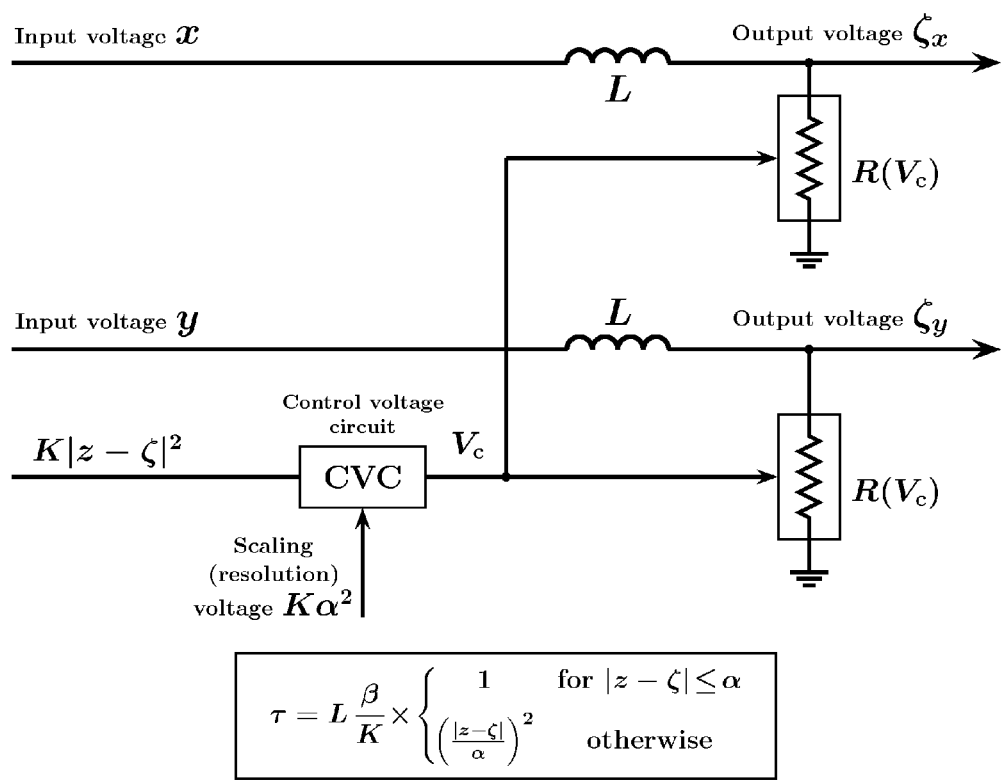

FIG. 58. Generalized block diagram of an 'LR' implementation of a particular 1st order complex-valued DoL with the control of the resistive elements.

Figure 59:
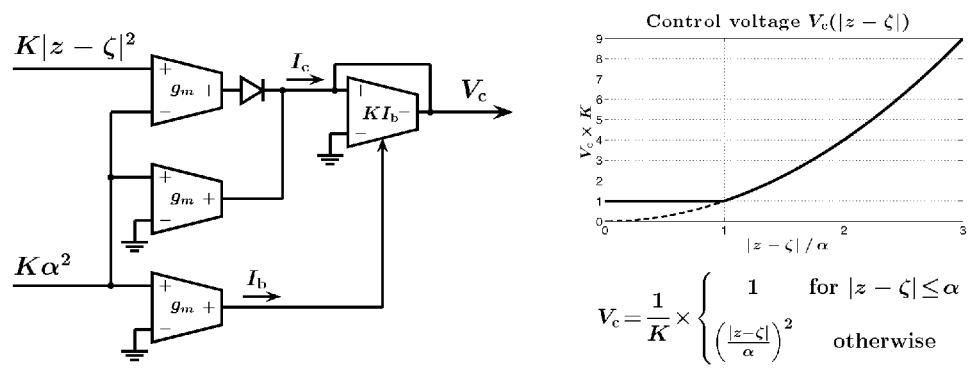

FIG. 59. Control voltage circuit for the complex-valued DoL shown in FIG. 58.

Figure 60:
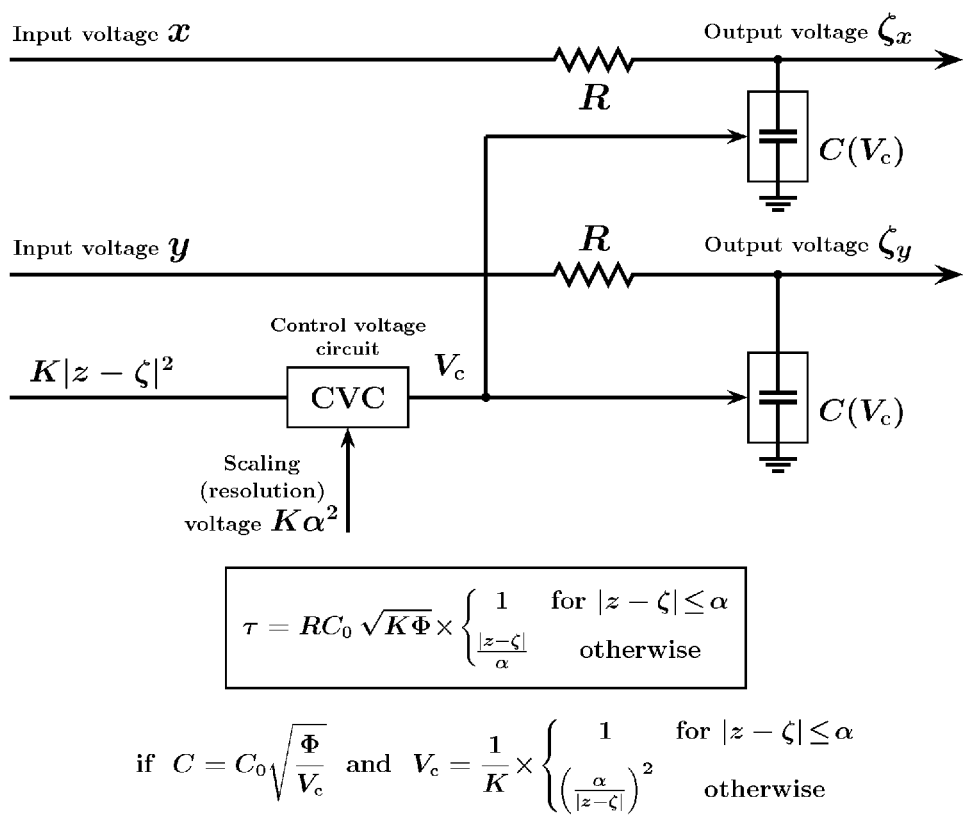

FIG. 60. Generalized block diagram of an 'RC' implementation of a 1st order complex-valued CDL with the control of the reactive elements (capacitors).

Figure 61:
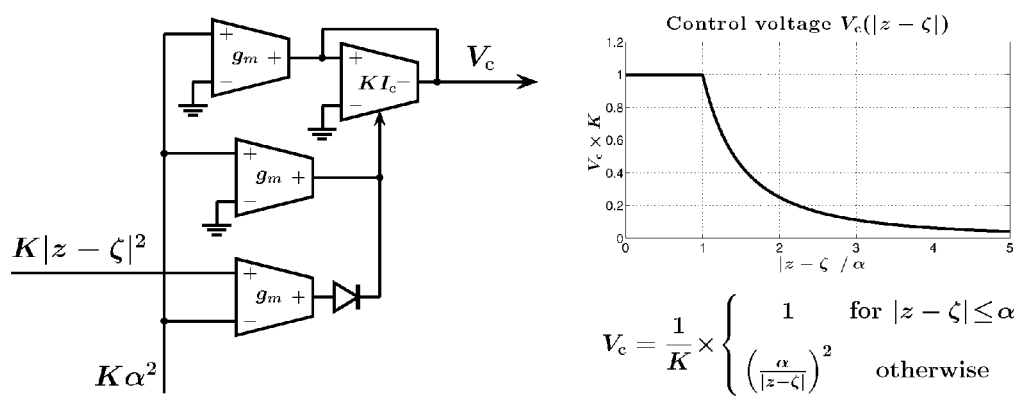

FIG. 61. Control voltage circuit for the complex-valued DoL shown in FIG. 60.

Figure 62:
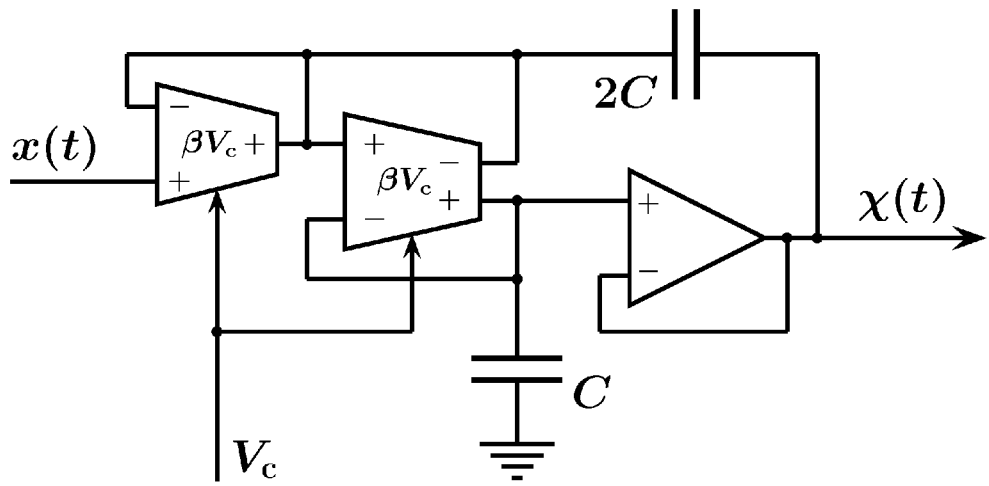

FIG. 62. OTA-based example of implementation of 2nd order constant-Q ($Q=1/\sqrt{2}$) CDL.

Figure 63:
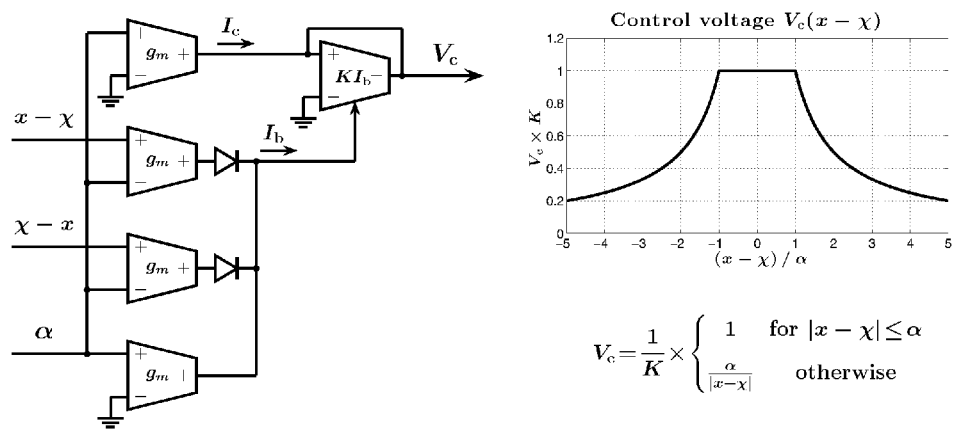

FIG. 63. Control voltage circuit for the 2nd order CDL shown in FIG. 62.

FIG. 64. Example of odd order NDL-based lowpass filter comprising 1st order NDL.

FIG. 65. Example of odd order NDL-based lowpass filter comprising 3rd order NDL.

FIG. 66. Example of even order NDL-based lowpass filter comprising 2nd order NDL.

Figure 67:
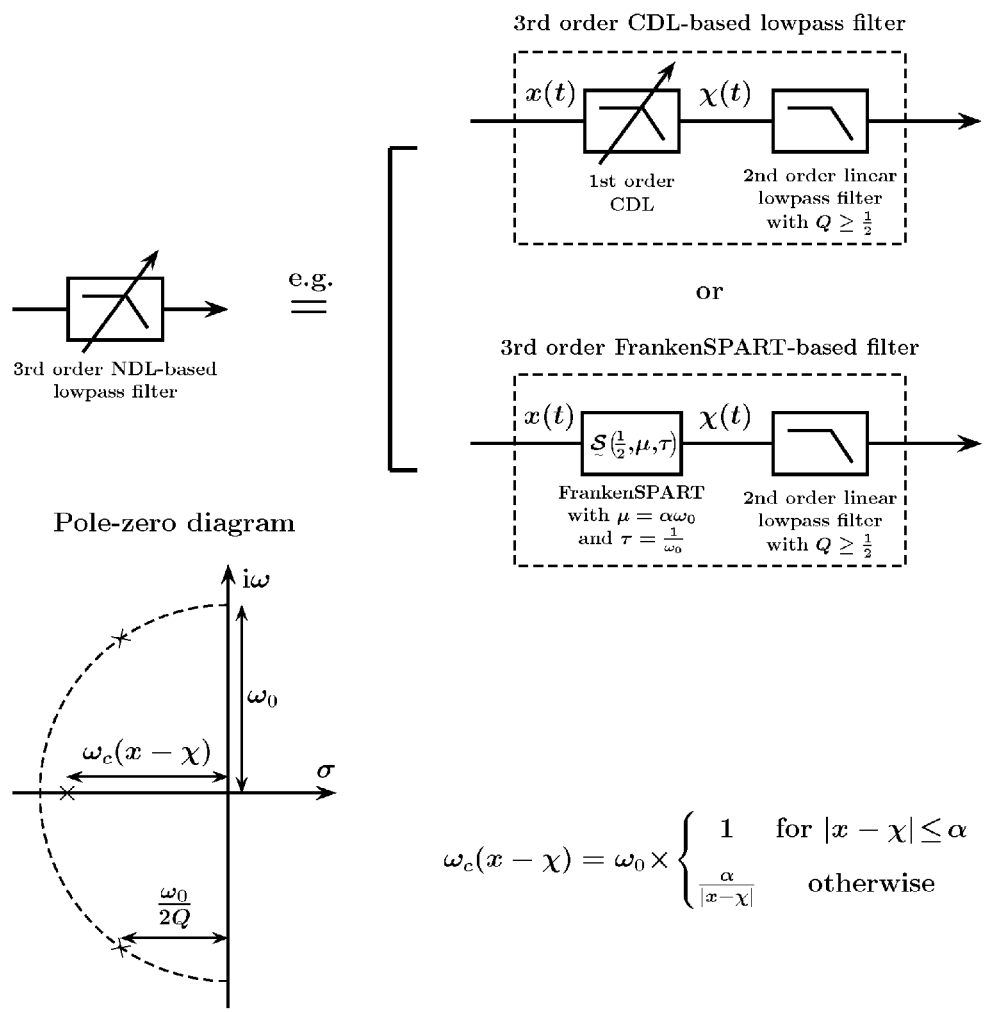

FIG. 67. Example of an odd order CDL/FrankenSPART-based lowpass filter.

Figure 68:
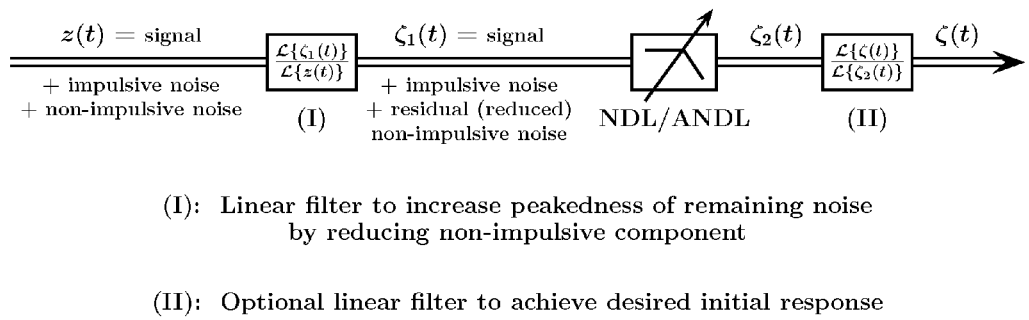

FIG. 68. Improved NDL-based filter comprising a linear front-end filter to suppress the non-impulsive component of the interference.

Figure 69:
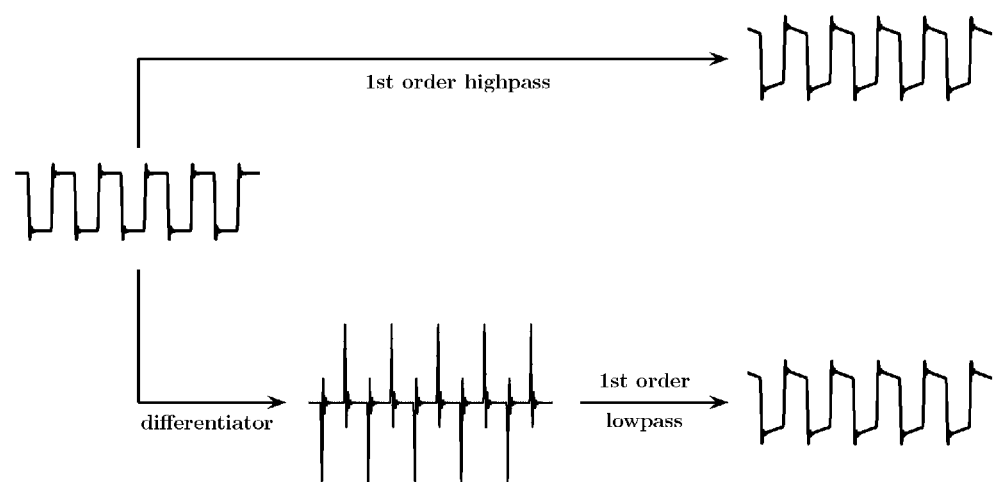

FIG. 69. 1st order highpass filter viewed as a differentiator followed by a 1st order lowpass filter. In this example, differentiation of the input signal transforms it into an impulsive pulse train.

Figure 70:
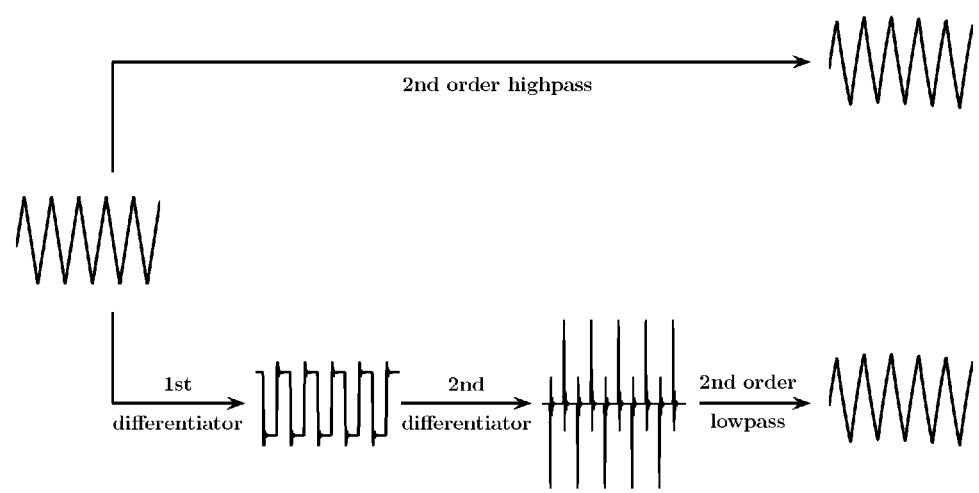

FIG. 70. 2nd order highpass filter viewed as two consecutive differentiators followed by a 2nd order lowpass filter. In this example, 2nd derivative of the input signal is an impulsive pulse train.

FIG. 71. Improved NDL-based bandpass filters comprising LFE highpass filters/differentiators to increase peakedness of the interference.

Figure 72:
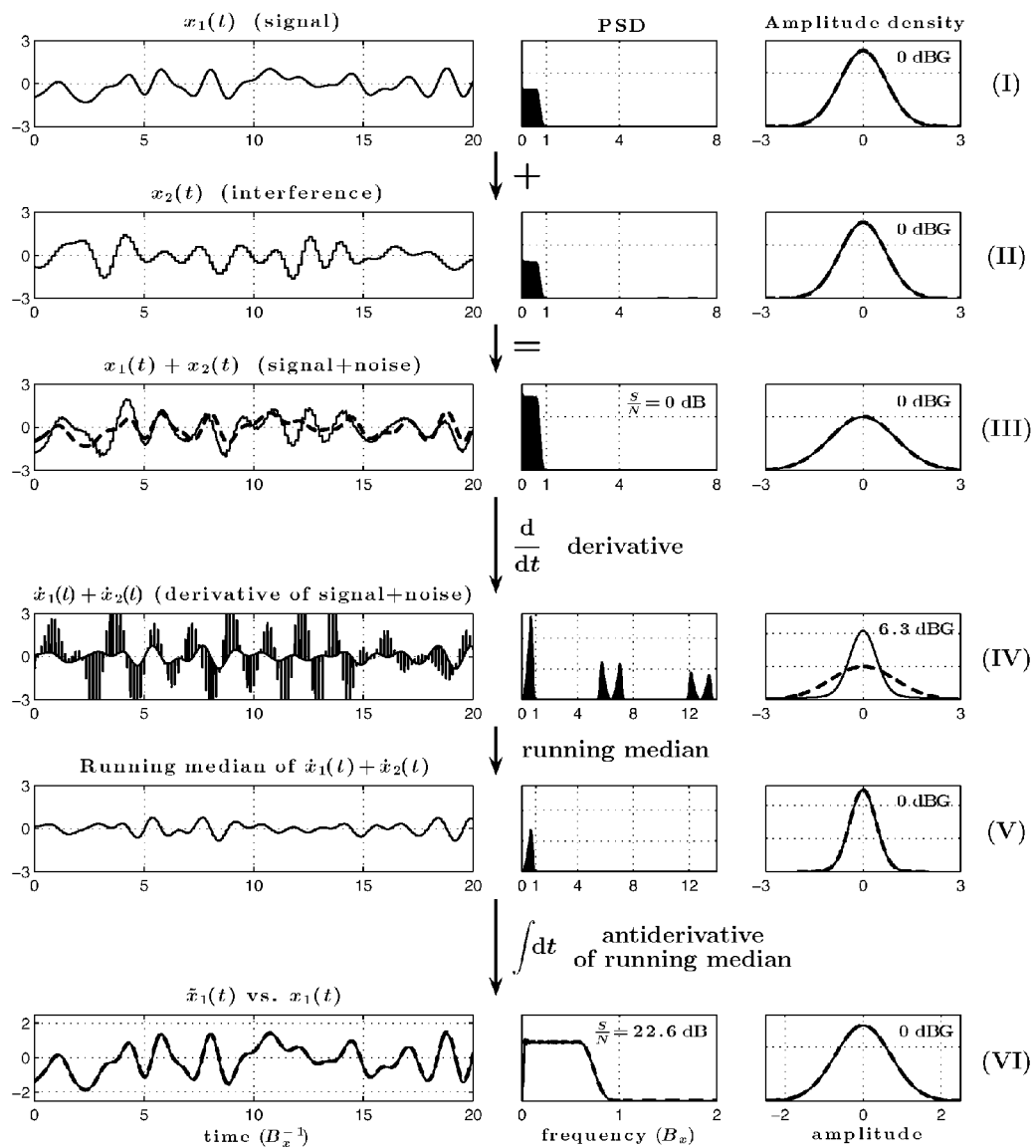

FIG. 72. Idealized illustration of using 'differentiator→(impulse noise filter)→integrator' sequence to improve interference suppression.

Figure 73:
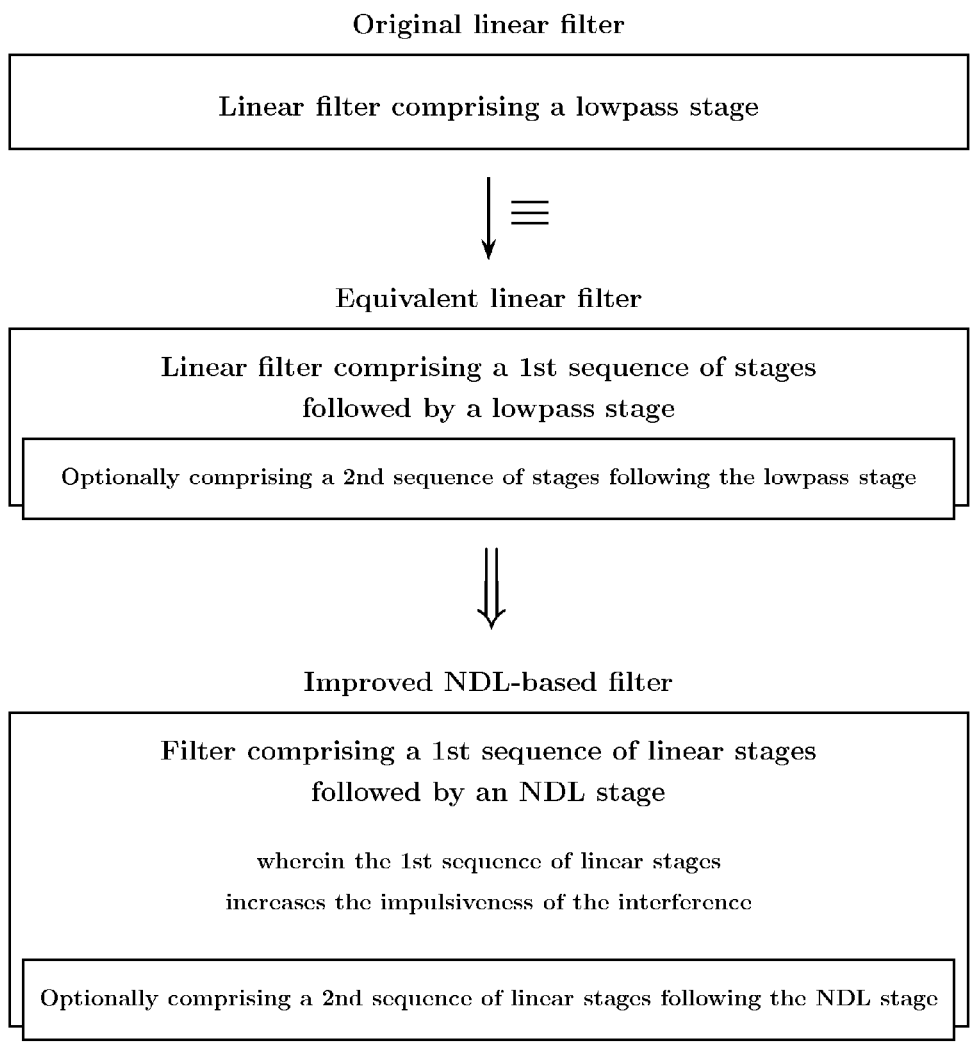

FIG. 73. General schematic illustration of constructing an improved NDL-based filter comprising a linear front-end (LFE) filter to increase the impulsiveness of the interference. In the figure, an LFE filter is referred to as "a 1st sequence of linear stages."

Figure 74:
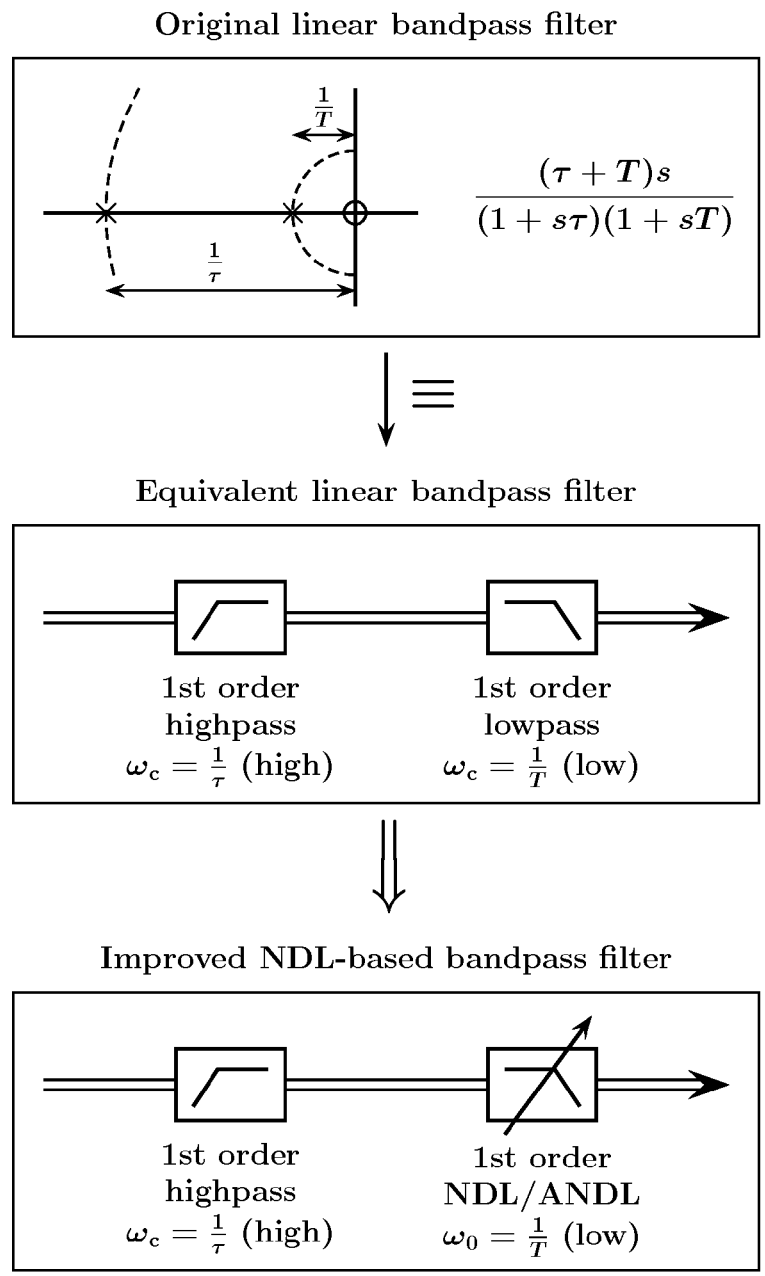

FIG. 74. Particular illustration of constructing an improved NDL-based bandpass filter.

FIG. 75. Particular illustration of constructing an improved 2nd order NDL-based bandpass filter.

Figure 76:
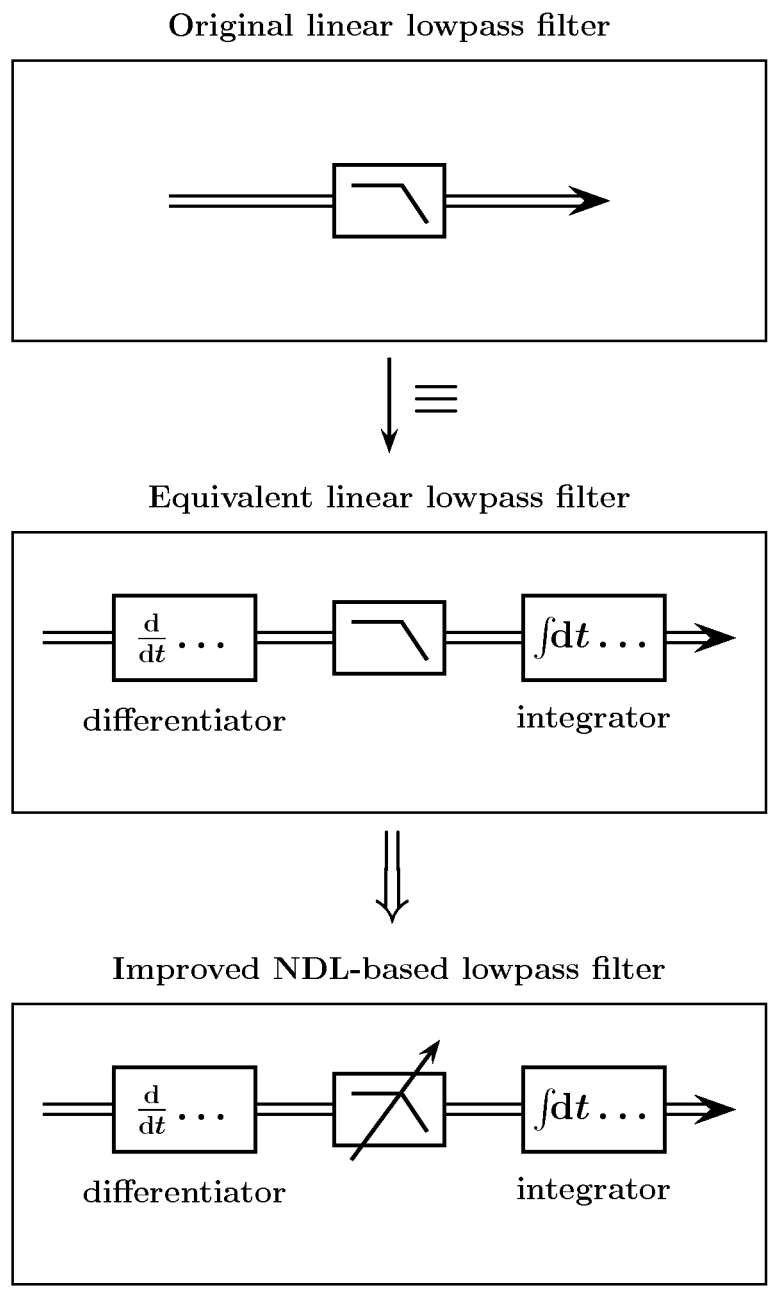

FIG. 76. Idealized particular illustration of constructing an improved NDL-based lowpass filter.

Figure 77:
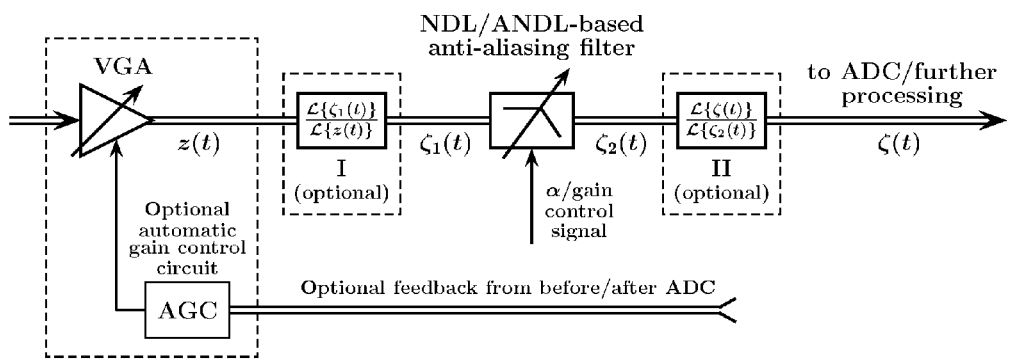

FIG. 77. Illustration of using an NDL/ANDL filter as a replacement for an anti-aliasing filter to improve performance of an analog-to-digital converter.

Figure 78:
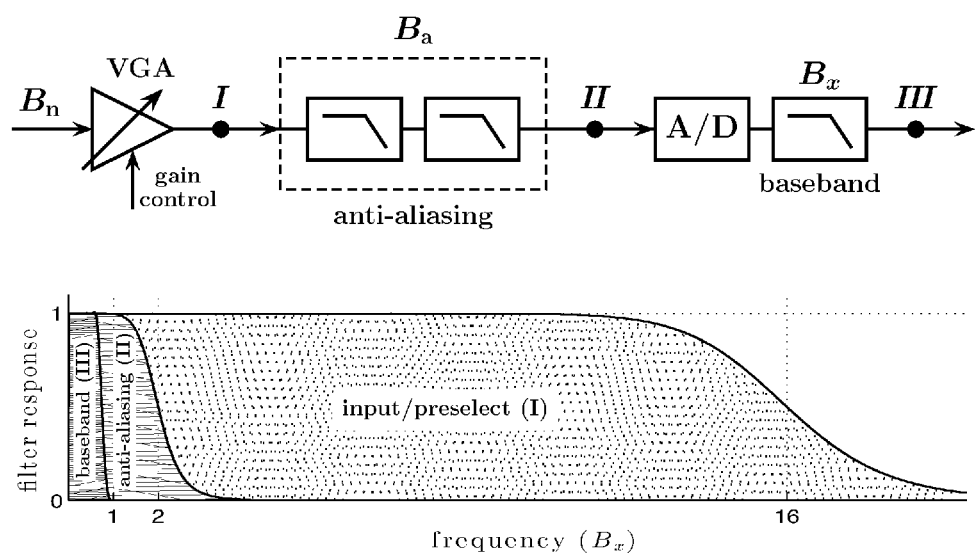

FIG. 78. Fragment of the signal processing chain used in the examples of FIG. 79 through FIG. 86, and the responses of the respective filters in the chain.

Figure 79:
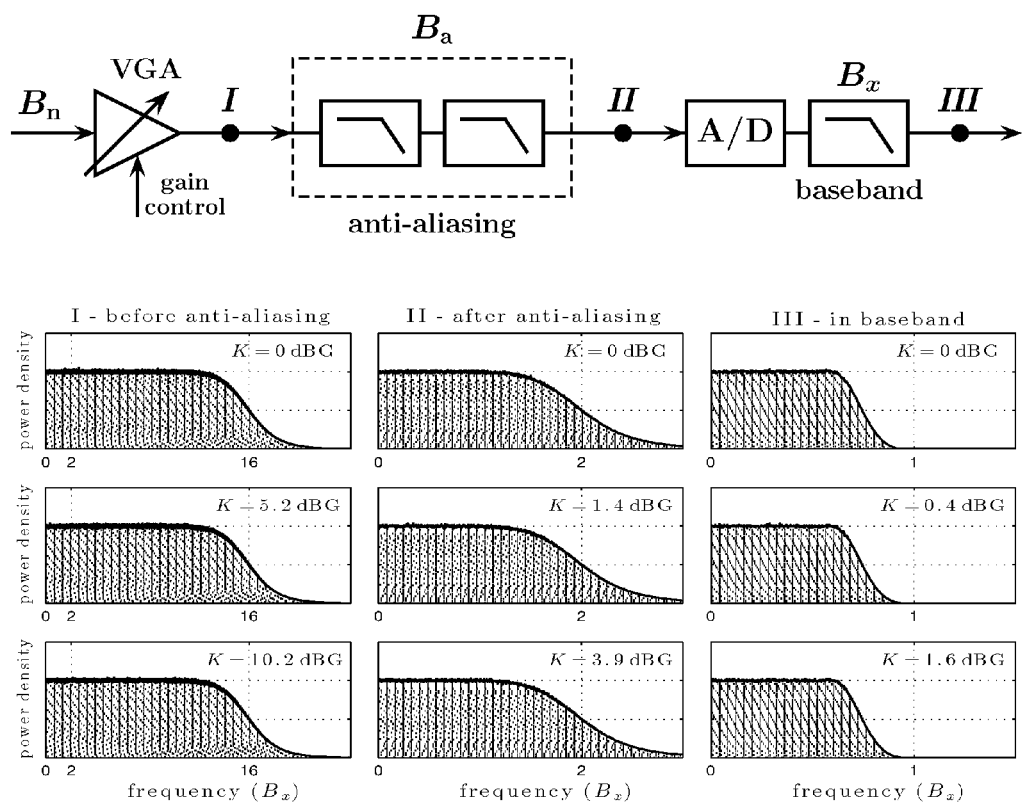

FIG. 79. PSDs of the input white noise which is Gaussian (top row of the panels), strongly impulsive (bottom row of the panels), and the 50/50 (in power) mixture of the Gaussian and impulsive noises (middle row of the panels), measured at points I, II, and III of the signal chain shown at the top of the figure.

Figure 80:
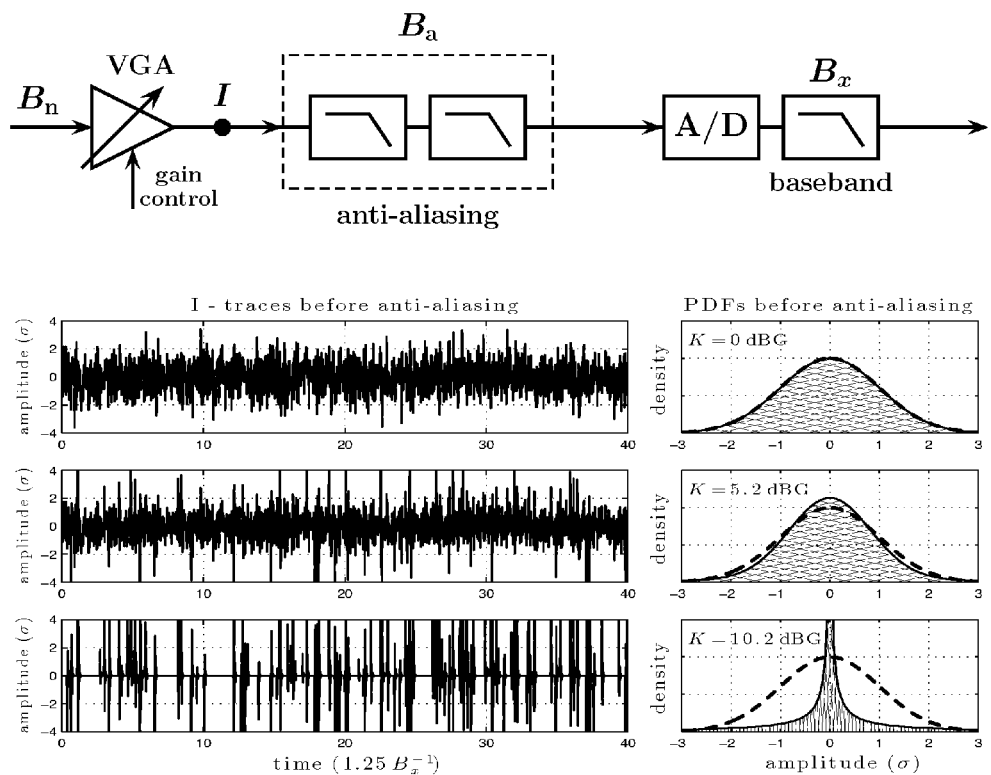

FIG. 80. Time domain traces and amplitude densities of the noise at point I (before the anti-aliasing filter) of the signal chain shown at the top. Left-hand panels: Time domain traces of the noise at point I. Right-hand panels: Amplitude densities of the noise at point I (solid lines) in comparison with the Gaussian distribution (dashed lines).

Figure 81:
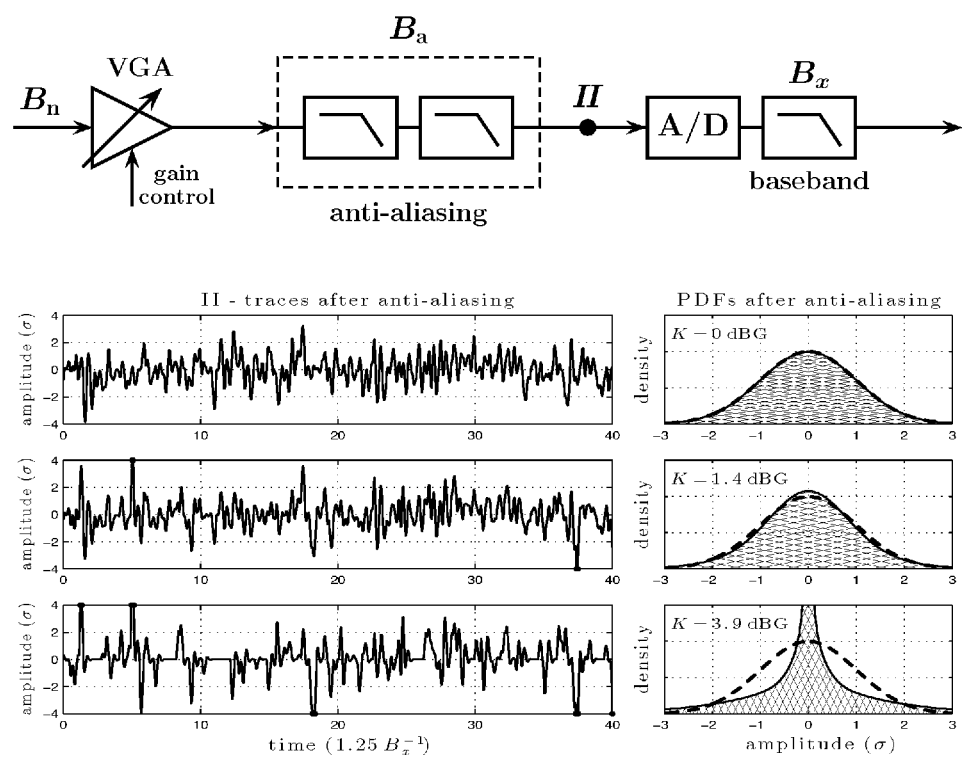

FIG. 81. Time domain traces and amplitude densities of the noise at point II (after the anti-aliasing filter) of the signal chain shown at the top. Left-hand panels: Time domain traces of the noise at point II. Right-hand panels: Amplitude densities of the noise at point II (solid lines) in comparison with the Gaussian distribution (dashed lines).

Figure 82:
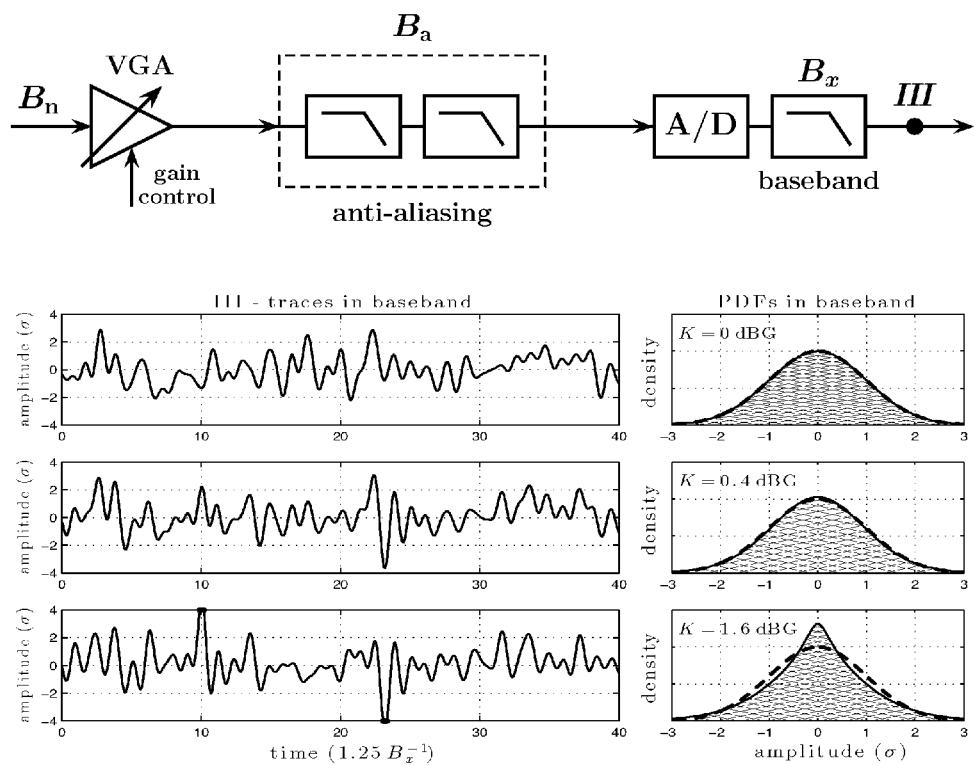

FIG. 82. Time domain traces and amplitude densities of the noise at point III (in baseband) of the signal chain shown at the top. Left-hand panels: Time domain traces of the noise at point III. Right-hand panels: Amplitude densities of the noise at point III (solid lines) in comparison with the Gaussian distribution (dashed lines).

Figure 83:
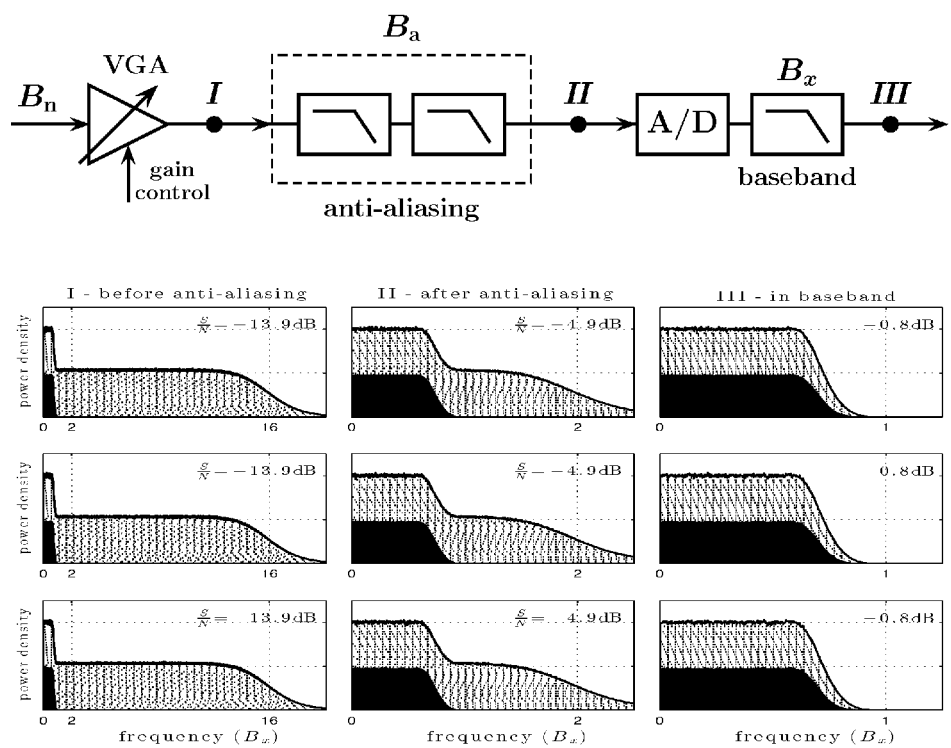

FIG. 83. Power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

Figure 84:
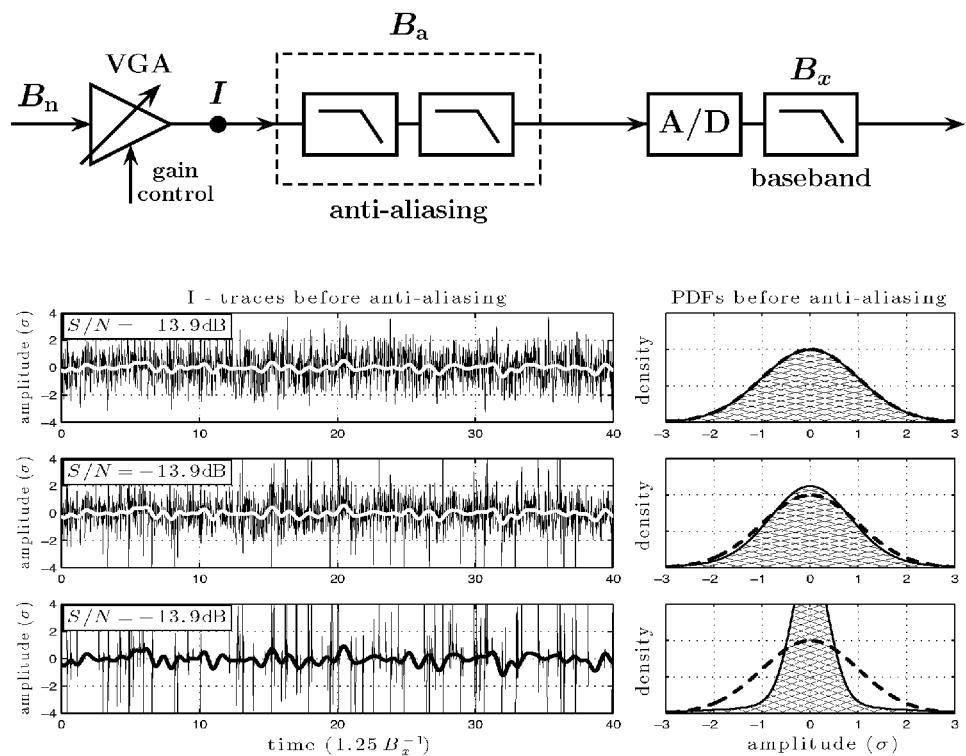

FIG. 84. Time domain traces and amplitude densities of the signal+noise mixtures at point I (before the anti-aliasing filter) of the signal chain shown at the top. Left-hand panels: Time domain traces of the signal+noise mixtures (thin black lines) at point I. Right-hand panels: Amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 85:
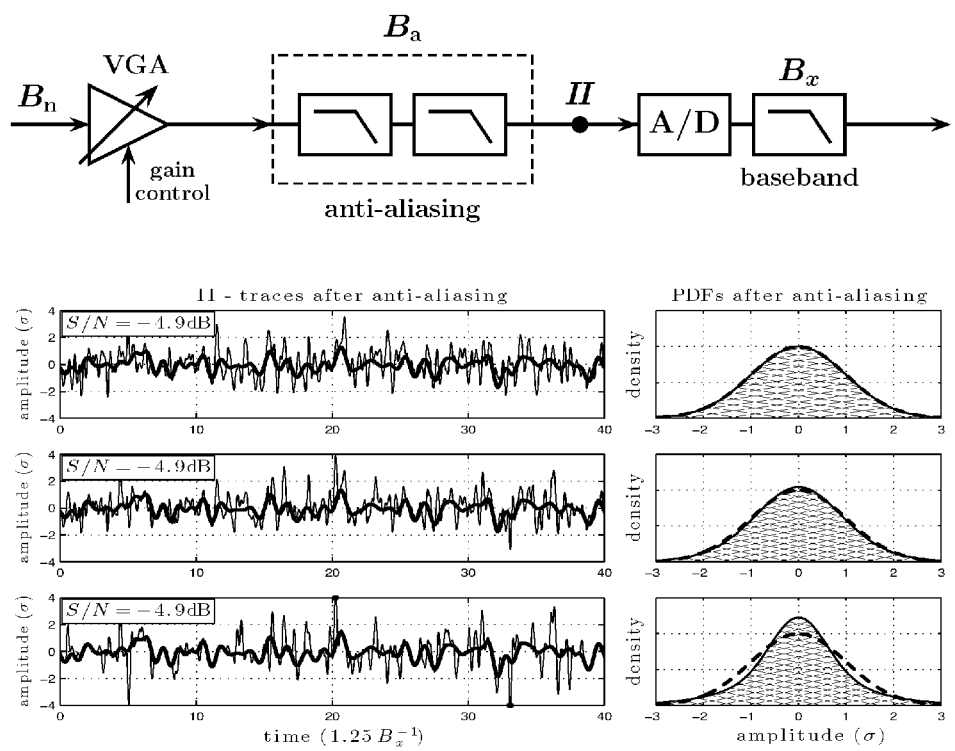

FIG. 85. Time domain traces and amplitude densities of the signal+noise mixtures at point II (after the anti-aliasing filter) of the signal chain shown at the top. Left-hand panels: Time domain traces of the signal+noise mixtures (thin black lines) at point II. Right-hand panels: Amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 86:
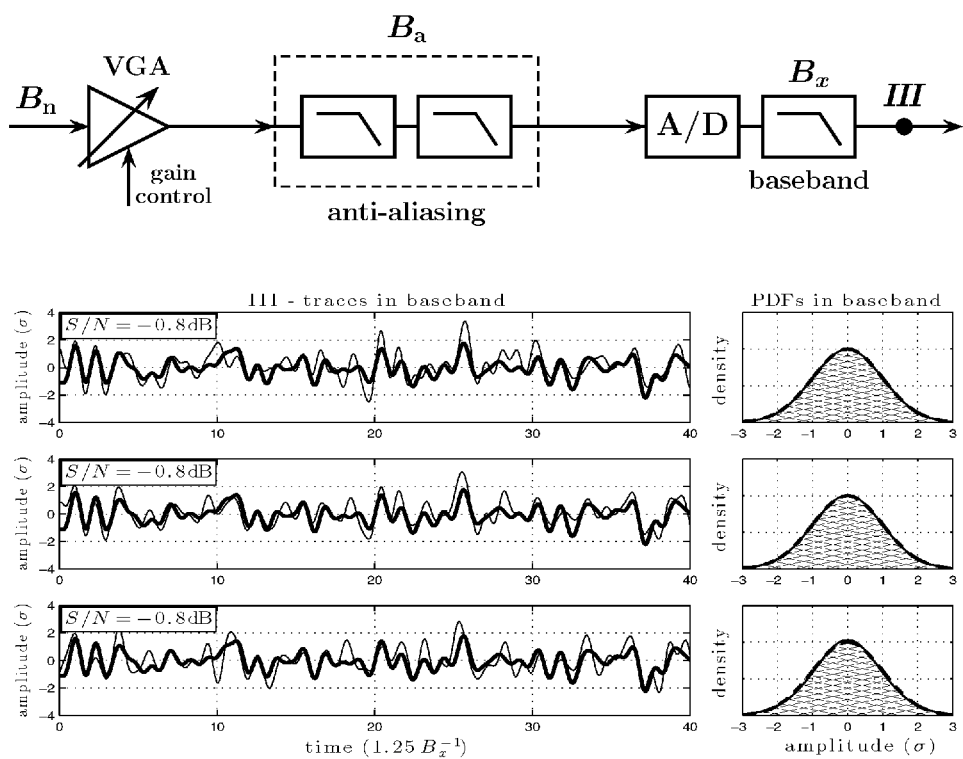

FIG. 86. Time domain traces and amplitude densities of the signal+noise mixtures at point III (in baseband) of the signal chain shown at the top. Left-hand panels: Time domain traces of the signal+noise mixtures (thin black lines) at point III. Right-hand panels: Amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 87:
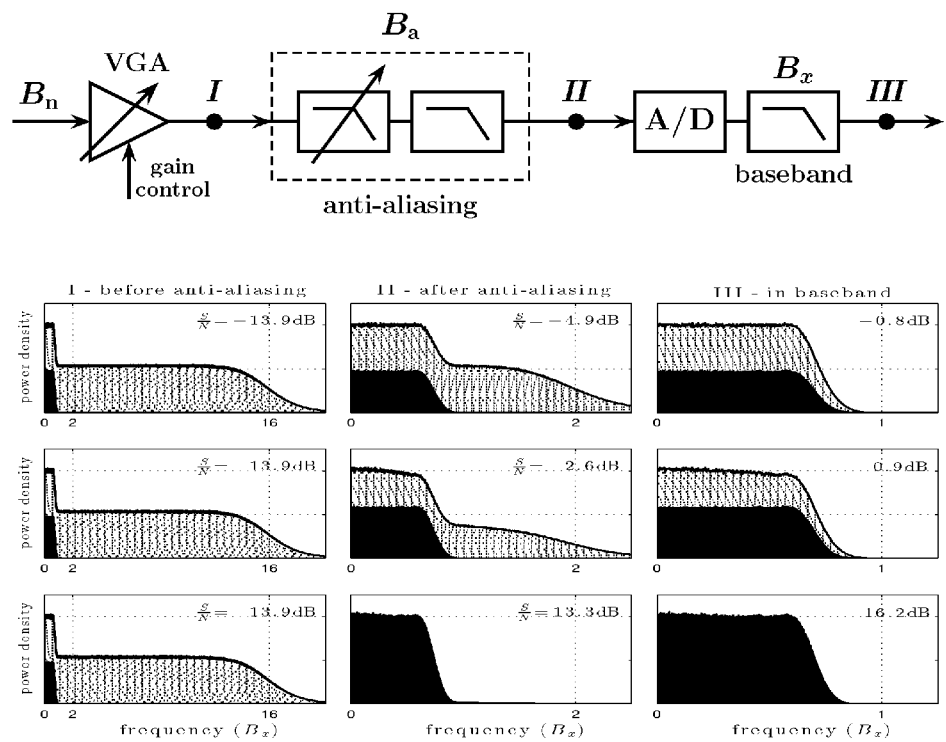

FIG. 87. Power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

Figure 88:
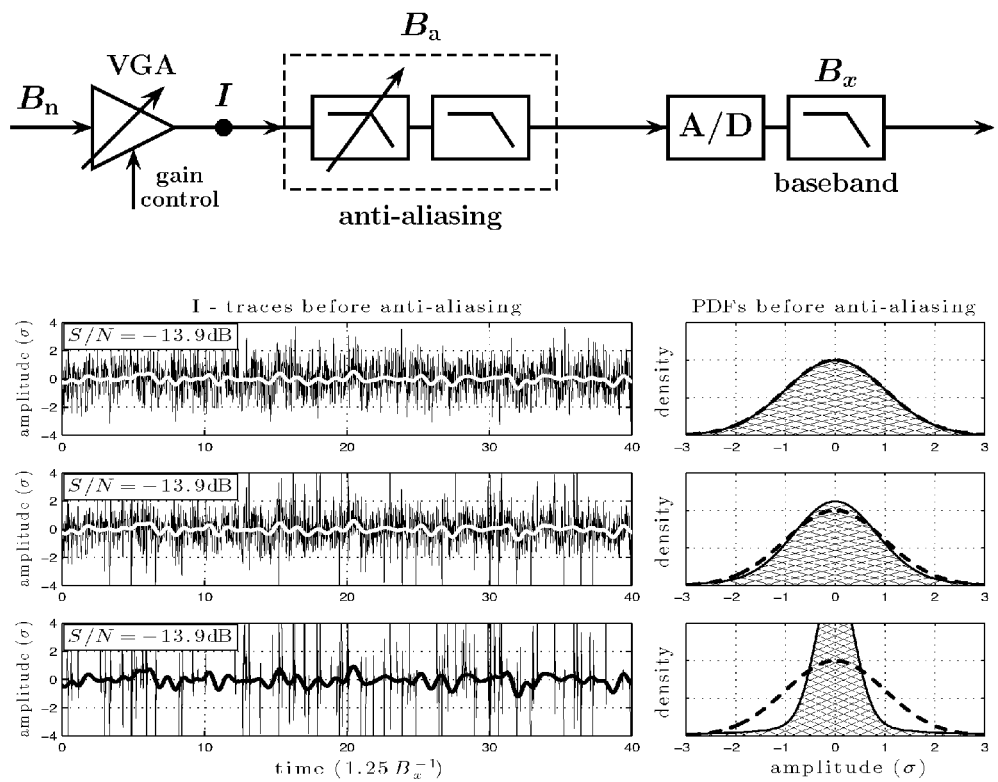

FIG. 88. Time domain traces and amplitude densities of the signal+noise mixtures at point I (before the anti-aliasing filter) of the signal chain shown at the top. Left-hand panels: Time domain traces of the signal+noise mixtures (thin black lines) at point I. Right-hand panels: Amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 89:
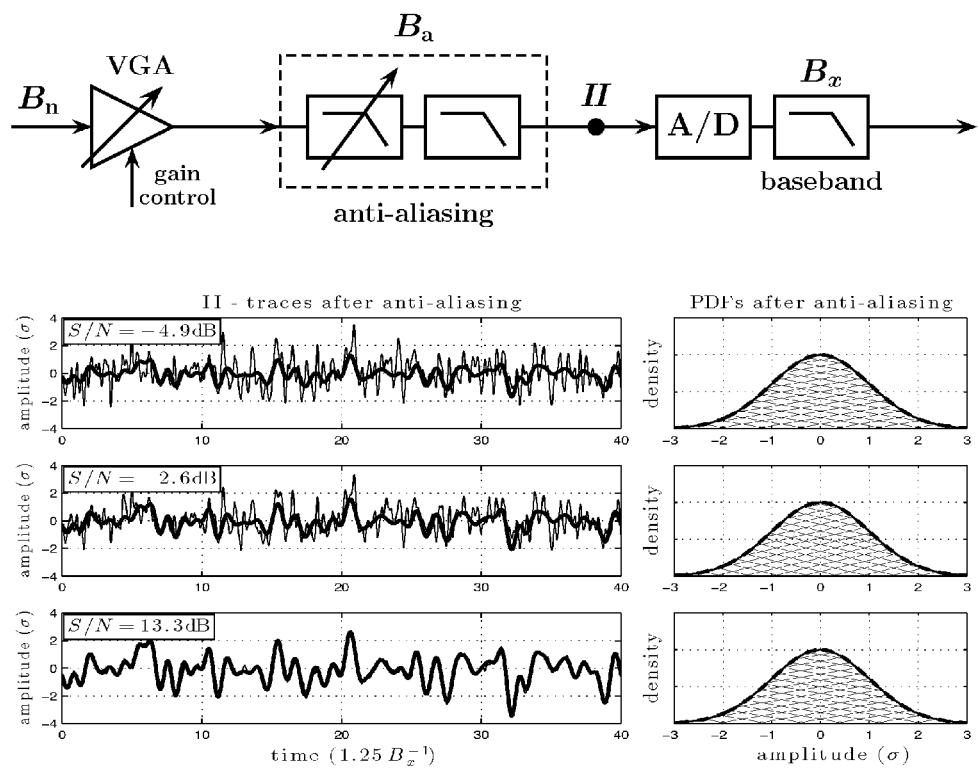

FIG. 89. Time domain traces and amplitude densities of the signal+noise mixtures at point II (after the anti-aliasing filter) of the signal chain shown at the top. Left-hand panels: Time domain traces of the signal+noise mixtures (thin black lines) at point II. Right-hand panels: Amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 90:
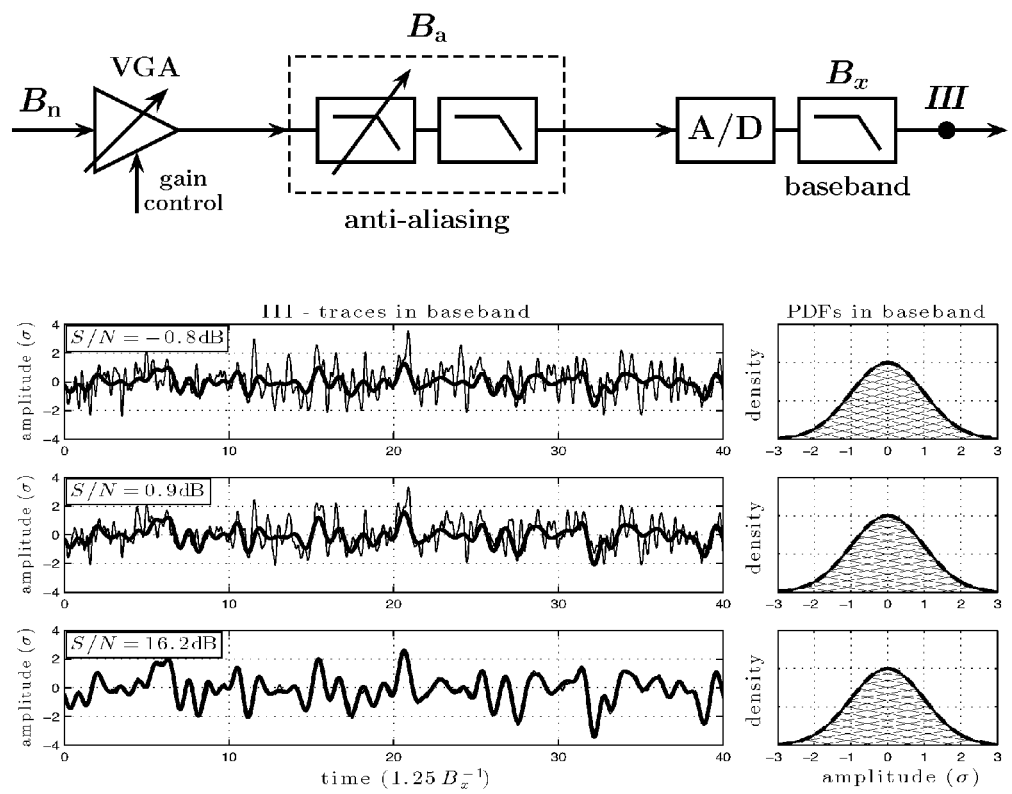

FIG. 90. Time domain traces and amplitude densities of the signal+noise mixtures at point III (in baseband) of the signal chain shown at the top. Left-hand panels: Time domain traces of the signal+noise mixtures (thin black lines) at point III. Right-hand panels: Amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

Figure 91:
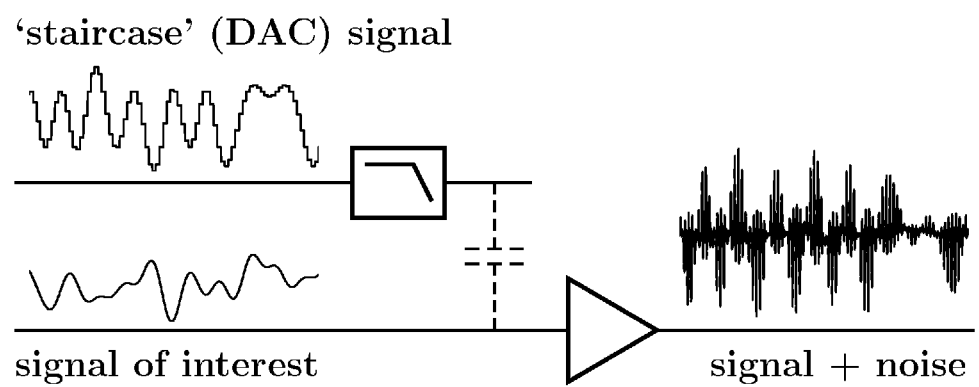

FIG. 91. Illustration of a simplified interference scenario where a 'staircase' DAC signal is "smoothened" by a lowpass filter, then capacitively coupled into an adjacent trace.

Figure 92:
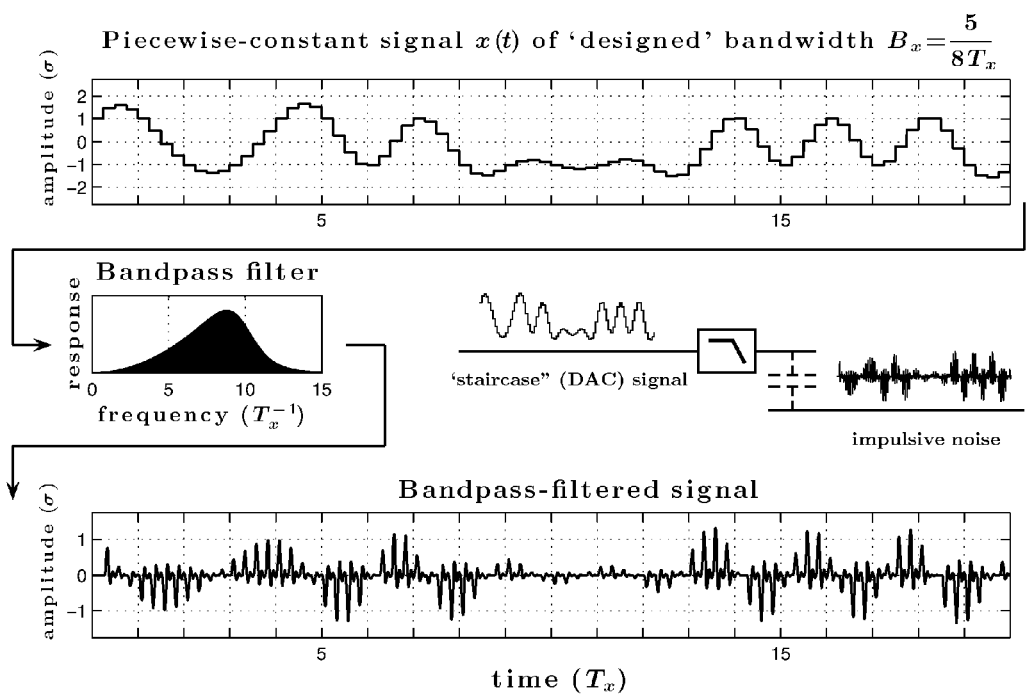

FIG. 92. Clarifying details for the interference scenario shown in FIG. 91.

Figure 93:
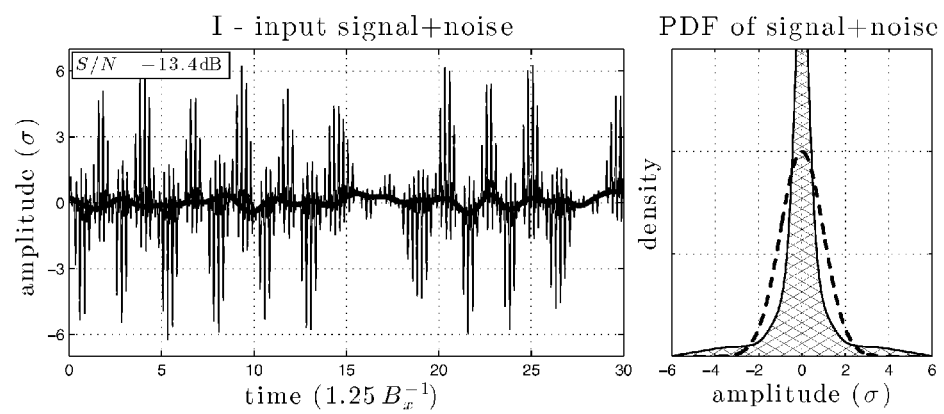

FIG. 93. Input signal at point I (before the anti-aliasing filter) of both signal chains shown in FIG. 94. Left-hand panel: Time domain trace of the signal+noise mixture where the noise is the DAC interference from the scenario illustrated in FIG. 91 and FIG. 92, and the signal of interest is some small signal within the baseband frequency. Right-hand panel: Amplitude density of the signal+noise mixture (solid line) in comparison with the Gaussian distribution (dashed line).

Figure 94:
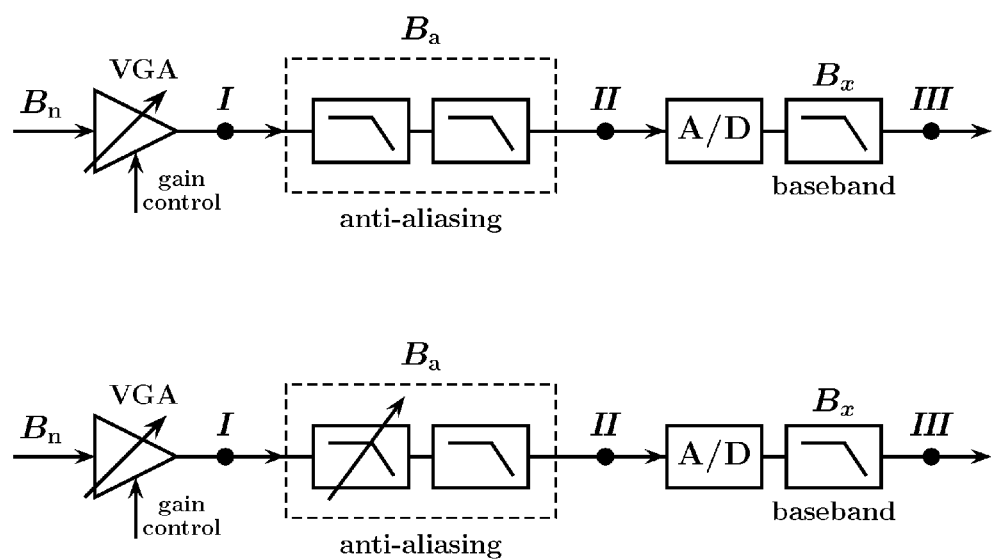

FIG. 94. Signal chain with a linear anti-aliasing filter (top), and a signal chain with an NDL-based anti-aliasing filter (bottom). All filters are the same as the respective filters used in the examples of FIG. 78 through FIG. 90.

Figure 95:
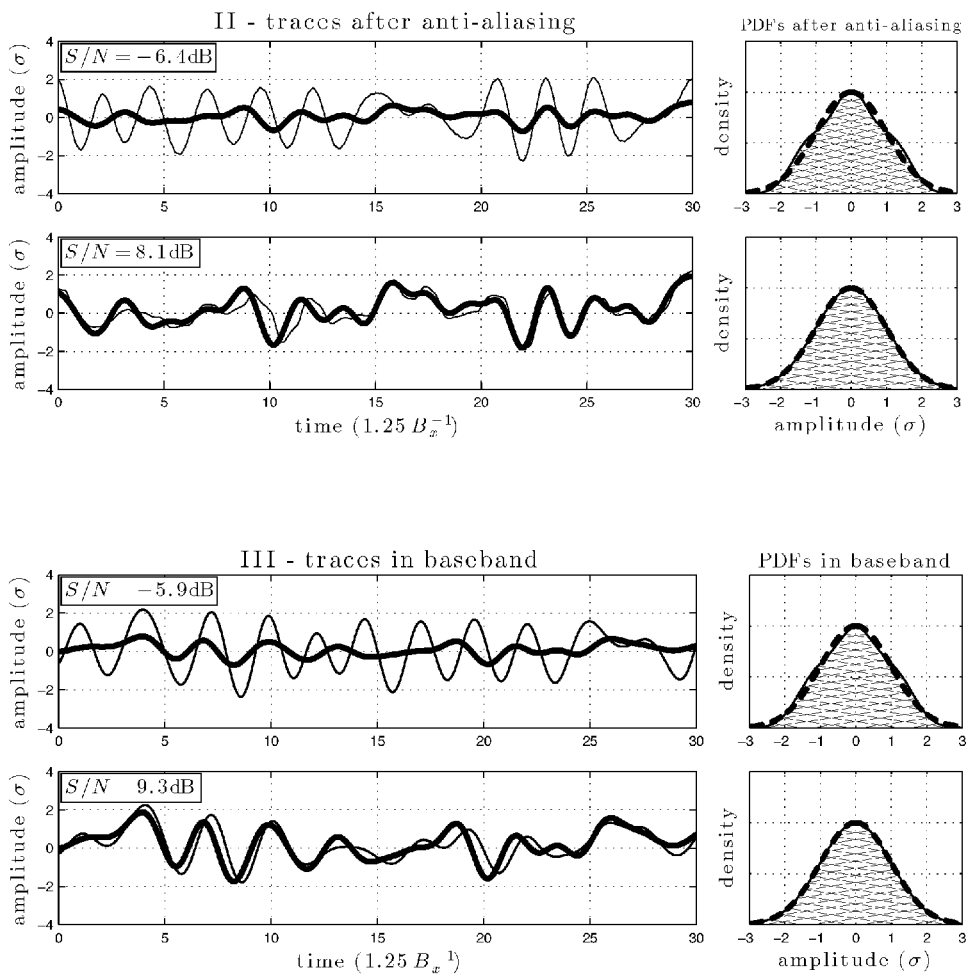

FIG. 95. Time domain traces of the signal+noise mixtures and their amplitude densities at point II (upper set of panels) and at point III (lower set of panels).

Figure 96:
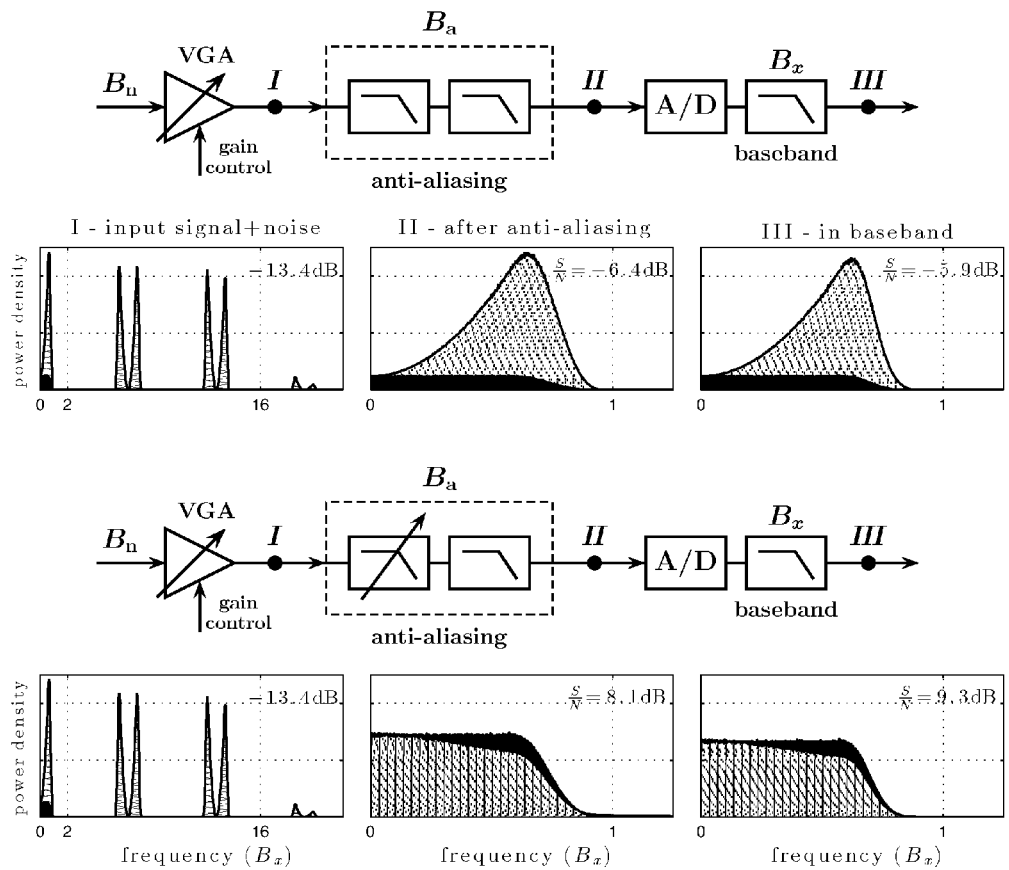

FIG. 96. PSDs of the signal+noise mixtures along the signal chains shown in FIG. 94, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

Figure 97:
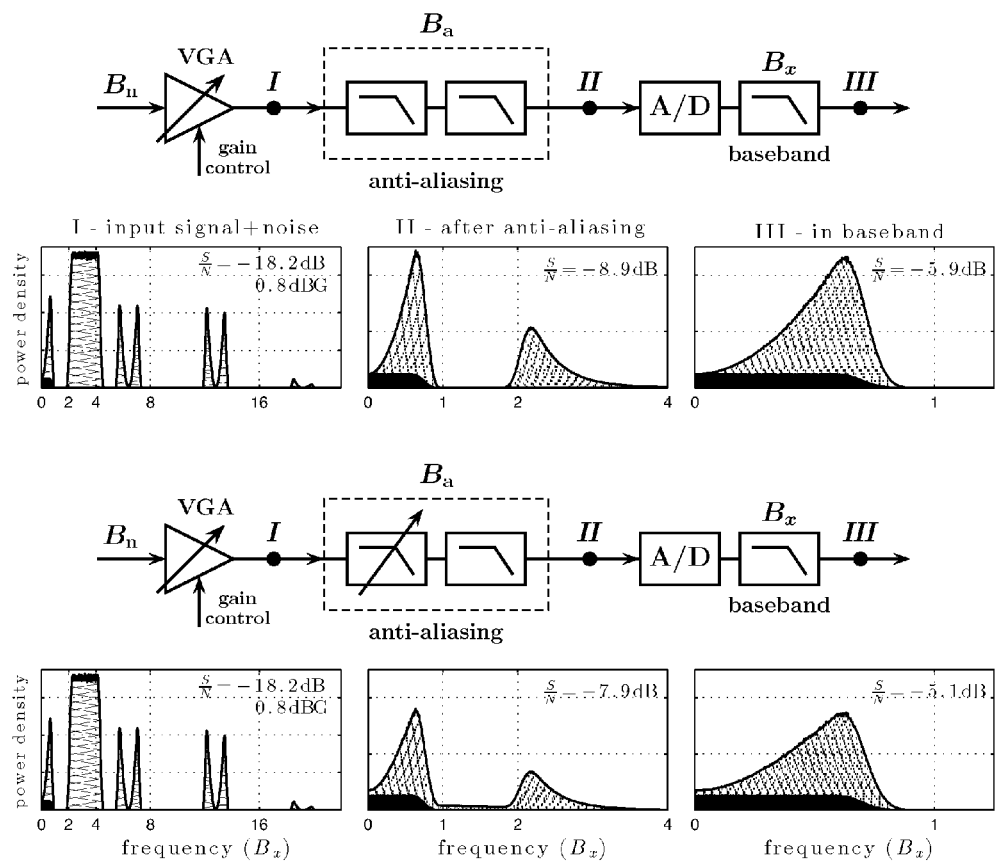

FIG. 97. Example of NDL-based mitigation of interference when the latter comprises impulsive and non-impulsive components.

Figure 98:
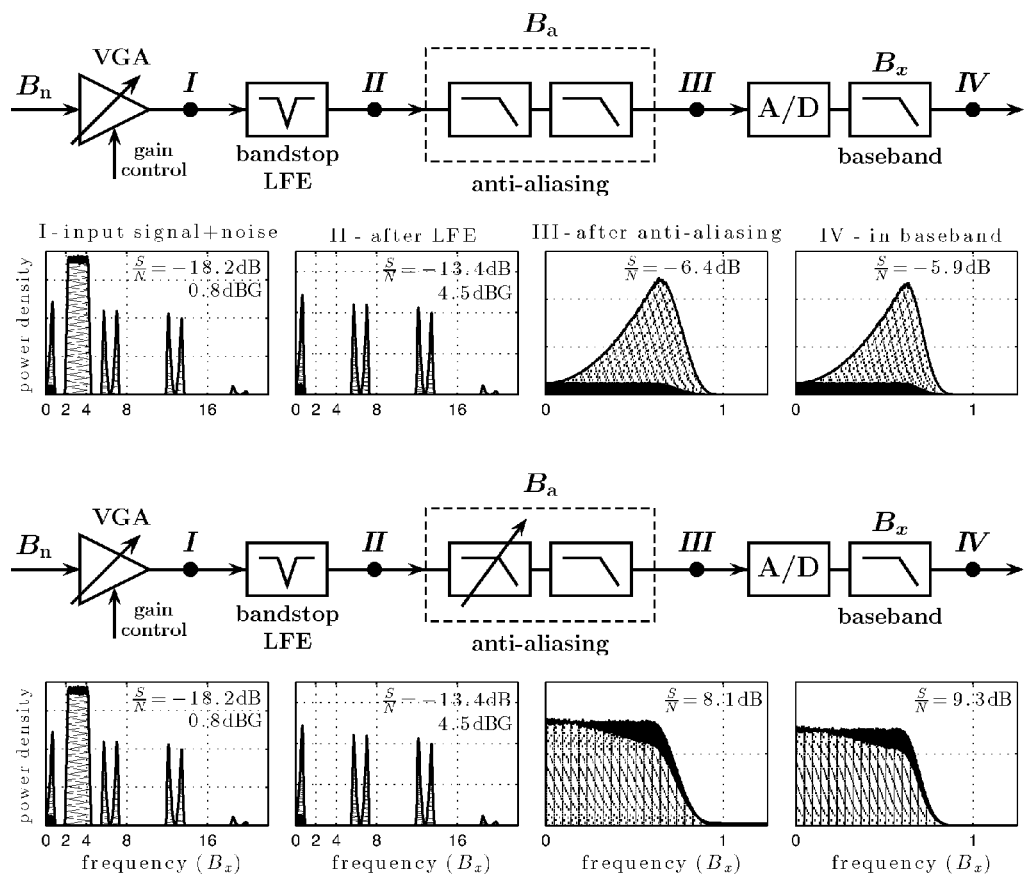

FIG. 98. Example of improving NDL-based mitigation of interference when the latter comprises impulsive and non-impulsive components.

Figure 99:
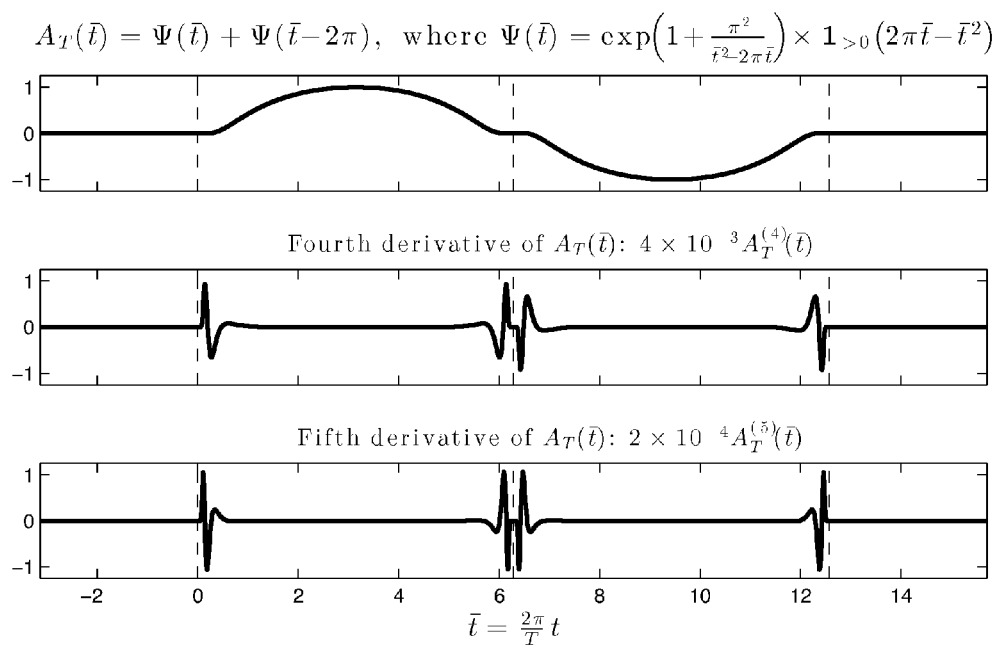

FIG. 99. Illustrative example of increasing impulsiveness of a truly smooth signal by consecutive differentiation.

Figure 100:
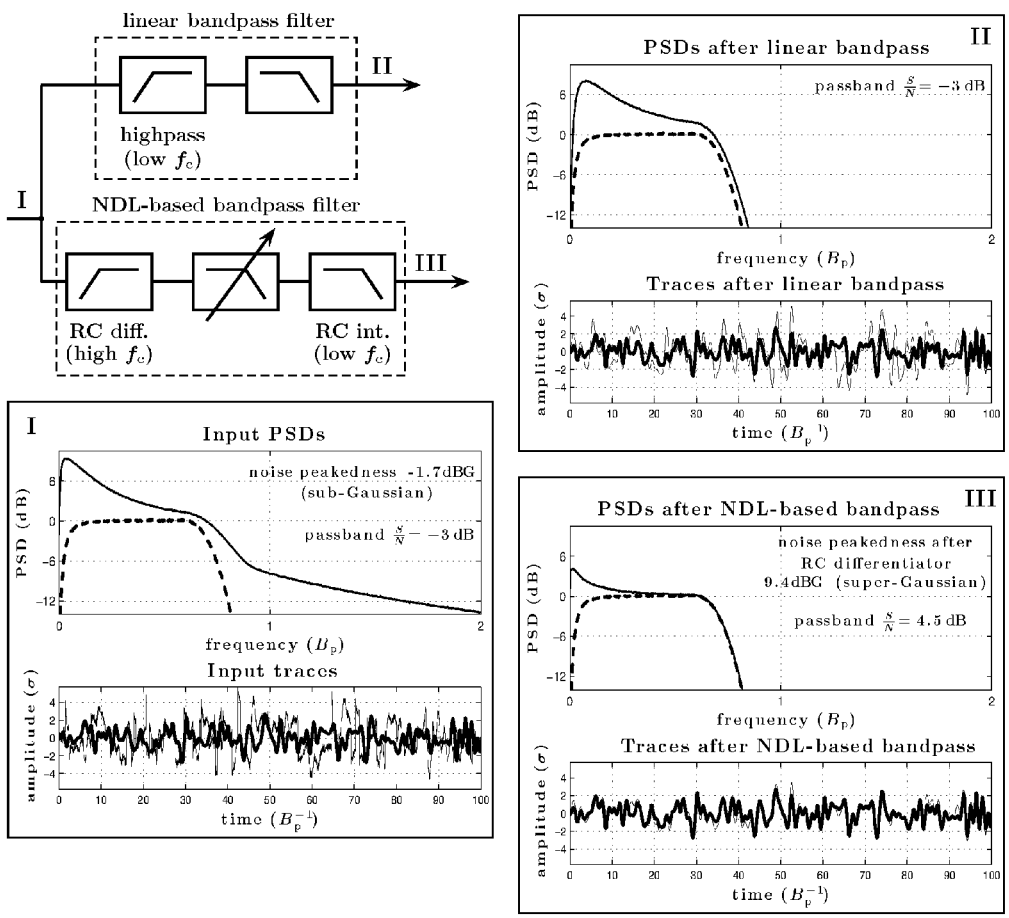

FIG. 100. Illustrative example of using an improved NDL-based bandpass filter to mitigate sub-Gaussian (non-impulsive) noise affecting a bandpass signal.

Figure 101:
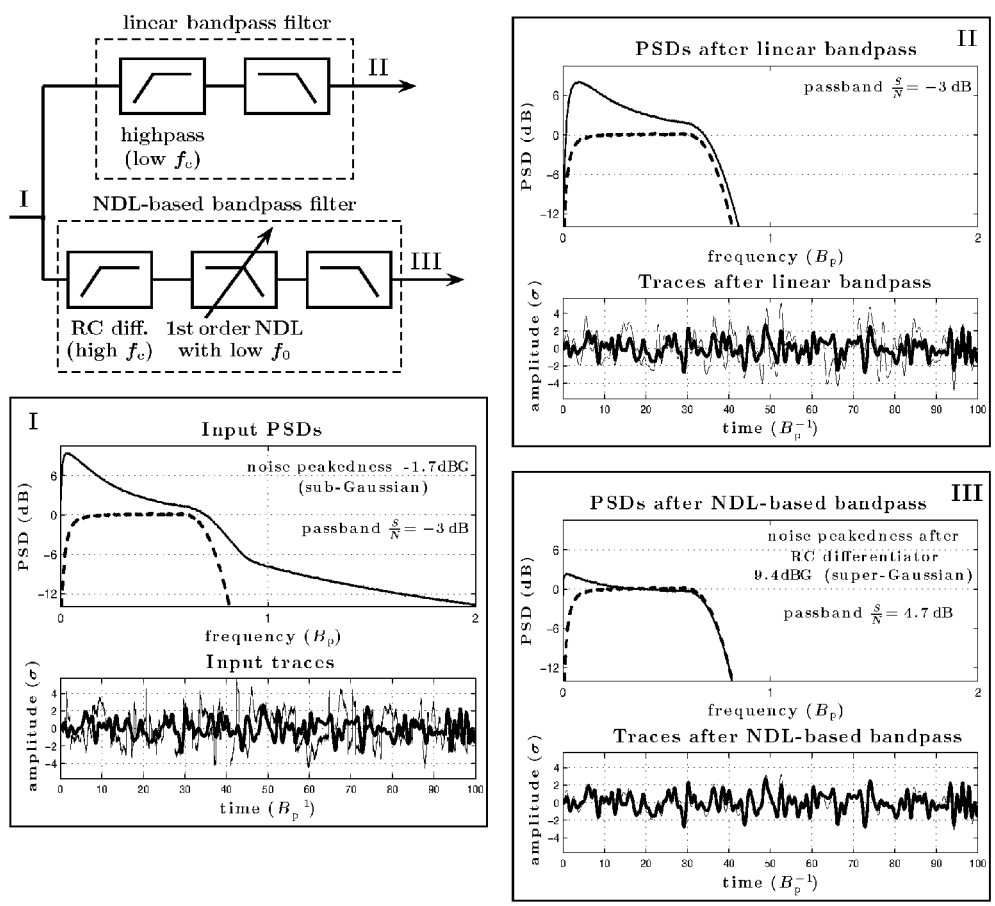

FIG. 101. Illustrative example of using an alternative improved NDL-based bandpass filter to mitigate sub-Gaussian (non-impulsive) noise affecting a bandpass signal.

Figure 102:
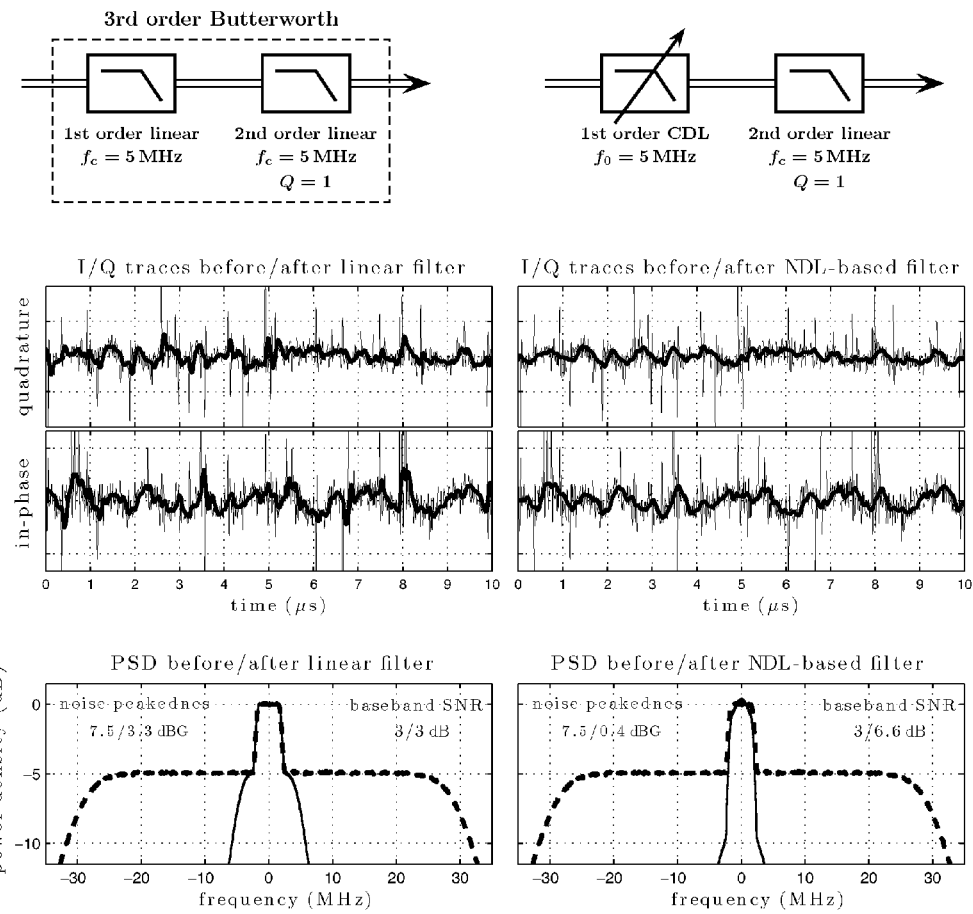

FIG. 102. Impulsive noise mitigation in communication channel by an NDL. The 3rd order NDL-based filter is a 1st order CDL followed by a 2nd order linear filter.

Figure 103:
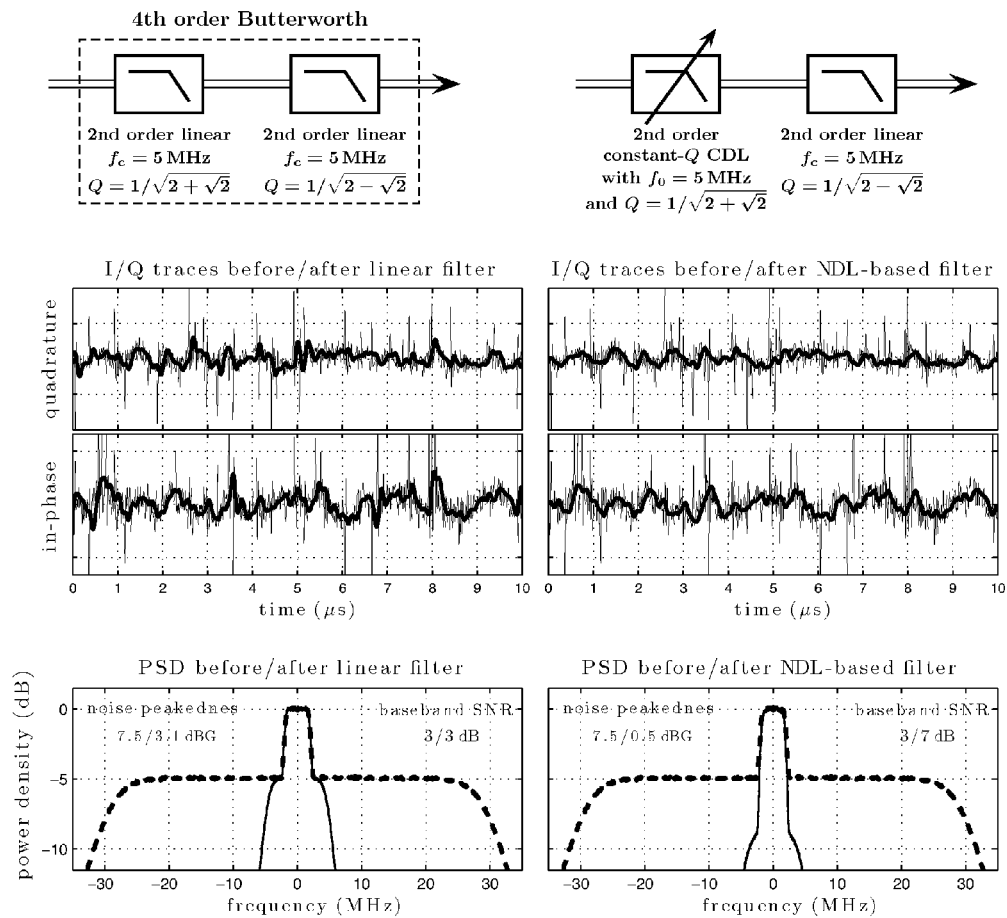

FIG. 103. Impulsive noise mitigation in communication channel by an NDL. The 4th order NDL-based filter is a 2nd order CDL followed by a 2nd order linear filter.

Figure 104:
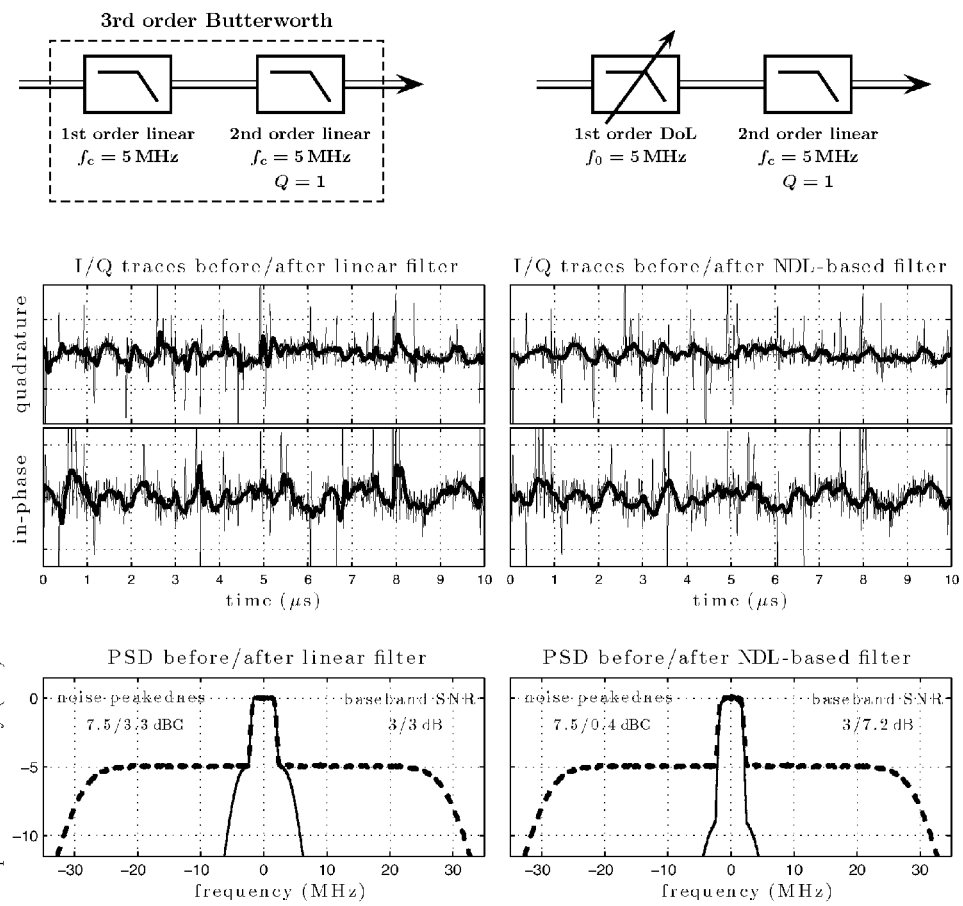

FIG. 104. Impulsive noise mitigation in communication channel by an NDL. The 3rd order NDL-based filter is a 1st order DoL ($\beta=1$ in equation (38)) followed by a 2nd order linear filter.

Figure 105:
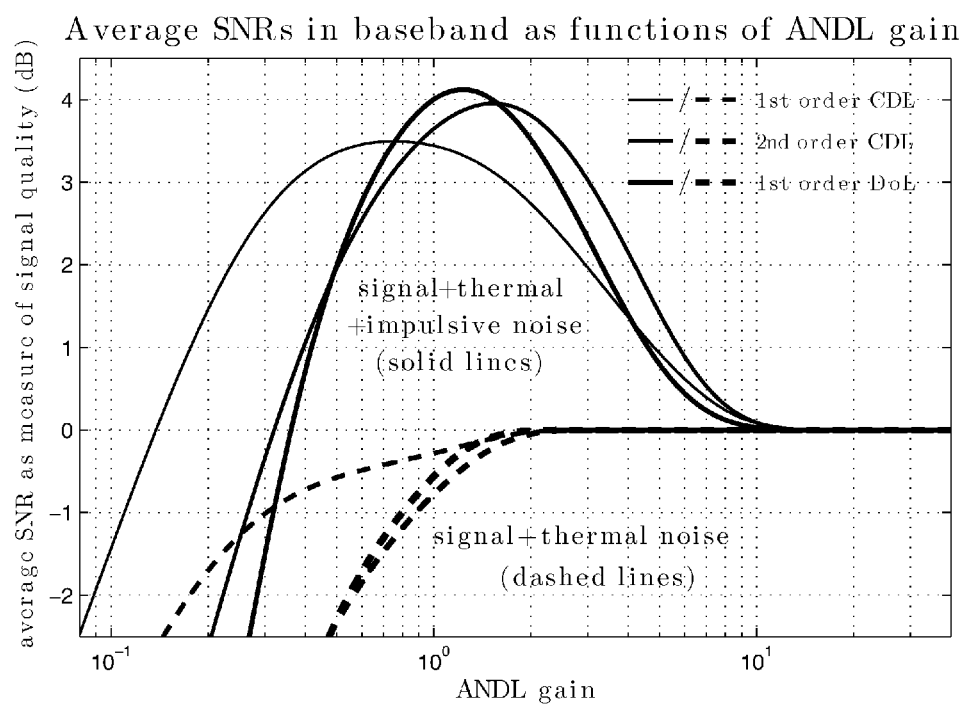

FIG. 105. Average baseband SNRs as functions of the ANDL gain for the examples shown in FIG. 102 through FIG. 104, where the respective NDLs are replaced by their adaptive versions according to the topology shown in FIG. 33, with zero quantile offset in the DcL.

Figure 106:
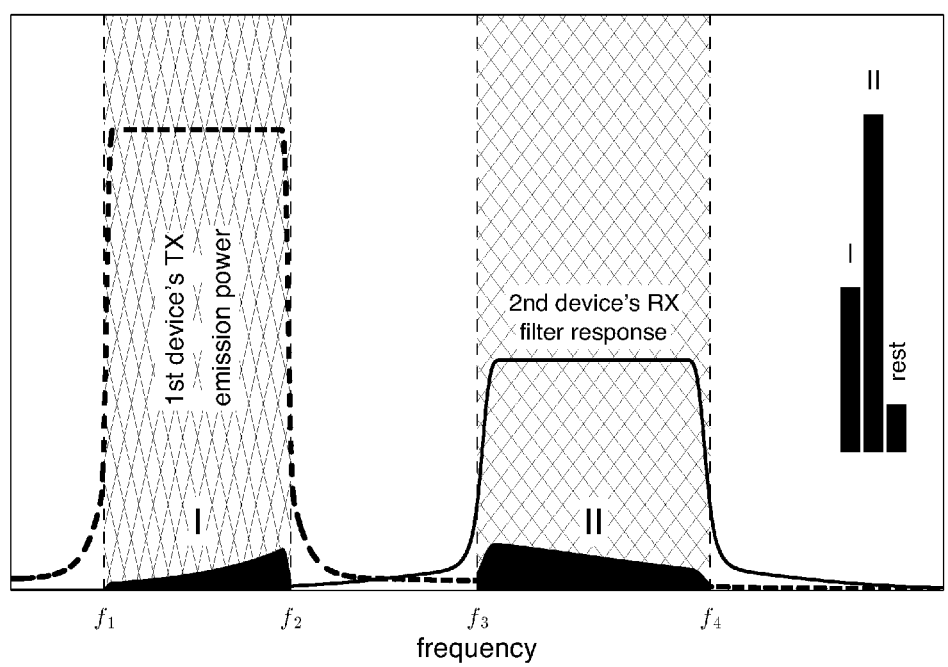

FIG. 106. Qualitative illustration of different contributions into the interference which the receiver (RX) of a 2nd device experiences from the transmitter (TX) of a 1st device.

Figure 107:
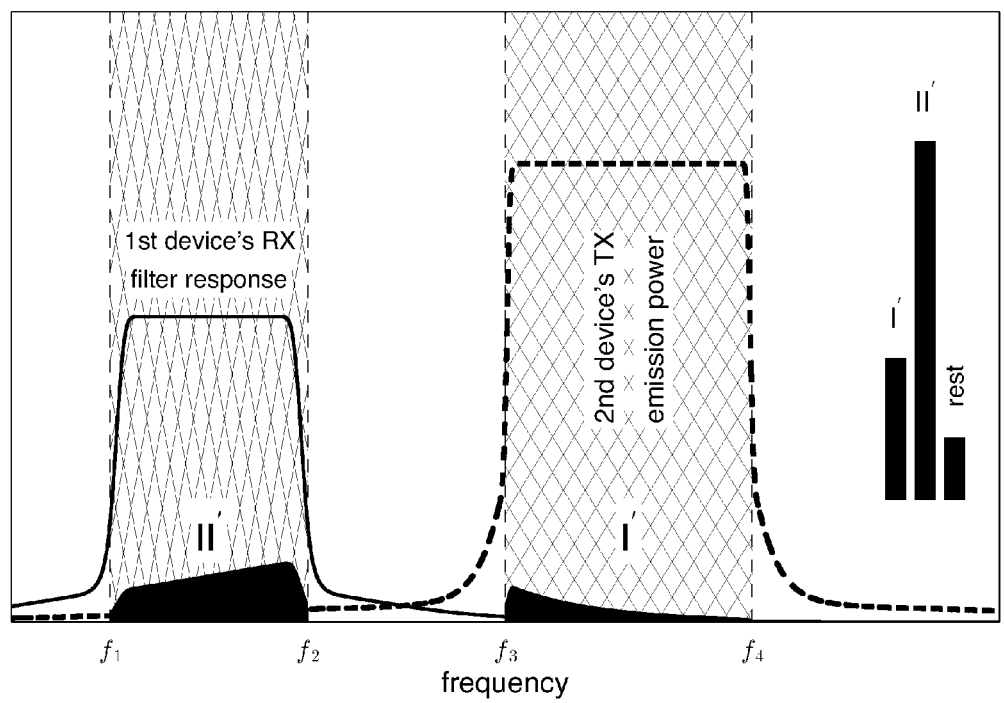

FIG. 107. Similar illustration of different contributions into the interference which the receiver of the 1st device experiences from the transmitter of the 2nd device.

Figure 108:
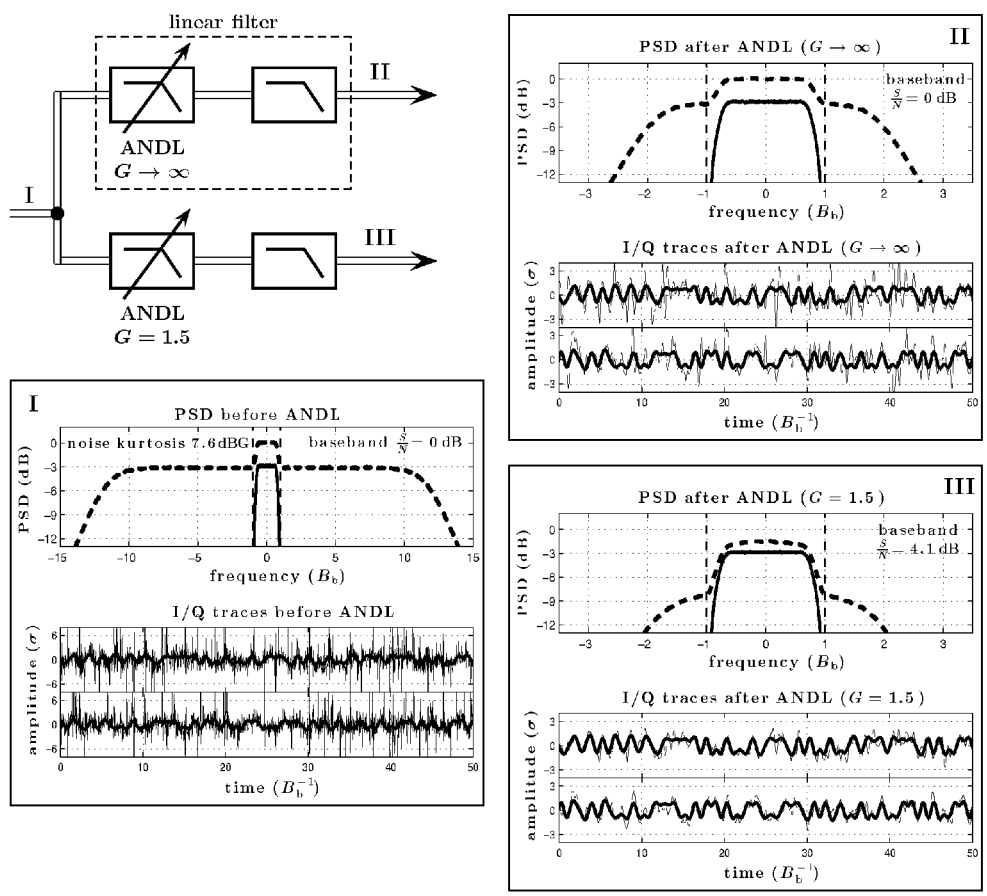

FIG. 108. Input and outputs of an ANDL for $G \to \infty$ and $G=1.5$ for a model signal. The ANDL is the 4th order NDL-based filter of FIG. 66, where the NDL is the 2nd order adaptive CDL according to the topology shown in FIG. 33, with zero quantile offset in the DcL.

Figure 109:
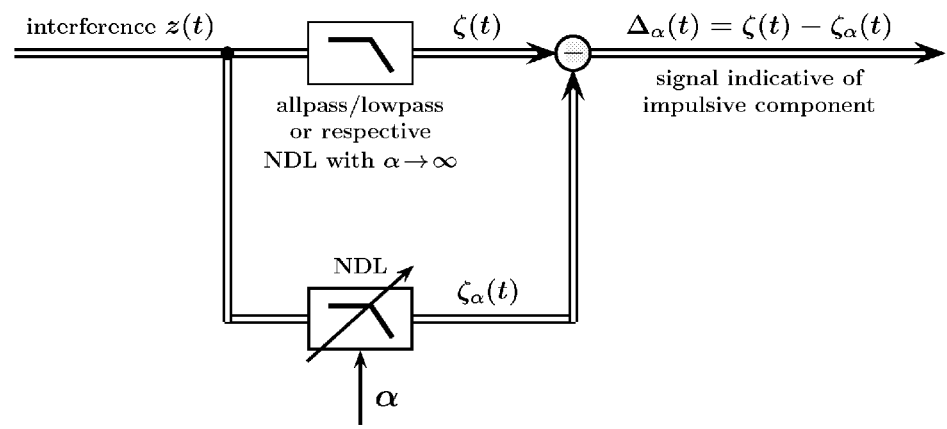

FIG. 109. Schematic illustration of obtaining a difference signal $\Delta_\alpha(t)$ that is indicative of the impulsive component of the incoming interference $z(t)$.

Figure 110:
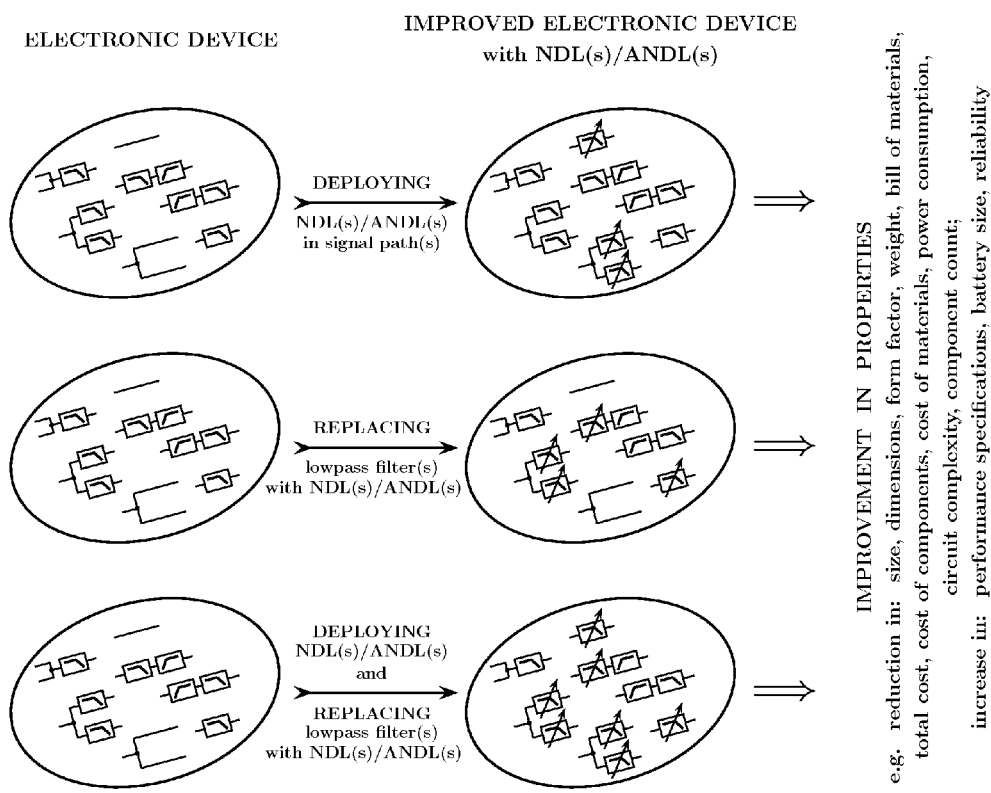

FIG. 110. Schematic illustration of improving properties of electronic devices by deploying NDL(s) in signal path(s), and/or by replacing linear filter(s) with NDL(s).

Figure 111:
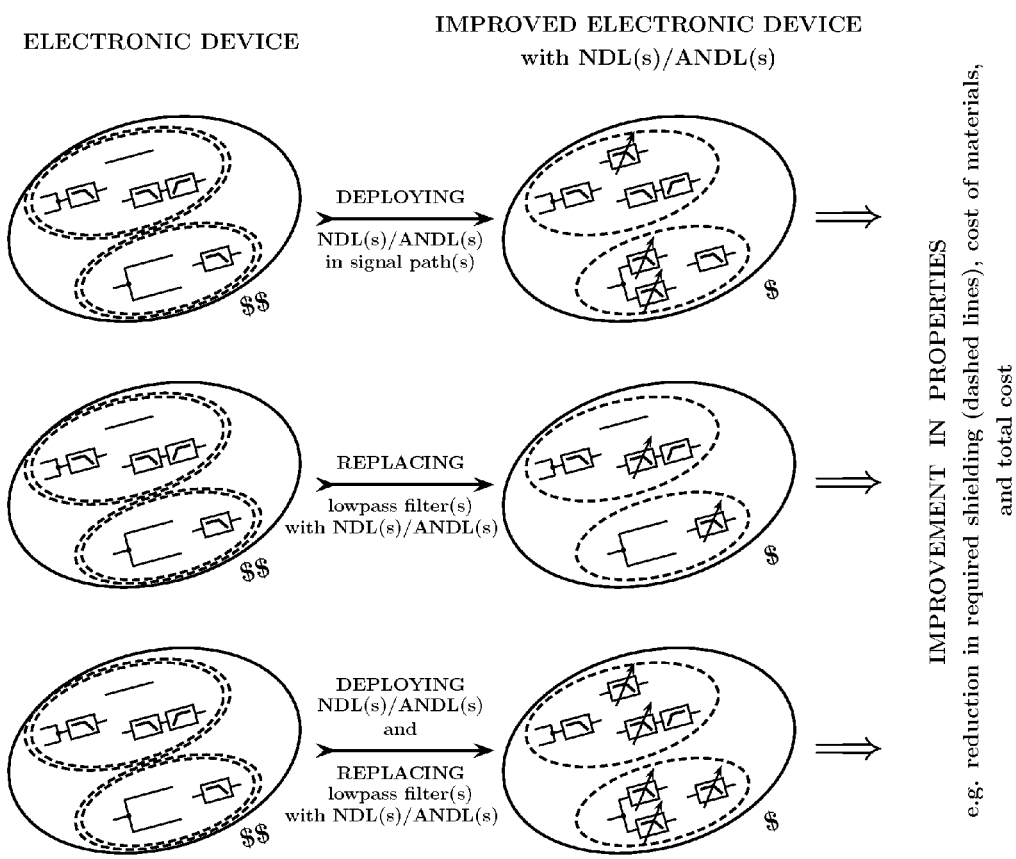

FIG. 111. Schematic illustration of improving properties of electronic devices by deploying NDL(s) in signal path(s), and/or by replacing linear filter(s) with NDL(s), with emphasis on the reduction in required shielding (dashed lines), cost of materials, and the total cost.

Figure 112:
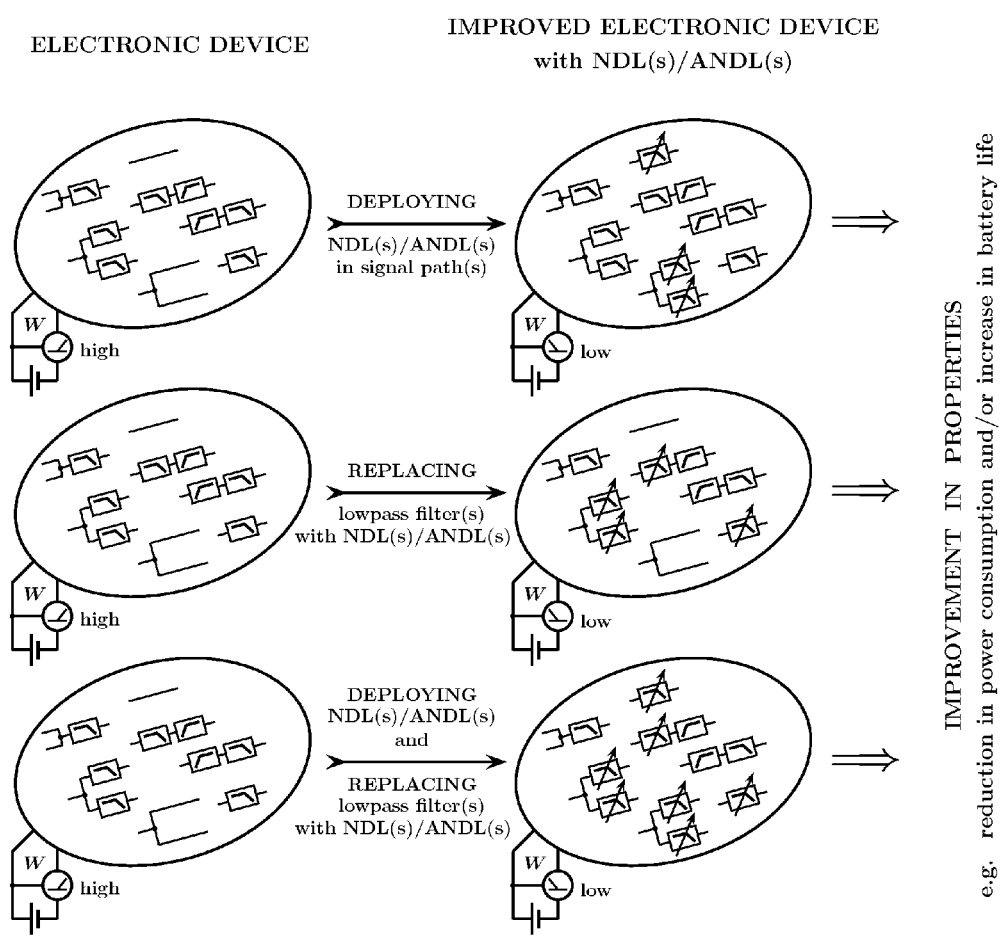

FIG. 112. Schematic illustration of improving properties of electronic devices by deploying NDL(s) in signal path(s), and/or by replacing linear filter(s) with NDL(s), with emphasis on the reduction in power consumption and/or increase in battery life.

Figure 113:
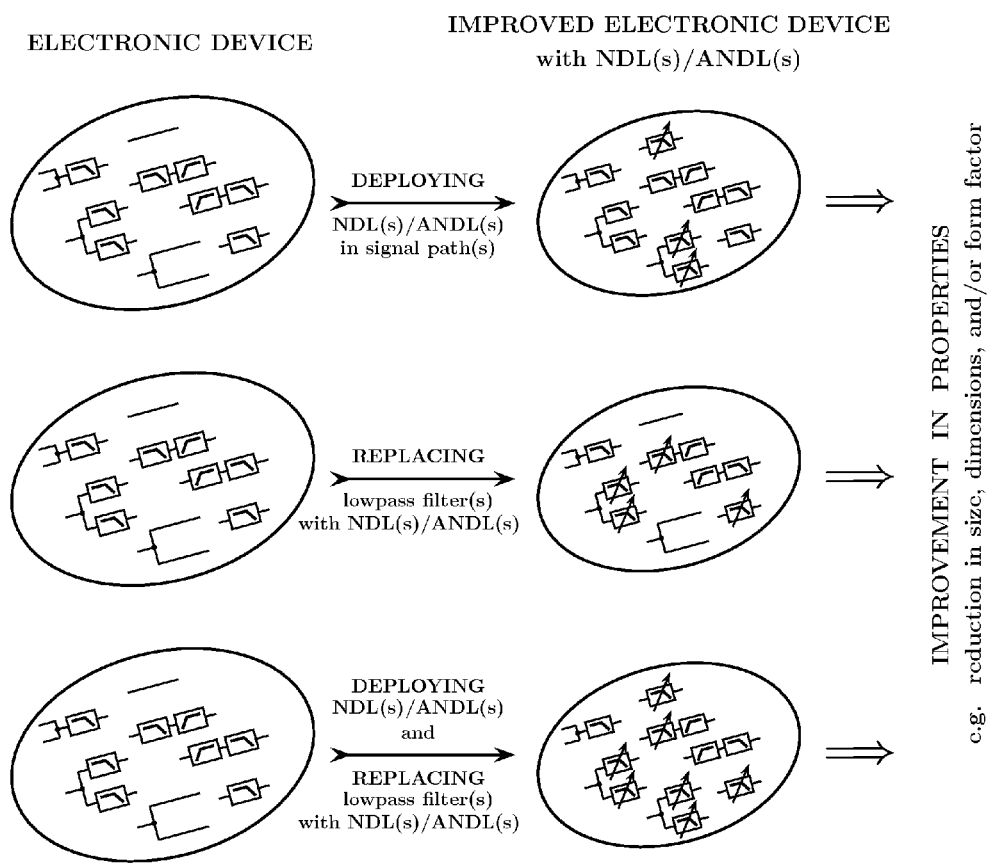

FIG. 113. Schematic illustration of improving properties of electronic devices by deploying NDL(s) in signal path(s), and/or by replacing linear filter(s) with NDL(s), with emphasis on the reduction in size, dimensions, and/or form factor.

Figure 114:
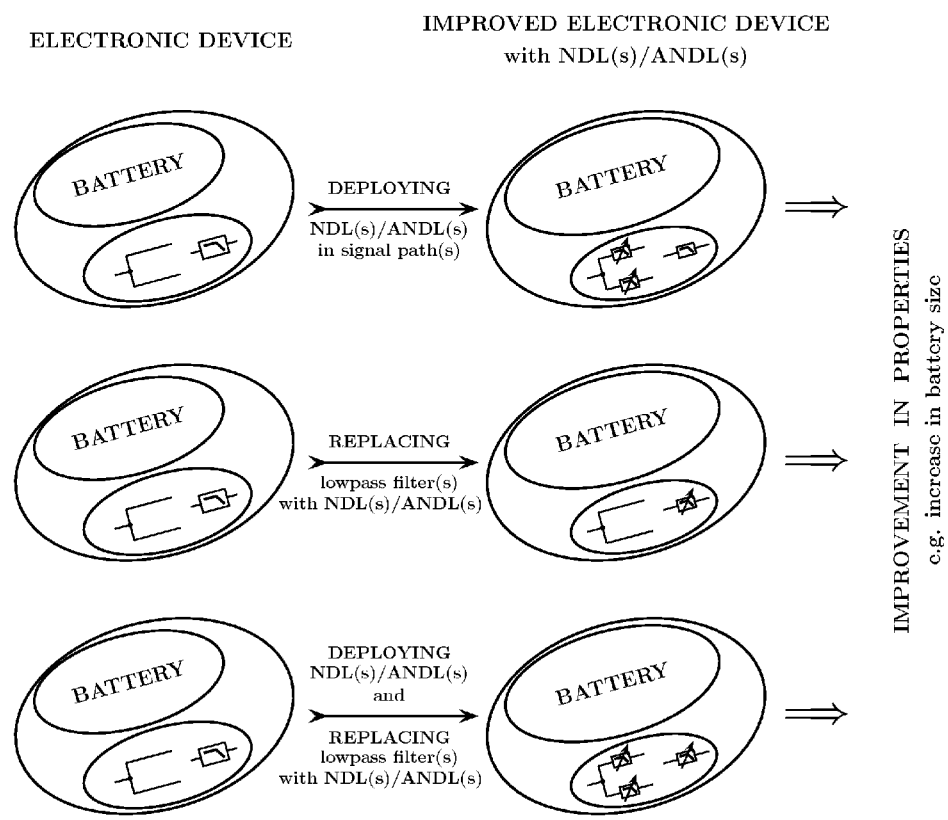

FIG. 114. Schematic illustration of improving properties of electronic devices by deploying NDL(s) in signal path(s), and/or by replacing linear filter(s) with NDL(s), with emphasis on the increase in battery size.

Figure 115:
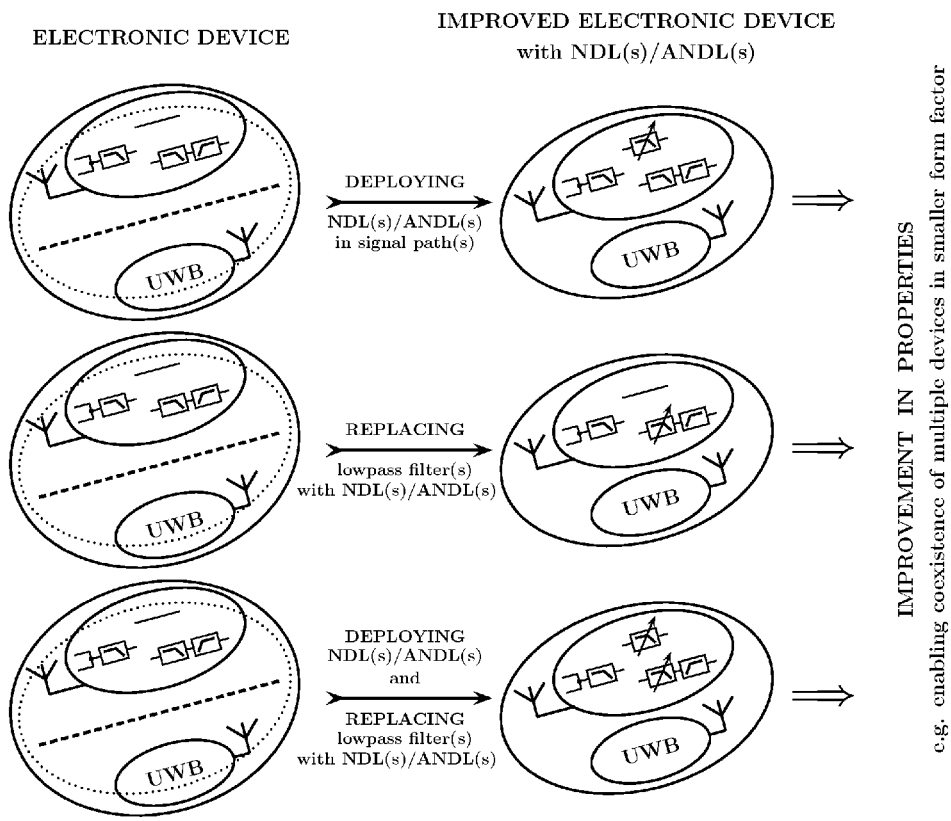

FIG. 115. Schematic illustration of improving properties of electronic devices by deploying NDL(s) in signal path(s), and/or by replacing linear filter(s) with NDL(s), with emphasis on enabling coexistence of multiple devices in a smaller form factor.

Figure 116:
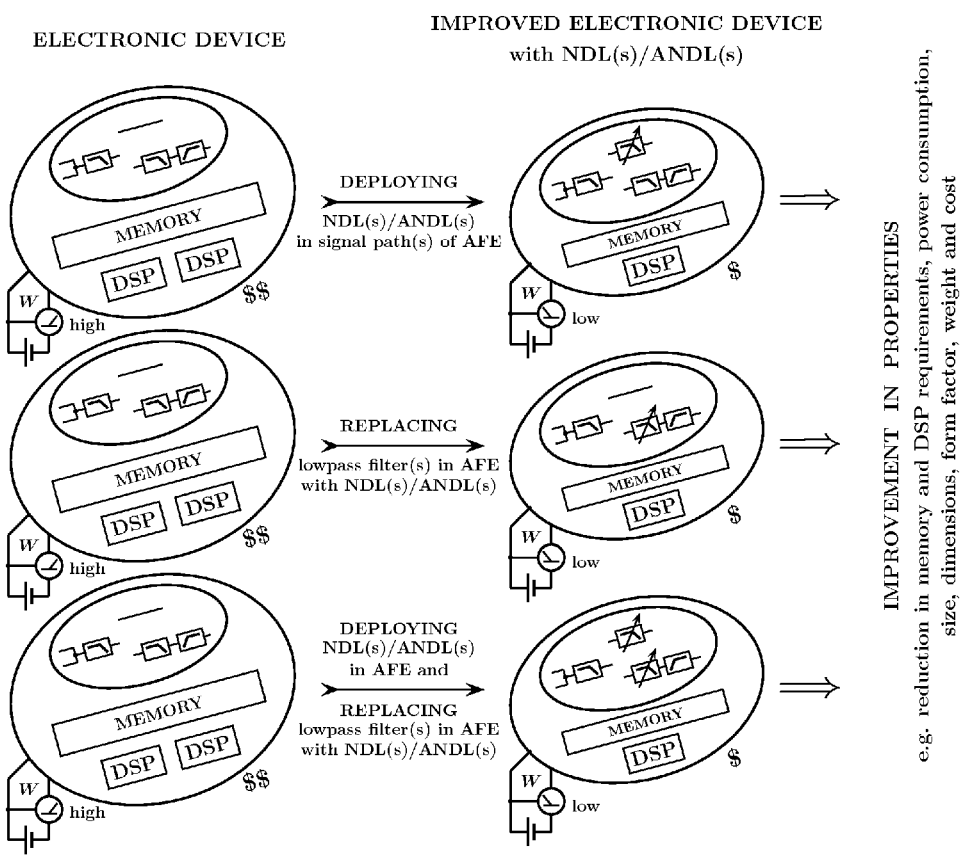

FIG. 116. Schematic illustration of improving properties of electronic devices by deploying NDL(s) in signal path(s), and/or by replacing linear filter(s) with NDL(s), with emphasis on the reduction in memory and DSP requirements, power consumption, size, dimensions, form factor, weight and cost.

Figure 117:
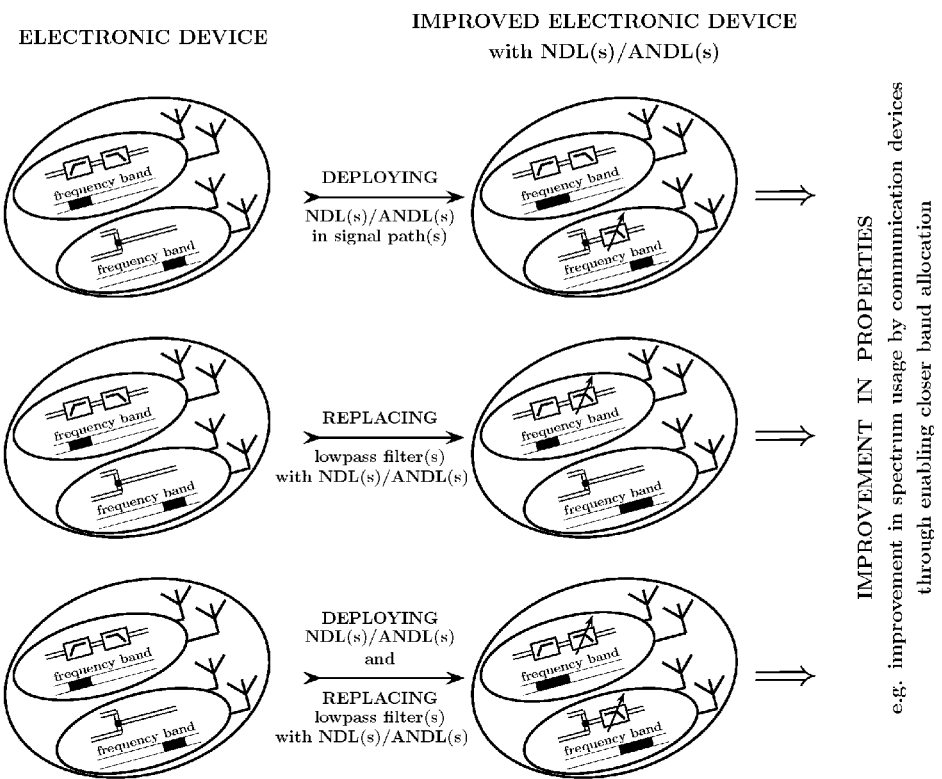

FIG. 117. Schematic illustration of improving properties of electronic devices by deploying NDL(s) in signal path(s), and/or by replacing linear filter(s) with NDL(s), with emphasis on the improvement in spectrum usage by communication devices through enabling closer band allocation.

Figure 118:
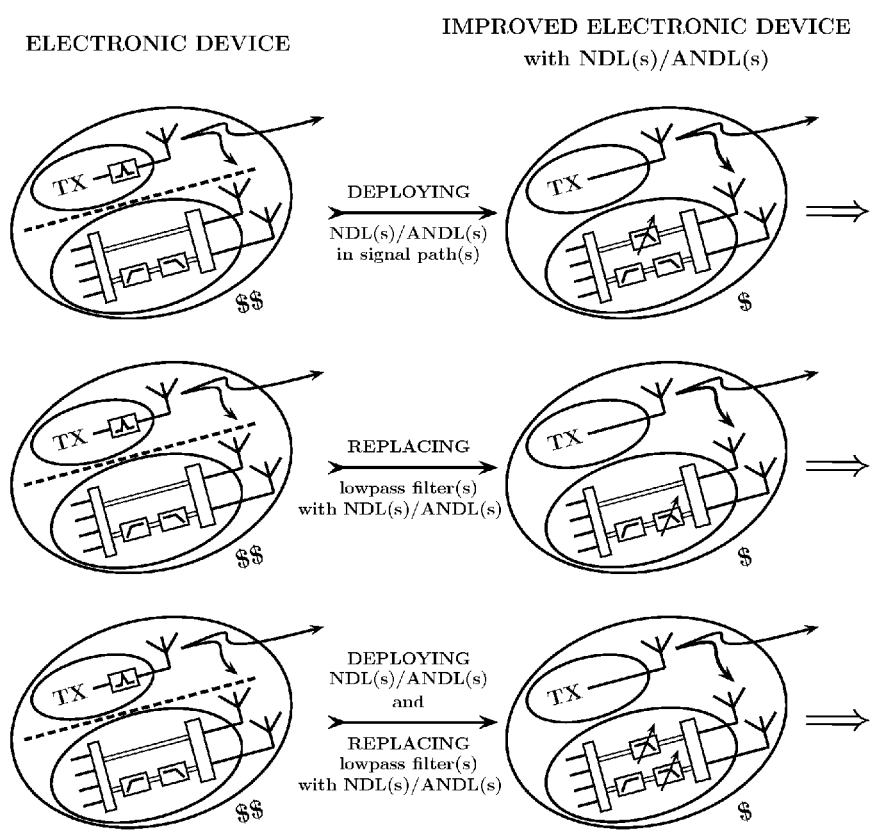

FIG. 118. Schematic illustration of improving properties of electronic devices by deploying NDL(s) in signal path(s), and/or by replacing linear filter(s) with NDL(s), with emphasis on the reduction in component count, cost of materials, and the total cost.

Figure 119:
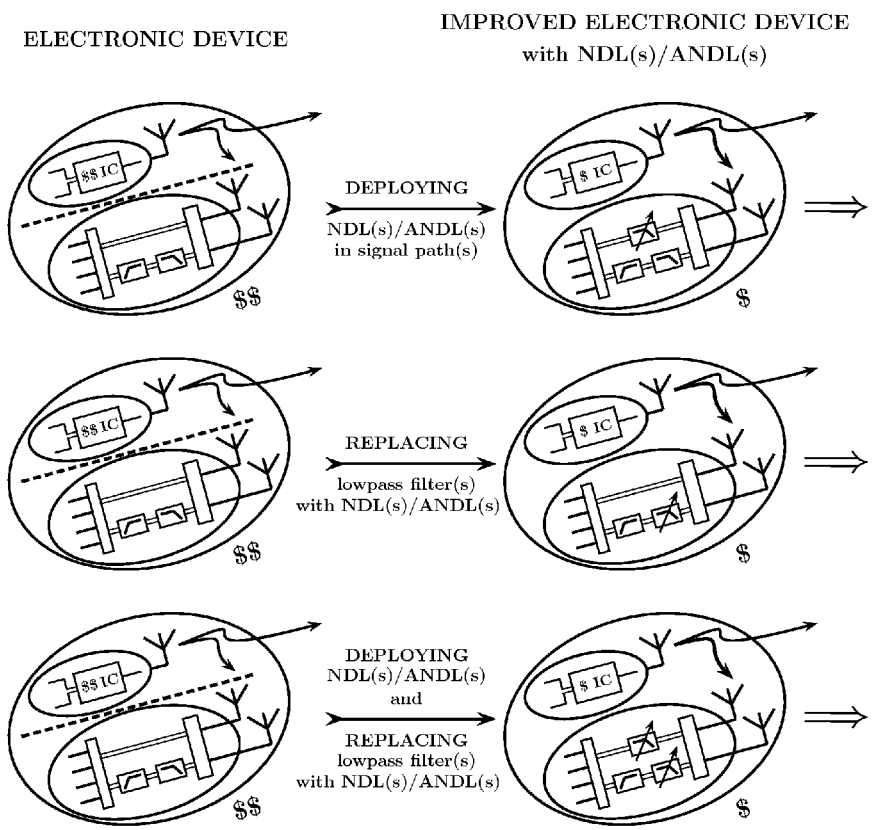

FIG. 119. Schematic illustration of improving properties of electronic devices by deploying NDL(s) in signal path(s), and/or by replacing linear filter(s) with NDL(s), with emphasis on the reduction in cost of components, materials, and the total cost.

ABBREVIATIONS

ACI: Adjacent-Channel Interference; A/D: Analog-to-Digital Converter; ADC: Analog-to-Digital Converter; AFE: Analog Front End; aka: also known as; ANDL: Adaptive Nonlinear Differential Limiter; AWGN: Additive White Gaussian Noise; CDL: Canonical Differential Limiter; CDMA: Code Division Multiple Access; DAC: Digital-to-Analog Converter; DC: Direct Current; DcL: Differential critical Limiter; DoL: Differential over-Limiter; DSL: Digital Subscriber Line; DSP: Digital Signal Processing/Processor; EMI: Electromagnetic Interference; FIR: Finite Impulse Response; FPGA: Field Programmable Gate Array; GPS: Global Positioning System; HSDPA: High Speed Downlink Packet Access; IC: Integrated Circuit; ICI: Inter-Channel Interference; I/Q: In-phase/Quadrature; IQR: interquartile range; LCD: Liquid Crystal Display; LFE: Linear Front End; MAD: Mean/Median Absolute Deviation; MATLAB: MATrix LABoratory (numerical computing environment and fourth-generation programming language developed by MathWorks); MCT: Measure of Central Tendency; MEMS: Micro-ElectroMechanical System; MOS: Metal-Oxide-Semiconductor; NDL: Nonlinear Differential Limiter; OOB: Out-Of-Band; PDF: Probability Density Function; PSD: Power Spectral Density; PSRR: Power-Supply Rejection Ratio; RF: Radio Frequency; RFI: Radio Frequency Interference; RMS: Root Mean Square; RRC: Root Raised Cosine; RX: Receiver; SAR: Synthetic Aperture Radar; SMPS: Switched-Mode Power Supply; SNR: Signal to Noise Ratio; SPART: Single Point Analog Rank Tracker; TX: Transmitter; UWB: Ultra-wideband; VLSI: Very-Large-Scale Integration; WiFi: Wireless Fidelity (a branded standard for wirelessly connecting electronic devices); WLAN: Wireless Local Area Network; WSN: Wireless Sensor Network; ZigBee: a specification for a suite of communication protocols based on an IEEE 802 standard for personal area networks (the name refers to the waggle dance of honey bees)

DETAILED DESCRIPTION

As required, detailed embodiments of the present invention are disclosed herein. However, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Moreover, except where otherwise expressly indicated, all numerical quantities in this description and in the claims are to be understood as modified by the word "about" in describing the broader scope of this invention. Practice within the numerical limits stated is generally preferred. Also, unless expressly stated to the contrary, the description of a group or class of materials as suitable or preferred for a given purpose in connection with the invention implies that mixtures or combinations of any two or more members of the group or class may be equally suitable or preferred.

The detailed description of the invention is organized as follows.

Section 1("Linear lowpass filters") provides an introductory general discussion of linear lowpass filters.

Section 2 ("Nonlinear differential limiters") introduces basic nonlinear differential limiters and provides their general discussion.

Section 3 ("Mathematical description of 1st order differential limiter") contains mathematical description of a 1st order NDL. In 3.1("Specifying range of linear behavior by resolution parameter") this NDL is further characterized by a resolution parameter, and in 3.2 ("1st order differential limiters as 1st order lowpass filters with feedback-controlled parameter") a 1st order differential limiter is described as a 1st order lowpass filter with a feedback-controlled parameter.

Section 4 ("2nd order differential limiters") provides a general description of a 2nd order NDL along with illustrative examples of its implementation.

Section 5 ("Canonical differential limiters (CDLs)") introduces the canonical differential limiters (CDLs) as NDLs with a particular dependence of their bandwidth and/or filter parameters on the difference signal. Subsection 5.1("Comparison of responses to various forcing functions of 1st and 2nd order CDLs and respective linear filters"), in its divisions 5.1.1 ("Step function"), 5.1.2 ("Boxcar pulses of different durations"), 5.1.3 ("Ramp function"), and 5.1.4 ("Combination of ramp function and boxcar pulses"), provides illustrative comparison of responses of the 1st and 2nd order CDLs to various forcing functions with the responses of respective linear filters.

Section 6 ("Differential critical limiters") introduces the differential critical limiters (DcLs) as NDLs with a particular type of dependence of their filter parameters on the difference signal. Subsection 6.1("Differential critical limiters with quantile offsets") discusses differential critical limiters with quantile offsets, and shows that such limiters may be used as analog rank filters for scalar as well as complex and vector signals.

Subsection 6.2 ("Numerical implementation of CDL with optional quantile offset") provides an example of numerical implementation of a 1st order DcL (CDL) with optional quantile offset for a real and/or complex signal.

Section 7 ("Real-time tests of normality and real-time detection and quantification of impulsive interference") discusses the use of small-$\alpha$ DcLs with quantile offsets for construction of various real-time methods and apparatus for tests of normality and for detection and quantification of impulsive interference.

Section 8 ("Adaptive NDLs (ANDLs)") introduces NDLs with a resolution parameter that is adaptively controlled by negative feedback.

Section 9 ("Differential over-limiters (DoIs)") describes the differential over-limiters as NDLs with a particular type of dependence of their filter parameters on the difference signal.

Section 10 ("Examples of OTA-based implementations of NDLs") provides examples of idealized algorithmic implementations of nonlinear differential limiters based on the operational transconductance amplifiers (OTAs). Transconductance cells based on the metal-oxide-semiconductor (MOS) technology represent an attractive technological platform for implementation of such active nonlinear filters as NDLs, and for their incorporation into IC-based signal processing systems. NDLs based on transconductance cells offer simple and predictable design, easy incorporation into ICs based on the dominant IC technologies, small size (10 to 15 small transistors are likely to use less silicon real estate on an IC than a real resistor), and may be usable from the low audio range to gigahertz applications. The examples of this section also illustrate how NDLs that comprise electronic components may be implemented through controlling values of these components by the difference between the input signal and a feedback of the output signal.

Subsection 10.1("'RC' implementation of 1st order CDL") provides an illustration of a 1st order CDL implemented as an RC integrator with a control of the resistive element, while Subsection 10.2 ("Complex-valued 1st order CDL and DoL") illustrates extensions of this implementation to include complex-valued 1st order CDLs and DoLs.

Subsection 10.3 ("CDLs with quantile offset") describes illustrative implementations of CDLs with quantile offsets for both real- and complex-valued signals.

Subsection 10.4 ("'LR' OTA implementation of 1st order CDL with control of resistive element"), Subsection 10.5 ("'LR' OTA implementation of 1st order CDL with control of reactive element"), and Subsection 10.6 ("'LR' OTA implementation of 1st order CDL with control of both resistive and reactive elements") show that when a 1st order lowpass filter is an LR circuit, this filter can be converted into an NDL by controlling either or both the resistive and the reactive elements.

Subsection 10.7 ("'LR' OTA implementations of 1st order complex-valued CDL and DoL with control of resistive elements") extends the implementation of Subsection 10.4 to complex-valued CDLs and DoLs.

Subsection 10.8 ("Complex-valued 'RC' CDL with varicaps") provides an illustration of a 1st order CDL implemented as an RC integrator with a control of the reactive element (capacitance).

Subsection 10.9 ("OTA-based implementation of 2nd order CDL") provides an example of an OTA-based implementation of a 2nd order CDL with a constant pole quality factor.

Section 11("Examples of high-order NDLs for replacement of lowpass filters") illustrates the construction of higher-order NDL-based lowpass filters by converting initial stages of cascaded lowpass filters into NDLs/ANDLs, and Subsection 11.1("Improved FrankenSPART filtering circuit") provides a discussion of improved FrankenSPART-based filters.

Section 12 ("Improved NDL-based filters comprising linear front-end filters to suppress non-impulsive component of interference and/or to increase its peakedness") discusses improving effectiveness of NDL-based filters by preceding the basic NDLs with linear front-end filters in order to suppress the non-impulsive component of the interference and/or to increase the peakedness of the interference.

Section 13 ("Examples of NDL applications") and its divisions provide some illustrations of NDL uses, along with clarifying discussions.

Subsection 13.1("NDL-based antialiasing filters to improve performance of ADCs") gives an illustration of using an NDL/ANDL filter as a replacement for an anti-aliasing filter to improve performance of an analog-to-digital converter.

Subsection 13.2 ("Impulsive noise mitigation") and its divisions illustrate the basic principles of the impulsive noise mitigation by nonlinear differential limiters.

Subsection 13.2.1("Measures of peakedness") discusses measures of peakedness that may be used to quantify impulsiveness of a signal. Subsection 13.2.2 ("Impulsive and non-impulsive noises and their peakedness along the signal processing chain") illustrates that peakedness of a signal may not be revealed by its power spectra, and that peakedness of impulsive noise typically decreases as the noise bandwidth is reduced by linear filtering.

Subsection 13.2.3 ("Linear filtering of signal affected by impulsive and non-impulsive noises of the same power") illustrates that, when linear filtering is used in the signal chain and the signal is affected by independent impulsive and/or non-impulsive noises of the same noise power density, there is no difference in the power densities for signals affected by impulsive and/or non-impulsive noise, and that the signal-to-noise ratios along the signal processing chain remain the same regardless the noise composition/peakedness.

In Subsection 13.2.4 ("NDL-based filtering of signal affected by impulsive and non-impulsive noises"), an NDL replaces a respective linear filter in the anti-aliasing portion of the signal chain. This example shows that, if an impulsive noise component is present, the NDL-based anti-aliasing filter may lower the noise floor throughout the subsequent signal chain (including the baseband) without affecting the signal.

Subsection 13.2.5 ("Mitigation of impulsive noise coupled from adjacent circuitry") discusses and illustrates NDL-based mitigation of impulsive noise in a simplified interference scenario where the noise is coupled into the signal chain from adjacent circuitry.

Subsection 13.2.6 ("Improving NDL-based mitigation of interference when the latter comprises impulsive and non-impulsive components") provides discussion and an illustrative example of NDL-based mitigation of interference when the latter comprises impulsive and non-impulsive components, while Subsection 13.2.7 ("Increasing peakedness of interference to improve its NDL-based mitigation") discusses and illustrates increasing peakedness of interference as a means to improve its NDL-based mitigation, including the mitigation of sub-Gaussian (non-impulsive) noise.

While the examples of Subsections 13.2.1 through 13.2.7 are given for real-valued signals, Subsection 13.2.8 ("Mitigation of impulsive noise in communication channels by complex-valued NDL-based filters") addresses the use of complex-valued NDLs and/or ANDLs for mitigation of impulsive noise in a communication channel. Subsection 13.2.8 also discusses a measure of peakedness for complex-valued signals, and provides performance comparison for several different NDLs and ANDLs.

Subsection 13.3 ("Mitigation of inter- and/or adjacent-channel interference") discusses and illustrates a particular problem of mitigating interchannel and/or adjacent-channel interference, which is an increasingly prevalent problem in the modern communications industry due to an elevated value of wireless spectrum.

Section 14 ("Method and apparatus for detection and quantification of impulsive component of interference") outlines a method and apparatus for obtaining knowledge about the composition of a noise mixture comprising impulsive and non-impulsive components. This knowledge may be used to design improved NDL-based filters comprising linear front-end filters for suppression of the non-impulsive component of the interference. Such improved NDL-based filters may greatly increase the effectiveness of the interference mitigation when the interfering signal comprises a mixture of impulsive and non-impulsive components.

Section 15 ("Improvements in properties of electronic devices") provides discussion and illustrative examples of improving physical, commercial, and/or operational properties of electronic devices through NDL-based mitigation of interference (in particular, that of technogenic origin) affecting signals of interest in a device.

1 Linear Lowpass Filters

The general transfer function of a lowpass filter is obtained by the linear mapping of the Laplace transform of the input x(t) to the output $\chi(t)$ and may be written as follows:

$$\frac{\mathcal{L}\{x(t)\}}{\mathcal{L}\{\chi(t)\}} = \frac{G_0}{\Pi_k(1 + a_k s + b_k s^2)}, \qquad (2)$$

where $s=\sigma+i\omega$ is the complex frequency, $G_0$ is the gain at $s=0$, and $a_k>0$ and $b_k \geq 0$ are the filter coefficients.

For a linear filter all coefficients $a_k$ and $b_k$ are constants, and the ratio $Q_k=\sqrt{b_k}/a_k$ is defined as the pole quality.

The multiplication of the denominator terms in equation (2) with each other yields an $n^{th}$ order polynomial of s, with n being the filter order.

Different sets of the coefficients $a_k$ and $b_k$ distinguish among different filter types such as Butterworth, Chebyshev, Bessel, and other filters.

Since the coefficients $a_k$ and $b_k$ for a specific filter type are in a definite relation to each other, a lowpass filter of a given type and order may be characterized by a single parameter such as, for example, the cutoff frequency.

Without loss of generality, the gain $G_0$ may be set to unity to simplify the subsequent discussions of nonlinear differential limiters. One skilled in the art will recognize that a non-unity gain may be easily handled through appropriate scaling of the output signal and its feedback.

For a first-order filter, the coefficient b is always zero, b=0, thus yielding $$\frac{\mathcal{L}\{x(t)\}}{\mathcal{L}\{\chi(t)\}} = \frac{1}{1+as} = \frac{1}{1+\tau_c s} = \frac{1}{1+s/\omega_c}, \qquad (3)$$

where $\omega_c = 1/\tau_c = 1/a$ is the corner or cutoff frequency.

The transfer function of the 1st order filter given by equation (3) has a single pole at $s=-\omega_c$.

For a second-order filter, the transfer function is $$\frac{\mathcal{L}\{x(t)\}}{\mathcal{L}\{\chi(t)\}} = \frac{1}{1+as+bs^2} = \frac{1}{1+\tau_c s/Q + \tau_c^2 s^2} = \frac{1}{1+s/(\omega_c Q) + s^2/\omega_c^2}, \qquad (4)$$

where $Q=\sqrt{b}/a$ is the pole quality factor and $\omega_c = 1/\tau_c = 1/\sqrt{b}$ is the cutoff frequency.

When $Q>\frac{1}{2}$, the transfer function of the 2nd order filter given by equation (4) has two complex poles at $$s = -\frac{\omega_c}{2Q}(1 \pm i\sqrt{4Q^2 - 1})$$

on the circle of radius $\omega_c$.

When $Q \leq \frac{1}{2}$, the transfer function of the 2nd order filter given by equation (4) has two real negative poles at $$s = -\frac{\omega_c}{2Q}(1 \pm \sqrt{1 - 4Q^2}),$$

thus corresponding to two cascaded 1st order lowpass filters.

An $n^{th}$-order filter may be constructed by cascading filters of lower order. A filter with an even order number n=2m consists of m second-order stages only, while filters with an odd order number n=2m+1 include an additional first-order stage (m+1 stages total).

In hardware implementations, in order to avoid saturation of individual stages, the filters are typically cascaded in the order of rising $Q_k$ values. Thus, for example, an odd-order filter contains a 1st order filter as the first stage.

Since a lowpass filter of an arbitrary order may be constructed by cascading filters of 1st and 2nd order, the subsequent discussion of the Nonlinear Differential Limiters (NDLs) will focus on the NDLs of the first and second order.

When an $n^{th}$-order filter is constructed from cascaded filters, the final output $\chi(t)$ as well as the intermediate outputs $\chi_k(t)$ of the stages may be obtained.

For complex and vector signals, the transfer function given by equation (2) describes the mapping of the respective components (for example, the real and imaginary components of a complex signal) of the input and the output.

2 Nonlinear Differential Limiters

For a linear filter all coefficients $a_k$ and $b_k$ in equation (2) are constants, and when the input signal x(t) is increased by a factor of K, the output is also increased by the same factor, as is the difference between the input and the output. For convenience, we will call the difference between the input and the output $x(t)-\chi(t)$ the difference signal.

When an $n^{th}$-order filter is constructed from cascaded filters, we may also obtain the intermediate difference signals such as $x(t)-\chi_k(t)$ and the difference signals $\chi_l(t)-\chi_k(t)$ between various stages, k>l.

A transient outlier in the input signal will result in a transient outlier in the difference signal of a filter, and an increase in the input outlier by a factor of K will result, for a linear filter, in the same factor increase in the respective outlier of the difference signal.

If a significant portion of the frequency content of the input outlier is within the passband of the linear filter, the output will typically also contain an outlier corresponding to the input outlier, and the amplitudes of the input and the output outliers will be proportional to each other.

The reduction of the output outliers, while preserving the relationship between the input and the output for the portions of the signal not containing the outliers, may be done by proper dynamic modification of some of the filter coefficients in equation (2) based on the magnitude (for example, the absolute value) of the total and/or partial difference signals. A filter comprising such proper dynamic modification of the filter coefficients based on the magnitude of the difference signal(s) is a Nonlinear Differential Limiter (NDL).

Since the filters disclosed in the present invention limit the magnitude of the output outliers, these filters are called limiters. Since the proper dynamic modification of the filter coefficients is based on the magnitude of the difference signal(s), these filters are called differential. Since at least some of the filter coefficients depend on the instantaneous magnitude of the difference signal(s), these coefficients are functions of time and the differential equations describing the filter behavior are no longer linear but nonlinear. As a consequence, these filters are nonlinear. Hence we may refer to the present invention generally by the term Nonlinear Differential Limiters, or NDLs.

When any of the coefficients in equation (2) depend on the difference signal(s), the resulting NDL filter is no longer linear in general. However, if the coefficients remain constant as long as the magnitude of the difference signal(s) remains within a certain range, the behavior of the NDL filter will be linear during that time.

An NDL may be configured to behave linearly as long as the input signal does not contain outliers. By specifying a proper dependence of the NDL filter parameters on the difference signal(s) it may be ensured that, when the outliers are encountered, the nonlinear response of the NDL filter limits the magnitude of the respective outliers in the output signal.

For example, for both 1st and 2nd order filters given by equations (3) and (4), respectively, their cutoff (corner) frequency $\omega_c$ may be dynamically modified by making it a non-increasing continuous function of the absolute value of the difference signal $|x(t)-\chi(t)|$: $\omega_c = \omega_c(|x-\chi|) \geq \omega_c(|x-\chi|+\epsilon)$ for $\epsilon > 0$. While this absolute value remains small, the cutoff frequency should remain essentially constant and equal to some initial maximum value $\omega_c = \omega_c(0) = \omega_0$.

When this absolute value becomes larger, the cutoff frequency should become a decreasing function of its argument, $$\omega_c(|z|+\epsilon) < \omega_c(|z|) \leq \omega_0 \text{ for } \epsilon > 0, \quad (5)$$

for example, inversely proportional to $|x(t)-\chi(t)|$.

Since the cutoff frequency $\omega_c$ represents the absolute (radial) value of the filter poles in the S-plane, such dependence of the cutoff frequency on the difference signal will result in the poles moving closer to the origin as the absolute value of the difference signal increases, approaching the origin ($\omega_c = 0$) in the limit of large absolute values of the difference.

For a 2nd order filter given by equation (4), an alternative (or additional) modification of the filter parameters may be accomplished by making the pole quality factor Q a non-increasing continuous function of the absolute value of the difference signal $|x(t)-\chi(t)|$: $Q=Q(|x-\chi|) \geq Q(|x-\chi|+\epsilon)$ for $\epsilon > 0$. While said absolute value remains small, the pole quality factor remains essentially constant and equal to some initial maximum value $Q=Q(0)=Q_0$.

When said absolute value becomes larger, the pole quality factor should become a decreasing function of its argument, $$Q(|z|+\epsilon) < Q(|z|) \leq Q_0 \text{ for } \epsilon > 0, \quad (6)$$

for example, inversely proportional to $|x(t)-\chi(t)|$.

If the maximum value of the pole quality factor $Q_0$ is larger than ½, the initial reduction of Q, while $Q \geq ½$, results in the filter poles moving closer to the real axis in the S-plane while remaining on the circle of radius $\omega_c$.

The further reduction in Q results in two real negative poles at $$s = -\frac{\omega_c}{2Q}(1 \pm \sqrt{1-4Q^2}),$$

thus corresponding to two cascaded 1st order lowpass filters. The pole quality factor approaches zero in the limit of large absolute values of the difference signal, moving one pole further away from the origin, while moving the other pole closer to the origin. The resulting filter approaches a single 1st order lowpass filter with the pole at $s = -\omega_c Q$ (close to the origin).

It should be noted that, if the bandwidth of a lowpass filter is defined as an integral over all frequencies (from zero to infinity) of a product of the frequency with the filter frequency response, divided by an integral of the filter frequency response over all frequencies, the reduction of the cutoff frequency and/or the reduction of the pole quality factor both result in the reduction of the filter bandwidth, as the latter is a monotonically increasing function of the cutoff frequency, and a monotonically increasing function of the pole quality factor.

Additional details of various dependencies of the NDL filter bandwidth and parameters on the difference signal(s) will be discussed further in this disclosure.

When an $n^{th}$-order filter is constructed from a sequence of cascaded filters, any subsequence of the intermediate stages (for example, between the intermediate signals $\zeta_i(t)$ and $\zeta_k(t)$) may be designated as an NDL. In practice, for more effective suppression of the broadband transients, the initial subsequence (between z(t) and $\zeta_k(t)$) may be preferred.

3 Mathematical Description of 1st Order Differential Limiter

A 1st order differential limiter may be viewed as a 1st order lowpass filter with a feedback-dependent time (or frequency) parameter, where the parameter is a monotonic function (non-decreasing for time, and non-increasing for frequency) of the absolute value of the difference between the input and the output signals. More precisely, given a complex-valued or vector input signal z(t), the output $\zeta(t)$ of such a limiter may be described by $$\zeta(t) = \int dt \frac{z(t) - \zeta(t)}{\tau_c(|z-\zeta|)} \quad (7)$$

$$= \int dt \omega_c(|z-\zeta|)[z(t) - \zeta(t)],$$

where $$\tau_c(|z|+\epsilon) \geq \tau_c(|z|) \geq \tau_0 \text{ for } \epsilon > 0, \quad (8)$$

and $$\omega_c(|z|+\epsilon) \leq \omega_c(|z|) \leq \omega_0 \text{ for } \epsilon > 0. \quad (9)$$

For vector signals, the magnitude (absolute value) of the difference signal may be defined as the square root of the sum of the squared components of the difference signal.

Both time and frequency parameters are real and positive parameters, and both integrands in equation (7) represent the rate of change of the output signal.

Figure 1:
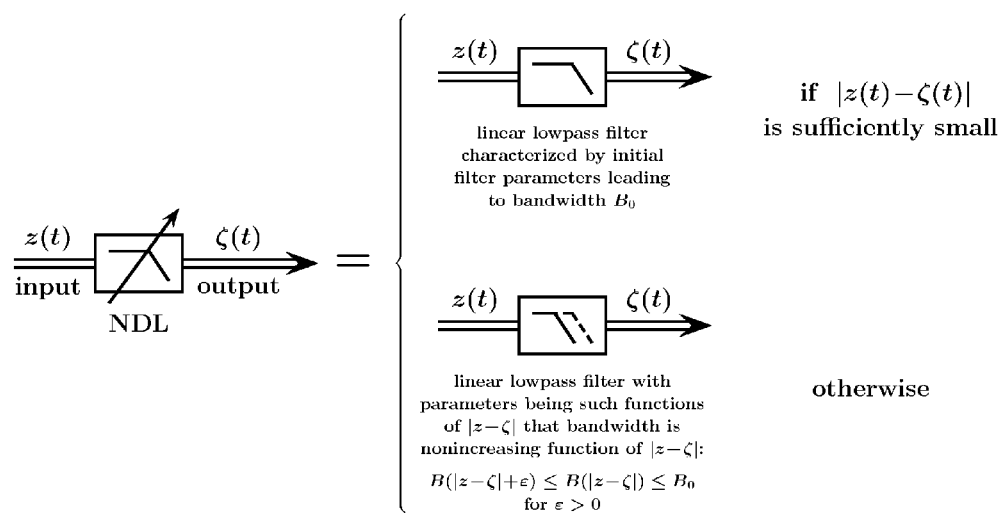
FIG. 1. Illustrative diagram of a Nonlinear Differential Limiter.
Figure 2:
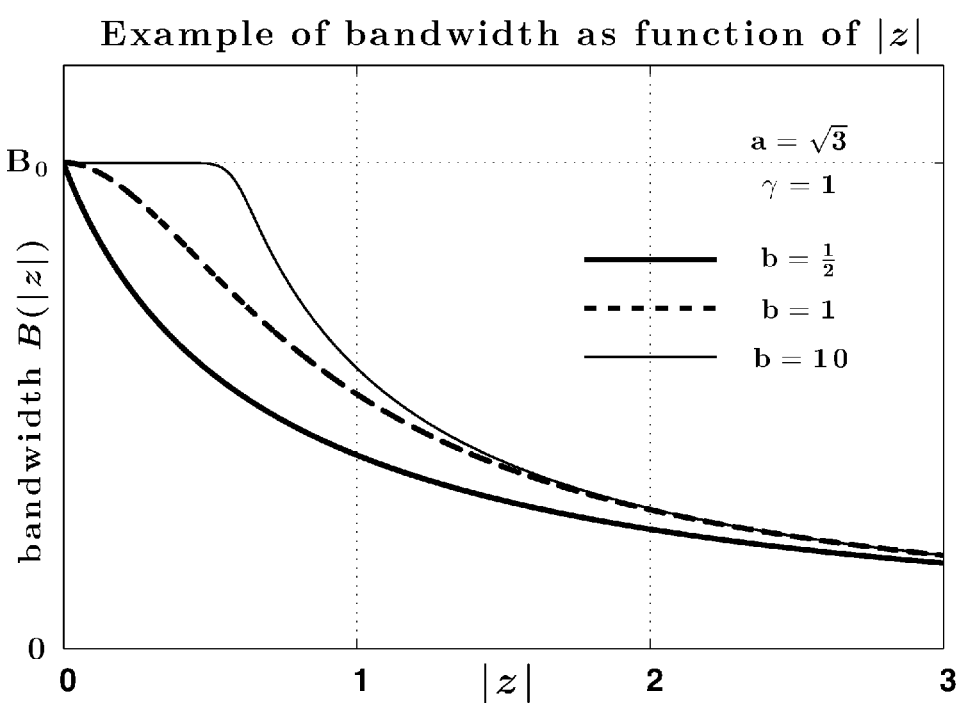
FIG. 2. Illustrative functional dependence of bandwidth on magnitude of difference signal.
Figure 3:
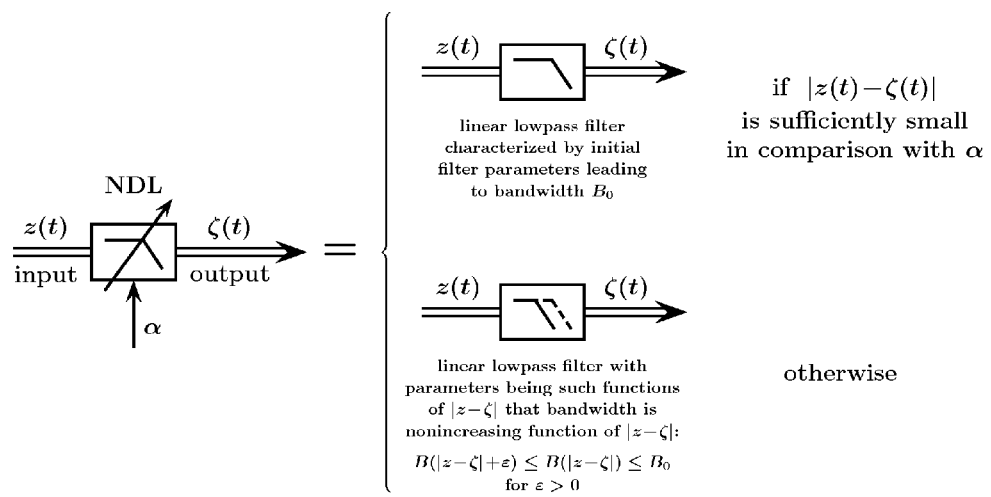
FIG. 3. Illustrative diagram of a Nonlinear Differential Limiter further characterized by a resolution parameter.
Figure 5:
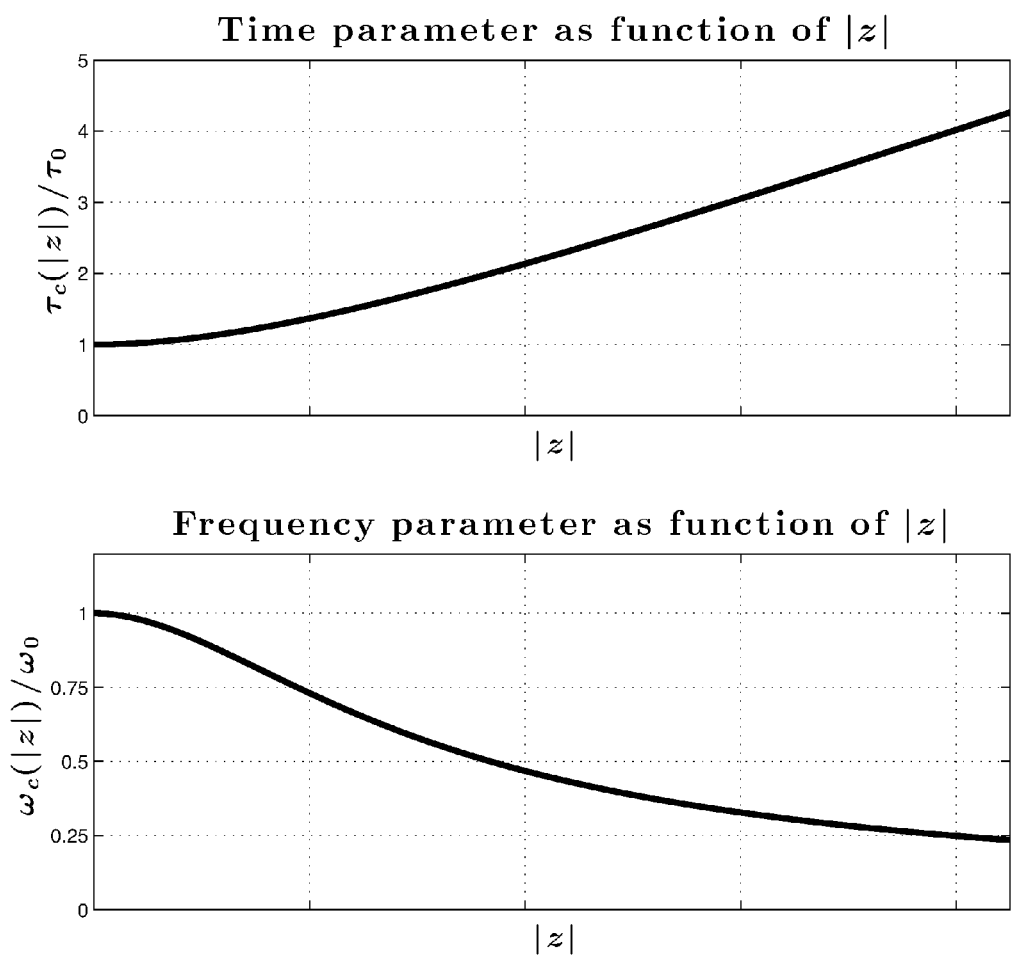
FIG. 5. Example of time and frequency parameters as functions of the absolute value of the difference signal according to equations (8) and (9).

FIG. 4 shows equations (7), (8), and (9) as block diagrams, providing figure descriptions of a 1st order nonlinear differential limiter method and/or circuit. FIG. 5 provides an example of time and frequency parameters as functions of the absolute value of the difference signal according to equations (8) and (9).

Based on equations (7), (8), and (9), and on FIG. 4 and FIG. 5, a 1st order NDL method and/or circuit may be given the following descriptions:

Given an input signal, a 1st order NDL produces an output signal, wherein the output signal is an antiderivative of a ratio of a difference signal and a time parameter, wherein the difference signal is the difference between the input signal and the output signal, and wherein the time parameter is a nondecreasing function of the magnitude of the difference signal.

Equivalently, given an input signal, a 1st order NDL produces an output signal, wherein the output signal is an antiderivative of a product of a difference signal and a frequency parameter, wherein the difference signal is the difference between the input signal and the output signal, and wherein the frequency parameter is a nonincreasing function of the magnitude of the difference signal.

3.1 Specifying Range of Linear Behavior by Resolution Parameter

The range of linear behavior of a 1st order NDL may be further controlled by specifying a resolution parameter α as follows:

$$\zeta(t; \alpha) = \int dt \frac{z(t) - \zeta(t; \alpha)}{\tau_c(|z - \zeta|)} \quad (10)$$
$$= \int dt \omega_c(|z - \zeta|)[z(t) - \zeta(t; \alpha)],$$

where $\{\tau_c(|z|) = \tau_0$ when $|z|$ is sufficiently small in comparison with $\alpha \tau_c(|z|+\epsilon) \geq \tau_c(|z|)$ for $\epsilon > 0$ otherwise, (11)

and $\{\omega_c(|z|) = \omega_0$ when $|z|$ is sufficiently small in comparison with $\alpha \omega_c(|z|+\epsilon) < \omega_c(|z|)$ for $\epsilon > 0$ otherwise. (12)

One may see from equation (11) that when the magnitude of the difference signal is small in comparison with the resolution parameter, the time parameter is equal to the minimum value of the time parameter, and when the magnitude of the difference signal is large in comparison with the resolution parameter, the time parameter is an increasing function of the magnitude of the difference signal.

One may also see from equation (12) that when the magnitude of the difference signal is small in comparison with the resolution parameter, the frequency parameter is equal to the maximum value of the frequency parameter, and when the magnitude of the difference signal is large in comparison with the resolution parameter, the frequency parameter is a decreasing function of the magnitude of the difference signal.

Figure 7:
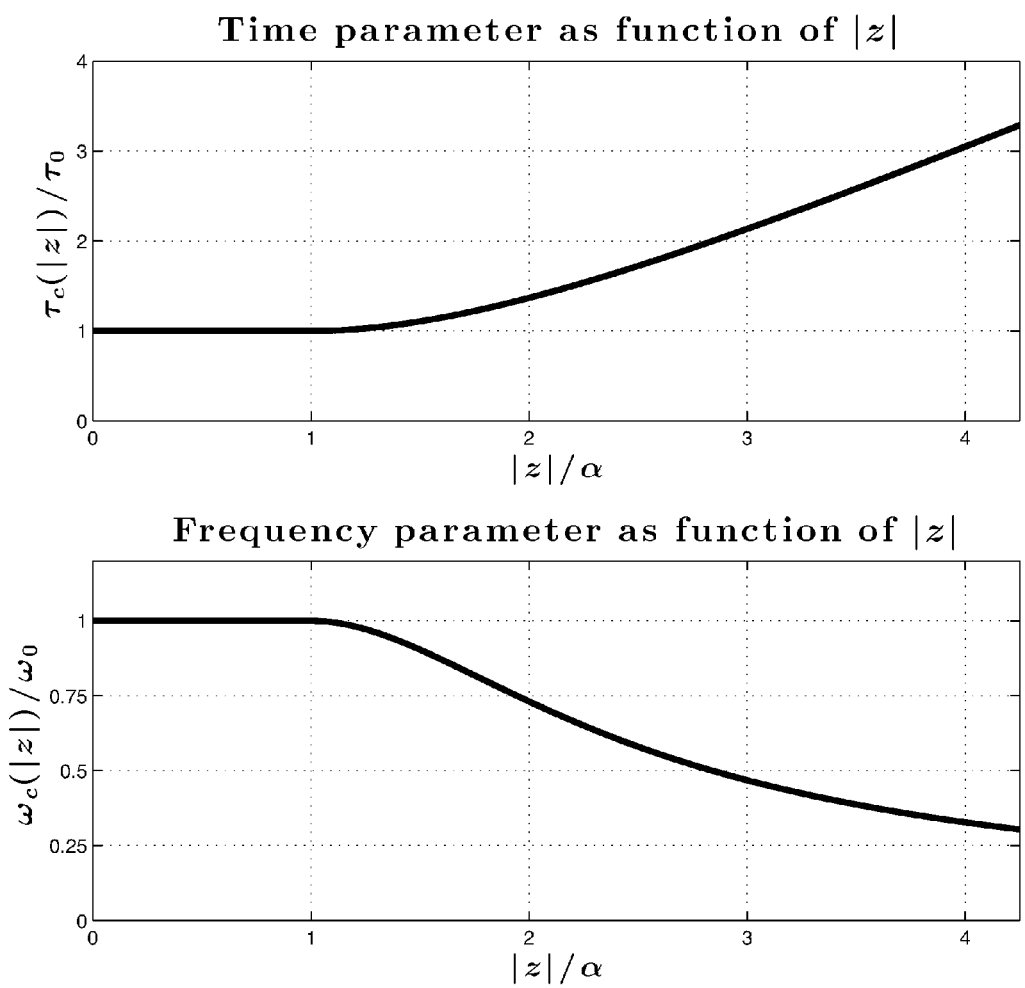
FIG. 7. Example of time and frequency parameters as functions of the absolute value of the difference signal with specified resolution parameter according to equations (11) and (12).

FIG. 6 shows equations (10), (11), and (12) as block diagrams, providing figure descriptions of nonlinear differential limiter method and/or circuit with specified resolution parameter. FIG. 7 provides an example of time and frequency parameters as functions of the magnitude of the difference signal according to equations (11) and (12).

3.2 1st Order Differential Limiters as 1st Order Lowpass Filters with Feedback-Controlled Parameter One skilled in the art will recognize that when the time parameter is constant, and/or the frequency parameter is constant, equation (7) describes the response of a 1st order lowpass filter. This is illustrated in panels (a) and (b) of FIG. 8, and in panels (a) and (b) of FIG. 9.

Figure 8:
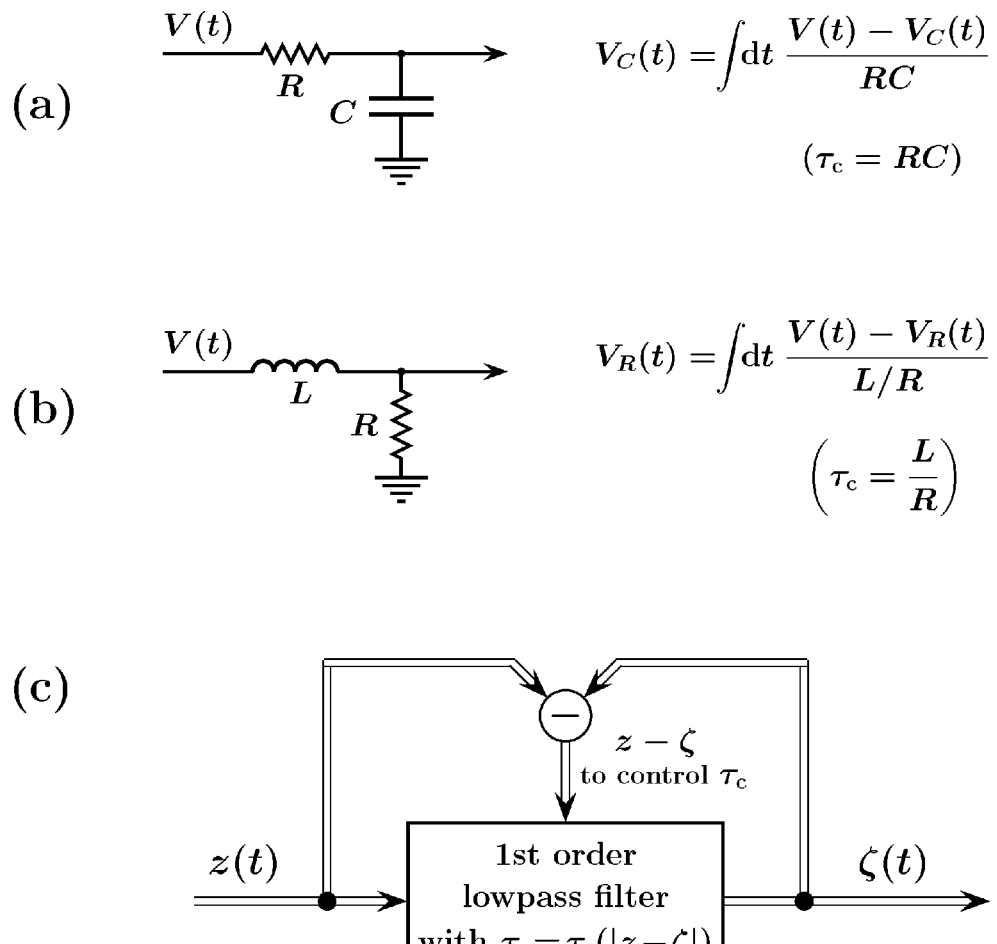
FIG. 8. Nonlinear differential limiter as 1st order lowpass filter with feedback-controlled time parameter.
Figure 9:
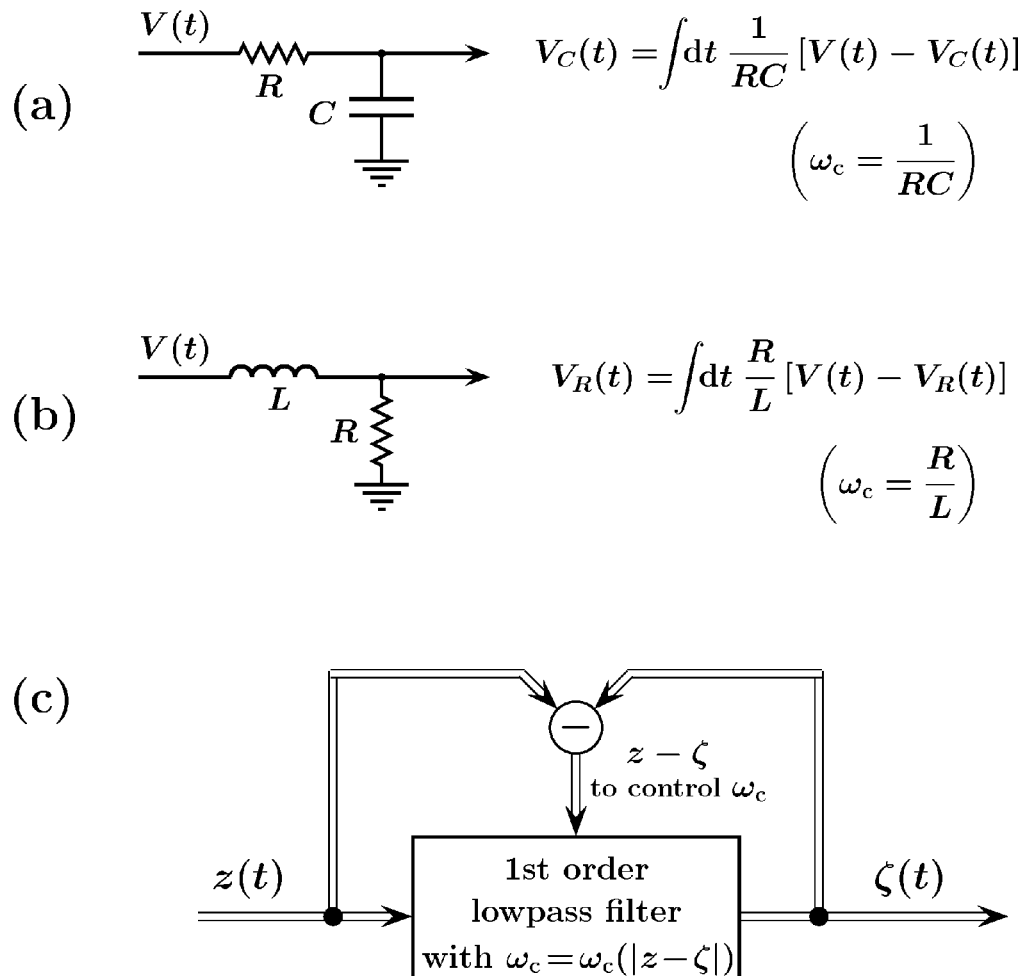
FIG. 9. Nonlinear differential limiter as 1st order lowpass filter with feedback-controlled frequency parameter.

Thus a 1st order NDL may be implemented by controlling, in a proper manner, both or either the resistive element and/or the reactive element in such a filter with the difference signal, as schematically indicated in panel (c) of FIG. 8, and in panel (c) of FIG. 9.

Note that the integrals in panels (a) and (b) of FIG. 8, and in panels (a) and (b) of FIG. 9 simply represent a convenient form of the mathematical relationship between the output of the limiter and the difference signal, and no explicit integration is actually required.

For example, the equation in panel (a) of FIG. 8 may be rewritten as $$V_C(t) = V(t) - \tau_c \dot{V}_C(t), \quad (13)$$

where the dot denotes the time derivative, which represents the output signal as the difference between the input signal and a signal proportional to the time derivative of the output.

Figure 10:
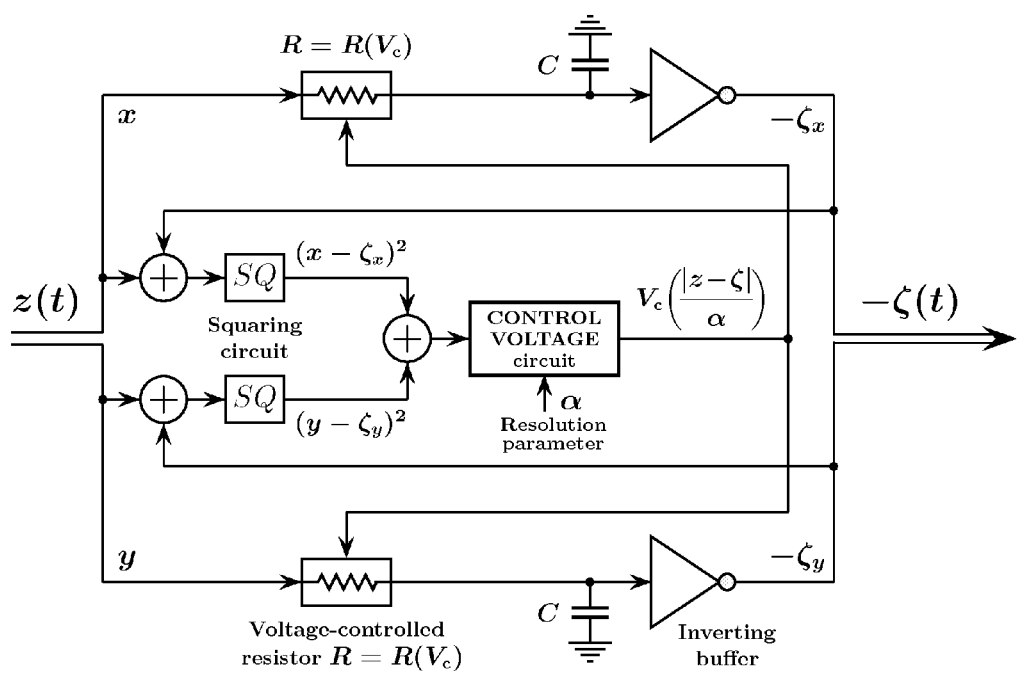
FIG. 10. Simplified block diagram of an illustrative circuit for electronic implementation of a complex-valued NDL, where the control of the time/frequency parameter is accomplished by a voltage-controlled resistor.

FIG. 10 shows a simplified block diagram of an illustrative circuit for electronic implementation of a complex-valued 1st order NDL, where the control of the time/frequency parameter is accomplished by a voltage-controlled resistor.

4 2nd Order Differential Limiters

The equation for the 1st order NDL may be written as $$\zeta(t) = z(t) - \tau \dot{\zeta}(t), \quad (14)$$

where the dot denotes the time derivative, and the non-decreasing time parameter $\tau = \tau(|z-\zeta|)$ equals to the cutoff time parameter $\tau_c = \tau_c(|z-\zeta|)$ defined previously.

Similarly, starting from equation (4) and setting the time parameter $\tau = \tau_c/Q$ for convenience of the subsequent analysis, the equation for the 2nd order NDL may be written as $$\zeta(t) = z(t) - \tau \dot{\zeta}(t) - (\tau Q)^2 \ddot{\zeta}(t), \quad (15)$$

where the double dot denotes the second time derivative.

As was discussed in Section 2, either $\tau_c$ or Q, or both $\tau_c$ and Q may be made functions of the magnitude of the difference signal (non-decreasing for $\tau_c$, and non-increasing for Q). However, it should be easy to see that the form of equation (15) allows us to consider only the two cases of either (i) only τ, or (ii) both τ and Q being functions of the magnitude of the difference signal. In this disclosure, a constant pole quality factor Q=const is normally assumed, and the attention is focused on the variable τ only, unless specifically stated otherwise.

Figure 11:
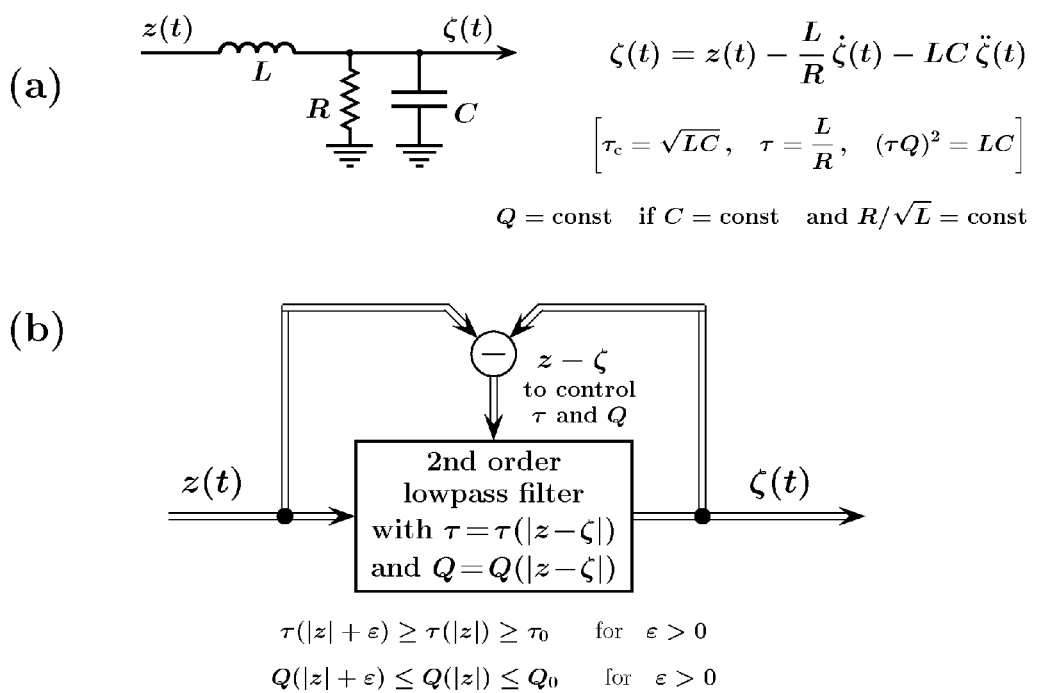
FIG. 11. Nonlinear differential limiter as 2nd order RLC lowpass filter with feedback-controlled time parameter and pole quality factor.

Panel (a) of FIG. 11 provides a simple illustration of a 2nd order linear RLC filter according to equation (15). This circuit may be transformed into a 2nd order NDL by making any combination of the circuit elements properly dependent on the absolute value of the difference signal, as schematically indicated in panel (b) of FIG. 11.

For example, the cutoff frequency $\omega_c$ of the RLC filter shown in FIG. 11 is independent of the resistance R, while the pole quality factor Q is proportional to the resistance. Thus making the resistance in the circuit a non-increasing function of the absolute value of the difference signal (strictly decreasing for a large argument), R=R(|z-ζ|), will implement a constant-$\omega_c$ NDL filter described in Section 2.

If the resistance R and the inductance L of the RLC circuit shown in FIG. 11 depend on the absolute value of the difference signal in such a way that the ratio L/R is a non-decreasing function of |z-ζ| while the ratio $\sqrt{L/R}$ is constant, the resulting filter is a constant-Q 2nd order NDL.

Figure 12:
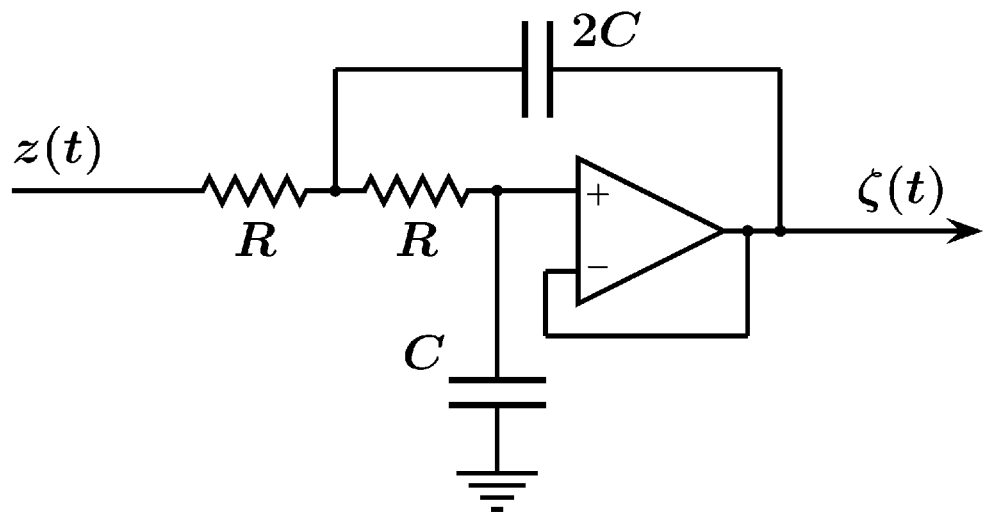
FIG. 12. Nonlinear differential limiter as 2nd order Butterworth lowpass filter (Sallen-Key topology) with feedback-controlled time parameter.

FIG. 12 provides another simplified illustration of a 2nd order constant-Q NDL filter. The lowpass filter is a 2nd order Butterworth filter (Q=1/√2) based on the Sallen-Key topology (Sallen and Key [27]). This circuit may be transformed into a 2nd order NDL by making the resistance R a non-increasing function of the absolute value of the difference signal (strictly decreasing for a large argument), $R=R(|z-\zeta|)$.

Detailed descriptions of various dependencies of the NDL filter parameters on the difference signal and examples of implementation of different NDLs are provided further in this disclosure.

5 Canonical Differential Limiters (CDLs)

When a frequency response of an NDL is characterized by the same shape for all values of the difference signal, and a bandwidth of an NDL is a continuous function that is constant ($B_0$) for small values of the magnitude of the difference signal, and is inversely proportional to this magnitude for larger values of the magnitude, $B(|z|) \propto |z|^{-1}$, then the NDL is a canonical differential limiter, or CDL.

When $\gamma=1$, a bandwidth of a CDL may be described by equation (1) in the limit $b \to \infty$, namely by $$B(|z|) = \lim_{b \to \infty} B_0 \times \{(a|z|)^b + \exp[-(a|z|)^b]\}^{-\frac{1}{b}}. \quad (16)$$

Further introducing a resolution parameter $\alpha = a^{-1}$, equation (16) for the bandwidth of a CDL may be rewritten as $$B(|z|) = B_0 \times \begin{cases} 1 & \text{for } |z| \leq \alpha \\ \dfrac{\alpha}{|z|} & \text{otherwise.} \end{cases} \quad (17)$$

When the time parameter of a nonlinear differential limiter is given by $$\tau(|z-\zeta|) = \tau_0 \times \begin{cases} 1 & \text{for } |z-\zeta| \leq \alpha \\ \dfrac{|z-\zeta|}{\alpha} & \text{otherwise,} \end{cases} \quad (18)$$

the NDL is a canonical differential limiter (CDL).

For a 2nd order CDL the pole quality factor is a constant, $Q$=const. For example, the filter shown in FIG. 12 will be a 2nd order CDL if the resistance R is given by $$R(|z-\zeta|) = R_0 \times \begin{cases} 1 & \text{for } |z-\zeta| \leq \alpha \\ \dfrac{|z-\zeta|}{\alpha} & \text{otherwise.} \end{cases} \quad (19)$$

It should be noted that the integrands in equation (7) for the 1st order NDL represent the rate of change of the output signal, and the absolute values of the integrands are equal to the absolute value of the rate of change of the output. Thus the absolute value of the rate of change of the output is a function of the absolute value of the difference signal.

One may see from equation (18) that the absolute rate of change of the output of the 1st order CDL is proportional to the absolute value of the difference signal in the interval $0 \leq |z| \leq \alpha$, and remains constant at the maximum value $\alpha/\tau_0$ for larger absolute values of the difference signal.

Figure 13:
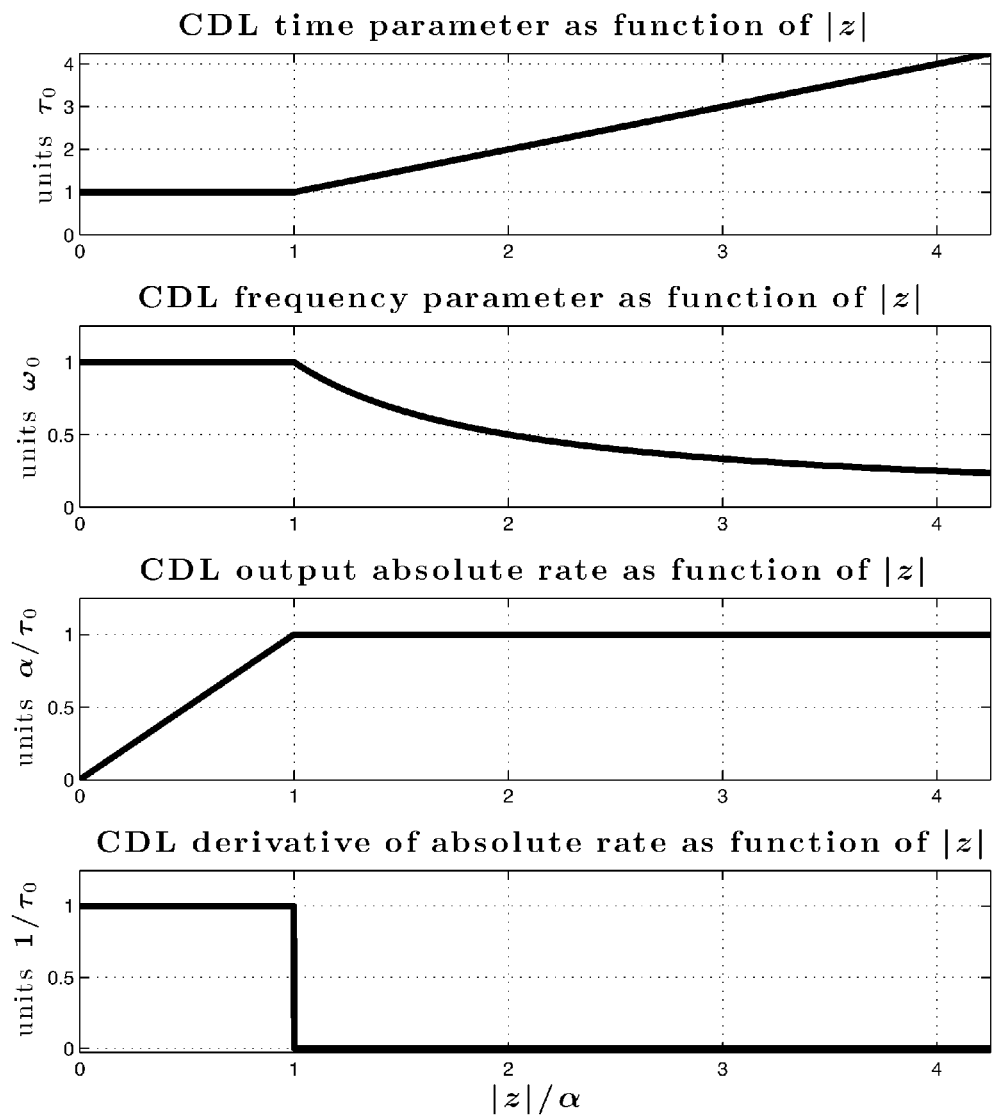
FIG. 13. Time and frequency parameters, and the output absolute rate of change with its derivative, as functions of the absolute value of the difference signal for a 1st order canonical differential limiter.

FIG. 13 shows the time and frequency parameters, and the output absolute rate of change with its derivative, as functions of the absolute value of the difference signal for a 1st order canonical differential limiter.

Figure 14:
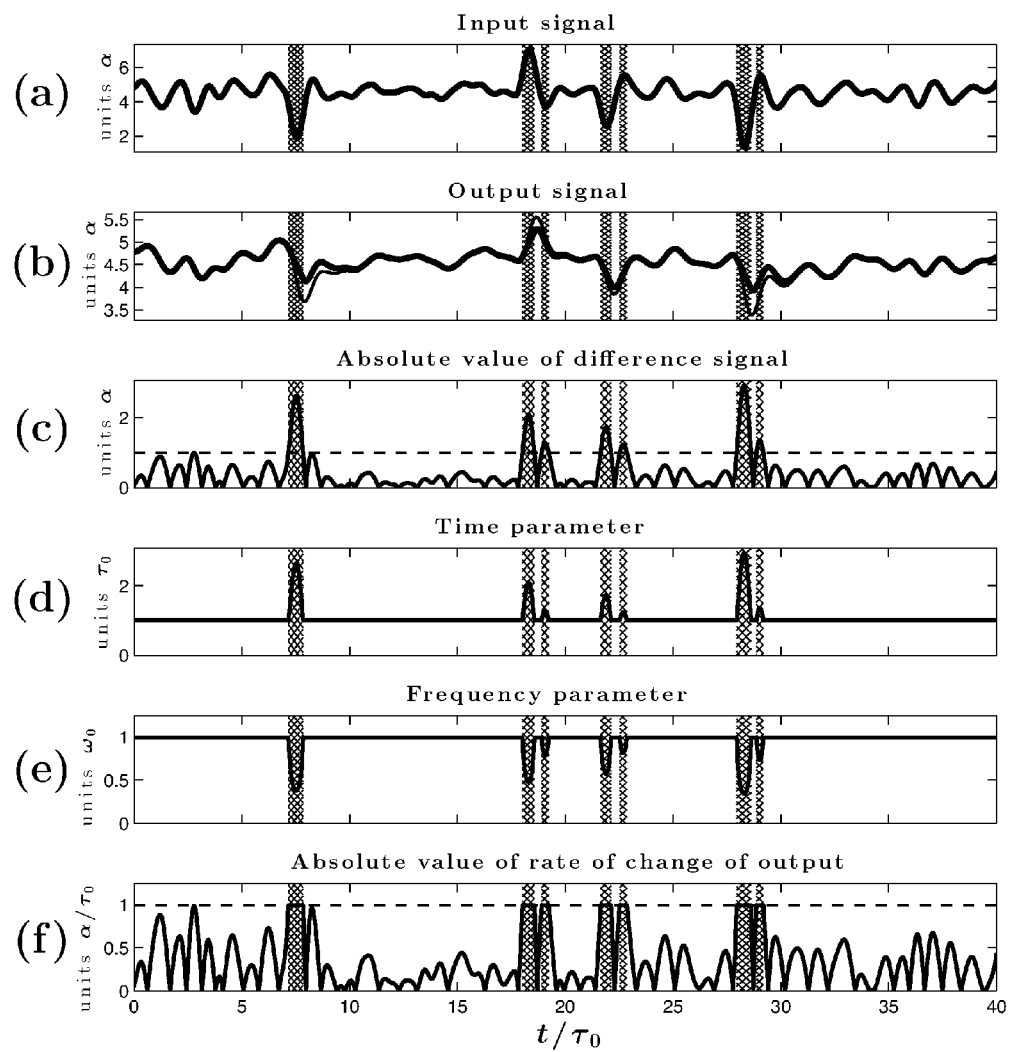
FIG. 14. Example showing a real input signal (panel (a)), the output signal (panel (b)), the absolute value of the difference signal (panel (c)), the time parameter (panel (d)), the frequency parameter (panel (e)), and the absolute rate of change of the output signal (panel (f)) as functions of time for a 1st order canonical differential limiter. The cross-hatched areas indicate the time intervals where the CDL has nonlinear behavior. For comparison, the dashed line in panel (b) shows the output of a 1st order lowpass filter with the time constant equal to the minimum value of the time parameter.

FIG. 14 provides an example showing a real input signal (panel (a)), the output signal (panel (b)), the absolute value of the difference signal (panel (c)), the time parameter (panel (d)), the frequency parameter (panel (e)), and the absolute rate of change of the output signal (panel (f)) as functions of time for a 1st order canonical differential limiter. In the figure, the cross-hatched areas indicate the time intervals where the CDL has nonlinear behavior. For comparison, the thinner line in panel (b) shows the output of a 1st order lowpass filter with the time constant equal to the minimum value of the time parameter.

5.1 Comparison of Responses to Various Forcing Functions of 1st and 2nd Order CDLs and Respective Linear Filters

5.1.1 Step Function

Figure 15:
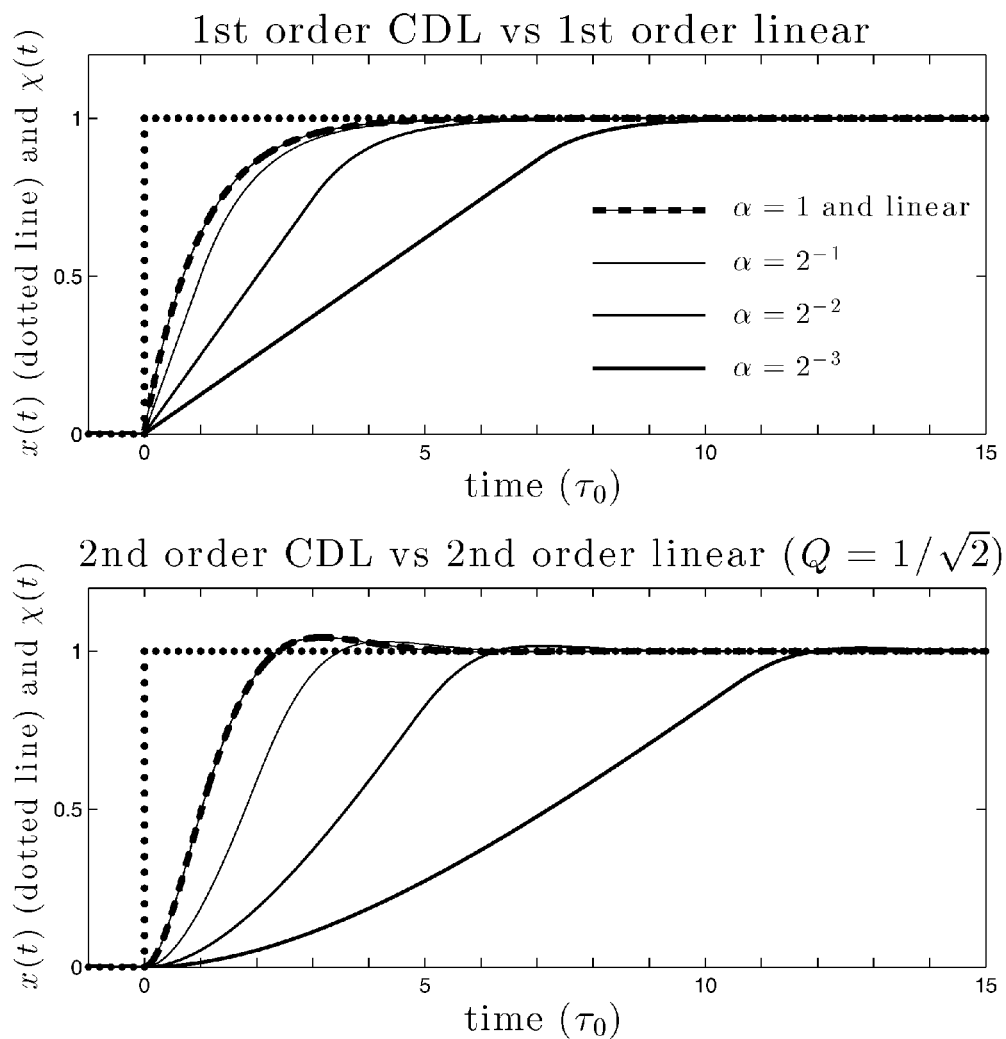
FIG. 15. Example showing the responses of the 1st and 2nd order CDLs and their respective linear filters to a step forcing function.

FIG. 15 provides an example showing the responses of the 1st and 2nd order CDLs and their respective linear filters to a step forcing function. One may see that for the 2nd order CDL the onset delay of the output increases as the magnitude of the forcing step in comparison with the resolution parameter increases.

Figure 16:
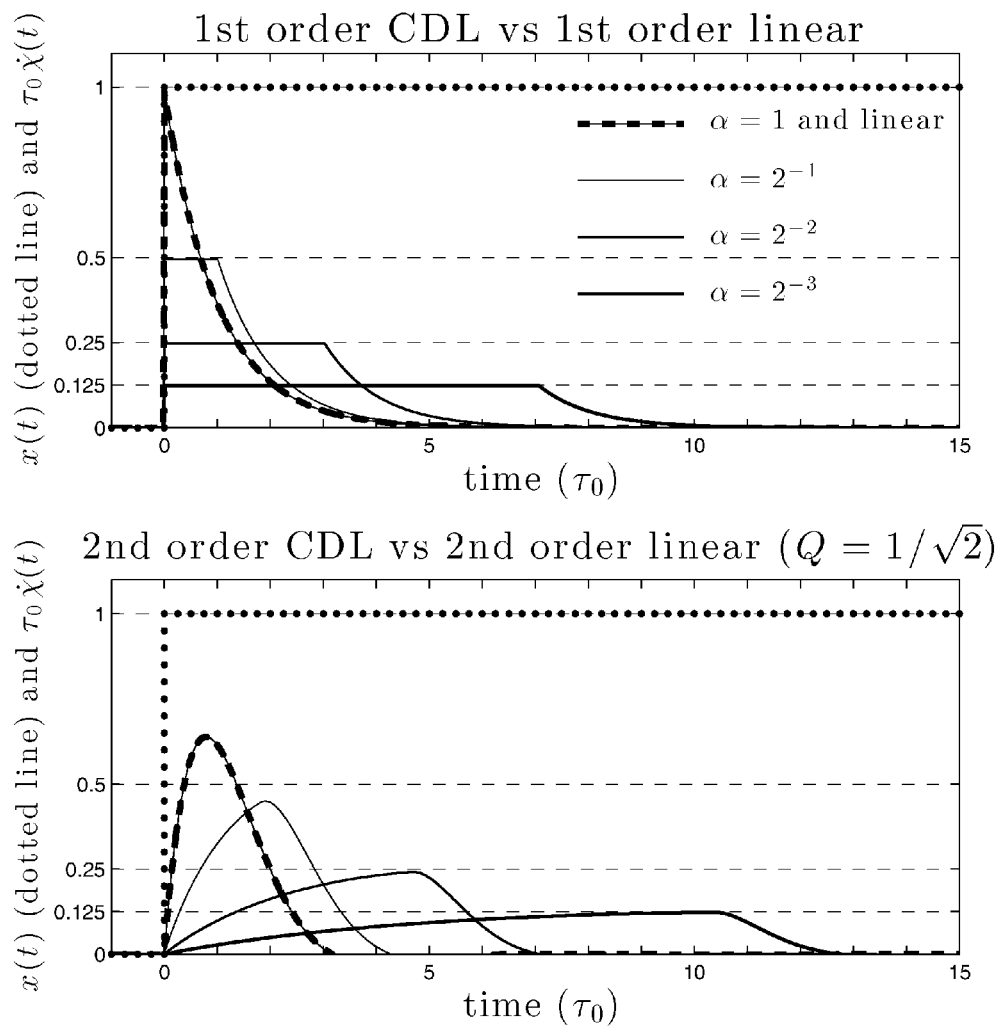
FIG. 16. Time derivatives of the responses shown in FIG. 15.

FIG. 16 makes this increased delay of the 2nd order CDL more apparent by showing the time derivatives of the responses shown in FIG. 15.

5.1.2 Boxcar Pulses of Different Durations

Figure 17:
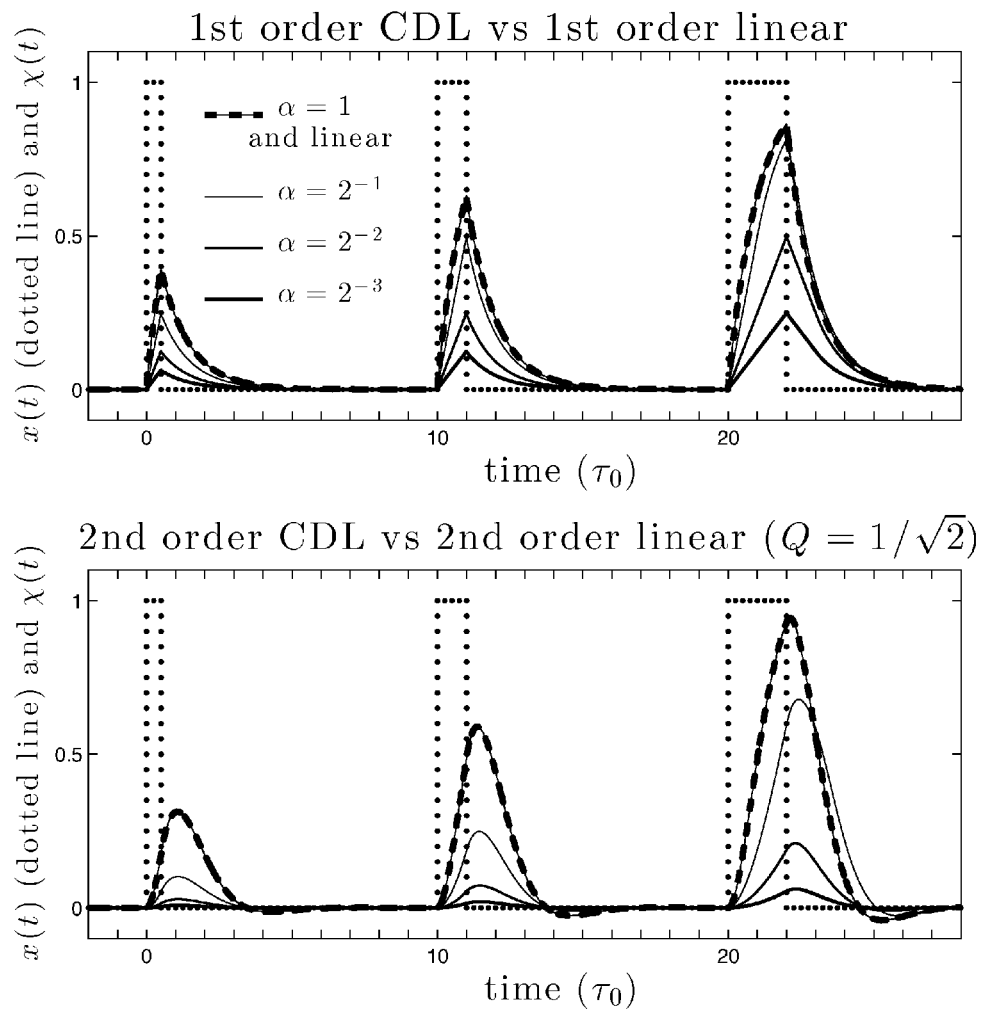
FIG. 17. Example showing the responses of the 1st and 2nd order CDLs and their respective linear filters to boxcar forcing functions of different durations.

FIG. 17 provides an example showing the responses of the 1st and 2nd order CDLs and their respective linear filters to boxcar forcing functions of different durations. One may see that for the 2nd order CDL the onset delay of the output increases as the magnitude of the forcing pulse increases, and, as a result, the magnitude of the output pulses progressively decreases with the increase of the forcing pulse.

Figure 18:
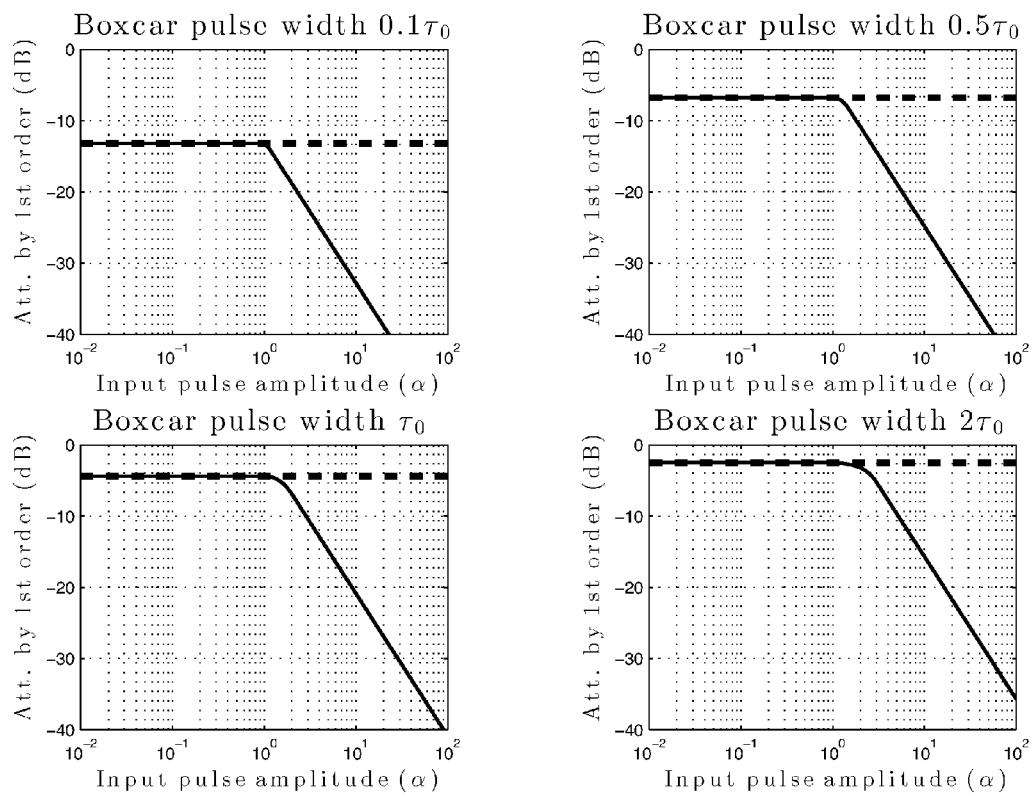
FIG. 18. Attenuation of boxcar pulses by a 1st order CDL (black lines) in comparison with the 1st order linear filter (dashed lines).

FIG. 18 shows the attenuation of boxcar pulses by a 1st order CDL (black lines) in comparison with the 1st order linear filter (dashed lines). As one may see, a 1st order CDL attenuates boxcar pulses with amplitudes up to $\alpha$ as effectively as the linear 1st order filter. For pulses of any width with amplitudes larger than $\alpha$, the 1st order CDL circuit has much stronger attenuation than the linear filter. As the magnitude of the forcing pulses continues to increase, the magnitude (and power) of the output pulses remains constant.

Figure 19:
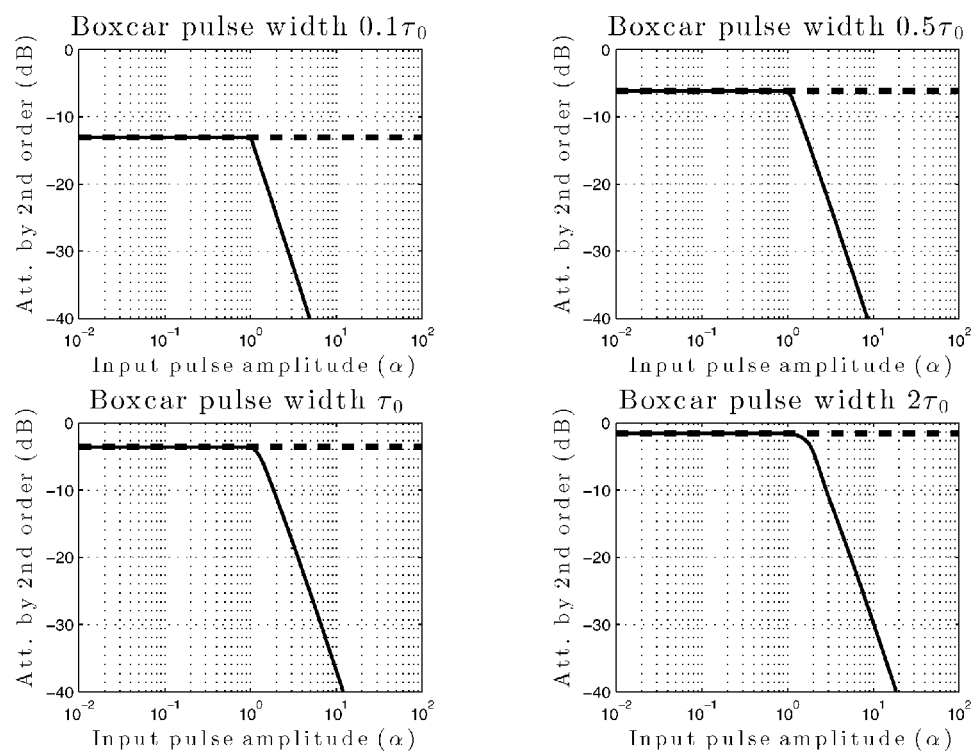
FIG. 19. Attenuation of boxcar pulses by a 2nd order CDL (black lines) in comparison with the 2nd order linear filter (dashed lines).

FIG. 19 shows the attenuation of boxcar pulses by a 2nd order CDL (black lines) in comparison with the 2nd order linear filter (dashed lines). As one may see, a 2nd order CDL attenuates boxcar pulses with amplitudes up to $\alpha$ as effectively as the linear 2nd order filter. For pulses of any width with amplitudes larger than $\alpha$, the 2nd order CDL circuit has much stronger attenuation than the linear filter. As the magnitude of the forcing pulses continues to increase, the power of the output pulses decreases inversely proportional to the squared magnitude of the forcing pulses.

5.1.3 Ramp Function

Figure 20:
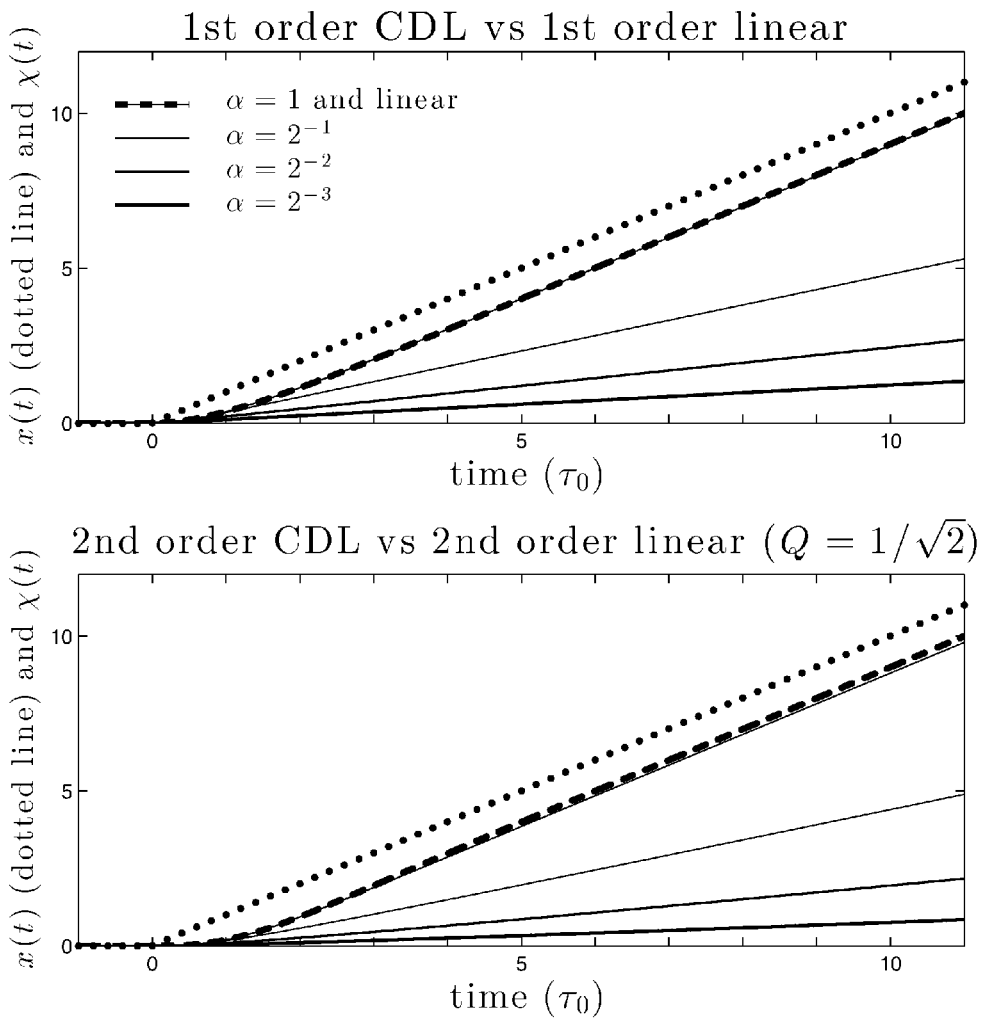
FIG. 20. Example showing the responses of the 1st and 2nd order CDLs and their respective linear filters to a ramp forcing function.

FIG. 20 provides an example showing the responses of the 1st and 2nd order CDLs and their respective linear filters to a ramp forcing function.

5.1.4 Combination of Ramp Function and Boxcar Pulses

Figure 21:
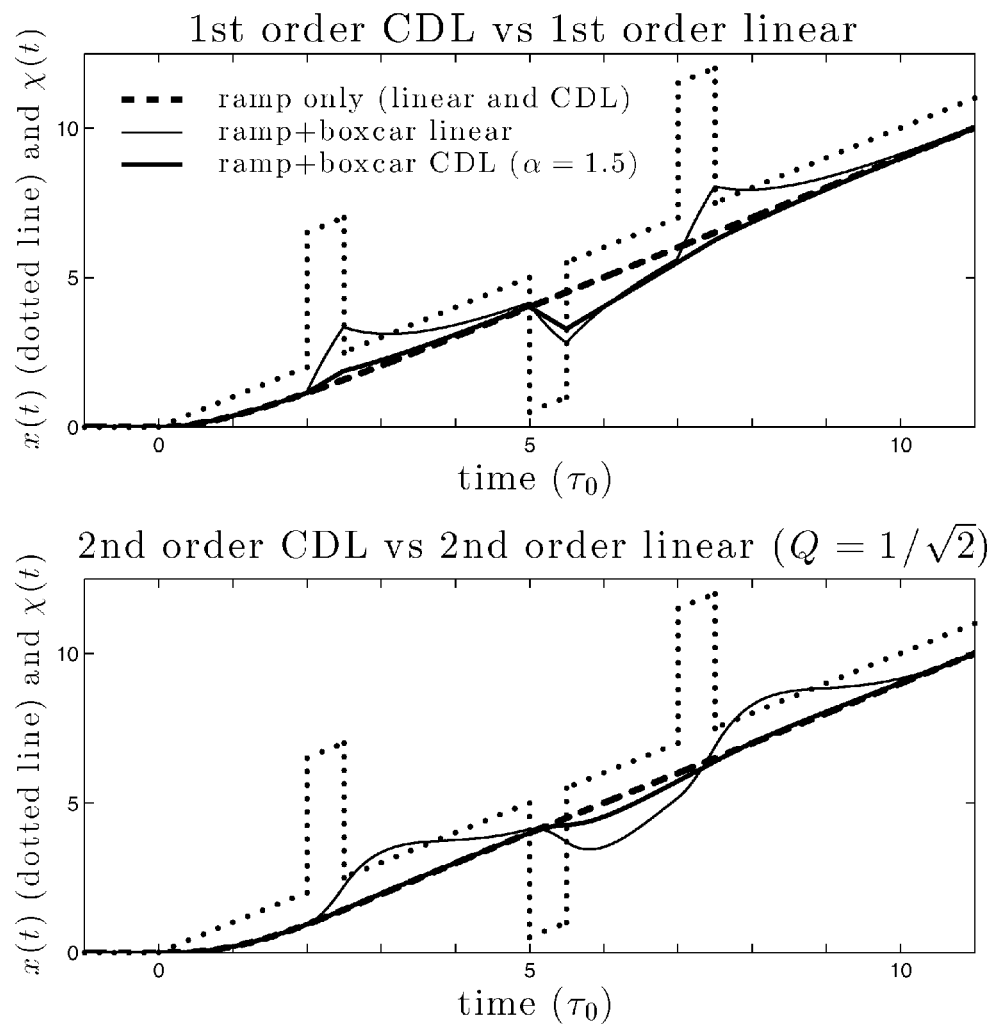
FIG. 21. Comparison of the outputs of the 1st- and 2nd-order CDLs (thick solid black lines) with the outputs of respective linear filters (thin solid black lines), and with responses of the same filters to a ramp-only input (dashed lines).

Given an input which is a combination of a ramp function and boxcar pulses (dotted lines), FIG. 21 compares the outputs of the 1st- and 2nd-order CDLs (thick solid black lines) with the outputs of respective linear filters (thin solid black lines), and with responses of the same filters to a ramp-only input (dashed lines). This figure provides a simplified illustration of how an NDL circuit removes the impulsive noise by "trimming" the outliers while following a slower-varying trend. It also further illustrates the advantages of higher-order NDLs.

6 Differential Critical Limiters

A 1st order differential critical limiter (DcL) may be defined by requiring that (i) the absolute rate of change of the output signal is constant in the limit of large difference signal, and (ii) the derivative of the absolute rate of change of the output signal is a non-increasing function of the absolute value of the difference signal.

For both 1st and 2nd order critical limiters, when the time parameter is viewed as a function of the absolute value of the difference signal, its first derivative is a non-decreasing function monotonically approaching a constant value in the limit of a large argument.

A bandwidth of a DcL may be described by equation (1) with $\gamma=1$, namely by $$B(|z|) = B_0 \times \{(a|z|)^b + \exp[-(a|z|)^b]\}^{-\frac{1}{b}}. \qquad (20)$$

One should easily see that the canonical differential limiter is also a differential critical limiter.

As another example, the time parameter given by $$\tau(|z|) = \tau_0 \frac{|z|/\alpha}{1 - e^{-|z|/\alpha}} \qquad (21)$$

leads to a differential critical limiter since $$\lim_{|z| \to \infty} \frac{|z|}{\tau(|z|)} = \frac{\alpha}{\tau_0} = \text{const}, \qquad (22)$$

and since $$\frac{d}{d|z|} \frac{|z|}{\tau(|z|)} = \frac{1}{\tau_0} e^{-|z|/\alpha}, \qquad (23)$$

which is a monotonically decreasing function of $|z|$.

Figure 22:
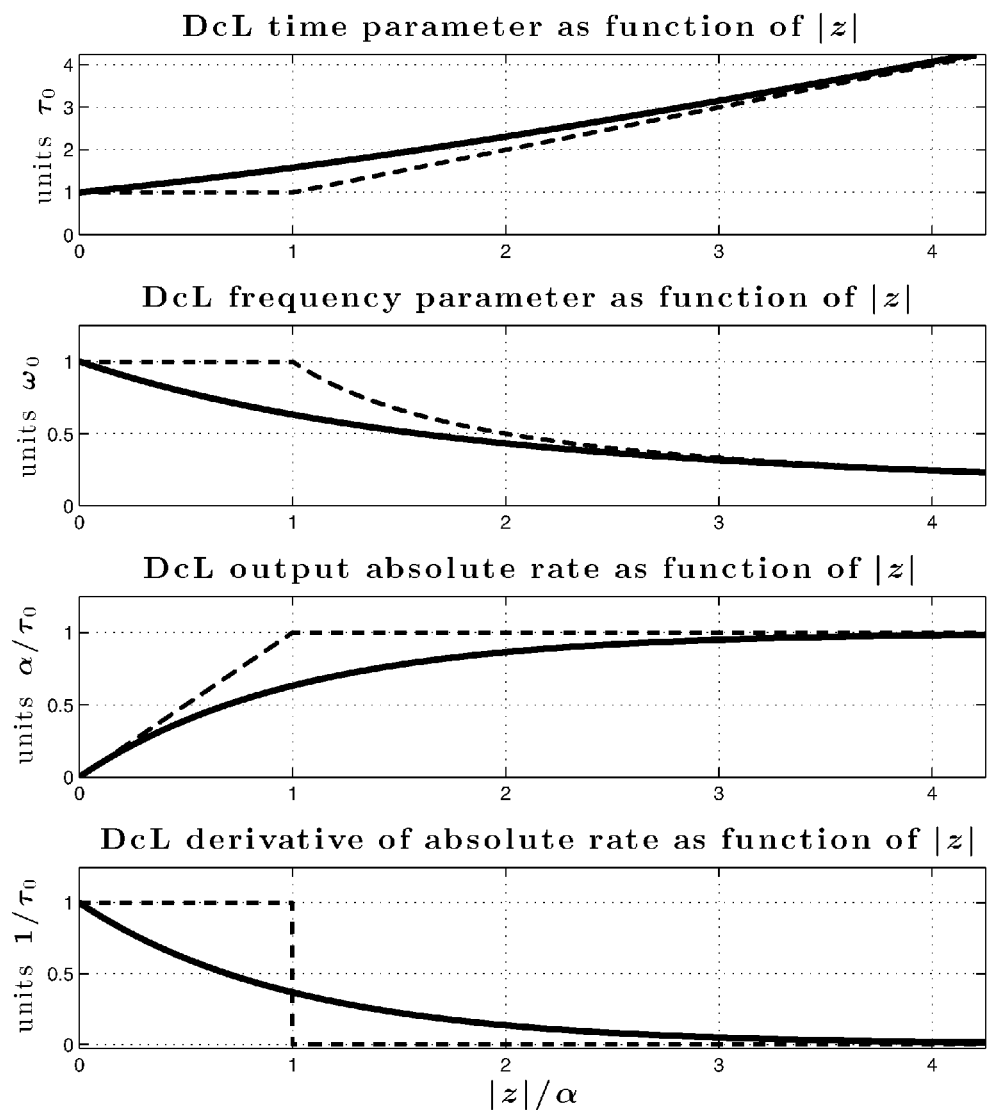
FIG. 22. Particular example of time and frequency parameters, and the output absolute rate of change and its derivative, as functions of the absolute value of the difference signal for a 1st order differential critical limiter. For comparison, the corresponding functions for the canonical differential limiter are shown by the dashed lines.

For the above example of the time parameter of a differential critical limiter, FIG. 22 shows, for the 1st order limiter, the time and frequency parameters, and the output absolute rate of change and its derivative, as functions of the absolute value of the difference signal. For comparison, the corresponding functions for the canonical differential limiter are shown by the dashed lines.

6.1 Differential Critical Limiters with Quantile Offsets

Generalizing the equations (2.3) and (2.5) on page 1174 in Ref. [20] (Nikitin and Davidchack [20]) for a complex- or vector-valued input signal $z(t)$, the output $z_{\tilde{q}}(t)$ of a complex- or vector-valued quantile filter in a moving rectangular time window of width T may be given implicitly by $$\frac{1}{T}\int_{t-T}^{t} ds \, \text{sign}[z_{\tilde{q}}(t) - z(s)] = \tilde{q}, \qquad (24)$$

where $\tilde{q}$ is a complex or vector quantile offset parameter, $|\tilde{q}|<1$, and $\text{sign}(z)=z/|z|$.

For real signals, the quantile offset parameter is real, and is related to the quantile q as $\tilde{q}=2q-1$. For example, $\tilde{q}=0$ for the median, or second quartile, ($q=\frac{1}{2}$), $\tilde{q}=-\frac{1}{2}$ for the first quartile ($q$ ¼), and $\tilde{q}=\frac{1}{2}$ for the third quartile ($q=\frac{3}{4}$).

Given an input signal and the minimum time parameter (or, equivalently, the maximum frequency parameter), for sufficiently small resolution parameter $\alpha$ the output of a differential critical limiter may be approximated as $$\zeta(t) \approx \frac{\alpha}{\tau_0} \int dt \frac{z(t) - \zeta(t)}{|z(t) - \zeta(t)|} \qquad (25)$$

$$= \frac{\alpha}{\tau_0} \int dt \, \text{sign}[z(t) - \zeta(t)].$$

Equation (25) also holds for any NDL for which equation (22) holds, that is, an NDL such that the absolute rate of change of the output signal is constant $\alpha/\tau_0$ in the limit of a large difference signal. This includes, but is not limited to, CDL and DcL filters.

For a large variety of input signals, the output given by equation (25) is approximately equal to the output of a complex median filter in some time window. The width T of this window approximately equals to the minimum value of the time parameter ($\tau_0$), scaled by the ratio of a measure of deviation of the input signal and the resolution parameter $\alpha$.

For example, if the input signal is a weak-sense stationary random signal, equation (25) approximates the output of a complex median filter in a moving time window of approximate width T, $$T \approx \frac{4 \, \text{median}(|z - \tilde{z}|)}{\alpha} \tau_0, \qquad (26)$$

where $\tilde{z}$ is the mean value of the incoming signal in a time interval of width T (in the respective moving window), and the median is taken for the same time interval.

FIG. 23 illustrates this, for a real weak-sense stationary random input signal, by comparing the outputs of such small-$\alpha$ DcLs and the median filters with appropriate rectangular moving windows, for larger (upper panel) and 10 times smaller (lower panel) values of the resolution parameter. In this example, the input signal has a skewed distribution so that the mean and the median central tendencies are different. For comparison with the median, the outputs of the averaging filters within the same rectangular moving windows are shown by the dotted lines.

To enable DcLs to approximate arbitrary complex (or vector) quantile filters, equation (10) may be modified by introducing a complex (or vector) quantile offset parameter $\tilde{q}$ as follows:

$$\zeta_{\tilde{q}}(t) = \int dt \left[ \frac{z(t) - \zeta_{\tilde{q}}(t)}{\tau(|z - \zeta_{\tilde{q}}|)} + \tilde{q} \frac{\alpha}{\tau_0} \right], \quad (27)$$

where $|\tilde{q}| < 1$. Then, for a sufficiently small resolution parameter, $$\zeta_{\tilde{q}}(t) \approx \frac{\alpha}{\tau_0} \int dt \{ \text{sign}[z(t) - \zeta_{\tilde{q}}(t)] + \tilde{q} \}. \quad (28)$$

Figure 24:
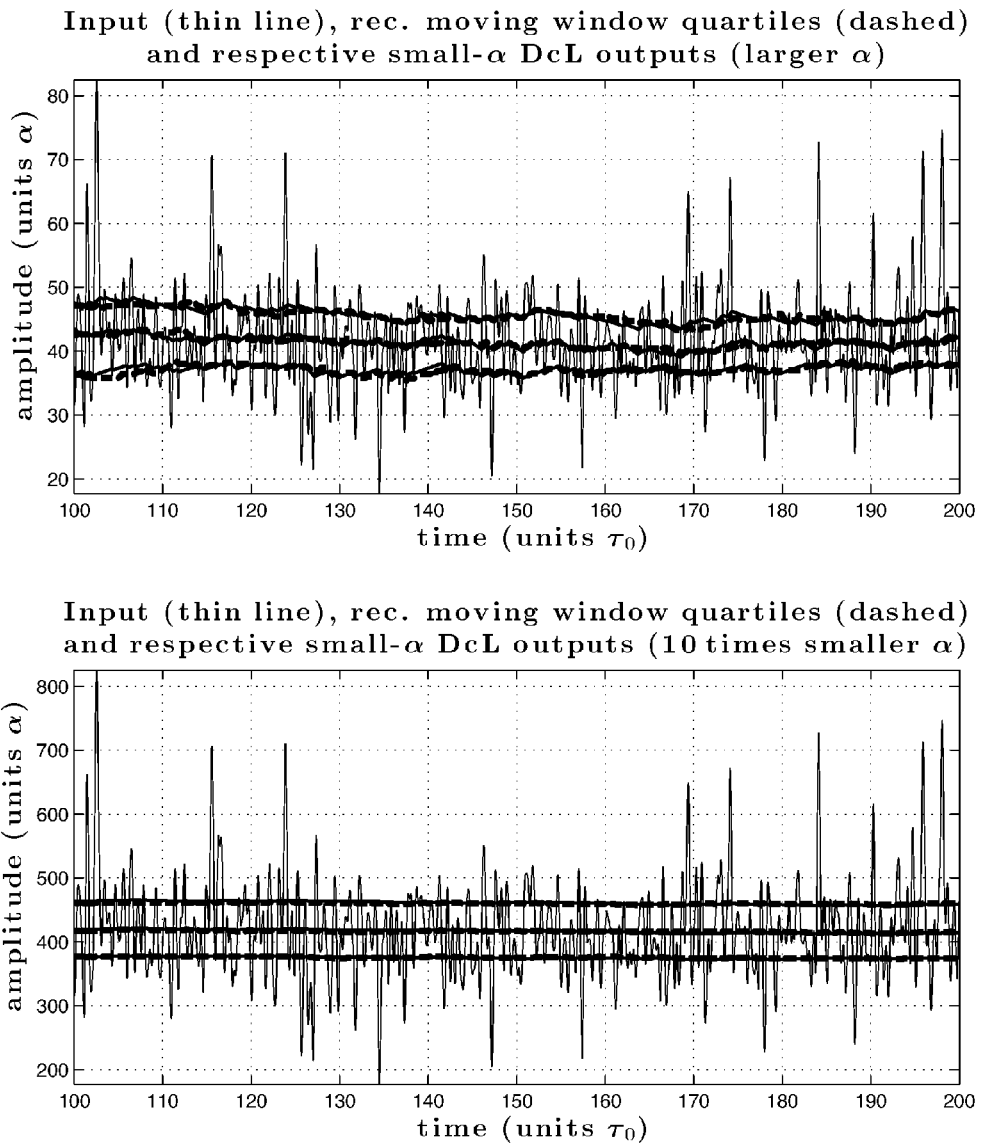
FIG. 24. Comparison, for a real weak-sense stationary random input signal, the quartile outputs of small-α DcLs with the respective outputs of quartile filters with appropriate rectangular moving windows, for larger (upper panel) and 10 times smaller (lower panel) values of the resolution parameter.

FIG. 24 compares, for a real weak-sense stationary random input signal, the quartile outputs of small-α DcLs with the respective outputs of quartile filters with appropriate rectangular moving windows, for larger (upper panel) and 10 times smaller (lower panel) values of the resolution parameter.

Figure 25:
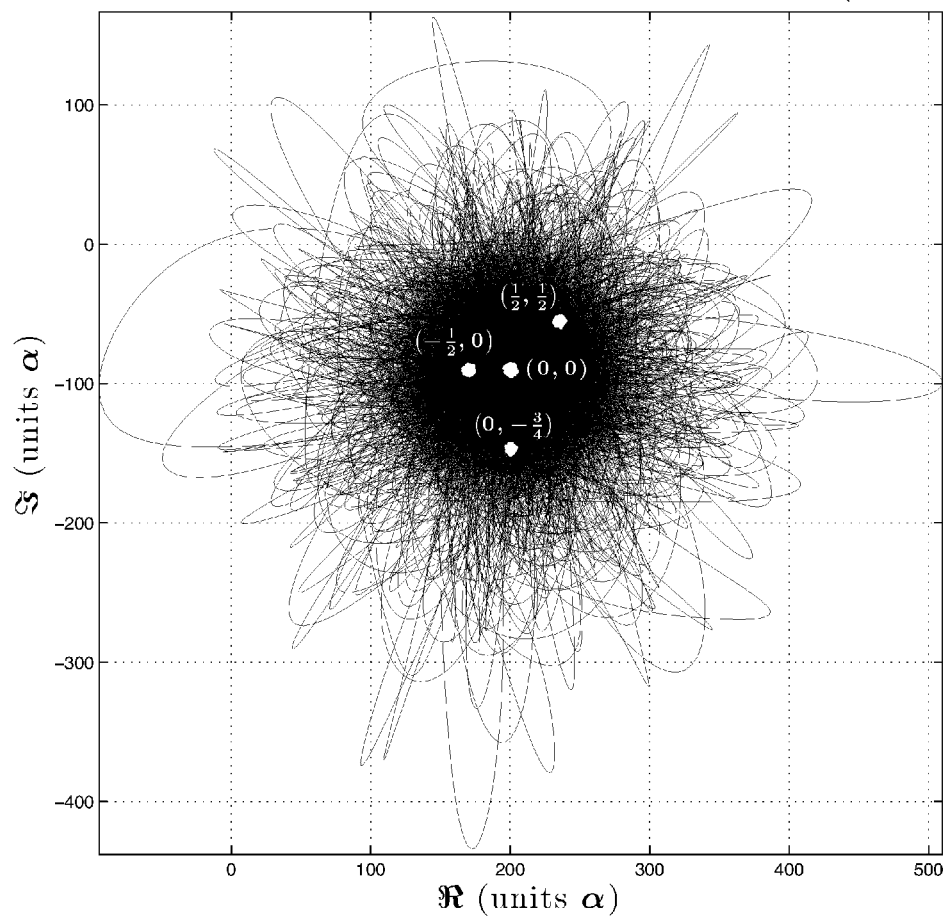
FIG. 25. Phase-space plots of a complex weak-sense stationary random input signal (black), and complex quantile outputs (for the offset quantile parameters (0,0), (½,½), (0,¾), and (−½,0)) of a small-α CDL (white).

FIG. 25 shows the phase-space plots of a complex weak-sense stationary random input signal (black), and complex quantile outputs (for the offset quantile parameters (0,0), (½,½), (0,−¾), and (−½,0)) of a small-α CDL (white).

One skilled in the art will recognize that constellation diagrams of various modulation schemes may be represented in terms of quantities expressed through the quantile offset parameters discussed in this section (e.g. complex for quadrature carriers, or four-dimensional for modulation schemes of fiber optics and optical communications), and thus DcLs with quantile offsets may be used in methods and devices for modulation and demodulation of communication signals.

Figure 26:
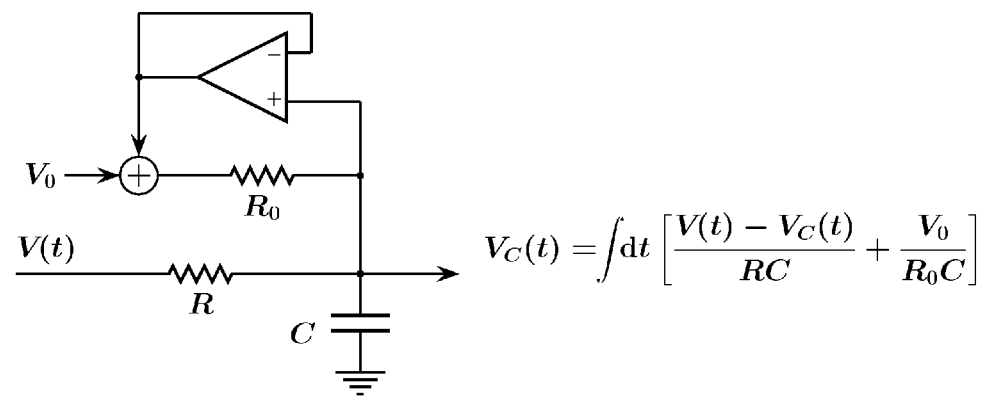
FIG. 26. Simplified block diagram of an illustrative implementation of equation (27) in an electronic circuit.

FIG. 26 shows a simplified block diagram of an illustrative implementation of equation (27) in an electronic circuit.

6.2 Numerical Implementation of CDL with Optional Quantile Offset

Even though an NDL is an analog filter by definition, it may be easily implemented digitally, for example, in a Field Programmable Gate Array (FPGA) or software. A digital NDL requires very little memory and typically is inexpensive computationally, which makes it suitable for real-time implementations.

An example of a numerical algorithm implementing a finite-difference version of a 1st order CDL filter with optional quantile offset is given by the following MATLAB function:

```
function zeta=CDLq(z,t,tau0,alpha,dq)
zeta=zeros(size(z));
dt=diff(t);
zeta(1)=z(1)+alpha(1)*dq;
for i=2:length(z);
   dZ=z(i)-zeta(i-1);
   if abs(dZ)<=alpha
     tau=tau0+dt(i-1);
   else
     tau=(tau0+dt (i-1))*abs(dZ)/alpha;
   end
   zeta(i)=zeta(i-1)+(dZ/tau+dq*alphaRtau0+dt(i-1)))
     *dt(i-1);
end
return
```

7 Real-Time Tests of Normality and Real-Time Detection and Quantification of Impulsive Interference The interquartile range (IQR), mean or median (or other measures of central tendency), and standard or absolute deviation from the mean or median (or from other measures of central tendency) of a signal may be used in a simple test of whether or not the amplitude of the signal is normally distributed, i.e. the signal is Gaussian.

For example, if the signal (or noise) x(t) is Gaussian, then the standard score of the quantile q is $\sqrt{2}\text{erf}^{-1}(2q-1) = \sqrt{2}\text{erf}^{-1}(\tilde{q})$, where $\text{erf}^{-1}$ is the inverse error function. Given the mean value $\bar{x}$ and the standard deviation σ for the signal in some (moving) window, if the signal is Gaussian, the third quartile is $$Q_3 = \bar{x} + \sigma\sqrt{2}\,\text{erf}^{-1}\left(\frac{1}{2}\right) \approx \bar{x} + \frac{2\sigma}{3}, \quad (29)$$

and the first quartile is $$Q_1 = \bar{x} + \sigma\sqrt{2}\,\text{erf}^{-1}\left(-\frac{1}{2}\right) \approx \bar{x} - \frac{2\sigma}{3}. \quad (30)$$

If the actual values of the third and/or first quartiles differ substantially from the calculated values, then the signal is not Gaussian.

Since small-α DcLs with quantile offsets allow us to obtain outputs of quantile filters with time windows of arbitrary width (see equations (26) and (27)), we may obtain a couple of such outputs for two different values of $\tilde{q}$ (for example, one positive and one negative) and compare them with the corresponding outputs of the circuits measuring the central tendency of the signal (e.g. the mean or median) and a deviation from this central tendency. If the relations between the measured values differ substantially from those based on the assumption of the signal being Gaussian, then the signal is not Gaussian. Thus we may construct a variety of real-time tests of normality, and use them for real-time detection and quantification of the presence of impulsive interference.

More generally, the measures of central tendency (MCT) and/or deviation may be obtained as linear combinations (e.g. the weighted sums and/or differences) of the outputs of small-α DcLs with different quantile offsets. On the other hand, these measures may be obtained by alternative means having different sensitivity to the outliers, for example, as the outputs of mean or median filters (for the central tendency) and/or as the outputs of circuits for obtaining the root mean square (RMS) or the average absolute value. One skilled in the art would recognize that a variety of such alternative measures may be constructed, including the measures based on the different weighted sums and/or differences of the outputs of small-α DcLs with various quantile offsets.

Figure 27:
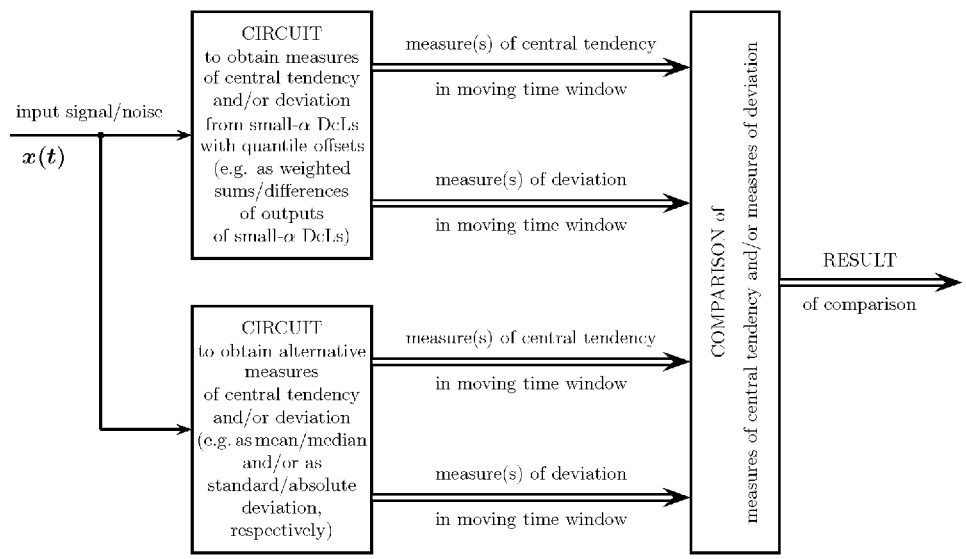
FIG. 27. Simplified block diagram of a method and apparatus for real-time tests of normality, and for real-time detection and quantification of impulsive interference.

As an example, FIG. 27 provides a simplified block diagram of a method and apparatus for real-time tests of normality, and for real-time detection and quantification of impulsive interference. On one hand, the measures of central tendency and/or deviation may be obtained as linear combinations (e.g. the weighted sums and/or differences) of the outputs of small-α DcLs with different quantile offsets. On the other hand, these measures may be obtained by alternative means, e.g. as the outputs of mean or median filters (for the central tendency) and/or as the outputs of circuits for obtaining the root mean square (RMS) or the average absolute value. These differently obtained measures of central tendency and/or deviation may be compared to each other, and the result(s) of such comparison will be indicative of the signal being Gaussian or not Gaussian, or of the absence or presence of impulsive interference.

For example, under the Gaussian assumption, we may equate the measures of central tendency of the signal as $$\chi_{\tilde{q}}(t)+\chi_{-\tilde{q}}(t)=2\bar{x}(t), \quad (31)$$

were $\bar{x}(t)$ is the central tendency of the signal x(t) (e.g. the mean or median) measured in a moving window of time of width T, $\chi_{\tilde{q}}(t)$ is given by equation (27), and the measures of deviation from the central tendency as $$\chi_{\tilde{q}}(t)-\chi_{-\tilde{q}}(t)=2\sigma_T(t)\sqrt{2}\mathrm{erf}^{-1}(\tilde{q}), \quad (32)$$

were $\sigma_T(t)$ is the standard deviation of the signal in a moving window of time of width T (see equation (26)). If the actual measured values for the central tendencies and/or deviations are significantly different from those required by the equalities of equations (31) and (32), the signal is not Gaussian.

Since it is generally easier (and less expensive) in practice to obtain a measure of absolute deviation (MAD) rather than standard deviation, equation (32) may be re-written as $$\chi_{\tilde{q}}(t)-\chi_{-\tilde{q}}(t)=(\text{absolute deviation from mean/median})\times 2\sqrt{\pi}\mathrm{erf}^{-1}(\tilde{q}). \quad (33)$$

In practice, the absolute deviation from mean/median of the signal in a moving window of time of width T may be approximated by $$(\text{absolute deviation})=\langle |x(t)-\bar{x}(t)|\rangle_T, \quad (34)$$

where $\bar{x}(t)$ is the output of either averaging (giving absolute deviation from the mean), or median (giving absolute deviation from the median) filter in a moving window of time of width T. Then equation (33) becomes $$\chi_{\tilde{q}}(t)-\chi_{-\tilde{q}}(t)=2\sqrt{\pi}\langle |x(t)-\bar{x}(t)|\rangle_T \mathrm{erf}^{-1}(\tilde{q}). \quad (35)$$

Figure 28:
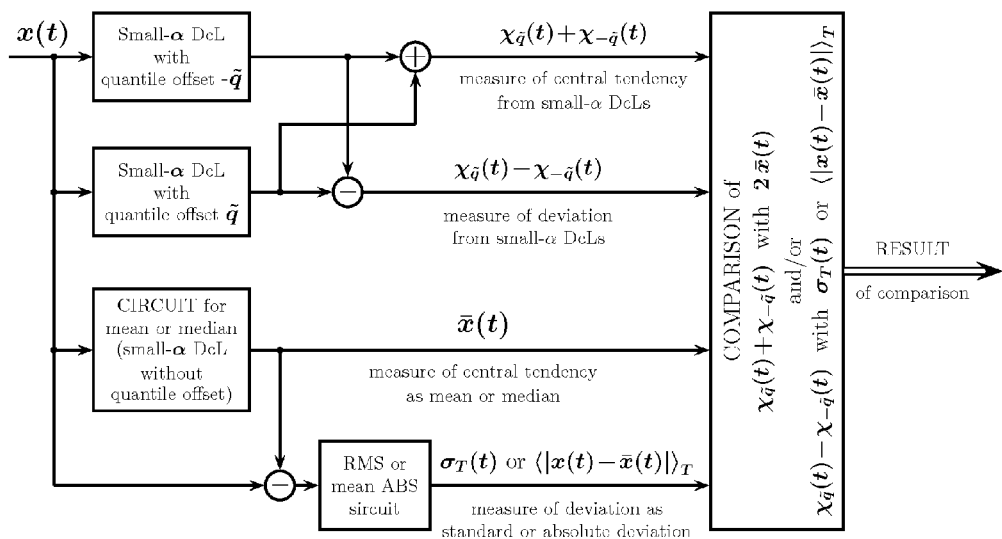
FIG. 28. Particular block diagram example of a method and apparatus for a real-time test of normality, and for real-time detection and quantification of impulsive interference according to equations (31) through (35).

FIG. 28 provides a particular block diagram example of a method and apparatus for a real-time test of normality, and for real-time detection and quantification of impulsive interference according to equations (31) through (35).

Figure 29:
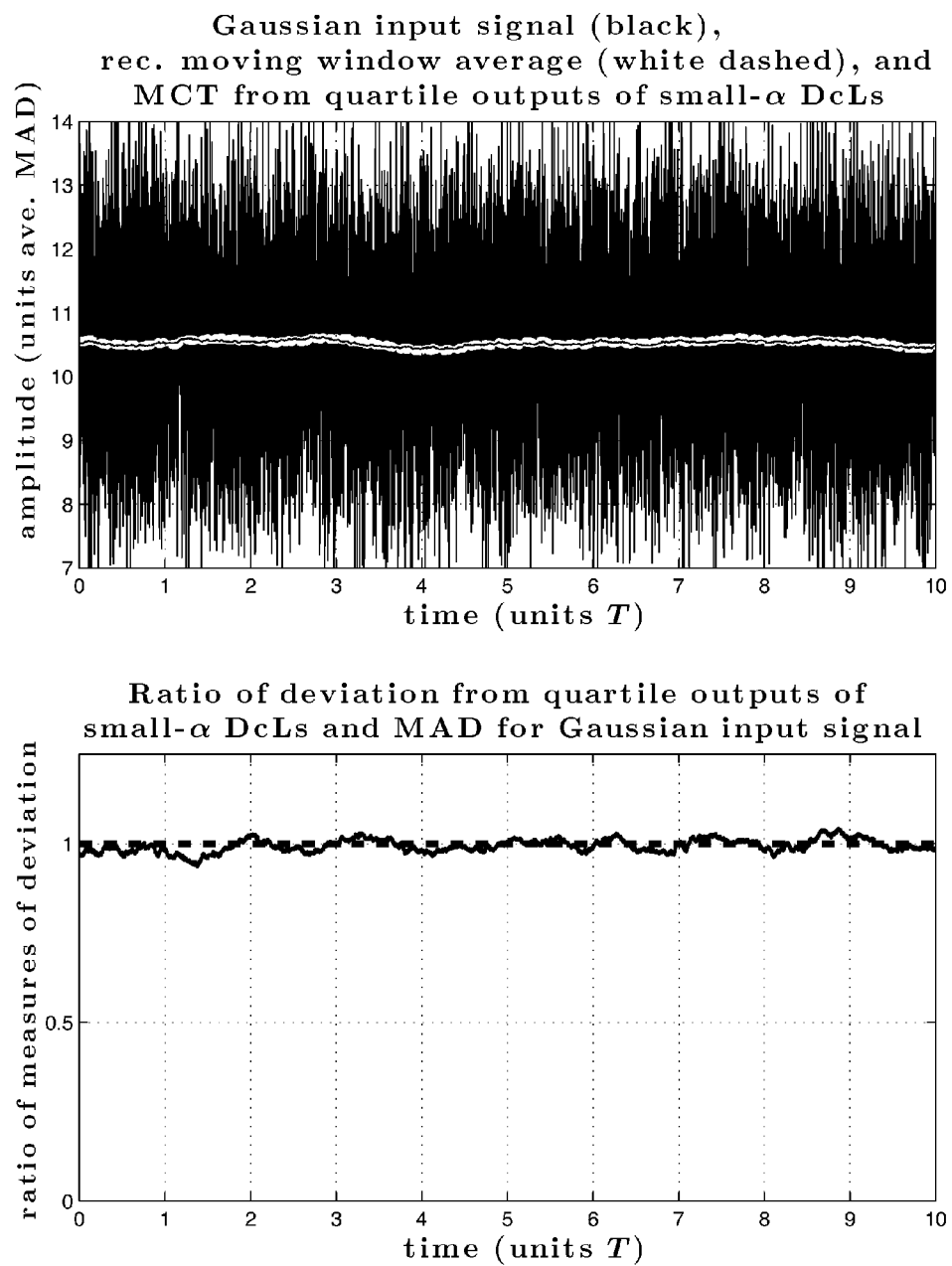
FIG. 29. Simulated example of a real time test of normality according to equations (31) and (35), with $$\tilde{q} = \frac{1}{2},$$

FIG. 29 shows a simulated example of a real time test of normality according to equations (31) and (35), with $\tilde{q}=\frac{1}{2}$, for a Gaussian input signal (thermal noise), while FIG. 30 shows a simulated example of such a test for a non-Gaussian input signal (mixture of thermal noise and asymmetric impulsive noise). In the lower panel of FIG. 30, smaller-than-unity value of the ratio of the deviations obtained as an IQR using small-α DcLs and as MAD is an indication that the input signal is impulsive.

8 Adaptive NDLs (ANDLs)

The range of linear behavior of an NDL may be determined and/or controlled by the resolution parameter α. Given an NDL and its input signal z(t), the magnitude/power of the output ζ(t) is a monotonically increasing function of α for small α, approaching a steady (constant) value in the limit of large α. On the other hand, the magnitude/power of the average absolute value of the difference signal z(t)−ζ(t) is a monotonically decreasing function of α for small α, approaching a steady (constant) value in the limit of large α. This property may be utilized to implement a negative feedback to adaptively control the resolution parameter of an NDL in order to ensure optimal suppression of the signal outliers such as impulsive noise.

FIG. 31 provides an illustration of such an adaptive NDL (ANDL), where the average absolute value of the difference signal z(t)−ζ(t) is obtained either by means of a lowpass filter (panel (a)) with sufficiently narrow bandwidth (e.g. order of magnitude narrower than the initial bandwidth of the ANDL in the limit of large resolution parameter), or by an NDL (panel (b)) with sufficiently narrow initial bandwidth.

Note that the outputs of the lowpass filter (panel (a)) and the NDL (panel (b)) both provide measures of central tendency (MCT) of a magnitude of the difference signal, and that these MCT may also constitute measures of deviation of the difference signal from its central tendency (e.g. from zero).

It should be pointed out that an external absolute value circuit is not necessary for the implementation of an adaptive NDL, since the absolute value of the difference signal |z(t)−ζ(t)| is normally required (directly or indirectly) for the NDL operation, and is typically already available internally in an NDL. Thus this value may be made externally available and used in an ANDL as illustrated in FIG. 32.

Since a median filter is robust to outliers (impulsive noise), a small-α DcL operating on the absolute value of the difference signal may be used to automatically adjust the value of α, as illustrated in FIG. 33. The optimization of performance of such an adaptive NDL may be achieved by controlling the gain G of the amplifier in the feedback. This gain may be set according to specifications, or it may be (optionally) controlled by an external (feedback) signal indicative of the desired performance of the NDL.

The small gain g<<1 (e.g. one-tenth) ensures that the DcL operates in its small-α regime. Then, a DcL approximates a quantile filter (e.g. median filter for a zero quantile offset) in a moving time window of approximate width T given by (see equation (26))

$$T \approx \frac{4}{g}\tau_0, \quad (36)$$

where $\tau_0$ is the minimum value of the DcL time parameter.

One skilled in the art will recognize that the small-α DcL in FIG. 33 may be replaced by any other means for obtaining a quantile measure of the absolute value of the difference signal |z(t)−ζ(t)| in a moving time window, for example, by the filters described by Nikitin and Davidchack [21], Nikitin [18, 19].

For vector signals, the magnitude (absolute value) of the difference signal may be defined as the square root of the sum of the squared components of the difference signal. One skilled in the art will recognize that an adaptive NDL for vector signals may be constructed in a manner similar to the complex-valued NDLs shown in FIG. 31 through FIG. 33.

9 Differential Over-Limiters (DoLs)

For a 1st order differential critical limiter, the absolute rate of change of the output signal is constant in the limit of a large difference signal. This implies that in that limit the time parameter increases linearly with the absolute value of the difference signal. Equivalently, the frequency parameter and the bandwidth decrease in inverse proportion to the absolute value of the difference signal.

If the increase in the time parameter (or, equivalently, the decrease in the frequency parameter) of an NDL is faster than that of a DcL in the limit of a large magnitude of the difference signal, the resulting NDL is a differential over-limiter (DoL). In a 1st order DoLs, the absolute rate of change of the output signal in the limit of a large difference signal approaches zero instead of a maximum constant value of a DcL filter.

An example of functional dependency of a DoL bandwidth on the absolute value of the difference signal may be given by equation (1) with the requirement that γ=1+β>1, $$B(|z|) = B_0 \times \{(a|z|^{1+\beta})^b + \exp[-(a|z|^{1+\beta})^b]\}^{-\frac{1}{b}}. \quad (37)$$

It may be easily seen that the DoL bandwidth given by equation (37) is $B(|z|) \propto 1/|z|^{1+\beta}$ for large $|z|$, and decays faster than a bandwidth of a DcL ($B(|z|) \propto |z|^{-1}$ for large $|z|$).

Under certain conditions, such faster decrease of the bandwidth of a DoL in comparison with that of a DcL may provide improved impulsive interference suppression, as illustrated further in this disclosure.

A particular example of the functional dependency of the DoL time parameter on the absolute value of the difference signal may be given by equation (38) below:

$$\tau(|z - \zeta|) = \tau_0 \times \begin{cases} 1 & \text{for } |z - \zeta| \le \alpha \\ \left(\frac{|z - \zeta|}{\alpha}\right)^{1+\beta} & \text{otherwise,} \end{cases} \quad (38)$$

where $\beta > 0$ and a single resolution parameter $\alpha$ replaces the two parameters a and b of equation (37).

FIG. 34 provides a particular example ($\beta = 1;2$ in equation (38)) of the time and frequency parameters, and the output absolute rate of change and its derivative, as functions of the absolute value of the difference signal for a 1st order differential over-limiter. For comparison, the corresponding functions for the canonical differential limiter are shown by the dashed lines.

10 Examples of OTA-Based Implementations of NDLs

This section provides examples of idealized algorithmic implementations of nonlinear differential limiters based on the operational transconductance amplifiers (OTAs) (see, for example, Schaumann and Van Valkenburg [28], Zheng [34]). Transconductance cells based on the metal-oxide-semiconductor (MOS) technology represent an attractive technological platform for implementation of such active nonlinear filters as NDLs, and for their incorporation into IC-based signal processing systems. NDLs based on transconductance cells offer simple and predictable design, easy incorporation into ICs based on the dominant IC technologies, small size (10 to 15 small transistors are likely to use less silicon real estate on an IC than a real resistor), and may be usable from the low audio range to gigahertz applications.

The examples of this section also illustrate how NDLs that comprise electronic components may be implemented through controlling values of these components by the difference between the input signal and a feedback of the output signal. These examples include a variety of common blocks and components (such as voltage- and current-controlled resistors, inductors, and capacitors, and the circuits for control voltages and currents) which may be used by one skilled in the art to construct NDLs of arbitrary behavior, order, and complexity. These blocks and components may be varied in many ways, and such variations are not to be regarded as a departure from the spirit and scope of this invention, and all such modifications will be obvious to one skilled in the art.

10.1 'CRC' Implementation of 1st Order CDL

FIG. 35 shows a generalized block diagram of an 'RC' implementation of a 1st order CDL with a control of the resistive element. If the resistance of the controlled resistor circuit depends on the absolute value of the difference signal as $$R(|x - \chi|) = \frac{1}{g_m} \times \begin{cases} 1 & \text{for } |x - \chi| \le \alpha \\ \frac{|x - \chi|}{\alpha} & \text{otherwise,} \end{cases} \quad (39)$$

the resulting filter is a 1st order CDL with the time parameter $$\tau = RC = \frac{C}{g_m} \times \begin{cases} 1 & \text{for } |x - \chi| \le \alpha \\ \frac{|x - \chi|}{\alpha} & \text{otherwise.} \end{cases} \quad (40)$$

FIG. 36 provides an OTA-based example of a controlled resistor circuit for the CDL shown in FIG. 35, and FIG. 37 shows an example of conceptual schematic for the CDL outlined in FIG. 35.

The circuit shown in FIG. 35 is a 1st order lowpass filter consisting of electronic components (a resistor and a capacitor) and having a bandwidth which may be characterized as an inverse of the product of the values of the resistance R and the capacitance C. When applied to an input signal (voltage) x(t), this filter produces an output filtered signal (voltage) $\chi$(t). The value of the resistance R is dynamically controlled by the difference between the input signal and a feedback of the output filtered signal. The dependence of the controlled resistance on this difference is further characterized by a resolution parameter $\alpha$ and is configured in such a way that the resistance remains constant and equal to an initial value as long as the magnitude (the absolute value) of the difference remains smaller than the resolution parameter. When the magnitude of the difference is larger than the resolution parameter, the resistance increases proportionally to the magnitude of the difference, increasing the time parameter of the filter and decreasing its bandwidth.

10.2 Complex-Valued 1st Order CDL and DoL

FIG. 38 shows an example of a generalized block diagram of an 'RC' implementation of a 1st order complex-valued CDL. If the control voltage is given by $$V_c(|z - \zeta|) = \frac{1}{K} \times \begin{cases} 1 & \text{for } |z - \zeta| \le \alpha \\ \frac{\alpha}{|z - \zeta|} & \text{otherwise,} \end{cases} \quad (41)$$

the resulting filter is a 1st order complex-valued CDL with the time parameter $$\tau = C \frac{K}{\beta} \times \begin{cases} 1 & \text{for } |z - \zeta| \le \alpha \\ \frac{|z - \zeta|}{\alpha} & \text{otherwise.} \end{cases} \quad (42)$$

FIG. 39 provides an OTA-based example of a control voltage circuit for the complex-valued CDL shown in FIG. 38, and FIG. 40 provides an OTA-based example of an absolute value circuit for obtaining the magnitude of the complex difference signal used in the control voltage circuit of FIG. 39.

FIG. 41 shows an example of a generalized block diagram of an 'RC' implementation of a particular ($\beta=1$ in equation (38)) 1st order complex-valued DoL. If the control voltage is given by $$V_c(|z-\zeta|) = \frac{1}{K} \times \begin{cases} 1 & \text{for } |z-\zeta| \le \alpha \\ \left(\frac{\alpha}{|z-\zeta|}\right)^2 & \text{otherwise,} \end{cases} \quad (43)$$

the resulting filter is a 1st order complex-valued DoL with the time parameter $$\tau = C\frac{K}{\beta} \times \begin{cases} 1 & \text{for } |z-\zeta| \le \alpha \\ \left(\frac{|z-\zeta|}{\alpha}\right)^2 & \text{otherwise.} \end{cases} \quad (44)$$

FIG. 42 provides an OTA-based example of a control voltage circuit for the complex-valued DoL shown in FIG. 41, and FIG. 43 provides an OTA-based example of squaring circuits for obtaining the signals used in the control voltage circuit of FIG. 42.

10.3 CDLs with Quantile Offset

FIG. 44 shows a generalized block diagram of an 'RC' implementation of a 1st order CDL with quantile offset. If equation (39) describes the resistance of the controlled resistor circuit, then the output of the filter is given by $$\chi(t) = \frac{1}{C} \int dt \left[ \frac{x(t) - \chi(t)}{R(|x-\chi|)} + \tilde{q}\alpha g_m \right], \quad (45)$$

corresponding to equation (27).

FIG. 45 provides an example of conceptual schematic for the CDL with quantile offset shown in FIG. 44.

FIG. 46 shows a generalized block diagram of an 'RC' implementation of a 1st order complex-valued CDL with quantile offset. If equation (41) describes the voltage of the control voltage circuit, then the output of the filter is given by $$\zeta(t) = \frac{B}{C} \int dt \left\{ [z(t) - \zeta(t)]V_c(|z-\zeta|) + \tilde{q}\frac{\alpha}{K} \right\}, \quad (46)$$

corresponding to equation (27).

As discussed in Section 6.1, differential critical limiters (including CDLs) with quantile offsets may be used as analog rank filters for scalar as well as complex and vector signals. One skilled in the art will recognize that constellation diagrams of various modulation schemes may be represented in terms of quantities expressed through the quantile offset parameters discussed in Section 6.1 (e.g. complex for quadrature carriers, or four-dimensional for modulation schemes of fiber optics and optical communications), and thus DcLs/CDLs with quantile offsets may be used in methods and devices for modulation and demodulation of communication signals.

10.4 'LR' OTA Implementation of 1st Order CDL with Control of Resistive Element FIG. 47 shows an example of a generalized block diagram of an 'LR' implementation of a 1st order CDL with the control of the resistive element, where the inductive element is implemented as an OTA-based active inductor (see, for example, Schaumann and Van Valkenburg [28], Zheng [34]). If the resistance is given by $$\frac{1}{R(V_c)} = \beta V_c, \quad (47)$$

and the control voltage is given by $$V_c = \frac{1}{K} \times \begin{cases} 1 & \text{for } |x-\chi| \le \alpha \\ \frac{|x-\chi|}{\alpha} & \text{otherwise,} \end{cases} \quad (48)$$

then the resulting filter is a 1st order CDL with the time parameter $$\tau = L\frac{\beta}{K} \times \begin{cases} 1 & \text{for } |x-\chi| \le \alpha \\ \frac{|x-\chi|}{\alpha} & \text{otherwise.} \end{cases} \quad (49)$$

FIG. 48 provides an OTA-based example of a control voltage circuit for the 'LR' CDL shown in FIG. 47, and FIG. 49 shows an example of conceptual schematic for the 'LR' CDL outlined in FIG. 47.

10.5 'LR' OTA Implementation of 1st Order CDL with Control of Reactive Element FIG. 50 shows an example of a generalized block diagram of an 'LR' implementation of a 1st order CDL with the control of the reactive element, where the reactive element is an OTA-based active inductor (see, for example, Schaumann and Van Valkenburg [28], Zheng [34]).

If the inductance is given by $$L(V_c) = \frac{C}{g_m \beta V_c}, \quad (50)$$

and the control voltage is given by $$V_c = \frac{1}{K} \times \begin{cases} 1 & \text{for } |x-\chi| \le \alpha \\ \frac{\alpha}{|x-\chi|} & \text{otherwise,} \end{cases} \quad (51)$$

then the resulting filter is a 1st order CDL with the time parameter $$\tau = \frac{C}{g_m R}\frac{K}{\beta} \times \begin{cases} 1 & \text{for } |x-\chi| \le \alpha \\ \frac{|x-\chi|}{\alpha} & \text{otherwise.} \end{cases} \quad (52)$$

FIG. 51 provides an OTA-based example of a control voltage circuit for the 'LR' CDL shown in FIG. 50, and FIG. 52 shows an example of conceptual schematic for the 'LR' CDL outlined in FIG. 50.

10.6 'LR' OTA Implementation of 1st Order CDL with Control of Both Resistive and Reactive Elements FIG. 53 shows an example of a generalized block diagram of an 'LR' implementation of a 1st order CDL with the control of both resistive and reactive elements. If the inductance is given by $$L(\alpha) = \frac{C}{K\alpha g_m^2}, \tag{53}$$

and the resistance is given by $$\frac{1}{R(I_c)} = KI_c = Kg_m \times \begin{cases} \alpha & \text{for } |x - \chi| \le \alpha \\ |x - \chi| & \text{otherwise,} \end{cases} \tag{54}$$

then the resulting filter is a 1st order CDL with the time parameter $$\tau = \frac{C}{g_m} \times \begin{cases} 1 & \text{for } |x - \chi| \le \alpha \\ \frac{|x - \chi|}{\alpha} & \text{otherwise.} \end{cases} \tag{55}$$

FIG. 54 provides an OTA-based example of a control voltage circuit for the 'LR' CDL shown in FIG. 53, and FIG. 55 shows an example of conceptual schematic for the 'LR' CDL outlined in FIG. 53.

10.7 'LR' OTA Implementations of 1st Order Complex-Valued CDL and DoL with Control of Resistive Elements FIG. 56 shows an example of a generalized block diagram of an 'LR' implementation of a 1st order complex-valued CDL with the control of the resistive elements. If the resistance is given by equation (47), and the control voltage is given by $$V_c = \frac{1}{K} \times \begin{cases} 1 & \text{for } |z - \zeta| \le \alpha \\ \frac{|z - \zeta|}{\alpha} & \text{otherwise,} \end{cases} \tag{56}$$

then the resulting filter is a 1st order complex-valued CDL with the time parameter $$\tau = L\frac{\beta}{K} \times \begin{cases} 1 & \text{for } |z - \zeta| \le \alpha \\ \frac{|z - \zeta|}{\alpha} & \text{otherwise.} \end{cases} \tag{57}$$

FIG. 57 provides an OTA-based example of a control voltage circuit for the 'LR' complex-valued CDL shown in FIG. 56.

FIG. 58 shows an example of a generalized block diagram of an 'LR' implementation of a 1st order complex-valued DoL with the control of the resistive elements. If the resistance is given by equation (47), and the control voltage is given by $$V_c = \frac{1}{K} \times \begin{cases} 1 & \text{for } |z - \zeta| \le \alpha \\ \left(\frac{|z - \zeta|}{\alpha}\right)^2 & \text{otherwise,} \end{cases} \tag{58}$$

then the resulting filter is a 1st order complex-valued DoL with the time parameter $$\tau = L\frac{\beta}{K} \times \begin{cases} 1 & \text{for } |z - \zeta| \le \alpha \\ \left(\frac{|z - \zeta|}{\alpha}\right)^2 & \text{otherwise.} \end{cases} \tag{59}$$

FIG. 59 provides an OTA-based example of a control voltage circuit for the 'LR' complex-valued DoL shown in FIG. 58.

10.8 Complex-Valued 'RC' CDL with Varicaps

FIG. 60 shows an example of a generalized block diagram of an 'RC' implementation of a 1st order complex-valued CDL with the control of the capacitive elements (e.g. varicaps, see Stauffer [32]). If the capacitance is given by $$C = C_0 \sqrt{\frac{\Phi}{V_c}}, \tag{60}$$

and the control voltage is given by $$V_c = \frac{1}{K} \times \begin{cases} 1 & \text{for } |z - \zeta| \le \alpha \\ \left(\frac{\alpha}{|z - \zeta|}\right)^2 & \text{otherwise,} \end{cases} \tag{61}$$

then the resulting filter is a 1st order complex-valued CDL with the time parameter $$\tau = RC_0\sqrt{K\Phi} \times \begin{cases} 1 & \text{for } |z - \zeta| \le \alpha \\ \frac{|z - \zeta|}{\alpha} & \text{otherwise.} \end{cases} \tag{62}$$

FIG. 61 provides an OTA-based example of a control voltage circuit for changing the varicap capacitances in the 'RC' complex-valued CDL circuit shown in FIG. 60.

10.9 OTA-Based Implementation of 2nd Order CDL

FIG. 62 provides an example of an OTA-based implementation of a 2nd order constant-Q (Q=1/√2) CDL. The lowpass filter is a 2nd order Butterworth filter (Q=1/√2) based on the Sallen-Key topology (Sallen and Key [27]) shown in FIG. 12. This lowpass filter is transformed into a 2nd order CDL by controlling the resistance R with the control voltage $V_c = V_c(|x - \chi|)$.

FIG. 63 provides an example of a control voltage circuit for the 2nd order CDL shown in FIG. 62.

11 Examples of High-Order NDLs for Replacement of Lowpass Filters

The particular embodiments of high-order NDLs described in this section merely provide illustrations to clarify the inventive ideas, and are not limitative of the claimed invention.

FIG. 64 provides an example of an odd order NDL-based lowpass filter comprising a 1st order NDL. A 5th order NDL is constructed as a 1st order NDL/ANDL (e.g. a 1st order CDL) followed by a 4th order linear lowpass filter. The difference signal is the difference between the input signal and a feedback of the output of the 1st order NDL.

FIG. 65 provides an example of an odd order NDL-based lowpass filter comprising a 3rd order NDL. A 5th order NDL is constructed as a 3rd order NDL/ANDL (e.g. a 3rd order CDL) followed by a 2nd order linear lowpass filter. The difference signal is the difference between the input signal and a feedback of the output of the 3rd order NDL. In this example, the filters are cascaded in the order of rising values of the pole quality factors.

FIG. 66 provides an example of an even order NDL-based lowpass filter comprising a 2nd order NDL. A 4th order NDL is constructed as a 2nd order NDL/ANDL (e.g. a 2nd order CDL) followed by a 2nd order linear lowpass filter, and the filters are cascaded in the order of rising values of the pole quality factors. The difference signal is the difference between the input signal and a feedback of the output of the 2nd order NDL. If, for example, the 4th order NDL-based filter is a 2nd order constant-Q CDL with Q=1/$rl;\sqrt{2}+rl;\sqrt{2}rlxrlx$ and the initial cutoff frequency $\omega_0$, followed by a 2nd order linear filter with Q=1/$rl;\sqrt{2}-/rl;\sqrt{2}rlxrlx$ and the cutoff frequency $\omega_0$, then the resulting filter may be viewed as an NDL-based 4th order Butterworth lowpass filter.

11.1 Improved FrankenSPART Filtering Circuit

Nikitin [19] introduces the FrankenSPART filtering circuit for real-valued signals. The behavior of this circuit may be described by the operator $\underline{S}=\underline{S}(q, \mu, \tau)$ such that $$\underline{S}(q, \mu, \tau)x(t) = \qquad (63)$$
$$\chi(q, \mu, \tau)(t) = \mu \int dt \{\tilde{\mathcal{F}}_{\mu\tau}[x(t) - \chi(q, \mu, \tau)(t)] + 2q - 1\},$$

where $\int dt \ldots$ denotes the primitive (antiderivative), x(t) is the input signal, $\chi(q, \mu,\tau)(t)$ is the output, and the comparator function $\tilde{\mathcal{F}}_{\mu\tau}(x)$ is given by $$\tilde{\mathcal{F}}_{\mu\tau}(x) = \begin{cases} \dfrac{x}{\mu\tau} & \text{for } |x| < \mu\tau \\ \text{sgn}(x) & \text{otherwise,} \end{cases} \qquad (64)$$

where sgn(x) is the sign function. The parameters $\tau$, $\mu$, and q are the time constant, slew rate, and quantile parameters of the FrankenSPART filter, respectively.

Through mathematical manipulation it may be shown that, for a real-valued input, when q=½, $\tau=\tau_0$ and $\mu=\alpha/\tau_0$, the output of the FrankenSPART filtering circuit equals that of the 1st order Canonical Differential Limiter with the resolution parameter $\alpha$ and the time parameter given by equation (18).

Therefore, when an odd order NDL-based filter for real-valued signals employs a 1st order CDL, the latter may be replaced by a FrankenSPART filter, as illustrated in FIG. 67 that provides an example of an odd order CDL/FrankenSPART-based lowpass filter. When the order of the resulting FrankenSPART-based filter is greater or equal 3, this filter may be considered an improved FrankenSPART filter, wherein the improvement comprises the addition of an even order linear lowpass filter with the poles appropriately chosen to achieve the desired initial response of the filter. For example, a filter consisting of a FrankenSPART circuit with q=½, followed by a 2nd order linear filter with Q=1 and the cutoff frequency 1/$\tau$, may be viewed as a FrankenSPART-based 3rd order Butterworth lowpass filter.

12 Improved NDL-Based Filters Comprising Linear Front-End Filters to Suppress Non-Impulsive Component of Interference and/or to Increase its Peakedness As discussed in Section 13.2.6 of this disclosure, when the interfering signal comprises a mixture of impulsive and non-impulsive components, the effectiveness of the mitigation of the interference by an NDL may be greatly improved if the non-impulsive component may be reduced (filtered out) by linear filtering without significantly affecting both the impulsive component of the interference and the signal of interest.

FIG. 68 provides a schematic illustration of such an improved NDL-based filter for the mitigation of an interference comprising impulsive and non-impulsive components. In the figure, the "initial response" should be understood as the total response of the filter when the NDL/ANDL is in its linear mode (i.e. in the limit of small absolute value of the difference signal $|\zeta_1-\zeta_2|$).

It is important to notice that linear filtering may be designed to increase peakedness of the interfering signal even if the latter is not a mixture of (independent) impulsive and non-impulsive components.

For example, unless the interfering signal is smooth (i.e. its time derivatives of any order are continuous), its time derivatives of some order may contain jump discontinuities, and subsequent differentiation of the signal containing such discontinuities will transform these discontinuities into singular $\delta$-functions (see Dirac [8], for example).

As an illustration, an idealized discrete-level (digital) signal may be viewed as a linear combination of Heaviside unit step functions (Bracewell [5], for example). Since the derivative of the Heaviside unit step function is a Dirac $\delta$-function (Dirac [8], for example), the derivative of an idealized digital signal is a linear combination of Dirac $\delta$-functions, which is a limitlessly impulsive signal with zero interquartile range and infinite peakedness.

Since multiplying by s in the complex S-plane has the effect of differentiating in the corresponding real time domain, if a linear filter contains N zeros at s=0 (e.g. it contains a highpass filter), the effect of such a filter on the input signal is equivalent to (i) differentiating the input signal N times, then (ii) applying to the resulting Nth derivative of the input a filter with a transfer function equal to the original transfer function divided by $s^N$ (that is, the original filter with N zeros at s=0 excluded).

For example, a 1st order highpass filter with the cutoff frequency $f_c$ may be viewed as a differentiator followed by a 1st order lowpass filter with the cutoff frequency $f_c$, as illustrated in FIG. 69. In this example, differentiation of the input signal transforms it into an impulsive pulse train.

Likewise, a 2nd order highpass filter with the cutoff frequency $f_c$ and the pole quality factor Q may be viewed as two consecutive differentiators followed by a 2nd order lowpass filter with the cutoff frequency $f_c$ and the pole quality factor Q, as illustrated in FIG. 70. In this example, 2nd derivative of the input signal is an impulsive pulse train.

It should be easily deducible from the examples of FIG. 69 and FIG. 70 that, when $f_c$ is sufficiently large (e.g. approximately equal to, or larger than the bandwidth of the input signal), the output of a highpass filter of Nth order approximates that of a sequence of N differentiators.

When the signal of interest is a bandpass signal (i.e. a signal containing a band of frequencies away from zero frequency), a linear bandpass filter would typically be used to filter out the interference. Such a bandpass filter may be viewed as containing a sequence of lowpass and highpass filters, with the latter filters containing zeros at s=0, and a highpass filter of Nth order with sufficiently large cutoff frequency may be viewed as a sequence of N differentiators.

Since differentiation may increase the impulsiveness (peakedness) of the interfering signal in excess of that of the signal of interest, an improved NDL-based bandpass filter may thus include a sequence of a highpass filter followed by an NDL-based lowpass filter, as outlined in FIG. 71.

The filter sequence shown in panel (c) of FIG. 71 deserves a particular comment. The initial response (i.e. when the NDL is in its linear regime) of the first two stages in this panel is that of a broadband bandpass filter (an RC differentiator followed by an RC integrator). Thus such a sequence of two stages, provided that $f_0$ is sufficiently small and $f_c$ is sufficiently large, may constitute an interference suppressing front end for a large variety of linear filters with nonzero response confined to within the passband $[f_0, f_c]$.

Illustrative examples of using such improved NDL-based bandpass filters outlined in FIG. 71 to mitigate sub-Gaussian (non-impulsive) noise affecting a bandpass signal are given further in this disclosure.

Given an original linear filter, an equivalent linear filter can be constructed by cascading the original filter with two other linear filters, 1st and 2nd, where the transfer function of the second filter is a reciprocal of the transfer function of the first filter. A filter with an ideal differentiator (transfer function $\propto s$) preceding the original linear filter and an ideal integrator (transfer function $\propto 1/s$) following the original linear filter may be considered an example of such an equivalent linear filter.

Indeed, if $\omega(t)$ is the impulse response of the original linear filter and $z(t)$ is the input signal, then $$\int dt \omega(t) * \left[\frac{d}{dt} z(t)\right] = \int dt \frac{d}{dt}[\omega(t) * z(t)] = \omega(t) * z(t) + const, \quad (65)$$

where the asterisk denotes convolution, $\int dt$ denotes antiderivative (aka primitive integral or indefinite integral), and 'const' is the constant of integration ('DC offset'). The latter may be ignored since in practice differentiation may be performed by a 1st order highpass filter with sufficiently large cutoff frequency, and integration may be performed by a 1st order lowpass filter with sufficiently small cutoff frequency.

If differentiation noticeably increases impulsiveness of the interference without significantly affecting the signal of interest (or even decreasing the peakedness of the signal of interest), then replacing the linear lowpass filter in the 'differentiator-lowpass-integrator' sequence by a nonlinear impulsive noise filter (e.g. by a median filter or an NDL) may improve interference suppression. FIG. 72 provides an idealized illustration of this statement.

FIG. 72 consists of six rows of panels (I through VI), each row consisting of three panels. The left panels in each row show signal fragments in the time domain, the middle panels show the PSDs of the respective signals, and the right panels show the amplitude densities of the signals. In the right panels of rows I through V the dashed lines show, for comparison, the Gaussian densities with the same variance as the respective signals, and the dashed line in the right panel in row VI shows the amplitude density of the signal $x_1(t)$ which is designated as the signal of interest. The dashed lines in the left panels in rows III and VI show, for comparison, the time domain traces of the signal of interest, and the dashed line in the middle panel of row VI shows the PSD of the signal of interest.

The upper row of the panels (I) in FIG. 72 shows the incoming signal of interest $x_1(t)$ (left panel), along with its PSD (middle panel) and amplitude density (right panel). It is a bandlimited (raised cosine-shaped) signal with a Gaussian amplitude distribution (0 dBG peakedness).

The second row of panels (II) shows the interfering signal $x_2(t)$ that is independent of the signal of interest. This signal can be viewed as an idealized 'staircase' digital-to-analog converter (DAC) approximation of some other bandlimited (raised cosine-shaped) signal, with the same PSD and amplitude distribution as $x_1(t)$, and with finite-time transitions between the 'steps' such that the transition time is small in comparison with the duration of the steps. As can be seen in the middle panel, the PSD of the interfering signal is essentially identical to that of the signal of interest, as the PSD values at higher frequencies are insignificant in comparison with the PSD values in the nominal passband.

As can be seen in the third row of panels (III), the PSD of the $x_1(t) x_2(t)$ mixture is the sum of the PSDs of $x_1(t)$ and $x_2(t)$, and is essentially double the PSD of the signal of interest. The amplitude distribution of the mixture remains Gaussian, with the standard deviation $\sqrt{2}$ times the standard deviation of the signal of interest.

The time derivative of the signal of interest $\dot{x}_1(t)$ is a continuous function of time, while the time derivative of the interfering signal $\dot{x}_2(t)$ is an impulsive pulse train consisting of pulses of the duration equal to the transition time, and the amplitudes proportional to the amplitudes of the respective transitions. Thus, as can be seen in the left panel of the fourth row (IV), the time derivative of the $x_1(t)+x_2(t)$ mixture is the derivative of the signal of interest $\dot{x}_1(t)$ affected by the impulsive noise $\dot{x}_2(t)$, and the peakedness of the $\dot{x}_1(t)+\dot{x}_2(t)$ mixture (6.3 dBG) is significantly higher than that of a Gaussian distribution. Since the PSD of the time derivative of a signal equals to the original signal's PSD multiplied by the frequency squared, the higher-frequency portions of the $\dot{x}_1(t)+\dot{x}_2(t)$ mixture's PSD become noticeable, as may be seen in the middle panel.

The impulsive noise $\dot{x}_2(t)$ can be mitigated by an impulse noise filter, e.g. an NDL. In the example of FIG. 72, a median filter is used to remove the impulsive component $\dot{x}_2(t)$ from the $\dot{x}_1(t) \dot{x}_2(t)$ mixture. This filter suppresses the impulsive component, effectively removing all its associated frequency content, as can be seen in the fifth row of panels (V). The resulting median-filtered signal is the derivative of the signal of interest $\dot{x}_1(t)$, with the addition of a small residual noise.

As may be seen in the sixth row of panels (VI), integrating the output of the median filter produces the signal $\tilde{x}_1(t)$ that is equal to the signal of interest $x_1(t)$ with the addition of a noise that is much smaller than the original interfering signal $x_2(t)$, resulting in the SNR increase from 0 dB to 22.6 dB.

FIG. 72 thus illustrates that an impulse noise filter such as an NDL may improve separation between signal and noise even if neither the signal nor the noise is impulsive. If a linear filter turns either the signal or the noise into impulsive, the improved separation may be achieved by applying the sequence '(linear filter)→(impulse noise filter)→(inverse linear filter)' to the mixture of the signal and the noise.

FIG. 73 provides an illustrative schematic recipe for constructing an improved NDL-based filter comprising a linear front-end (LFE) filter to increase the impulsiveness of the interference. In the figure, an LFE filter is referred to as "a 1st sequence of linear stages."

FIG. 74 provides a particular illustration of constructing an improved NDL-based bandpass filter. Such a filter may improve interference suppression if differentiation increases impulsiveness of the interference in relation to the signal of interest. Since a highpass filter may be viewed as a differentiator followed by a lowpass filter, and since peakedness generally decreases with the reduction in the bandwidth, the front-end highpass filter should be the filter with the highest cutoff frequency.

FIG. 75 provides a particular illustration of constructing an improved 2nd order NDL-based bandpass filter. In practice, the differentiator may be constructed as a 1st order highpass filter with a sufficiently high cutoff frequency (e.g. much larger than $\omega_c$). Such a filter may improve interference suppression if differentiation increases impulsiveness of the interference in relation to the signal of interest.

FIG. 76 provides an idealized particular illustration of constructing an improved NDL-based lowpass filter. Such a filter may improve interference suppression if differentiation increases impulsiveness of the interference in relation to the signal of interest.

One skilled in the art will recognize that the improved NDL-based filters comprising LFE filters to suppress non-impulsive components of the interference and/or to increase impulsiveness of the interference discussed in this section (Section 12) may be varied in many ways. All such variations are not to be regarded as a departure from the spirit and scope of this invention, and all such modifications will be obvious to one skilled in the art.

In this disclosure, any sequence of filters comprising an NDL and/or an ANDL (e.g. an NDL/ANDL preceded and/or followed by a linear and/or nonlinear filter or filters), and/or any NDL/ANDL-based filter may be referred to as an NDL and/or ANDL, respectively.

13 Examples of NDL Applications

All examples of the NDL applications provided below are used only as illustrations to clarify the utility of the inventive ideas, and are not limitative of the claimed invention.

13.1 NDL-Based Antialiasing Filters to Improve Performance of ADCs

A transient outlier in the input signal will result in a transient outlier in the difference signal of a filter, and an increase in the input outlier by a factor of K will result, for a linear filter, in the same factor increase in the respective outlier of the difference signal. If a significant portion of the frequency content of the input outlier is within the passband of the linear filter, the output will typically also contain an outlier corresponding to the input outlier, and the amplitudes of the input and the output outliers will be proportional to each other.

Outliers in the output of an antialiasing filter may exceed the range of an ADC, causing it to saturate, and a typical automatic gain control (AGC) circuit may not be able to compensate for the outliers due to their short duration. Saturation of the ADC input may lead to noticeable degradation of the ADC performance, including significant nonlinearity of its output.

Due to high nonlinearity of the delta-sigma modulation, $\Delta\Sigma$ converters are especially susceptible to misbehavior when their input contains high-amplitude transients (impulse noise). When such transients are present, larger size and more expensive converters may need to be used, increasing the overall size and cost of a device, and its power consumption.

Also, if the output of a linear antialiasing filter is still impulsive as a consequence of the presence of impulsive noise at its input, to avoid ADC saturation the gain of the AGC may need to be reduced below that required for a Gaussian noise of the same power, due to 'heavier tails' of an impulsive noise distribution. That may reduce the effective resolution of an ADC with respect to the signal of interest, and/or require the use of a higher resolution converter.

Since an NDL-based antialiasing filter may mitigate impulsive interference affecting the signal of interest, the total power of the interference in the signal's passband may be reduced, enabling further increase of the effective resolution of an ADC with respect to the signal of interest.

Thus, with respect to ADC performance, replacing a linear antialiasing filter with an NDL/ANDL-based filter may address either or both issues, the ADC saturation due to outliers and the loss of the effective resolution due to impulsive interference. Also, since the output outliers of the antialiasing filter are suppressed, the automatic gain control becomes insensitive to outliers, which improves the linearity and the overall performance of an ADC.

FIG. 77 provides an illustration of using an NDL/ANDL filter as a replacement for an anti-aliasing filter to improve performance of an analog-to-digital converter. An adaptive NDL (ANDL) may be preferred when an optional automatic gain control (AGC) is not enabled.

13.2 Impulsive Noise Mitigation

FIG. 78 through FIG. 105 illustrate the basic principles of the impulsive noise mitigation by nonlinear differential limiters.

FIG. 78 shows the fragment of the signal processing chain used in the examples of FIG. 79 through FIG. 86, and the responses of the respective filters in the chain. In these examples, the analog filters are Butterworth filters (7th order for the preselect filter, and 4th order for the anti-aliasing filter), and the digital baseband filter is an FIR raised cosine filter (Proakis and Manolakis [26], for example) with roll-off factor 0.25. The anti-aliasing Butterworth filter is constructed out of two cascaded 2nd order filters with the respective pole quality factors $1/rl;\sqrt{2}+rl;\sqrt{2rlxrlx}$ and $1/rl;\sqrt{2}-rl;\sqrt{2rlxrlx}$. Notice that the initial bandwidth (at point I after the preselect filter) is much larger than the bandwidth of both the anti-aliasing filter (point II) and the baseband filter (point III).

13.2.1 Measures of Peakedness

Referring to a noise as impulsive implies that the distribution of its instantaneous amplitude and/or power has a high degree of peakedness relative to some standard distribution, such as the Gaussian distribution. In this disclosure, "a high degree of peakedness" means "peakedness higher than that of the Gaussian distribution."

Various measures of peakedness may be constructed. Examples include, for instance, the excess-to-average power ratio described by Nikitin [23, 24], or the measures based on the real-time tests of normality and detection and quantification of impulsive interference disclosed in Section 7. One of the advantages of these measures is that they may be obtained in real time using analog circuitry, without high-rate digitization followed by intensive numerical computations. In the subsequent examples, however, we use a measure of peakedness based on the classical definition of kurtosis (Abramowitz and Stegun [2], for example).

The classical definition of kurtosis, or the fourth-order cumulant, of the signal x(t) is as follows:

$$\text{kurt}(x) = \langle (x-\langle x \rangle)^4 \rangle - 3\langle (x-\langle x \rangle)^2 \rangle^2, \quad (66)$$

where the angular brackets denote the time averaging. Kurtosis is zero for a Gaussian random variable. For most (but not all) non-Gaussian random variables, kurtosis is nonzero.

Based on the above definition of kurtosis, the peakedness may be measured in units "decibels relative to Gaussian" (dBG) in relation to the kurtosis of the Gaussian (aka normal) distribution as follows:

$$K_{dBG}(x) = 10 \lg\left[\frac{\langle (x-\langle x \rangle)^4 \rangle}{3\langle (x-\langle x \rangle)^2 \rangle^2}\right]. \quad (67)$$

By this definition, the Gaussian distribution has zero dBG peakedness. Impulsive noise would typically have a higher peakedness than the Gaussian distribution (positive dBG). In time domain, high peakedness means a higher occurrence of outliers. In terms of the amplitude distribution of the signal, positive dBG peakedness normally translates into 'heavier tails' than those of the Gaussian distribution.

It is important to notice that while positive dBG peakedness would indicate the presence of an impulsive component, negative or zero dBG peakedness does not exclude the presence of such an impulsive component. This simply follows from the following linearity property of kurtosis: If $x_1$ and $x_2$ are two independent random variables, it holds that $$\text{kurt}(x_1+x_2) = \text{kurt}(x_1) + \text{kurt}(x_2). \quad (68)$$

Thus a mixture of super-Gaussian (positive kurtosis) and sub-Gaussian (negative kurtosis) variables may have any value of kurtosis.

However, the examples of FIG. 79 through FIG. 86 do not involve sub-Gaussian noise, and thus the dBG measure given by equation (67) is appropriate for quantification of noise peakedness. Discussion of the mitigation of interference comprising both super- and sub-Gaussian components is given later in this disclosure in Section 13.2.6.

13.2.2 Impulsive and Non-Impulsive Noises and their Peakedness Along the Signal Processing Chain FIG. 79 shows the PSDs of the input white noise which is Gaussian (top row of the panels), strongly impulsive (bottom row of the panels), and the 50/50 (in power) mixture of the Gaussian and impulsive noises (middle row of the panels), measured at points I, II, and III of the signal chain shown at the top of the figure. Initially, at point I, the peakedness of the strongly impulsive noise is 10.2 dBG, while the peakedness of the 50/50 mixture is 5.2 dBG as expected for this mixture from equations (67) and (68). One may see that (i) peakedness is not revealed by the power spectra and (ii) peakedness of impulsive noise decreases as the noise bandwidth is reduced by filtering.

The left-hand panels in FIG. 80 show the time domain traces of the noise at point I (before the anti-aliasing filter), while the right-hand panels show the amplitude densities of the noise at point I (solid lines) in comparison with the Gaussian distribution (dashed lines).

The left-hand panels in FIG. 81 show the time domain traces of the noise at point II (after the anti-aliasing filter), while the right-hand panels show the amplitude densities of the noise at point II (solid lines) in comparison with the Gaussian distribution (dashed lines). One may see that the noise outliers are broadened by the anti-aliasing filtering while their amplitude is reduced, which leads to the decrease in the peakedness of the noise.

The left-hand panels in FIG. 82 show the time domain traces of the noise at point III (in baseband), while the right-hand panels show the amplitude densities of the noise at point III (solid lines) in comparison with the Gaussian distribution (dashed lines). The noise peakedness is further reduced.

One may see from FIG. 80 through FIG. 82 that broadband white noise that starts out as impulsive becomes less impulsive, and its distribution becomes more Gaussian-like, as the noise bandwidth is reduced by linear filtering.

13.2.3 Linear Filtering of Signal Affected by Impulsive and Non-Impulsive Noises of the Same Power In FIG. 83 through FIG. 86, a signal of interest (a Gaussian signal within the baseband) is affected by the noises used in the examples of FIG. 79 through FIG. 82.

FIG. 83 shows the power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure. One may see that when linear filtering is used in the signal chain, there is no difference in the power densities for signals affected by impulsive and/or non-impulsive noise, and that the signal-to-noise ratios along the signal processing chain remain the same regardless the noise composition/peakedness.

The left-hand panels in FIG. 84 show the time domain traces of the signal+noise mixtures (thin black lines) at point I (before the anti-aliasing filter), while the right-hand panels show the amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 85 show the time domain traces of the signal+noise mixtures (thin black lines) at point II (after the anti-aliasing filter), while the right-hand panels show the amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 86 show the time domain traces of the signal+noise mixtures (thin black lines) at point III (in baseband), while the right-hand panels show the amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

13.2.4 NDL-Based Filtering of Signal Affected by Impulsive and Non-Impulsive Noises FIG. 87 through FIG. 90 illustrate, for the same signal+noise mixtures as those used in FIG. 83 through FIG. 86, that if an impulsive component is present in broadband noise, employing an NDL early in the signal chain lowers the noise floor without affecting the signal, and increases signal-to-noise ratios along the signal processing chain following the NDL. In these examples, an NDL (a 2nd order constant-Q CDL with Q=1/rl;√2+rl;√2rlxrlx) replaces the respective linear filter in the anti-aliasing filter.

In the absence of impulsive noise, the NDL-based anti-aliasing is identical to the linear anti-aliasing filter, as may be seen from the comparison of the upper rows of panels in FIG. 87 through FIG. 90 with those in FIG. 83 through FIG. 86. If an impulsive component is present, however, the NDL-based anti-aliasing filter lowers the noise floor throughout the subsequent signal chain (including the baseband), without affecting the signal, as may be seen from the comparison of the lower and middle rows of panels in FIG. 87 through FIG. 90 with the respective panels in the top rows.

FIG. 87 shows the power spectral densities of the signal+noise mixtures along the signal chain shown at the top, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

The left-hand panels in FIG. 88 show the time domain traces of the signal+noise mixtures (thin black lines) at point I (before the anti-aliasing filter), while the right-hand panels show the amplitude densities of the mixtures at point I (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 89 show the time domain traces of the signal+noise mixtures (thin black lines) at point II (after the anti-aliasing filter), while the right-hand panels show the amplitude densities of the mixtures at point II (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

The left-hand panels in FIG. 90 show the time domain traces of the signal+noise mixtures (thin black lines) at point III (in baseband), while the right-hand panels show the amplitude densities of the mixtures at point III (solid lines) in comparison with the Gaussian distribution (dashed lines). For reference, the time domain traces of the signal without noise are shown by the thick lines in the left-hand panels, and the signal-to-noise ratios are indicated in the upper left corners of the respective panels.

If the Shannon formula (Shannon [29]) is used to calculate the capacity of a communication channel, the baseband SNR increase from −0.8 dB to 0.9 dB (linear filter vs. NDL for 50/50 mixture of the impulsive and thermal noise) results in a 33% increase in the channel capacity, while the SNR increase from −0.8 dB to 16.2 dB (linear filter vs. NDL for the impulsive noise only) results in a 520% increase in the channel capacity.

13.2.5 Mitigation of Impulsive Noise Coupled from Adjacent Circuitry

An idealized discrete-level (digital) signal may be viewed as a linear combination of Heaviside unit step functions (Bracewell [5], for example). Since the derivative of the Heaviside unit step function is a Dirac δ-function (Dirac [8], for example), the derivative of an idealized digital signal is a linear combination of Dirac δ-functions, which is a limitlessly impulsive signal with zero interquartile range and infinite peakedness. Then the derivative of a "real" (i.e. no longer idealized) digital signal may be represented by a convolution of a linear combination of Dirac δ-functions with a continuous kernel. If the kernel is sufficiently narrow, the resulting signal may appear as an impulse train protruding from a continuous background signal. Thus impulsive interference occurs "naturally" in digital electronics as the result of coupling between various circuit components and traces.

FIG. 91 provides an illustration of a simplified interference scenario where a 'staircase' DAC signal is "smoothened" by a lowpass filter, then capacitively coupled into an adjacent trace.

FIG. 92 provides clarifying details for the interference scenario shown in FIG. 91. The capacitor performs time-domain differentiation, transforming the non-impulsive DAC signal into an impulsive interference. The combination of a lowpass filter and a capacitive coupling forms a bandpass filter with the response shown in the figure. When the input of this bandpass filter is the DAC signal shown in the top panel, the output is the impulsive pulse train shown in the bottom panel.

The left-hand panel of FIG. 93 shows the time domain trace of the signal+noise mixture where the noise is the DAC interference from the scenario illustrated in FIG. 91 and FIG. 92, and the signal of interest is some small signal within the baseband frequency. For reference, the signal without noise is overlaid on top of the signal+noise trace (thick line), and the signal-to-noise ratio is indicated in the upper left corner of the panel. The right-hand panel of FIG. 93 shows the amplitude density of the signal+noise mixture (solid line) in comparison with the Gaussian distribution (dashed line). This signal+noise mixture forms the input signal at point I (before the anti-aliasing filter) of both signal chains shown in FIG. 94.

FIG. 94 shows a signal chain with a linear anti-aliasing filter (top), and a signal chain with an NDL-based anti-aliasing filter (bottom). All filters are the same as the respective filters used in the examples of FIG. 78 through FIG. 90.

FIG. 95 shows the time domain traces of the signal+noise mixtures and their amplitude densities at point II (upper set of panels) and at point III (lower set of panels). The time domain traces are shown in the left-hand panels, while the right-hand panels show the amplitude densities of the mixtures in comparison with the Gaussian distribution (dashed lines). For reference, the time domain traces of the signal without noise are shown by the thick lines in the left-hand panels, and the signal-to-noise ratios are indicated in the upper left corners of the respective panels.

FIG. 96 shows the power spectral densities of the signal+noise mixtures along the respective signal chains, measured at points I (before the anti-aliasing filter), II (after the anti-aliasing filter), and III (in baseband). For reference, the respective PSDs of the signal without noise are shown by the black shading. The signal-to-noise ratios are indicated in the upper right corners of the respective panels in the figure.

One may see from FIG. 96 that while the linear filtering eliminates only the noise components outside of the baseband, the NDL-based filtering suppresses all components of the impulsive noise, including those within the baseband, without significantly affecting the baseband signal of interest.

If the Shannon formula (Shannon [29]) is used to calculate the capacity of a communication channel, the baseband SNR increase from −5.9 dB to 9.3 dB (linear filter vs. NDL) results in an 885% increase in the channel capacity, or almost an order of magnitude.

13.2.6 Improving NDL-Based Mitigation of Interference when the Latter Comprises Impulsive and Non-Impulsive Components Typically, the NDL-based filters are more effective the higher the peakedness of the (broadband) impulsive noise affecting the signal of interest. When the interfering signal comprises a mixture of impulsive and non-impulsive components, the total peakedness is smaller than the peakedness of the most impulsive component, and the effectiveness of an NDL applied directly to the signal affected by such mixed interference may be greatly reduced.

However, in many instances the peakedness of a mixed interference may be increased by linear filtering preceding the NDL filter, provided that this filtering does not significantly affect the impulsive component.

Assume, for example, that the interference consists of two independent components $n_1(t)$ and $n_2(t)$, where $n_1$ is impulsive (high peakedness), and $n_2$ is non-impulsive (low peakedness).

If the frequency spectra (the PSDs) of $n_1$ and $n_2$ do not significantly overlap (e.g. one spectrum is a line spectrum, and the other one is a diffuse spectrum, or both are distinct line spectra), then the non-impulsive component $n_2$ may be significantly reduced (filtered out) by linear filtering without significantly affecting the impulsive component $n_1$.

For example, $n_1$ may be a broadband diffuse impulsive noise (e.g. the white impulsive noise used in the examples presented in FIG. 79 through FIG. 90), and $n_2$ may be a non-impulsive interferer with a line or narrow band spectrum. If, for instance, $n_2$ is a single tone with the frequency outside of the baseband, then a notch filter at the frequency of the tone $n_2$ may increase the peakedness of the interfering mixture without affecting the baseband signal of interest, and an NDL-based filter following the notch filter may more effectively mitigate the remaining interference.

If $n_1$ is an impulsive noise with a line spectrum (e.g. the coupled impulsive noise used in the examples of FIG. 92 through FIG. 96), and $n_2$ is an AWGN, then a properly configured bandstop filter with the stop bands between the lines of the $n_1$ power density spectrum (see the spectrum lines shown in the leftmost panels of FIG. 96) may increase the peakedness of the interfering mixture without affecting the baseband signal of interest, and an NDL-based filter following the bandstop filter may more effectively mitigate the remaining interference. Alternatively, an appropriate comb (multiple passband) filter may be used to pass through the impulsive portion $n_1$ of the interference and the baseband signal, while suppressing the non-impulsive portion $n_2$.

As yet another example, both $n_1$ and $n_2$ may have diffuse spectra, but $n_1$ is band-limited (e.g. within a certain range of relatively low frequencies) while $n_2$ occupies a wider spectrum range (e.g. extends to higher frequencies than $n_1$). Then a linear filter preceding an NDL and limiting the bandwidth of the interfering mixture to within the spectrum range of $n_1$ (e.g. a lowpass filter with the bandwidth equal to the bandwidth of the impulsive component) may increase the peakedness of the noise and may improve the mitigation of the remaining interference by the NDL.

In FIG. 97 and FIG. 98, the impulsive noise is the DAC interference from the scenario illustrated in FIG. 91 and FIG. 92, and the signal of interest is some small signal within the baseband frequency (see Section 13.2.5). The non-impulsive component of the interference comes from a strong transmitter in the band adjacent to the baseband signal, and the presence of a strong non-impulsive component reduces the total peakedness of the interference to 0.8 dBG, as may be seen from the leftmost panels in FIG. 97 and FIG. 98.

Low peakedness of such mixed interference greatly reduces the effectiveness of an NDL applied directly to the signal affected by this interference, as may be seen in the rightmost panels of FIG. 97. While the baseband SNR still increases, the increase is only from −5.9 dB to −5.1 dB, much smaller than the increase from −5.9 dB to 9.3 dB achieved in the absence of the non-impulsive component (see Section 13.2.5).

If the Shannon formula (Shannon [29]) is used to calculate the capacity of a communication channel, the baseband SNR increase from −5.9 dB to −5.1 dB (linear filter vs. NDL without LFE) results only in an 18% increase in the channel capacity.

Since the additional interference lies outside the baseband, this interference does not contribute to the baseband noise as linear filtering completely removes it. The only noise component affecting the baseband SNR is the impulsive component. A linear filter, while removing all noise outside the baseband, leaves the baseband component of the impulsive noise intact. As the result, the baseband SNR remains −5.9 dB in all linear filtering examples (the upper rows of panels) of FIG. 96, FIG. 97, and FIG. 98.

In the example of FIG. 98, an LFE filter (a bandstop filter with constant group delay) is used to filter out the non-impulsive component of the interference. As the result, the non-impulsive component is suppressed while the signal and the impulsive noise component remain intact. After the bandstop filter (at point II of FIG. 98), the signal+noise mixture is essentially identical to the input signal+noise mixture of the example of FIG. 96. The peakedness of the noise increases to 4.5 dBG, and the subsequent filtering with an NDL-based anti-aliasing filter (a 2nd order constant-Q CDL with $Q=1/rl;\sqrt{2}+rl;\sqrt{2}rlxrlx$ a followed by a 2nd order linear filter with $Q=1/rl;\sqrt{2}-rl;\sqrt{2}rlxrlx$) effectively mitigates the impulsive interference, improving the baseband SNR to 9.3 dB.

If the Shannon formula (Shannon [29]) is used to calculate the capacity of a communication channel, the baseband SNR increase from −5.9 dB to 9.3 dB (linear filter vs. improved NDL with LFE) results in an 885% increase in the channel capacity, or the same increase as in the absence of the non-impulsive component of the interference (see Section 13.2.5).

13.2.7 Increasing Peakedness of Interference to Improve its NDL-Based Mitigation Linear filtering may be designed to increase peakedness of the interfering signal. For example, often a continuous interfering signal may be represented by a convolution of a continuous kernel with a signal containing jump discontinuities. Differentiation of a jump discontinuity transforms it into a singular δ-function multiplied by the signed magnitude of the 'jump' (see Dirac [8], for example), and, if the kernel is sufficiently narrow, its convolution with the resulting δ-function may appear as an "impulse" protruding from a continuous background signal.

Unless the interfering signal is smooth (i.e. its time derivatives of any order are continuous), its time derivatives of some order may contain jump discontinuities, and subsequent differentiation of the signal containing such discontinuities will transform these discontinuities into singular δ-functions. If the signal of interest is "smoother" than the interfering signal (i.e. it has continuous derivatives of higher order than the interfering signal), then differentiation may increase the impulsiveness (peakedness) of the interfering signal in excess of that of the signal of interest.

It should be mentioned that consecutive differentiation may increase the impulsiveness (peakedness) of a signal even if the latter is truly "smooth" in mathematical sense, leaving aside the question of such a signal being physically realizable. This is illustrated in FIG. 99 for a mathematically smooth signal fragment. In FIG. 99, $1_{>0}(x)$ is the indicator function $$1_{>0}(x) = \begin{cases} 1 & \text{for } x > 0 \\ 0 & \text{otherwise.} \end{cases} \quad (69)$$

In the examples of FIG. 100 and FIG. 101, a bandpass signal adjacent to the zero frequency is affected by a sub-Gaussian (−1.7 dBG peakedness) noise which is a mixture of a band-limited thermal noise and a band-limited $1/f^2$ Brownian noise (in particular, 'asynchronous random walk' where the spatial increment and the time increment are obtained separately).

Since the noise is sub-Gaussian (non-impulsive), if the bandpass filter is constructed as a lowpass filter followed by a highpass filter, replacing the front end lowpass filter with an NDL does not offer any improvement in the passband SNR.

Likewise, since the 1st order highpass filter with some cutoff frequency may be viewed as a differentiator followed by the 1st order lowpass filter with the same cutoff frequency, if the bandpass filter is constructed as a highpass filter with low cutoff frequency followed by a lowpass filter with relatively high cutoff frequency, the peakedness of the output of the highpass stage is low, and replacing the lowpass filter with an NDL still does not offer noticeable improvement in the passband SNR.

If, however, the highpass stage is a 1st order highpass filter with a relatively high cutoff frequency (a differentiator), such a stage essentially differentiates the signal+noise mixture and the interference becomes super-Gaussian (9.4 dBG peakedness in the examples of FIG. 100 and FIG. 101). Then an NDL-based filter (an NDL-based stage followed by a low cutoff frequency 1st order lowpass filter (RC integrator) in FIG. 100, or a low initial frequency 1st order NDL followed by a linear lowpass stage in FIG. 101) effectively suppresses the impulsive interference, increasing the passband SNR to 4.5 dB in FIG. 100, and to 4.7 dB in FIG. 101.

In FIG. 100 and FIG. 101, the dashed lines in the PSD plots, and the thick lines in the time domain plots show, for comparison, the PSD and the time domain traces of the signal of interest.

If the Shannon formula (Shannon [29]) is used to calculate the capacity of a communication channel, the passband SNR increase from −3 dB to 4.5 dB (linear bandpass filter vs. NDL-based bandpass filter in FIG. 100) results in a 230% increase in the channel capacity, and the passband SNR increase from −3 dB to 4.7 dB (linear bandpass filter vs. NDL-based bandpass filter in FIG. 101) results in a 238% increase in the channel capacity.

One skilled in the art will recognize that a qualitatively similar result to the examples of FIG. 100 and FIG. 101 may be obtained if the sub-Gaussian noise affecting the signal of interest is a 'square wave' signal from a digital clock.

13.2.8 Mitigation of Impulsive Noise in Communication Channels by Complex-Valued NDL-Based Filters When the condition $|z(t)-\zeta(t)| \leq \alpha$ is satisfied, the response of an NDL circuit equals that of a lowpass filter with the NDL's initial parameters (that is, the parameters of the NDL in the limit of small $|z-\zeta|$). Otherwise, the nonlinear response of the NDL filter is such that it limits the magnitude of the outliers in the output signal. If an NDL circuit with appropriate initial bandwidth is deployed early in the signal chain of a receiver channel affected by non-Gaussian impulsive noise, it may be shown that there exists such resolution parameter $\alpha$ that maximizes signal-to-noise ratio and improves the quality of the channel. The simplified examples shown in FIG. 102 through FIG. 104 illustrate this statement.

In FIG. 102 through FIG. 104, the dashed lines in the frequency domain panels, and the thin black lines in the time domain panels show the incoming signal-plus-noise mixture, for both time (separately for the in-phase and the quadrature (I/Q) traces) and frequency domains. The incoming signal represents a communication signal with the total bandwidth of 5 MHz, affected by a bandlimited mixture of thermal (Gaussian) and white impulsive noises, with the total noise peakedness of 7.5 dBc. The signal-to-noise ratio in the baseband is 3 dB, and the bandwidth of the noise is an order of magnitude greater than the channel bandwidth.

The incoming signal is filtered by (i) the linear filters shown at the top left of the figures and (ii) the NDL-based circuits (shown at the top right of the figures) with appropriately chosen resolution parameters. The filtered signals are shown by the solid lines in the frequency domain plots, and by the thick black lines in the time domain plots. Note that the linear filters are just the NDL-based circuits in the limit of a large resolution parameter.

The NDL-based filters are a 1st order CDL (FIG. 102) and a 1st order DoL with β=1 (FIG. 104) followed by a 2nd order linear filter with Q=1, and a 2nd order CDL with Q=1/$rl$;√2+$rl$;√2$rlxrlx$ (FIG. 103) followed by a 2nd order linear filter with Q=1/$rl$;√2+$rl$;√2$rlxrlx$.

As may be seen in the left-hand panels, the linear filters do not affect the baseband signal-to-noise ratio, as they only reduce the power of the noise outside of the channel. Also, the noise remains relatively impulsive (3.3 dBG for the 3rd order filters, and 3.1 dBG for the 4th order filter), as may be seen in the upper panels on the left showing the in-phase/quadrature (I/Q) time domain traces. On the other hand, the NDL-based circuits (the right-hand panels) improve the signal-to-noise ratio in the baseband (by 3.6 to 4.2 dB), effectively suppressing the impulsive component of the noise and significantly reducing the noise peakedness. By comparing the black lines in the time domain panels of the figures, for the linear and the NDL-based circuits, one may see how the NDL-based circuits remove the impulsive noise by "trimming" the outliers while following the narrower-bandwidth trend.

The peakedness of the complex-valued noise in FIG. 102 through FIG. 104 is computed as $$K_{dBG}(z) = 10 \lg\left(\frac{\langle |z|^4 \rangle - |\langle zz \rangle|^2}{2\langle |z|^2 \rangle^2}\right), \quad (70)$$

where z(t) is the noise and the angular brackets denote time averaging (Hyvärinen et al. [13], for example). $K_{dBG}$ vanishes for a Gaussian distribution and attains positive and negative values for super- and sub-Gaussian distributions, respectively.

If the Shannon formula (Shannon [29]) is used to calculate the capacity of a communication channel, the SNR increase from 3 dB to 6.6 dB (FIG. 102) results in a 57% increase in the channel capacity, the SNR increase from 3 dB to 7 dB (FIG.

103) results in a 64% increase in the channel capacity, and the SNR increase from 3 dB to 7.2 dB (FIG. 104) results in a 67% increase.

FIG. 102 through FIG. 104 illustrate that if an NDL circuit (with sufficiently large initial bandwidth in order not to affect the baseband signal) is deployed early in the signal chain of a receiver channel affected by non-Gaussian impulsive noise, a properly chosen resolution parameter $\alpha$ maximizes SNR and improves the quality of the channel. Likewise, if an NDL circuit is an ANDL circuit (see, for example, FIG. 31 through FIG. 33), there exists such gain G that maximizes the SNR and improves the quality of the channel. FIG. 105 provides an illustration of the latter statement.

In the example of FIG. 105, the respective NDLs used in FIG. 102 through FIG. 104 are replaced by their adaptive versions according to the topology shown in FIG. 33, with zero quantile offset in the DcL, and the average baseband SNRs obtained for different gain values G are plotted as functions of the gain.

FIG. 105 shows that, when viewed as a function of the gain G, for any noise composition the channel quality measured by the average baseband SNR asymptotically approaches a constant value in the limit of large G, since in this limit the ANDLs become linear filters with their initial filter parameters. If the noise is purely thermal (Gaussian), for sufficiently large values of G the average SNR monotonically increases while approaching this asymptotic value (dashed lines in the figure). If, however, the total noise is impulsive and contains relatively short duration "bursts" of relatively high power, the average SNR exhibits an absolute maximum at some finite value of the gain (solid lines). One may see in this particular example that, in the case of the ANDL filter based on the 2nd order CDL (see FIG. 103), a single gain setting of about 2 (that provides the value for the resolution parameter $\alpha$ approximately equal to twice the median of the magnitude of the difference signal) ensures both the linear behavior of the ANDL when the noise is Gaussian (resulting in the asymptotic value of the baseband SNR), and a close to maximum increase in the baseband SNR for the impulsive noise mixture.

One may also see in FIG. 105 that the 1st order DoL offers an overall better performance in comparison with the 1st order CDL.

13.3 Mitigation of Inter- and/or Adjacent-Channel Interference

NDLs may help to mitigate interchannel and/or adjacent-channel interference, the problems that are becoming increasingly prevalent in the modern communications industry, caused by the wireless spectrum turning into a hot commodity.

FIG. 106 provides a qualitative illustration of different contributions into the interference which the receiver (RX) of a 2nd device experiences from the transmitter (TX) of a 1st device. Since real time 'brick-wall' filters are not physically realizable as they have infinite latency (i.e. their compact support in the frequency domain forces their time responses not to have compact support, meaning that they are ever-lasting) and infinite order (i.e. their responses cannot be expressed as a linear differential equation with a finite sum), the TX emissions 'leak' outside of the nominal (allocated) passband of the TX channel $[f_1, f_2]$ as out-of-band (OOB) emissions. Likewise, the RX filter has non-zero response outside of its nominal (allocated) passband $[f_3, f_4]$. As a result, there is non-zero interference from the TX into the RX.

The total power of the interference may be broken into three parts. Part I is the power of the TX signal in its nominal band $[f_1, f_2]$, weighted by the response of the RX filter in this band. Part II is the TX OOB emissions in the RX nominal band $[f_3, f_4]$, weighted by the response of the RX filter in this band. The rest of the interference power comes from the TX emissions outside of the nominal bands of both channels, and may be normally ignored in practice since in those frequency regions both the emitted TX power and the RX filter response are relatively small.

While part I of the interference contributes into the total power in the RX channel and may cause overload (as, for example, LightSquared emissions may cause overload in GPS receivers (FAA [1])), it does not normally degrade the quality of the communications in the RX since the frequency content of this part of the interference lies outside of the RX channel. Part II, however, in addition to contributing to overload, also causes degradation in the RX communication signal as it raises the noise floor in the RX channel.

Theoretical (Nikitin [23, 24]) as well as the experimental (Nikitin et al. [22]) data show that the TX OOB interference in the RX channel (part II of the interference in FIG. 106) is likely to appear impulsive under a wide range of conditions, especially if intermodulation in the TX is insignificant. Thus, as also shown by Nikitin [23, 24], Nikitin et al. [22], while this interference may not be reduced by linear filtering in the RX channel, it may be effectively mitigated by such nonlinear filters as the NDLs disclosed in the present invention.

The impulsive nature of the OOB interference provides an opportunity to reduce its power. Since the apparent peakedness for a given transmitter depends on the characteristics of the receiver, in particular its bandwidth, an effective approach to mitigating the out-of-band interference may be as follows: (i) allow the initial stage of the receiver to have a relatively large bandwidth so that the transients are not excessively broadened and the OOB interference remains highly impulsive, then (ii) implement the final reduction of the bandwidth to within the specifications through nonlinear means, such as the NDL filters described in the present invention.

FIG. 107 provides a similar illustration of different contributions into the interference which the receiver of the 1st device experiences from the transmitter of the 2nd device. The impulsive part of the interference (II') may be mitigated by the NDL filters properly deployed in the receiver channel.

It should be apparent to those skilled in the art that in the design, testing and implementation of communication devices operating in the co-interfering bands the method and apparatus for tests of normality and for detection and quantification of impulsive interference disclosed in Sections 7 and 14 may be used to assess the composition and properties of the interference, including its peakedness and the spectral composition of its impulsive component.

FIG. 108 shows the input and outputs of an ANDL for $G \to \infty$ and $G=1.5$ for a model signal. The ANDL is the 4th order NDL-based filter of FIG. 66, where the NDL is a 2nd order adaptive CDL according to the topology shown in FIG. 33, with the pole quality factor $1/rl;\sqrt{2}+rl;\sqrt{2}rlxrlx$ and zero quantile offset in the DcL, and the pole quality factor of the 2nd order linear filter is $1/rl;\sqrt{2}-rl;\sqrt{2}rlxrlx$.

In FIG. 108, the dashed lines show the PSDs, and the thin black lines show the time domain traces of the input and the outputs of an ANDL filter applied to a model signal+noise mixture. The outputs of the ANDL are shown for the cases of a large gain ($G \to \infty$, panel II), and the gain $G=1.5$ that maximizes the SNR in the baseband (panel III). For reference, the respective PSDs for the signal without noise are shown by the solid lines, and the time domain traces for the signal without noise are shown by the thick black lines.

In the limit of a large gain (G→∞) the ANDL filter used in the example of FIG. 108 is a linear 4th order lowpass Butterworth filter with the 3 dB roll-off frequency $2B_b$. As may be seen in panel II, this filter does not affect the SNR in the baseband of interest (it remains 0 dB) as it only reduces the higher-frequency noise. If we start reducing the gain G, "trimming" of the short-duration, high-power outliers comes into effect before the reduction in the gain (and, as a consequence, reduction in the resolution parameter α) affects the narrower-bandwidth trend in the signal. If the noise contains such outliers (that is, the noise is impulsive), the value $G=G_{max}$ (G=1.5 in this example) produces the maximum in an appropriate measure of the signal quality, for example, in the baseband SNR.

This may be seen in panel III of FIG. 108. The time domain traces show that the ANDL with G=1.5 reduces the impulsive noise by "trimming" the outliers while following the narrower-bandwidth trend in the signal, and the PSD plot shows that the noise floor is reduced throughout the full frequency range (including the baseband), leading to the 4.1 dB increase in the baseband SNR.

If the Shannon formula (Shannon [29]) is used to calculate the capacity of a communication channel, the baseband SNR increase from 0 dB to 4.1 dB (linear vs. NDL-based filter) results in an 84% increase in the channel capacity.

14 Method and Apparatus for Detection and Quantification of Impulsive Component of Interference As discussed in Sections 12 and 13.2.6, improved NDL-based filters comprising linear front-end filters to suppress the non-impulsive component of the interference may greatly increase the effectiveness of the interference mitigation when the interfering signal comprises a mixture of impulsive and non-impulsive components.

To design an effective analog linear front-end filter for such an improved NDL-based filter, one would need to know the spectral composition of the impulsive component of the interference, in particular, in its relation to the total spectral composition of the interfering mixture. This knowledge may be obtained according to the following recipe.

In the limit of a large resolution parameter (α→∞) an NDL is a linear filter characterized by the NDL's initial filter parameters. By choosing the bandwidth of this filter large enough to include most of the frequency range of the interference z(t), we may ensure that the temporal as well as the spectral characteristics of the output $\zeta(t)$ of the filter are close to those of the input z(t), especially if the group delay of the filter is approximately flat. If we start reducing α, "trimming" of the short-duration, high-power outliers starts coming into effect, and the difference $\Delta_\alpha(t)=\zeta(t)-\zeta_\alpha(t)$ between the outputs of the NDL ($\zeta_\alpha$) and the respective linear filter ($\zeta$) may be mostly due to the presence of the impulsive component.

By choosing a finite, but not too small a (e.g. an order of magnitude of the IQR of the NDL's difference signal), the spectral characteristics of the difference $\Delta_\alpha(t)$ may be made indicative of the spectral characteristics of the impulsive component of the interference. This knowledge may then be used to design the linear front-end filter for an improved NDL-based filter for effective mitigation of this component.

FIG. 109 provides a schematic illustration of obtaining a difference signal $\Delta_\alpha(t)$ that is indicative of the impulsive component of the incoming interference z(t). One skilled in the art will recognize that instead of an allpass or lowpass filter shown in the figure, a different filter (e.g. highpass or bandpass) may be used if the initial response of the respective NDL corresponds to the passband of the interference in question.

15 Improvements in Properties of Electronic Devices

By improving mitigation of various types of interference affecting the signal(s) of interest, the novel NDL-based filtering method and apparatus of the present invention enable improvements in the overall properties of electronic devices including, but not limited to, improvements in performance, reduction in size, weight, cost, and power consumption, and, in particular for wireless devices, improvements in spectrum usage efficiency. The overall improvement (e.g. maximum value or lowest cost) for a given device may be achieved through optimization based on the relationship among various device requirements. FIG. 110 provides a schematic illustration of improving properties of electronic devices by deploying NDL(s) in signal path(s), and/or by replacing linear filter(s) with NDL(s).

Even though in FIG. 110 and the subsequent figures "replacing" is shown separately and in addition to "deploying," one will realize that in all these examples "to replace" may mean "to deploy instead of, in place of, or as a substitution for", and that "replacement" is "deployment" with a specific narrower meaning.

An electronic device may be characterized by its various properties. For convenience, these properties may be classified, according to their shared qualities, as physical, commercial, and operational properties.

Physical properties may include size, dimensions, form factor, weight, bill of materials, circuit complexity, component count, and any combinations of the physical properties, and improving physical properties may comprise reducing the device size, dimensions, form factor, weight, bill of materials, circuit complexity, component count, and achieving any combinations of these improvements.

Commercial properties may include cost of components, cost of materials, total cost, value, and any combinations of the commercial properties, and improving commercial properties may comprise reducing the cost of components and/or materials, reducing the total cost, increasing the device value (e.g. benefits per cost), and achieving any combinations of these improvements.

Operational properties may include performance specifications, communication channel capacity, power consumption, battery size, reliability, and any combinations of the operational properties, and improving operational properties may comprise increasing the performance specifications, increasing the channel capacity, reducing the power consumption, increasing the battery size, increasing reliability, and achieving any combinations of these improvements.

It should be obvious that such classification of various properties of a device is by no means exhaustive and/or unambiguous, and is used only for convenience of generalization. A single property and/or its improvements may simultaneously belong to more than one property/improvement group, comprise a combination of various properties and/or improvements, or be a part of such a combination. For example, a subjective commercial property "value" may be viewed as "benefits per cost," and thus may include an operational property ("benefits"). Or better performance (improvements in operational properties) may lead to a better service (improvements in commercial properties).

Increasingly high integration of multiple radios and high speed digital systems in a single device (e.g. a tablet or a laptop computer) leads to a significant platform noise that is generated by digital clocking and signaling technologies. This platform noise noticeably degrades the performance of the device and its components by reducing the quality of the signals of interest in the device. Shielding by conductive foil or paint is a typical means of reducing such noise. Deployment of NDLs in the signal paths of the device may provide a low cost enhancement and/or alternative to the electromagnetic shielding, leading to a decrease in the cost of materials and the total cost. FIG. 111 provides a schematic illustration of improving properties of electronic devices by deploying NDL(s) in signal path(s), and/or by replacing linear filter(s) with NDL(s), with emphasis on the reduction in required shielding (dashed lines), cost of materials, and the total cost.

The levels of the signals of interest may be elevated (for example, by increasing the power output of a transmitter) to compensate for increased interference. This elevation, however, results in an increase in the device power consumption. Active digital methods of interference reduction (e.g. controlling/managing protocols such as multiple access protocols, interference alignment and/or cancellation, or statistical mitigation) that estimate and cancel interference during data transmission also contribute to an increase in the power consumption, e.g. through an increase in the computational load. NDLs deployed in the signal paths of an electronic device may provide a low-cost means of interference mitigation, enabling reduction in the device power consumption through the reduction in the signal levels and/or in the computation load. For battery powered devices, reduction in power consumption leads to an increase in battery life.

By mitigating the impulsive noise problems (as both the emitted RFI and the electronic noise at the output terminals) caused by the switching currents of switched-mode power supplies (SMPS), NDLs may facilitate replacement of linear regulators by more efficient, smaller, lighter, and less expensive SMPS, which contributes to reduced power consumption. By suppressing high-amplitude transients (impulse noise), NDLs may facilitate replacing larger size, more expensive and power-hungry high resolution analog-to-digital converters (ADCs) by more economical delta-sigma ($\Delta\Sigma$) ADCs, reducing the overall power consumption. FIG. 112 provides a schematic illustration of improving properties of electronic devices by deploying NDL(s) in signal path(s), and/or by replacing linear filter(s) with NDL(s), with emphasis on the reduction in power consumption and/or increase in battery life.

Deployment of NDLs in a device may compensate for the increase in the platform noise caused by increased proximity of various components in the device, and may relax requirements on the layout, amount and location of shielding, and/or the size of and separation among transmit and receive antennas in the device. This may lead to a reduction in size, dimensions, and/or form factor of the device and its components. Through mitigation of various noise problems, NDLs may also contribute to a reduction in size, dimensions, and/or form factor of the device by facilitating the use of smaller components (e.g. facilitating the use of MEMS, and/or the use of $\Delta\Sigma$ ADCs instead of high resolution converters, and/or the use of SMPS instead of linear regulators). FIG. 113 provides a schematic illustration of improving properties of electronic devices by deploying NDL(s) in signal path(s), and/or by replacing linear filter(s) with NDL(s), with emphasis on the reduction in size, dimensions, and/or form factor.

In a space-constrained battery powered device, reduction in size, dimensions, and/or form factor of the components of the device leaves more room for the battery. FIG. 114 provides a schematic illustration of improving properties of electronic devices by deploying NDL(s) in signal path(s), and/or by replacing linear filter(s) with NDL(s), with emphasis on the increase in battery size.

Multiple transmitters and receivers are increasingly combined in single devices, which produces mutual interference. A typical example is a smartphone equipped with cellular, WiFi, Bluetooth, and GPS receivers, or a mobile WiFi hotspot containing an HSDPA and/or LTE receiver and a WiFi transmitter operating concurrently in close physical proximity. This physical proximity, combined with a wide range of possible transmit and receive powers, creates a variety of challenging interference scenarios. This interference negatively affects the performance of the coexisting devices, and contributes to the increased size of a combined device. NDL-based mitigation of the interference may enable and/or improve coexistence of multiple devices, especially in a smaller form factor.

FIG. 115 provides a schematic illustration of improving properties of electronic devices by deploying NDL(s) in signal path(s), and/or by replacing linear filter(s) with NDL(s), with emphasis on enabling coexistence of multiple devices in a smaller form factor. This figure implies a particular example of a UWB device interfering with a narrowband communication system such as WLAN or a CDMA-based cellular system. A UWB device is seen by a narrowband receiver as a source of impulsive noise, which may be effectively suppressed by the NDL-based filtering. Such reduction in the UWB interference may enable and/or improve coexistence of the UWB and the narrowband devices in a smaller form factor.

Digital methods for reducing impulsive noise and artifacts typically involve non-real-time adaptive and non-adaptive nonlinear filtering, and digital nonlinear processing is computationally intensive. In addition, effective filtering of impulsive noise requires significant increase in the data bandwidth. This may lead to a "too much data" problem and to a dramatic increase in the computational load, that is, to an increase in memory and DSP requirements. This also contributes to the increase in power consumption, size, dimensions, form factor, weight and cost. Delegating the load of impulsive noise mitigation to real-time, inexpensive analog NDL-based filtering may greatly reduce these negative consequences of digital nonlinear processing. FIG. 116 provides a schematic illustration of improving properties of electronic devices by deploying NDL(s) in signal path(s), and/or by replacing linear filter(s) with NDL(s), with emphasis on the reduction in memory and DSP requirements, power consumption, size, dimensions, form factor, weight and cost.

As discussed in Section 13.3, NDLs may help to mitigate interchannel and/or adjacent-channel interference, the problems that are becoming increasingly prevalent in the modern communications industry, caused by the wireless spectrum turning into a hot commodity. Theoretical (Nikitin [23, 24]) as well as experimental (Nikitin et al. [22]) data show that an out-of-band interference from a transmitter induced in a receiver channel (part II of the interference in FIG. 106, and part II' of the interference in FIG. 107) is likely to appear impulsive under a wide range of conditions, especially if intermodulation in the transmitter is insignificant. As also shown by Nikitin [23, 24], Nikitin et al. [22], while this interference may not be reduced by linear filtering in the receiver channel, it may be effectively mitigated by such nonlinear filters as the NDLs disclosed in the present invention. In addition, as discussed in Section 12 and illustrated in Sections 13.2.6 and 13.2.7, NDL-based mitigation of an OOB interference may be enabled and/or improved even if this interference does not appear impulsive. By deploying NDL-based filters in receiver channels to reduce an OOB interference, spectrum usage by communication devices may be improved through enabling closer band allocation. FIG. 117 provides a schematic illustration of improving properties of electronic devices by deploying NDL(s) in signal path(s), and/or by replacing linear filter(s) with NDL(s), with emphasis on the improvement in spectrum usage by communication devices through enabling closer band allocation.

NDL-based filters deployed in receiver channels may provide cost-effective means of reducing an OOB interference, in addition and/or as an alternative to other available means. This may lead to reduction in component count, cost of materials, and the total cost of an electronic device. FIG. 118 provides a schematic illustration of improving properties of electronic devices by deploying NDL(s) in signal path(s), and/or by replacing linear filter(s) with NDL(s), with emphasis on the reduction in component count, cost of materials, and the total cost. This figure implies a particular example of a device comprising a transmitter (TX) that interferes with a receiver. In the original device (on the left), the interference is mitigated by (i) reducing the coupling between the antennas by electromagnetic shielding (indicated by the dashed line), and (ii) by deploying an additional high quality bandpass filter at the TX antenna. In the improved device (on the right), the NDLs deployed in the receiver allow the performance specifications of the device to be met in the absence of the shielding and the additional bandpass filter, thus reducing the component count, cost of materials, and the total cost of the device.

The non-idealities in hardware implementation of designed modulation schemes such as non-smooth behavior of the modulator around zero exacerbate the OOB emissions (Nikitin [23, 24], Nikitin et al. [22], for example). Thus, in order to keep these emissions at a low level, expensive high-quality components such as IC modulators and power amplifiers may be used, which increases the complexity and the cost of the components. By reducing an OOB interference, NDL-based filters may relax the requirements on the quality of such modulators and power amplifiers, leading to reduction in cost of components, materials, and the total cost of a device. FIG. 119 provides a schematic illustration of improving properties of electronic devices by deploying NDL(s) in signal path(s), and/or by replacing linear filter(s) with NDL(s), with emphasis on the reduction in cost of components, materials, and the total cost. This figure implies that in the original device (on the left) the interference is mitigated by (i) reducing the coupling between the antennas by electromagnetic shielding (indicated by the dashed line), and (ii) by using expensive high-quality components ($$ IC) in the transmitter. In the improved device (on the right), the NDLs deployed in the receiver allow the performance specifications of the device to be met in the absence of the shielding, and using less expensive components ($ IC) in the transmitter, thus reducing the cost of materials and components, and the total cost of the device.

One skilled in the art will recognize that various other ways, in addition to those illustrated in Section 15, of improving physical, commercial, and operational properties of electronic devices may be enabled and achieved by the NDL-based mitigation of various types of interference affecting the signals of interest in a device.

REFERENCES

[1] Assessment of compatibility of planned LightSquared Ancillary Terrestrial Component transmissions in the 1526-1536 MHz band with certified aviation GPS receivers. Federal Aviation Administration status report, 25 Jan. 2012.

[2] M. Abramowitz and I. A. Stegun, editors. *Handbook of Mathematical Functions with Formulas, Graphs, and Mathematical Tables.* 9th printing. New York: Dover, 1972.

[3] S. H. Ardalan and J. J. Paulos. An analysis of nonlinear behavior in delta-sigma modulators. *IEEE Transactions on Circuits and Systems*, CAS-34(6), 1987.

[4] S. A. Bhatti, Q. Shan, R. Atkinson, M. Vieira, and I. A. Glover. Vulnerability of Zigbee to impulsive noise in electricity substations. In *General Assembly and Scientific Symposium*, 2011 XXXth URSI, 13-20 Aug. 2011.

[5] R. Bracewell. *The Fourier Transform and Its Applications*, chapter "Heaviside's Unit Step Function, H(x)", pages 61-65. McGraw-Hill, New York, 3rd edition, 2000.

[6] J. Carey. Noise wars: Projected capacitance strikes back against internal noise. *EDN*, pages 61-65, Jan. 19, 2012.

[7] A. Chopra. *Modeling and Mitigation of Interference in Wireless Receivers with Multiple Antennae*. Phd thesis, The University of Texas at Austin, December 2011.

[8] P. A. M. Dirac. *The Principles of Quantum Mechanics*. Oxford University Press, London, 4th edition, 1958.

[9] R. Dragomir, S. Puscoci, and D. Dragomir. A synthetic impulse noise environment for DSL access networks. In *Proceedings of the 2nd International conference on Circuits, Systems, Control, Signals (CSCS'11)*, pages 116-119, 2011.

[10] C. Fischer. Analysis of cellular CDMA systems under UWB interference. In *International Zurich Seminar on Communications*, pages 130-133, Feb. 22-24, 2006.

[11] T. B. Gabrielson. Mechanical-thermal noise in micromachined acoustic and vibration sensors. *IEEE Transactions on Electron Devices*, 40(5): 903-909, 1993.

[12] V. Guillet, G. Lamarque, P. Ravier, and C. Léger. Improving the power line communication signal-to-noise ratio during a resistive load commutation. *Journal of Communications*, 4(2): 126-132, 2009.

[13] A. Hyvärinen, J. Karhunen, and E. Oja. *Independent component analysis*. Wiley, New York, 2001.

[14] E. Janssen and A. van Roermund. *Look-Ahead Based Sigma-Delta Modulation*. Springer, 2011.

[15] F. Leferink, F. Silva, J. Catrysse, S. Batterman, V. Beauvois, and A. Roc'h. Man-made noise in our living environments. *Radio Science Bulletin*, (334):49-57, September 2010.

[16] S. R. Mallipeddy and R. S. Kshetrimayum. Impact of UWB interference on IEEE 802.11a WLAN system. In *National Conference on Communications* (NCC), 29-31 Jan. 2010.

[17] F. Mohd-Yasin, D. J. Nagel, and C. E. Korman. Noise in MEMS. *Meas. Sci. Technol.*, 21 (012001), 2010.

[18] A. V. Nikitin. Method and apparatus for real-time signal conditioning, processing, analysis, quantification, comparison, and control, 2006, 2008, and 2009. U.S. Pat. Nos. 7,107,306 (Sep. 12, 2006), 7,418,469 (Aug. 26, 2008), and 7,617,270 (Nov. 10, 2009).

[19] A. V. Nikitin. Method and apparatus for adaptive real-time signal conditioning and analysis, 2011. US Patent Application Publication 2011/0112784 (12 May 2011).

[20] A. V. Nikitin and R. L. Davidchack. Signal analysis through analog representation. *Proc. R. Soc. Lond. A*, 459 (2033):1171-1192, 2003.

[21] A. V. Nikitin and R. L. Davidchack. Method and apparatus for analysis of variables, 2006 and 2007. U.S. Pat. Nos. 7,133,568 (Nov. 7, 2006) and 7,242,808 (Jul. 10, 2007).

[22] A. V. Nikitin, M. Epard, J. B. Lancaster, R. L. Lutes, and E. A. Shumaker. Impulsive interference in communication channels and its mitigation by SPART and other nonlinear filters. *EURASIP Journal on Advances in Signal Processing*, 2012 (79), 2012.

[23] A. V. Nikitin. On the impulsive nature of interchannel interference in digital communication systems. In *Proc. IEEE Radio and Wireless Symposium*, pages 118-121, Phoenix, Ariz., 2011.

[24] A. V. Nikitin. On the interchannel interference in digital communication systems, its impulsive nature, and its mitigation. *EURASIP Journal on Advances in Signal Processing*, 2011 (137), 2011.

[25] C. R. Popa. High-accuracy function synthesizer circuit with applications in signal processing. *EURASIP Journal on Advances in Signal Processing*, 2012 (146), 2012.

[26] J. G. Proakis and D. G. Manolakis. *Digital signal processing: principles, algorithms, and applications*. Prentice Hall, 4th edition, 2006.

[27] R. P. Sallen and E. L. Key. A practical method of designing RC active filters. *IRE Transactions on Circuit Theory*, CT-2: 78-85, 1955.

[28] R. Schaumann and M. E. Van Valkenburg. *Design of analog filters*, chapter 16. Oxford University Press, 2001.

[29] C. E. Shannon. Communication in the presence of noise. *Proc. Institute of Radio Engineers*, 37(1): 10-21, January 1949.

[30] I. Shanthi and M. L. Valarmathi. Speckle noise suppression of SAR image using hybrid order statistics filters. *International Journal of Advanced Engineering Sciences and Technologies (IJAEST)*, 5(2): 229-235, 2011.

[31] K. Slattery and H. Skinner. *Platform Interference in Wireless Systems*. Elsevier, 2008.

[32] G. H. Stauffer. Finding the lumped element varactor diode model. *High Frequency Electronics*, 2(6): 22-28, November 2003.

[33] X. Yang and A. P. Petropulu. Co-channel interference modeling and analysis in a poisson field of interferers in wireless communications. *IEEE Transactions on Signal Processing*, 51(1): 64-76, 2003.

[34] Y. Zheng. *Operational transconductance amplifiers for gigahertz applications*. Phd thesis, Queen's University, Kingston, Ontario, Canada, September 2008.

Regarding the invention being thus described, it will be obvious that the same may be varied in many ways. Such variations are not to be regarded as a departure from the spirit and scope of the invention, and all such modifications as would be obvious to one skilled in the art are intended to be included within the scope of the claims. It is to be understood that while certain now preferred forms of this invention have been illustrated and described, it is not limited thereto except insofar as such limitations are included in the following claims.

The invention claimed is:

1. A method for signal filtering comprising applying a filter to an input signal to produce an output filtered signal, wherein said input signal is a physical signal and wherein said output filtered signal is a physical signal, wherein said filter comprises a nonlinear lowpass stage characterized by a bandwidth and transforming a nonlinear lowpass stage input signal into a nonlinear lowpass stage output signal, and wherein said bandwidth is a non-increasing function of a magnitude of a difference between said nonlinear lowpass stage input signal and a feedback of said nonlinear lowpass stage output signal.

2. The method of claim 1 wherein said input signal comprises a signal of interest and an interfering signal affecting said signal of interest, wherein said output filtered signal is characterized by signal quality, and wherein said filter is configured to improve said signal quality.

3. The method of claim 2 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

4. The method of claim 1 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

5. The method of claim 4 wherein said input signal comprises a signal of interest and an interfering signal affecting said signal of interest, wherein said output filtered signal is characterized by signal quality, and wherein said filter is configured to improve said signal quality.

6. The method of claim 5 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

7. The method of claim 4 wherein said resolution parameter is proportional to a measure of central tendency of said magnitude of said difference between said nonlinear lowpass stage input signal and a feedback of said nonlinear lowpass stage output signal.

8. The method of claim 7 wherein said input signal comprises a signal of interest and an interfering signal affecting said signal of interest, wherein said output filtered signal is characterized by signal quality, and wherein said filter is configured to improve said signal quality.

9. The method of claim 8 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

10. The method of claim 1 wherein said bandwidth depends on nonlinear lowpass stage filter parameters, wherein at least one of said nonlinear lowpass stage filter parameters is a controlled parameter dynamically controlled by said difference between said nonlinear lowpass stage input signal and a feedback of said nonlinear lowpass stage output signal, and wherein dependence of said controlled parameter on said difference is configured in such a way that said bandwidth is a non-increasing function of said magnitude of said difference.

11. The method of claim 10 wherein said input signal comprises a signal of interest and an interfering signal affecting said signal of interest, wherein said output filtered signal is characterized by signal quality, and wherein said filter is configured to improve said signal quality.

12. The method of claim 11 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

13. The method of claim 10 wherein said dependence of said controlled parameter on said difference is further characterized by a resolution parameter, wherein said bandwidth remains essentially constant when said magnitude is smaller than said resolution parameter, and wherein said bandwidth decreases with the increase of said magnitude when said magnitude is larger than said resolution parameter.

14. The method of claim 13 wherein said input signal comprises a signal of interest and an interfering signal affecting said signal of interest, wherein said output filtered signal is characterized by signal quality, and wherein said filter is configured to improve said signal quality.

15. The method of claim 14 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

16. The method of claim 13 wherein said resolution parameter is proportional to a measure of central tendency of said magnitude of said difference between said nonlinear lowpass stage input signal and a feedback of said nonlinear lowpass stage output signal.

17. The method of claim 16 wherein said input signal comprises a signal of interest and an interfering signal affecting said signal of interest, wherein said output filtered signal is characterized by signal quality, and wherein said filter is configured to improve said signal quality.

18. The method of claim 17 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

19. The method of claim 1 wherein said nonlinear lowpass stage comprises electronic components, wherein said bandwidth depends on values of said electronic components, wherein at least one of said values is a controlled value dynamically controlled by said difference between said nonlinear lowpass stage input signal and a feedback of said nonlinear lowpass stage output signal, and wherein dependence of said controlled value on said difference is configured in such a way that said bandwidth is a non-increasing function of said magnitude of said difference.

20. The method of claim 19 wherein said input signal comprises a signal of interest and an interfering signal affecting said signal of interest, wherein said output filtered signal is characterized by signal quality, and wherein said filter is configured to improve said signal quality.

21. The method of claim 20 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

22. The method of claim 19 wherein said filter is deployed in a signal path of an electronic device comprising an electronic component, wherein said device is characterized by a property selected from the group comprising physical properties, commercial properties, operational properties, and any combinations thereof; wherein deploying said filter in said signal path improves said property of said electronic device, and wherein said improvement in said property is selected from the group comprising improvements in physical properties, improvements in commercial properties, improvements in operational properties, and any combinations thereof.

23. The method of claim 19 wherein dependence of said bandwidth on said difference is further characterized by a resolution parameter, wherein said bandwidth remains essentially constant when said magnitude of said difference is smaller than said resolution parameter, and wherein said bandwidth decreases with the increase of said magnitude when said magnitude is larger than said resolution parameter.

24. The method of claim 23 wherein said input signal comprises a signal of interest and an interfering signal affecting said signal of interest, wherein said output filtered signal is characterized by signal quality, and wherein said filter is configured to improve said signal quality.

25. The method of claim 24 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

26. The method of claim 23 wherein said filter is deployed in a signal path of an electronic device comprising an electronic component, wherein said device is characterized by a property selected from the group comprising physical properties, commercial properties, operational properties, and any combinations thereof; wherein deploying said filter in said signal path improves said property of said electronic device, and wherein said improvement in said property is selected from the group comprising improvements in physical properties, improvements in commercial properties, improvements in operational properties, and any combinations thereof.

27. The method of claim 23 wherein said resolution parameter is proportional to a measure of central tendency of said magnitude of said difference between said nonlinear lowpass stage input signal and a feedback of said nonlinear lowpass stage output signal.

28. The method of claim 27 wherein said input signal comprises a signal of interest and an interfering signal affecting said signal of interest, wherein said output filtered signal is characterized by signal quality, and wherein said filter is configured to improve said signal quality.

29. The method of claim 28 wherein said interfering signal affecting said signal of interest is characterized by a degree of peakedness, wherein said filter further comprises a first filtering stage preceding said nonlinear lowpass stage, and wherein said first filtering stage is configured to increase said degree of peakedness of said interfering signal affecting said signal of interest.

30. The method of claim 27 wherein said filter is deployed in a signal path of an electronic device comprising an electronic component, wherein said device is characterized by a property selected from the group comprising: physical properties, commercial properties, operational properties, and any combinations thereof; wherein deploying said filter in said signal path improves said property of said electronic device, and wherein said improvement in said property is selected from the group comprising: improvements in physical properties, improvements in commercial properties, improvements in operational properties, and any combinations thereof.

* * * * *

UNITED STATES PATENT AND TRADEMARK OFFICE
CERTIFICATE OF CORRECTION

PATENT NO. : 8,489,666 B1  
APPLICATION NO. : 13/662127  
DATED : July 16, 2013  
INVENTOR(S) : Alexei V. Nikitin It is certified that error appears in the above-identified patent and that said Letters Patent is hereby corrected as shown below:

In the Specification

Column 41, lines 23-24, delete "Q=1/rl;√2+rl;√2rlxrlx" and substitute --$Q = 1/\sqrt{(2 + \sqrt{2})}$--.

Column 41, line 25, delete "Q=1/rl;√2-/rl;√2rlxrlx" and substitute --$Q = 1/\sqrt{(2 - \sqrt{2})}$--.

Column 45, line 14, delete the line break.

Column 46, line 47, delete "1/rl;√2+rl;√2rlxrlx and 1/rl;√2-/rl;√2rlxrlx" and substitute --$1/\sqrt{(2 + \sqrt{2})}$ and $1/\sqrt{(2 - \sqrt{2})}$--.

Column 49, line 6, delete "Q=1/rl;√2+rl;√2rlxrlx" and substitute --$Q = 1/\sqrt{(2 + \sqrt{2})}$--.

Column 52, lines 34-35, delete "Q=1/rl;√2+rl;√2rlxrlx" and substitute --$Q = 1\sqrt{(2 + \sqrt{2})}$--.

Column 52, line 36, delete "Q=1/rl;√2-/rl;√2rlxrlx" and substitute --$Q = 1/\sqrt{(2 - \sqrt{2})}$--.

Column 54, lines 31-32, delete "Q=1/rl;√2+rl;√2rlxrlx" and substitute --$Q = 1/\sqrt{(2 + \sqrt{2})}$--.

Column 54, line 33, delete "Q=1/rl;√2+rl;√2rlxrlx" and substitute --$Q = 1/\sqrt{(2 - \sqrt{2})}$--.

Column 56, line 57, delete "rl;√2+rl;√2rlxrlx" and substitute --$1/\sqrt{(2 + \sqrt{2})}$--.

Column 56, line 59, delete "1/rl;√2-/rl;√2rlxrlx" and substitute --$1/\sqrt{(2 - \sqrt{2})}$--.

Signed and Sealed this  
Eighth Day of October, 2013

Teresa Stanek Rea  
*Deputy Director of the United States Patent and Trademark Office*